United States Patent [19]

Place

[11] 4,423,408
[45] Dec. 27, 1983

[54] REMOTE DATA GATHERING PANEL

[75] Inventor: William C. Place, Acton, Mass.

[73] Assignee: Honeywell Inc., Minneapolis, Minn.

[21] Appl. No.: 232,793

[22] Filed: Feb. 9, 1981

[51] Int. Cl.$^3$ .......................................... H03K 13/20
[52] U.S. Cl. ..................... 340/347 NT; 340/347 AD; 340/347 CC; 340/347 M; 324/99 D; 364/571
[58] Field of Search .... 340/347 M, 347 NT, 347 AD; 324/62, 99 D; 364/571

[56] References Cited

U.S. PATENT DOCUMENTS 3,027,079  3/1962  Fletcher et al. ........... 340/347 M X
3,974,443  8/1976  Thomas ........................ 324/62 X

OTHER PUBLICATIONS

Schmid, Electronic Analog/Digital Conversions, Van Nostrand Reinhold Co., 1970, pp. 282-292; 400-407.
Landee et al., Electronic Designers' Handbook, McGraw-Hill Book Co., Inc., 1957, pp. 23-31 (single sheet).

Primary Examiner—T. J. Sloyan
Attorney, Agent, or Firm—Trevor B. Joike

[57] ABSTRACT

A data gathering panel is disclosed for converting analog values into digital values having input terminals for connection to analog sensors, a memory for storing a base value and a range value associated with the sensor, a base circuit connected to the memory for applying the base value to the analog value, and an analog-to-digital converter using the analog value, the base value and the range value for converting the analog value into a digital value. The data gathering panel may also permit connection to a plurality of input sensors having different characteristics by providing a memory for storing the different characteristics of the input sensors to be used by a processor in processing the information derived from the sensors. This memory may be a programmable read-only memory and the data gathering panel may have a facility thereon for allowing the altering of information stored in the programmable read-only memory.

20 Claims, 14 Drawing Figures

REMOTE DATA GATHERING PANEL

BACKGROUND OF THE INVENTION

The subject invention relates to a data gathering panel for use in communication systems wherein the data gathering panel is located remotely from other remote stations one of which may include a central processing unit and, more particularly, to a data gathering panel which can accommodate a wide variety of analog and digital sensors, which provides an analog-to-digital converter capable of converting analog values from a wide variety of analog sensors to standard digital values, and which provides a programmable read-only memory for storing information which is useful by the processor in processing information wherein the programmable read-only memory can be configured and/or reconfigured from a station remote from the data gathering panel.

In an effort to reduce the complexity and attendant unreliability and installation costs of systems for controlling a building's air conditioning plant, energy consuming equipment, and the like, communication systems were developed wherein a central station communicated with a plurality of remote stations over a communication channel so that various points around a building could be sensed and various control units could be controlled. A typical remote station consisted of an interface circuit having a remote state address so that all remote stations were connected over a single pair of wires to the central station. Communication over this pair of wires was established between the central station and the remote stations so that the central station read the status points of the remote stations and commanded the control apparatus associated with the remote station. Therefore, the interface apparatus at the remote station simply served as a vehicle for collecting data to be reported to a central station and for responding to control messages sent by the central station to operate the various control apparatus associated with the remote station.

The evolution of such building automation and fire and security systems in recent times is beginning to influence system architecture. For example, there is a tendency for increasing the size of such building control systems to accommodate the ever increasing size of office buildings which are being constructed and to handle the increased number of sensing, control, fire and security points in new and existings buildings. The increased size and complexity of the system architecture and the increasing variety of tasks to be performed by the hardware has placed an enormous burden on the central processing units of such systems. Moreover, it may be necessary or desirable in some systems to eliminate the central processing unit altogether and to spread the control functions normally performed by a central station among a plurality of stations located throughout the communication system. These factors, among others, require that the system be capable of processing information at locations other than a central station. Thus, the remote stations (or data gathering panels) located throughout the communication system are beginning to be provided with computerized data processing capability made feasible by the microprocessor.

Since it is the data gathering panel which must now perform a portion of the data processing involved in the system as a whole, these data gathering panels must interface with the sensing and control points in such building automation and fire and security systems. The data gathering panel must acquire data from sensors connected thereto and must process the data acquired from these sensors to effect certain control decisions with respect to the control apparatus also connected to the data gathering panel. It would be beneficial if such data gathering panels were universal in nature such that they could be connected to any type of analog sensor or digital sensor without providing special connecting interface hardware between the sensor and the data gathering panel. If the data gathering panel is to be connected to sensors having widely varying characteristics, and if the data gathering panel is to process the data received from the sensors to effect control of the loads connected thereto, the data gathering panel must be able to convert the analog input signals from analog sensors having different characteristics into digital values for processing by the processing apparatus. If the use of separate hardware for each type of sensor is to be avoided, it is necessary to provide memory associated with the processing apparatus located in the data gathering panel for storing the programs and data files associated with the sensors and control apparatus, and it is desirable, therefore, to be able to change this memory from a remote location.

SUMMARY OF THE INVENTION

Thus, the invention relates to a data gathering panel for the conversion of analog values into digital values wherein the panel includes input terminals for connecting analog sensors to the panel, a memory for storing a base value and a range value for each of the analog sensors connected to the panel, a base circuit connected to the memory for applying the base value to the analog value, and an analog-to-digital converter connected to the input terminals, to the base circuit and to the memory for converting the analog value into a digital value, the analog-to-digital converter determining the digital value by utilizing the analog value, the base value and the range value.

The data gathering panel may also be adapted to be connected to a plurality of input sensors having different characteristics and thus include input terminals for connection to the plurality of input sensors, a memory for storing the characteristics of the input sensors so that the data gathering panel can be connected to the input sensors having different characteristics, and a processor connected to the input terminals and to the memory for processing the input signals derived from the input sensors according to the characteristics for the input sensors stored in the memory.

Moreover, the data gathering panel can be reprogrammed from a remote location by including a programmable read-only memory for storing information to be used by the data gathering panel for controlling processing, an energy source in the data gathering panel for altering upon command the information stored in the programmable read-only memory, and a controller responsive to remote transmissions from a remote station over a communication channel for interconnecting the energy source and the programmable read-only memory for altering the information stored in the programmable read-only memory.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
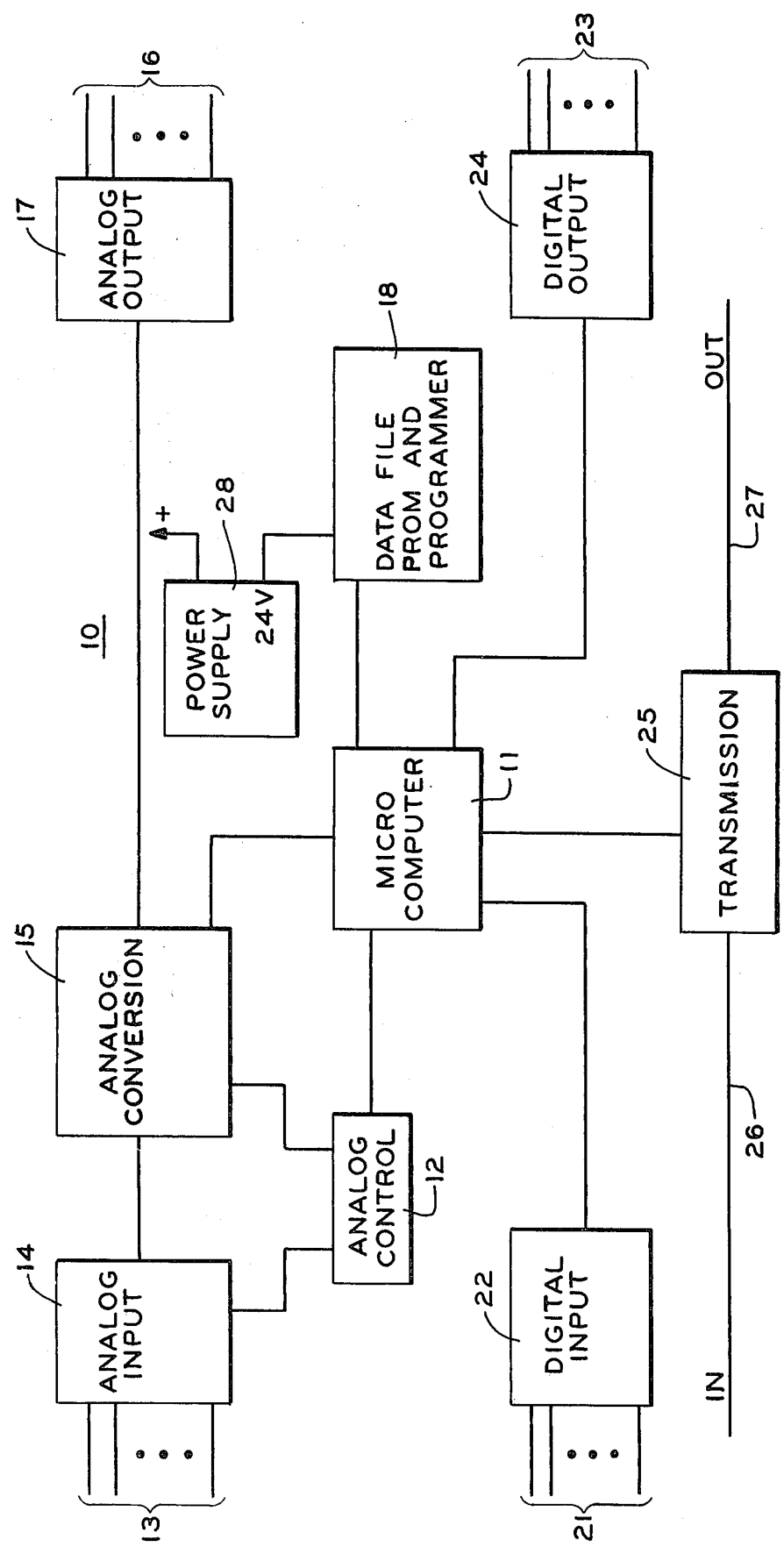
FIG. 1 shows a block diagram of the data gathering panel according to the present invention.

The block form of the data gathering panel is shown in FIG. 1. All of the circuits comprising the blocks shown in FIG. 1 may be placed on a single printed circuit board for easier installation and utility. The heart of the system shown in FIG. 1 is microcomputer 11 which through analog control circuit 12 controls the connection of analog inputs 13 through analog input circuit 14 to the input of an analog conversion network 15. Analog conversion network 15 converts the analog input signals supplied through analog input 14 into digital signals for connection to microcomputer 11. Microcomputer 11 also controls analog outputs 16 through analog conversion circuit 15 and analog output circuit 17. Analog outputs 16 may be connected to such apparatus as control point adjustment apparatus for adjusting the control point of a control system, relays or other equipment which is to be controlled by the data gathering panel.

Since the data gathering panel shown in FIG. 1 is intended to receive the input from any type of analog input sensor, data file PROM and programmer 18 is connected to microcomputer 11 and stores therein the data files necessary for characterizing each type of analog input sensor to which inputs 13 may be connected. Thus, at the time of installation of the data gathering panel shown in FIG. 1 into a building automation system, the input sensors to be connected to the inputs 13 are selected and characterizing information for each sensor is stored in memory 18 to be later used by microcomputer 11 for converting the analog input signal derived from the analog input sensor to a digital representation to be used by the microcomputer 11 in its communication with other stations connected to the communication bus and in determining whether or not a control point needs adjustment or is in alarm. For example, the types of analog sensors which may be connected to the data gathering panel shown in FIG. 1 include 1–100 millivolt voltage sensors, 4–20 milliamp current sensors, 0–5 milliamp current sensors, 3280–4000 ohms or 80–120 ohms resistance temperature devices, or 0–10 volts voltage sensors.

The analog conversion circuitry acts on one analog input at a time. Because the conversion circuitry chosen for implementing the present invention provides a digital 0 output for an analog input of less than 5 volts and will saturate for an analog input substantially greater than 10 volts, certain scaling and base values must be applied to the input depending on the type of analog sensor connected thereto. In the example given above, an input from a 0–100 millivolt voltage sensor is first multiplied or scaled by a factor of 10 to produce a 0–1 volt signal. Next, a 5.5 volt base value signal is added thereto so that the analog range for this type of sensor is between 5.5 and 6.5 volts. All current sensors when connected to one of the inputs 13 shown in FIG. 1 are also connected through a corresponding 121 ohm resistor (not shown) which converts, in the case of the 4–20 milliamp sensor, the current input into a 0.484–2.42 volt signal. Then, a base voltage is applied thereto of 5.016 volts to produce an analog voltage range of 5.5–7.436 volts for this sensor. As another example, the 0–5 milliamp current sensor is first applied through two 121 ohm parallel resistors and then is multiplied or scaled similarly to the 4–20 milliamp sensor.

If a two slope conversion of an analog input signal were followed, the process would begin by allowing an integrator to charge from a reference voltage VR for a fixed amount of time TI. After this integration time, the integrator is next allowed to discharge for a time TM, dependent upon its original charge, to the reference voltage VR. Next, since the reference voltage VR is known, since the digital representation of integration time TI is known and since the measured time TM has been digitally measured, the analog voltage VI can be calculated as a digital value according to the following equation:

$$\frac{VI}{VR} = \frac{TM}{TI}. \tag{1}$$

Figure 4:
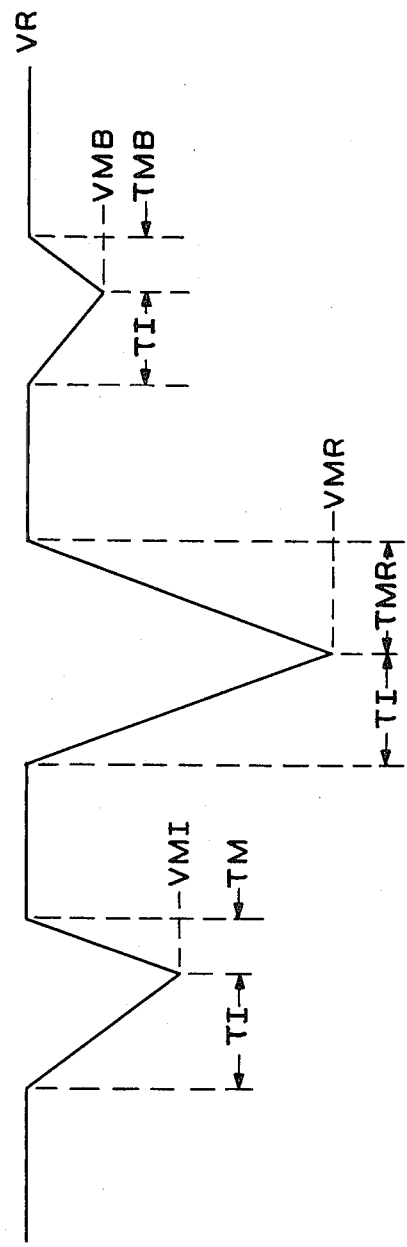

However, the digital representation of the analog value derived from this equation is not meaningful because it has not been related to the base value which was applied to the analog voltage during the conversion process and is not related to the voltage range for this analog signal. Therefore, a more meaningful conversion is a conversion which takes into account the base and range values. FIG. 4 shows a timing diagram for a hex slope conversion which uses not only the analog input voltage, but also the base and range values.

In FIG. 4, the integrator begins at the reference voltage VR and is allowed to charge for a reference amount of time TI. The voltage of the integrator at this point is representative of the measured analog input voltage, VMI. Next, the integrator is discharged over a variable measured amount of time TM until it reaches the reference voltage VR. Next, the range value, which is defined as the upper limit of the voltage range or span which can be supplied by the analog signal input sensor (6.5 volts in the example of the 0–100 millivolt sensor), is applied to the conversion circuitry and the integrator is again charged for the fixed amount of time TI. The voltage of the integrator after this amount of time is representative of the measured range value VMR. Next, the integrator is allowed to discharge for a measured amount of time TMR to discharge the integrator to the reference voltage level VR. Finally, the base voltage which is the lower limit of the span which may be experienced from the sensor (5.5 volts in the example of the 0–100 millivolt sensor) is applied to the integrator and the integrator is again charged for the reference amount of time TI. Next, the integrator is allowed to discharge for a measured amount of time TMB to the voltage reference level VR. As should be clear, the only unknown of these quantities is the analog input voltage VMI.

The following equation shows how these variables may be used in deriving a digital representation of the analog input signal:

$$PV = \frac{TMI - TMB}{TMR - TMB} = \frac{VMI\left(\frac{TI}{VR}\right) - VMB\left(\frac{TI}{VR}\right)}{VMR\left(\frac{TI}{VR}\right) - VMB\left(\frac{TI}{VR}\right)} = \quad (2)$$

$$\frac{VMI - VMB}{VMR - VMB}$$

In equation (2), the only unknown is the term VMI, the term VMB being representative of the base voltage, VMR being representative of the range voltage, TMI, TMB and TMR being the measured times in digital representation of the input discharge time, the base discharge time and the range discharge time respectively. Thus, the voltage VMI can be calculated readily.

It is to be noted that it is only necessary to derive a proportional value PV which is based upon the various measured times in digital representation and which can be said to relate the voltage within the span, that is the input voltage minus the base voltage, to the span itself, that is the difference between the range voltage and the base voltage. This proportional value is a digital representation of the input voltage as related to both the range value and the base value and it is specifically related to the type of analog input sensor from which the raw analog voltage signal was derived. The middle term of equation (2) merely shows that the integration time TI and the reference voltage VR cancel out and need not be used in the calculation process.

The digital value PV is a 16 bit raw value which, because the processor processes digital signals having a maximum of 12 bits, because of the wide variety of sensors which can be connected to the data gathering panel and because 12 bits have been chosen for resolution, the PV value must be converted to a final value. For this purpose, a standard range of 95-4095 has been chosen so that the following equation is useful for this conversion:

$$FV = (PV \times 4000) MOD\, 4096 + 95 \quad (3)$$

It is to be noted that the proportional value PV must by definition be less than 1. Therefore, equation (3) multiplies the proportional value by 4000 and then divides that result by 4096 and adds the remainder of that operation to the digital equivalent of 95. The result is a final value FV which is a digital representation within a standard range of an analog value received from an analog input sensor connected to one of the inputs 13 and related to the base and range for that specific sensor. The base and range values are stored in data file 18 along with any other necessary characterization data. Each set of data is stored in a memory location designated for a specific sensor. There will be as many sets of data stored in memory 18 as there are sensors connected to inputs 13.

The apparatus of FIG. 1 is also capable of successively approximating the analog value received over one of the inputs 13. In this mode of operation, a digital-to-analog converter can be used wherein the digital inputs to the digital-to-analog converter are continually adjusted until the analog input value is nulled out. At this point, the digital input value to the D/A converter is then representative of the analog value. However, in actual practice, this mode of operation is used as a threshold sensing arrangement. In this arrangement, the analog input value is compared to several digital threshold values to determine the limits within which the analog value falls. This type of operation is particularly useful in determining the nature of an alarm in a fire and security application.

A third mode of operation, suggested above, is the resistance-to-period, R/P, operation. When this type of operation is intended, a sensor and a R/P converter are connected to an input of inputs 13. The R/P routine has 6 ranges of calibration that are digitized. The ranges each result in a value of 4000 states from 95 to 4095 to make a 12 bit value. A counter will count the time between 20 pulses to accumulate an R/P count. The R/P count is then operated upon in a manner similar to equation (3) for determining the digital value representative of the R/P count.

Note that no terminal interconnect hardware changes are required to convert inputs from any of the inputs attached to 13.

The data gathering panel shown in FIG. 1 may receive inputs from a plurality of digital sensors, runtime or totalizer sensors connected to inputs 21. Digital sensors may be simple on/off devices such as air flow switches, security door switches, fire or smoke sensors, or the like. Totalizer inputs count pulses. Each time a totalizing contact opens and closes a count is registered. Such an input can be used, for example, in conjunction with runtime inputs to total the elapsed time an input is closed in two second increments. Such an input can be used, for example, for measuring fluid flow. The inputs 21 are connected through digital input circuit 22 to microcomputer 11 which also controls a plurality of digital outputs 23 through digital output circuit 24. Digital outputs 23 may be connected to loads such as relays for controlling the various functions in a building automation system. Finally, microcomputer 11 is connected to transmission circuit 25 which controls the receiving and transmitting of information over a communication channel which includes input line 26 and output line 27 for communication with other remote stations and a central processor if used.

The data gathering panel shown in FIG. 1 is capable of being reconfigured from a remote location. If it is desired, for example, to change the manner of processing the analog and digital inputs supplied to data gathering panel 10 over inputs 13 and 21, the data file and program contained in memory 18 can be changed from a remote location. As another example, it may be desirable to change sensors or their locations which would require a similar change in memory 18. Instead of having to disconnect memory 18 from data gathering panel 10 and substituting a new memory therefor or using a programmer for reprogramming old memory 18, those portions of the old routine which are no longer desirable can be erased from memory 18 and the new desired program and data file can be burned into memory 18 under control from a remote location. In order to facilitate the remote reconfiguration of memory 18, power supply 28 which supplies the power necessary to drive the various blocks shown in FIG. 1 is also provided with a 24 volt output connected to memory 18. Under control of microcomputer 11, therefore, memory 18 can use the 24 volt source for erasing the old information which is no longer desired and burning into memory 18 the new information which can be supplied and controlled from the remote location.

Figure 2:
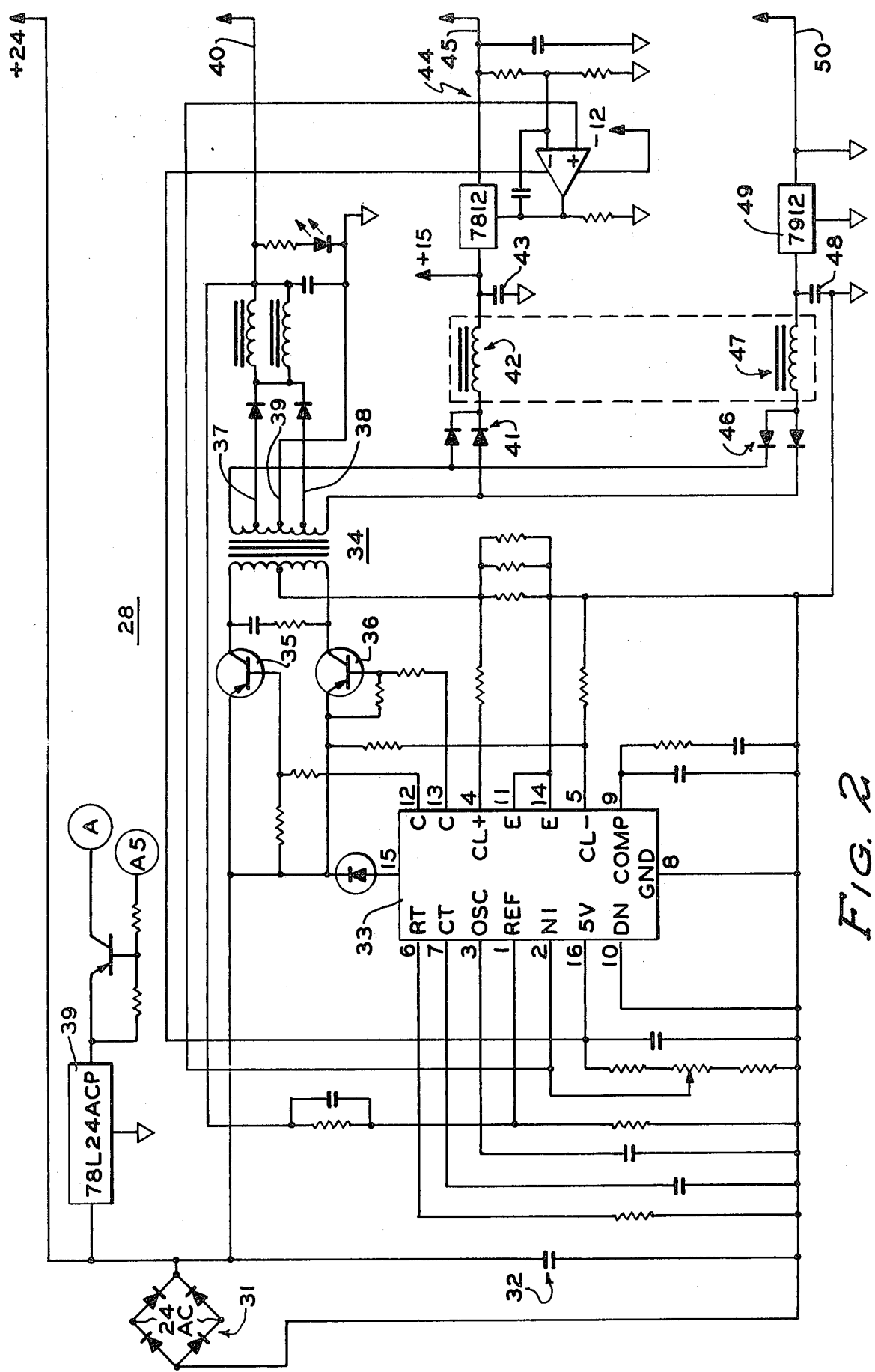
FIG. 2 shows the power supply which is used for providing the power to the various circuits shown in the drawings.

FIG. 2 shows power supply 28 in more detail. A 24 volt alternating current source is full wave rectified by bridge 31 and smoothed by capacitor 32 for supplying unfiltered 24 volt DC to the rest of power supply 28. The heart of power supply 28 is pulse width modulation chip 33 the pins of which are shown as connected. The output from pulse width modulator 33 is used for controlling the primary of transformer 34 through transistors 35 and 36. Taps 37 and 38 together with ground tap 39 are rectified and supplied through choke coils for supplying output 40 thereof. For example, these taps may be chosen so that output 40 provides a 5 volt output for use by the data gathering panel. One extreme end of the secondary of transformer 34 is rectified in a forward direction by diodes 41, smoothed by choke coil 42 and capacitor 43, and regulated by regulator 44 for supplying output 45 which may, for example, be a positive 12 volt output. Likewise, the other extreme end of the secondary of transformer 34 is rectified in a reverse direction by diodes 46, smoothed by choke coil 47 and capacitor 48, regulated by regulator 49 and supplied to output 50 which may be a negative 12 volt line, for example. The unfiltered direct current 24 volt signal is also regulated at 39 for supplying terminal A with a regulated 24 volt d.c. signal. Terminal A is connected to PROM 112 (FIG. 3F) of memory 18 for use in reconfiguring the data file and programs stored therein.

Figure 3A:
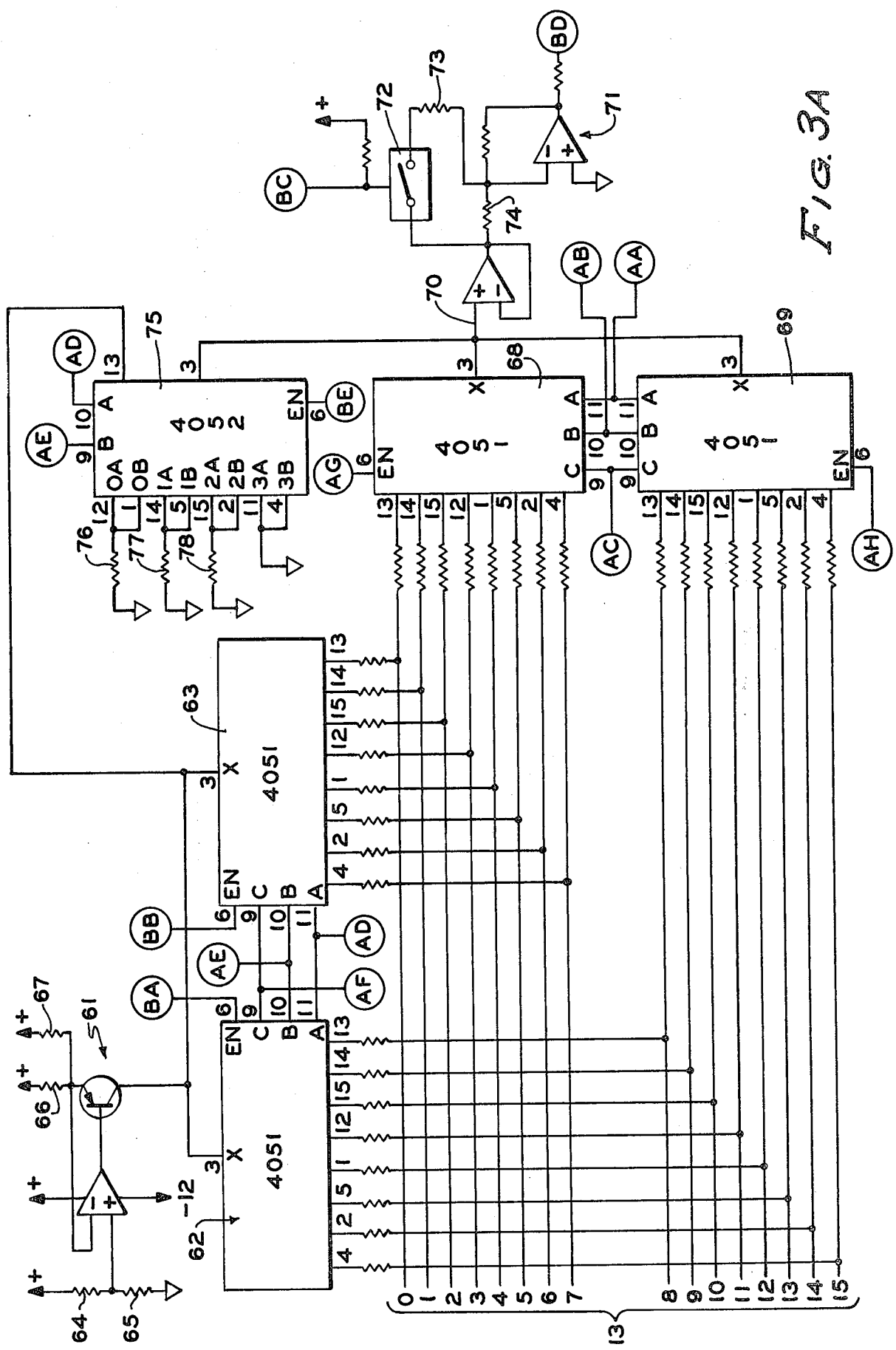
FIGS. 3A–3K show the details of the data gathering panel shown in block form in FIG. 1; and, FIG. 4 is a timing diagram of the signals used for hex slope converting an analog value into a digital value.

FIGS. 3A-3K show the details of the blocks shown in FIG. 1. The circled terminals show the interconnections between the blocks shown in FIG. 1 and the straight line terminals show the inputs and outputs to the various portions of the control circuitry of the data gathering panel. As shown in FIG. 3A, inputs 13 may, for example, total 16 in number and can receive current from constant current source 61 through multiplexers 62 and 63 depending upon the type of sensor. Current source 61 is used when passive sensors, such as resistance temperature devices, are used. If resistance-to-period, source voltage or source current sensors are provided, then constant current source 61 is not used. The current supplied by constant current source 61 is determined by resistors 64, 65 and 66. Resistor 67 may be provided as an option for supplying two different current levels.

Multiplexers 68 and 69 select which input sensor is to be connected to output line 70. Output line 70 is then connected through inverting buffer 71 to output terminal BD. This inverting buffer is a high input impedance voltage follower cascaded with an inverter. The inverter will scale the input signal depending upon whether the selected sensor supplies an input signal which is less than 1 volt. Thus, if the input signal on output 70 is to be less than 1 volt, switch 72 is closed to parallel resistor 73 with resistor 74 for multiplying the signal on output 70 by 10 to raise the signal to at least 1 volt. If the signal at output 70 is to be above 1 volt, switch 72 remains open and resistor 73 is omitted from the circuit. Thus, the signal at terminal BD is transformed into a low impedance scaled replica of the input signal.

Figure 3B:
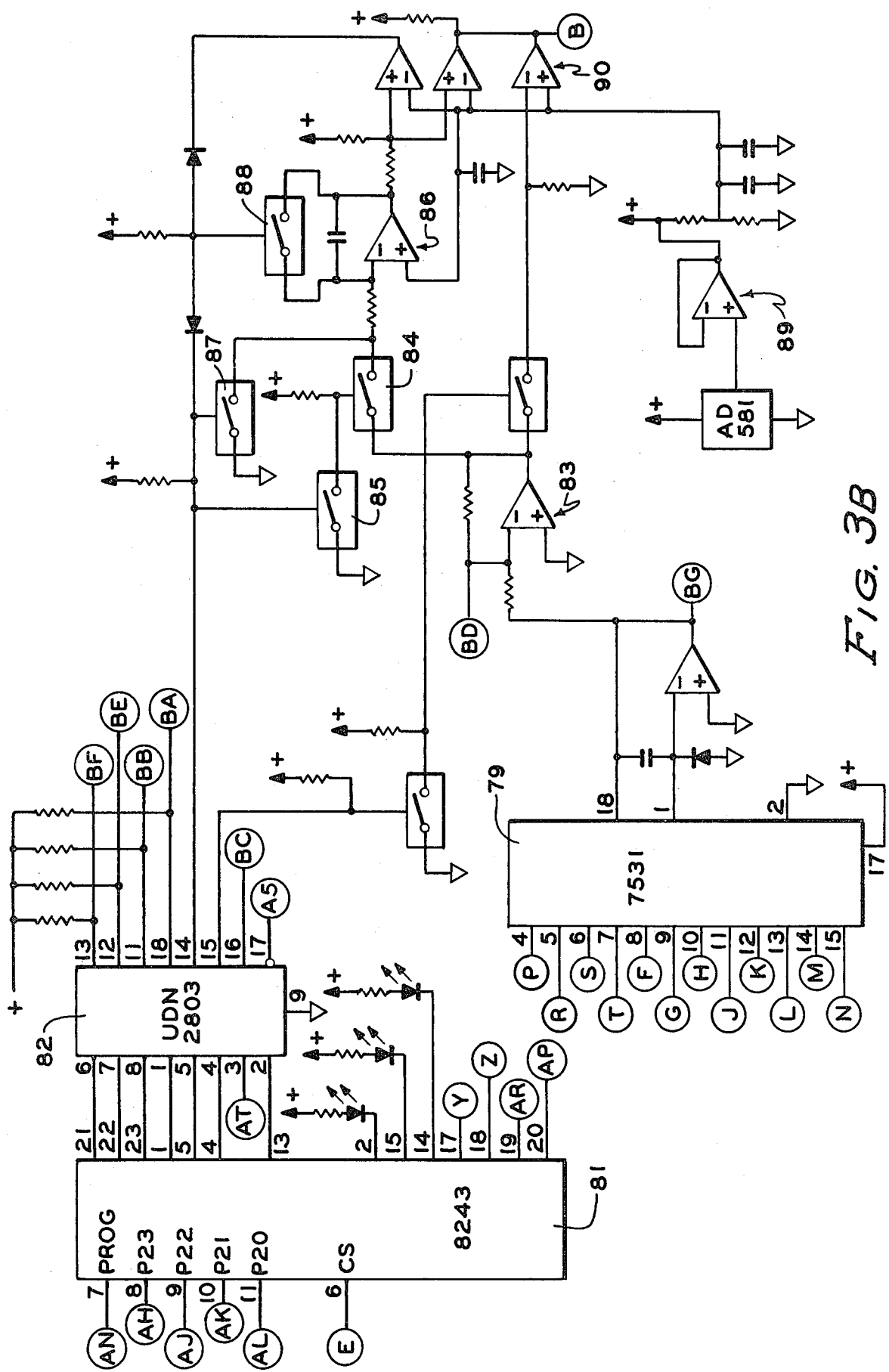

Moreover, as discussed above, if the sensor selected by multiplexers 68 and 69 supplies a signal which is less than 5.5 volts, a constant voltage must be added to the analog value to raise it to a value which is useful by the converter. If the sensor type which is being measured is a resistance sensor, then multiplexer 75 shown in FIG. 3A is used to steer current from constant current source 61 through resistor 76, 77 or 78 and to apply the resulting voltage to output 70. One resistor is selected for a base value and a second for a range value for each resistive sensor measurement. The digital-to-analog converter 79 shown in FIG. 3B is used to add a fixed voltage to the input, range and base voltages to insure that all values at BD are greater than 5.5 volts.

If the sensor is a current or a voltage sensor, then digital-to-analog converter 79 is used to provide base and range values of voltage at BD. The base voltage is added to the analog value as scaled to raise the voltage at BD to 5.5 volts mimimum. This signal at BD is then processed by the conversion circuitry for charging an integrator over a preset amount of time and discharging it to a preset level. The amount of time it takes to discharge the integrator to the preset level is then measured and is used as an indication of the analog value of the analog input signal at terminal BD.

Next, the base signal alone is applied by either multiplexer 75 or D/A converter 79 to the integrator and the process is repeated to derive a digital representation of the amount of time it takes to discharge the integrator from a level indicative of the base value to the reference voltage. Finally, the range or upper limit of the signal which may be expected from the type of sensor which is being connected to the integrator is applied to the integrator by either multiplexer 75 or D/A converter 79 and the process is again repeated deriving a digital representation of the amount of time required to discharge the integrator from a level representative of the range value to the reference voltage.

The control of the analog-to-digital conversion process is performed by port expander 81 and voltage driver 82. Port expander 81 has essentially four inputs at pins 8-11 which are time shared. These four inputs select the outputs over which command signals are given. They are also used to accomplish a plurality of commands. For example, they may transfer the output from port expander 81 to the microcomputer, they may control the transfer from the microcomputer to the output of the port expander, or they may transfer information from the microcomputer to the output of the port expander and change only one bit thereof by an AND operation or by an OR operation.

During the conversion process, the microcomputer using port expander 81 and voltage driver 82 will control switch 72 for scaling the analog value of the analog signal from the sensor which is connected through mux 68-69. The analog value is then amplified at 83 and connected through input switch 84, under control of control switch 85, to the input of integrator 86. At the same time that input switch 84 is closed, ground switch 87 and discharge switch 88 are opened. Thus, the input to the integrator received from amplifier 83 is charged for a fixed amount of time. The timer within the microcomputer is used to generate this delay. After this delay, the control line from pin 14 of driver 82 is switched high causing switch 85 to close, switch 84 to open and switch 87 to close. The timer within the 8155 RAM 113 shown in FIG. 3F then counts the time to discharge the integrator to the reference voltage level. This time is then a digital representation. Once the reference voltage level has been reached, switch 88 is closed to finally discharge the capacitor of integrator 86 so that the capacitor will always begin charging at a predetermined point. The reference voltage is supplied by circuit 89 shown in FIG. 3B. The output from the comparator section 90 of the integrator shown in FIG. 3B is connected over terminal B to an input of the microcomputer.

Next, under control of the microcomputer, the base value is supplied by D/A converter 79 in the case of a voltage or current input or by multiplexer 75 in the case of a resistance input and integrated, and finally the range value is supplied by either D/A converter 79 or multiplexer 75 and is integrated. Then the hex slope conversion process is performed as described above.

Finally enable terminals BA and BB of FIG. 3A for input multiplexers 62 and 63 are derived from voltage driver 82 shown in FIG. 3B.

Figure 3C:
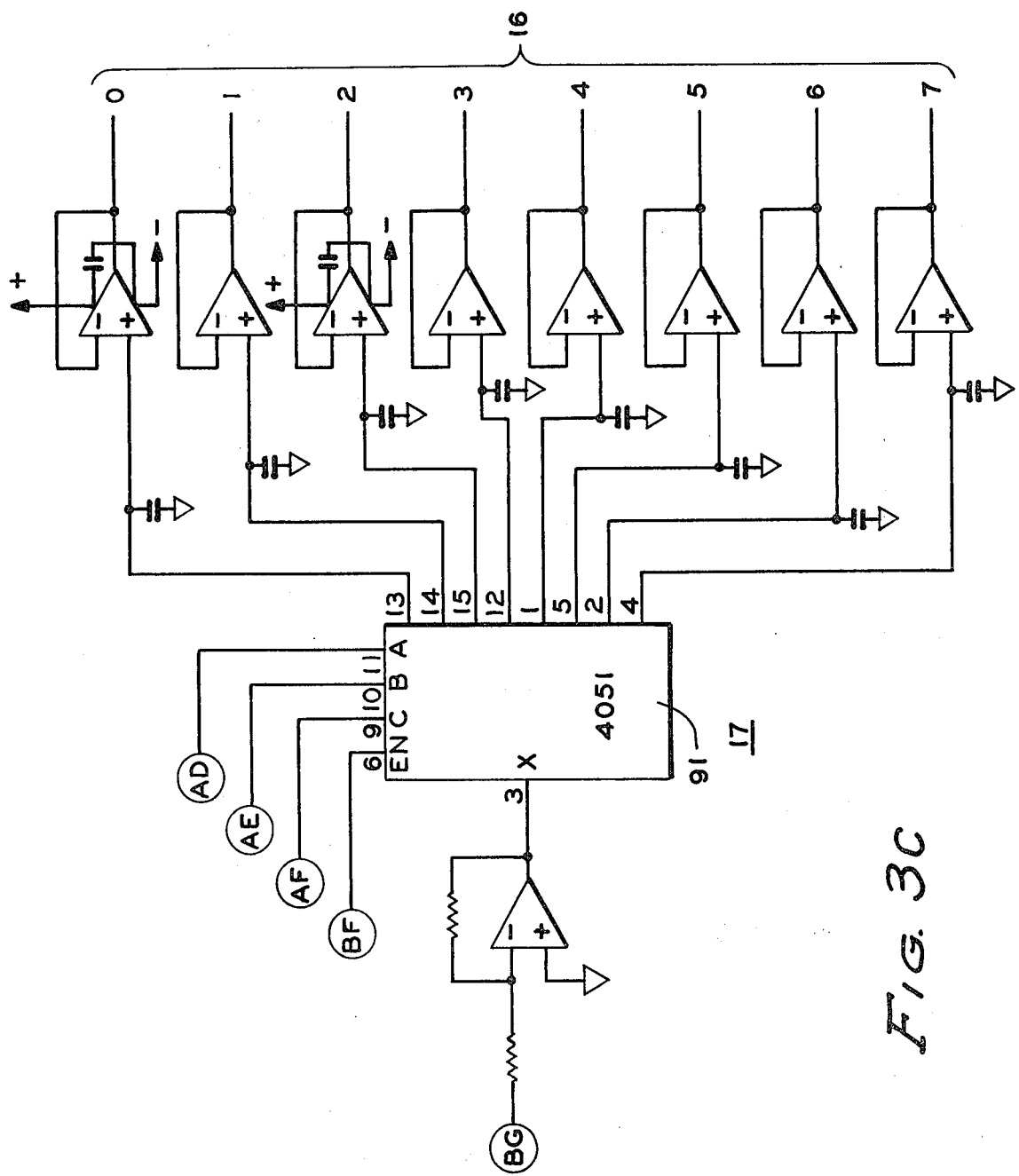

FIG. 3C shows the analog output 17 and output lines 16. As can be seen, up to 8 analog outputs, for example, may be provided and are controlled through multiplexer 91 by the microcomputer 11 and analog control logic 12. As can be seen from FIG. 3C, the analog outputs are sample and hold voltage follower outputs that are individually programmable for offset and range. Specifically, the digital-to-analog converter 79 of FIG. 3B is connected through terminal BG to the input of multiplexer 91. This digital-to-analog converter can be used then to program the offset and range for each analog output 16. The processor continually cycles through each analog output to refresh the charged capacitor. The voltage follower and multiplexer 91 arrangement provides super high impedance paths in the off state keeping the voltage ripple of the voltage follower output to a minimum.

Figure 3D:
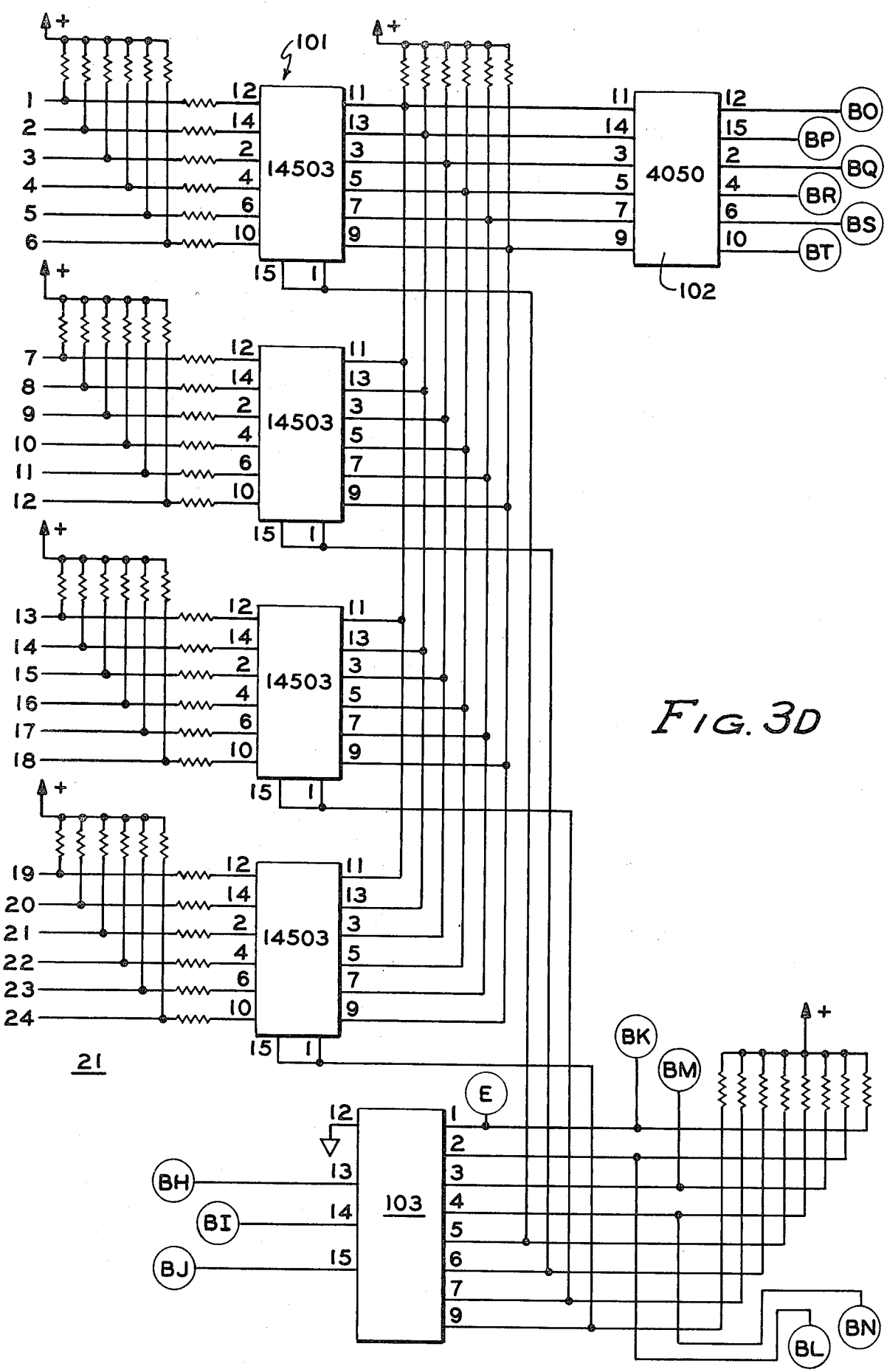

Digital inputs 21 are shown in FIG. 3D and may total, for example, 24. These input lines are connected to pull-up resistors as shown and are also connected through series limiting resistors to the inputs of four buffer circuits 101. Each digital input may be programmed as normally open or normally closed by an appropriate data file entry into memory 18. Digital inputs are read each time a poll is received. Demands, repeats, etc., do not affect the buffer status of digital inputs. The outputs of these buffers are likewise connected through pull-up resistors to the inputs of level converter 102 the outputs of which are connected directly to the microcomputer. The control of the buffers 101 is under control of decoder 103 which decodes three outputs from the microcomputer to control its various output lines for selectively enabling buffers 101 as well as RAM 113, a universal asynchronous receiver transmitter 114 and digital output port expanders 106, 109 all of which are to be discussed hereinafter.

Figure 3E:
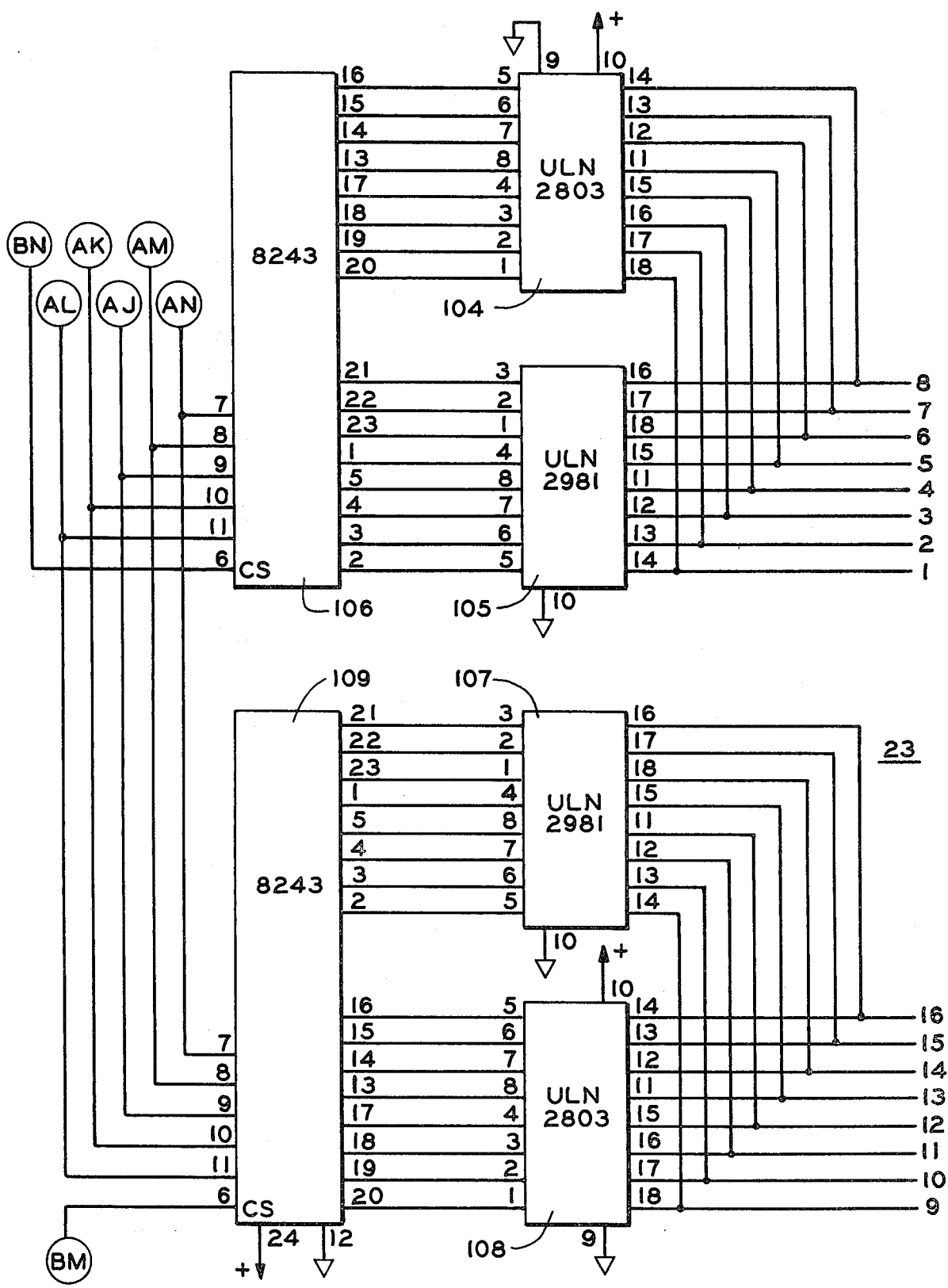

The first eight digital output lines of digital outputs 23 as shown in FIG. 3E are connected as outputs from voltage drivers 104 and 105 from the outputs of port expander 106 under control of the microcomputer. The last eight output lines are connected as outputs from voltage drivers 107 and 108 from the outputs of port expander 109 under control of the microcomputer. Each output can be configured individually to drive high to a predetermined voltage, low to a reference voltage such as ground, turn off or pulse high or low. Various pulse periods may also be chosen.

Figure 3F:
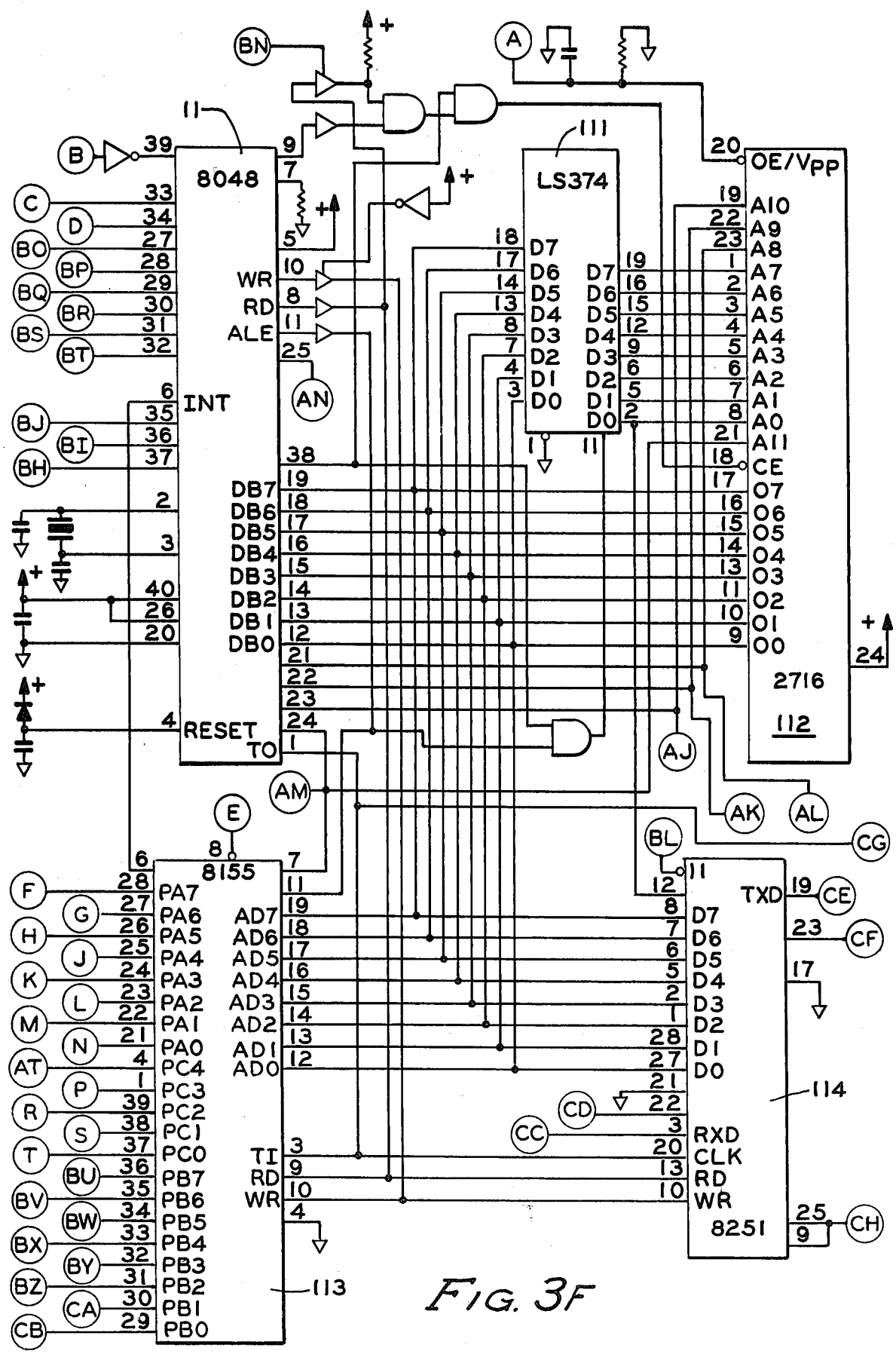

In FIG. 3F, microcomputer 11 is shown connected to the various control and input/output circuitry shown in the other figures of the drawing. For example, input terminal B is derived from the output of the conversion circuitry shown in FIG. 3B. Input terminals C and D come from FIG. 3J which shows input lines which may be connected to sensors. The pulse 1 and pulse 2 input lines may be programmed as totalizer or run time inputs in the same fashion as the digital inputs. Inputs BO–BT are taken from level converter 102 associated with the digital inputs shown in FIG. 3D. Outputs BJ, BI and BH control decoder 103 shown in FIG. 3D so that level converter 102 may time share the outputs from buffers 101. Data output lines DB0–DB7 are connected to corresponding inputs of latch 111, from corresponding outputs of ERROM 112, to address lines AD0–AD7 of random access memory (RAM) 113 and to input/output lines D0–D7 of universal asynchronous receiver transmitter (transceiver) 114. As shown, EPROM 112 is also connected to terminal A from the power supply for the supply of regulated 24 volts thereto. Latch 111 interfaces the data bus of microcomputer 11 to the address inputs of EPROM 112.

RAM 113 is enabled by an output from decoder 103 at terminal E. Outputs F–T from RAM 113 under control of microcomputer 11 are used to provide the digital inputs to digital-to-analog converter 79 shown in FIG. 3B. Moreover, RAM 113 under control of microcomputer 11 reads inputs BU–CB also shown in FIG. 3H. These terminals are connected to switch bank 116 and through series resistors 117 to a source of voltage. Switches 116 may be operated to define the address of data gathering panel 10. These switches are read on each power up so that the data gathering panel will know its own address. Furthermore, these outputs from RAM 113 are connected through voltage driver 118 to various terminals for control purposes. It will be seen, for example, that the control of the input multiplexers 62 and 63 of FIG. 3A is under control of terminals AD, AE and AF. Moreover, the control of reference mux 75 is under control of terminals AD and AE. The outut multiplexers 68 and 69 of FIG. 3A are under control of terminals AA–AC. In addition, terminal AG is used to enable output mux 68 and terminal AH is used to enable output mux 69. Terminals AD, AE and AF are used for controlling output analog multiplexer 91 shown in FIG. 3C. RAM 113 also provides an output over its pin 6, a timer out signal, for interrupting microcomputer 11.

EPROM 112 of data gathering panel 10 is used to hold a variable portion of the program depending on the PROM configuration used and to hold the variable data file. Also, each hardware block (digital outputs, digital inputs, analog inputs, analog outputs, as well as custom firmware options such as totalizer, run time and interpolation tables useful when sensors are non-linear) may be customized for the selected input sensors and output control hardware by individual data files programmed in the PROM. The particular EPROM chosen for this application is a UV erasable device. Individual program data files can be "erased" by zeroing out the first location of the data file and resetting the data gathering panel. As such, individual point definition can be arbitrarily changed (erased and reprogrammed) for as many times as there is space in the data file area.

PROM programming can be done from a remote station through the transmission bus. A program message is sent to data gathering panel 10 specifying the quadrant (256 byte multiple), address (address within 256 bytes) and data to be programmed in that byte. The PROM programmer then controls the actual manipulation of the data and storage in the address storage location. This routine then implements the timing diagram shown in FIG. 3K to program the specified location. After the programming is complete, the PROM location programmed is read through the normal data file reading technique. It is to be noted that all instructions executed during the programming must reside in microcomputer 11 or else the OE pin of PROM 112 will not be steady. In order to facilitate the reconfiguration of the data file and program stored in PROM 112, it is connected through terminal A to a regulated 24 volt source.

The heart of the transmission mechanism for data gathering panel 10 is the universal asynchronous receiver transmitter 114 shown in FIG. 3F. This transceiver receives serial data over input terminal CC from the receiving network shown in FIG. 3G. Transceiver 114 converts the serial data into parallel information on its output lines D0–D7 for supply to microcomputer 11.

Figure 3G:
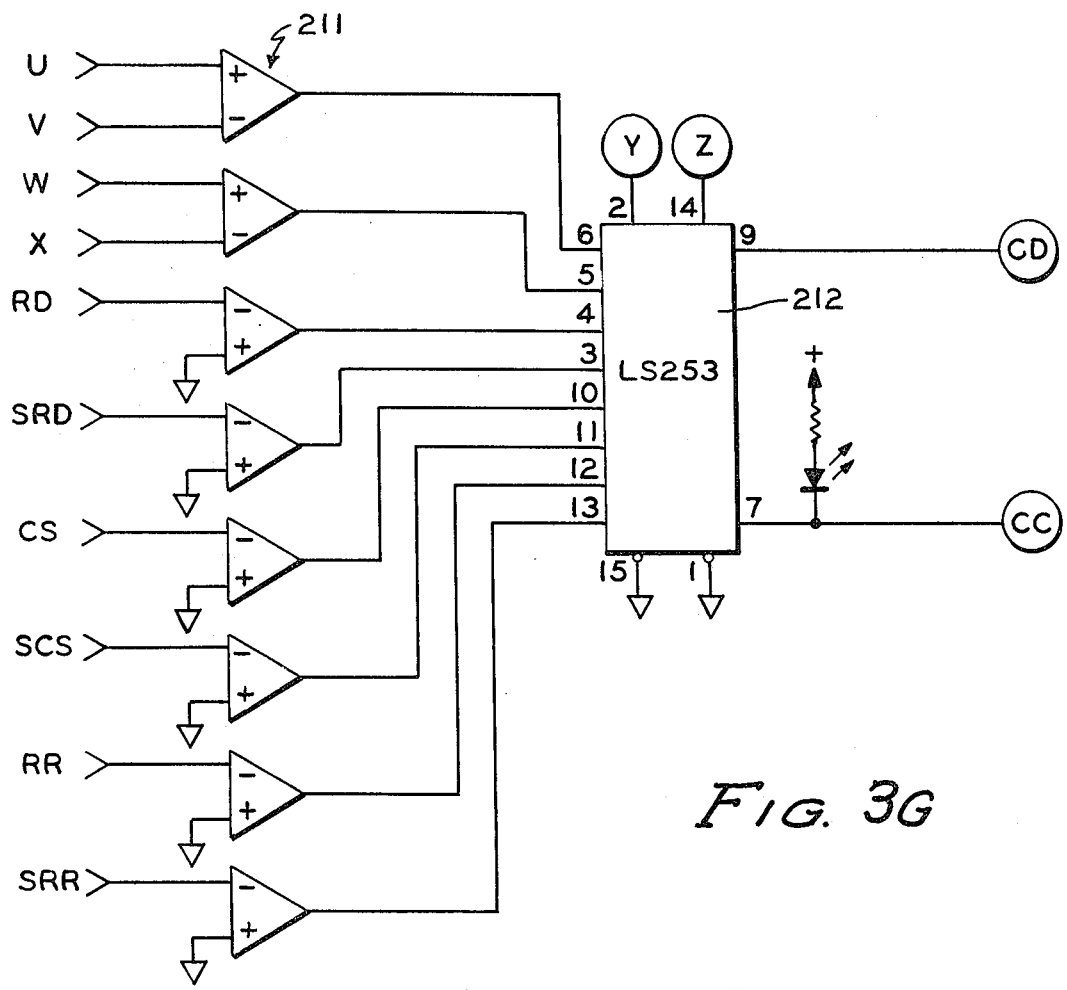
Figure 3H:
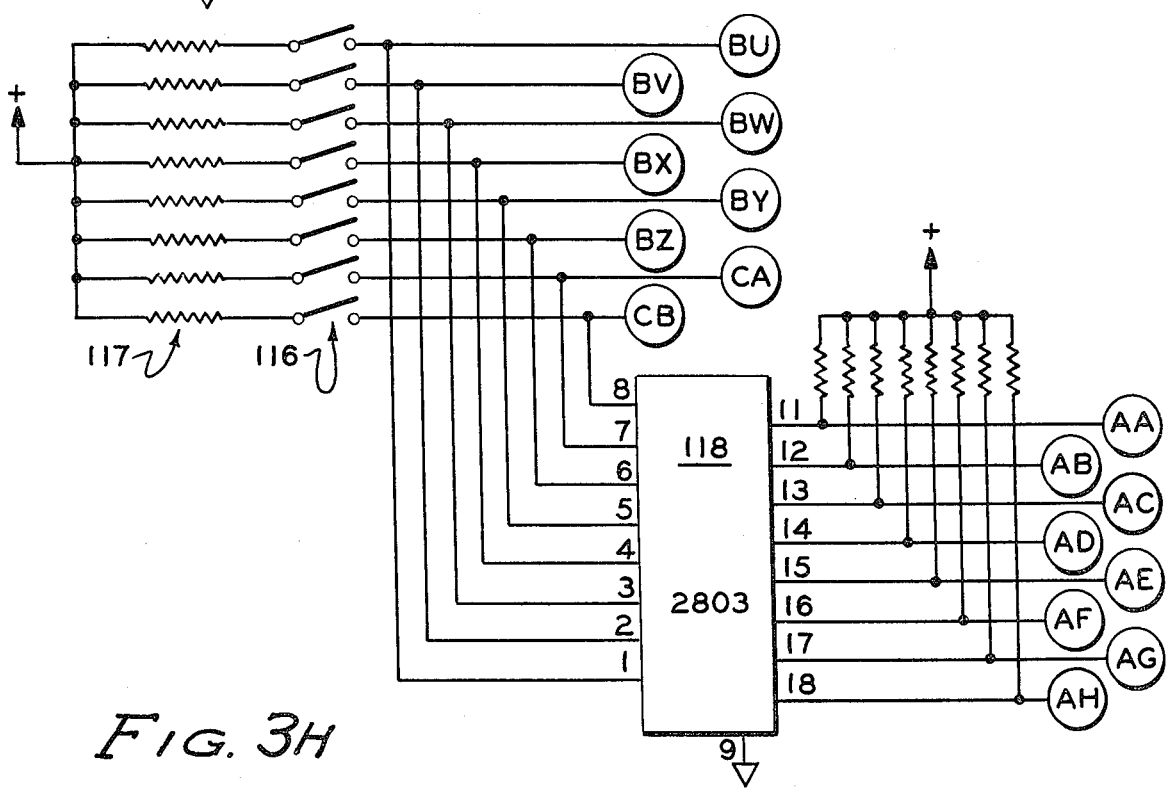

A flexible transmission hardware configuration is provided on data gathering panel 10 that allows receiving and sending data on four send and four receive channels. One channel is used for sending and another for receiving at any given time. The data gathering panel 10 has a flexible transmission interface that supports three distinct transmission interfaces which include an RS422 transmission system which is a 5 volt differential line driver/receiver, an RS232/RS449 point-to-point modem and a 600 baud tone modem. The bottom two switches of switchbank 116 shown in FIG. 3H are used to select the particular option or hybrid of these options. The RS422 interface is a balanced differential voltage signalling method. Up to eight data gathering panels can reside on a RS422 line with multipoint signalling being transmitted over one twisted pair of wires per channel. Channel signalling rate is 2400 baud nominally but can be jumpered to 9600, 2400 or 1200 baud using the jumper terminal set 201 shown in FIG. 3I, with the 300 jumper terminals translating to 1200 baud, the 600 terminals translating to 2400 baud, the 1200 terminals translating to 4800 baud and the 9600 terminals translating to 9600 baud.

The RS232/RS449 interface is used to communicate to 600 baud and customer provided modems. As shown in FIG. 3G, the RD terminal is the receive data terminal, the SRD terminal is the secondary receive data terminal, the CS terminal is the clear to send terminal, the SCS is the secondary clear to send terminal, the RR terminal is the receiver ready terminal, and the SRR is the secondary receiver ready terminal. Likewise, in the transmitter portion (FIG. 3I), the SD terminal is the send data terminal, the SSD terminal is the secondary send data terminal, the RS terminal is the request to send terminal and the SRS terminal is the secondary request to send terminal. When the RS232 interface is used, the 300 jumper terminals stand for 300 baud, the 600 jumper terminals stand for 600 baud, the 1200 jumper terminals stand for 1200 baud and the 9600 jumper terminals stand for 2400 baud. Since the jumper terminals 201 stand for different baud rates depending on the interface selected, it is these jumper terminals together with the bottom two switches of switch bank 116 which will determine the actual baud rate.

Figure 3I:
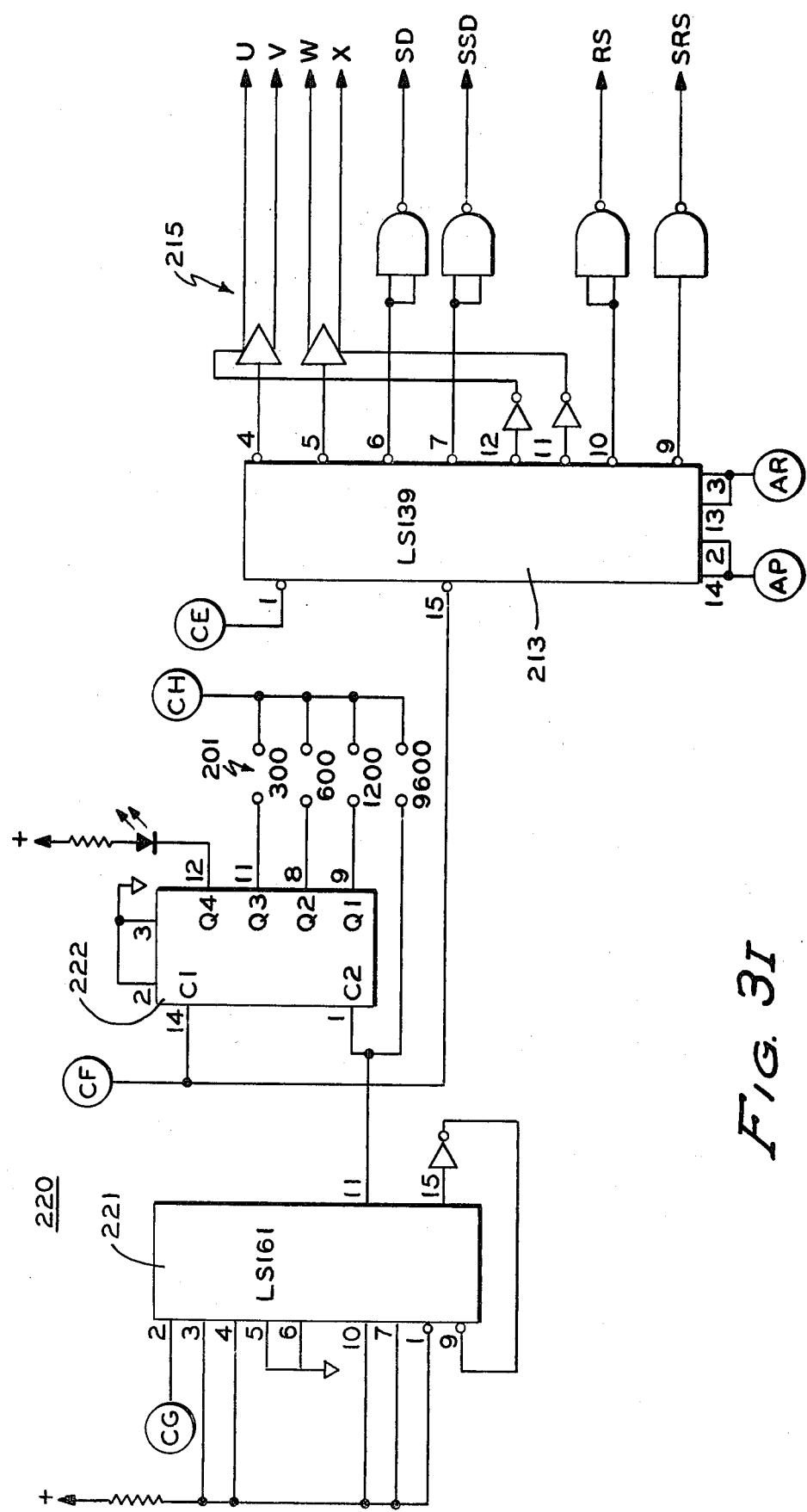
Figure 3K:
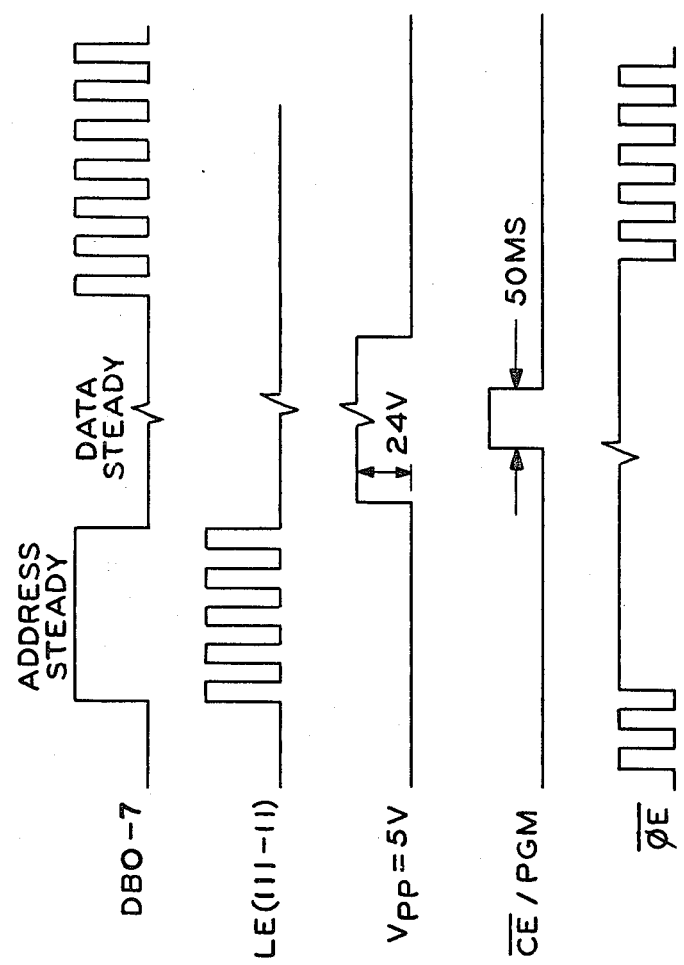
Figure 3J:
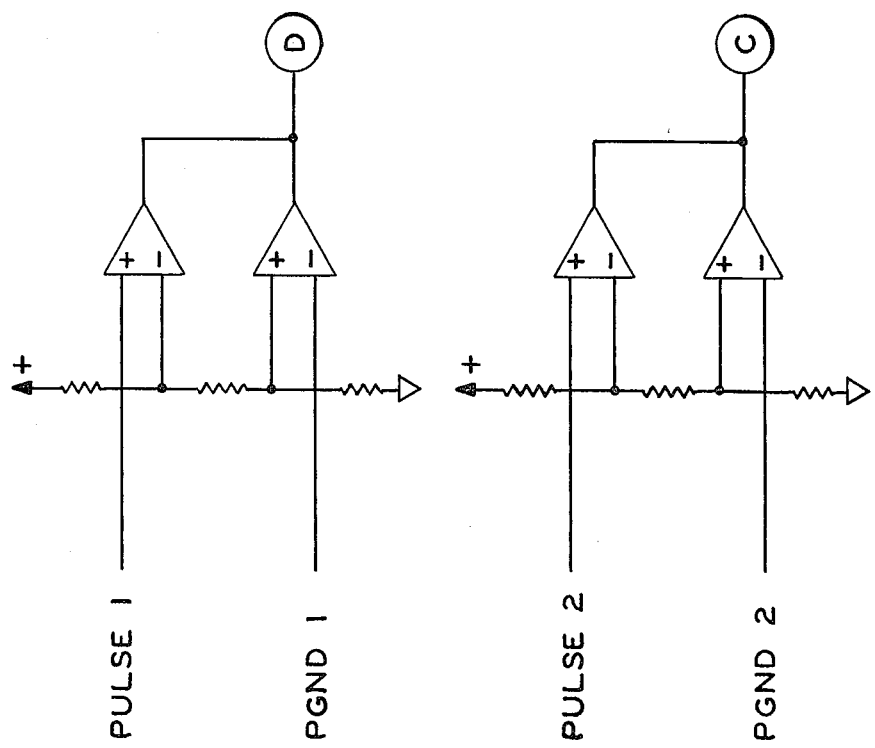

As shown in FIG. 3G, the four channels to which data gathering panel 10 may be connected are represented by the letters U and V, W and X, RD, and SRD. This is also shown in FIG. 3I for outgoing data. The remaining lines shown in FIG. 3G are the control lines from the modem interface. In the case of the RS422 interface, only U and V or W and X are used for the transmission of data. In the case of the RS232 interface, data is received on RD or SRD and transmitted via SD or SSD to and from modems. The RR, SRR, CS, SCS, RS and SRS terminals are used to control the modems. Control terminals from the modems and the four input channels are connected to line receivers 211 and then through multiplexer 212 to transceiver 114 shown in FIG. 3F for connection to microcomputer 11. On the transmission side, the data is supplied from the microcomputer to transceiver 114 which then supplies the data through multiplexer 213 and then through drivers 215 to the output channels and control lines. The control terminals Y and Z of multiplexer 212 in FIG. 3G are derived from corresponding outputs of port expander 81 shown in FIG. 3B. The control lines AP and AR of multiplexer 213 shown in FIG. 3I are also derived from port expander 81. The enable terminal CE of multiplexer 213 is derived from transceiver 114 as is the enable terminal CF of counter 222.

As discussed above, jumper terminals 201 determine the receive and transmit baud rate for data gathering panel 10. These jumpers act in conjunction with bit rate timer 220 for controlling this baud rate. Bit rate timer 220 is comprised of four bit binary counter 221 which receives a clock signal from the output clock signal at pin 1 for microcomputer 11. The output of counter 221 is fed through a further counter 222 for providing the receive and transmit clock signal to transceiver 114 over terminal CH.

The software for accomplishing the hex slope conversion and for allowing the programming and reconfiguration of memory 18 is attached as the Appendix hereto.

```
LOC   OBJ           LINE        SOURCE STATEMENT

1  ;
                     2  $TITLE('540-FIRMWARE REV.G DATED FEB 04, 1981 .BR, .')
                     3  ;************************************************************
                     4  ;*
                     5  ;*    540 DGP REV G, WITH 4K O.S. AND 1K BYTES OF DATA FILES
                     6  ;*    UNUSED LOCATIONS IN PROMS ARE FILLED WITH FF CODE
                     7  ;*
                     8  ;************************************************************
                     9  ;     REV.E REVISED TO MAKE LOGIC CORRECTIONS IN
                    10  ;     THE PROM-BURNING FUNCTION DATED JULY 16,80
                    11  ;REV.F: CLASS-B SWITCH SELECTION, LOGIC CHANGED
                    12  ;      IF CLASS-B SELECTED, LINE SWITCH IS DISABLED
                    13  ;      ADDRESS IS LIMITED FROM GRP 1 THRU 15
                    14  ;      ADDX, LINESW ROUTINES REVISED ON AUG.12,80
                    15  ;      SWITCH ZS1 BIT8=1 MEANS CLASS-A; BIT8=0 IS CLASS-B
                    16  ;      540 REPEATER LOGIC ADDED. 9-05-80
                    17  ;      AFTER THE PROM BURN, DISABLE ALL THE ACTIVITIES
                    18  ;REV. D, 10-14-80. THIS IS DONE BY SETTING A BEA FLAG
                    19  ;      IN R5 BIT6, CALLED PROM-BURN FLAG.ALL THE EXEC. ACTIVITIES
                    20  ;      BUT THE TSMN TASK , BIT0, ARE DISABLED. ALSO NO COS ARE
                    21  ;      PROCESSED AFTER RECEIVING AN I'M OK, INSTEAD RESPOND WITH
                    22  ;      AN I'M OK. EVERY THING ELSE WOULD FUNCTION NORMALLY.
                    23  ;      CHECK FOR VALID CONTROL BYTE ,GROUP ADDRESS, AND VALID
                    24  ;      LENGTH OF MESSGE LOGIC ADDED AS PART OF REC LOGIC.
                    25  ;REV.OCT.16    DELAY BETN. XMSN OF BYTES IS 4 MS. THIS IS
                    26  ;      DONE TO AVOID TEMPORARILY ANY OVER-RUN ERRORS
                    27  ;REV.NOV.05    REPEATER LOGIC CORRECTION IMPLEMENTED.
                    28  ;REV.DEC.04    560-540 NO RESPONSE AND ERROR PROBLEM RESOLVED.
                    29  ;      FOR RS-422 TRANSMISSION, 540 STRAPPING WILL
                    30  ;      BE FIXED AT 2400 BAUD. THIS ENABLED EIATF BOARD
                    31  ;      SOFTWARE DELAYS TO BE ELIMINATED.
                    32  ;      ALSO THE 422 LINES ARE CONDITIONED TO SEND MESSAGE
                    33  ;      IF THE TRANSMISSION IS FOR THIS REMOTE FOR 4.5 MS.
                    34  ;      BEFORE THE MESSAGE IS ACTUALLY TRANSMITTED, THIS IS ALSO
                    35  ;      REQUIRED FOR EIA BOARD TO TURN AROUND TO RECEIVE
                    36  ;      THE 540-RESPONSE.
                    37  ;      THE NET THROUGHPUT TO REMAIN THE SAME AS
                    38  ;      BEFORE, AND FREE UP A LOT OF PROCESS TIME IN
                    39  ;      THE 8085A PROCESSOR ON THE EIATF BOARD.
                    40  ;
                    41  ;
                    42  ;NOTE: 9600 AND 4800 BAUDS NOW READ AS 2400 BAUD IN THE COMMENTS.
                    43  ;
                    44  ;REV G: JAN 6, 81.  ENABLED FS20 LOGIC. CORRECTIONS AND ADDITIONS ALSO MADE.
                    45  ;                   CHANGED D/A OFFSET FOR "RRR"=100 TO 2.1V FOR EACH INTEGRATION.
                    46  ;REV G: JAN 19, 1981. CHANGED FS20 LOGIC SO THAT THE DATA FROM THE FS MODULES
                    47  ;      HAS A "HOME" IN THE "DIGST" AREA.  THE DIGITAL INPUT MASK IS
```

```
LOC  OBJ       LINE        SOURCE STATEMENT

48 ;
            49 ;                    MODIFIED SO THAT BYTE 5 CONTAINS THE NUMBER OF FS20 MODULES
            50 ;                    CONNECTED AND THE ID NUMBER ASSIGNED TO THE FIRST POINT.
            51 ;                    THAT ID NUMBER IS CHOSEN TO BE SUCH THAT THE FIRST FS20 DATA
            52 ;                    POINT FALLS INTO THE FIRST POSITION OF A NEW DATA BYTE IN THE
            53 ;REV G: JAN 22, 1981. CHANGED "XXX"=100 OFFSET TO 2.5V.
            54 ;                    DATA STREAM.
            55 ;REV G: JAN 26, 1981. RELOCATED COSFM ROUTINE, ADDED CODE TO DETERMINE
            56 ;                    CONDITION OF FS20 MODULES WITHOUT CLEARING COS.
            57 ;FEB.04,81:          ANALOG CONVERSION PROCESS HAS A TIMING PROBLEM WHEN
            58 ;                    INT AND T1 INTERRUPTS OCCURED AT THE SAME TIME DURING
            59 ;                    THE OVERFLOW CHECK OF THE TIMER IN POLLING MODE. THIS
            60 ;                    IS DUE TO THE FACT BOTH THE TIMERS ARE ASYNCHRONOUS AND
            61 ;                    IT IS POSSIBLE TO1 MISS AN OVERFLOW COUNT RESULTING IN
            62 ;                    "HOLES" IN THE FINAL HEX READINGS. THIS HAS BEEN
            63 ;                    RECTIFIED ,AS AFIRMWARE SOLUTION, IN THIS REVISION.
            64 ;                    THIS CONSISTS OF MAKING A CHECK OF THE TIMER VALUES
            65 ;                    WITH PROCESS TIME CALCULATIONS AND BY MAKING INT SIGNAL
            66 ;                    PROCESSED UNDER INTERRUPT CONTROL AND TOTALLY ELIMINATING
            67 ;                    THE POLLING ROUTINES DURING DS3 PHASE OF DUAL SLOPE
            68 ;                    INTEGRATION. THERE IS STILL SOME CHANCES OF SMALL ERRORS
            69 ;                    IN THIS APPROACH,BUT AVOIDS ANY BIG HOLES IN THE RANGE
            70 ;                    OF MEASUREMENT; ABOVE ALL NO HARDWARE SW0 REQUIRED.
            71 ;                    THIS BEING CHANGE IN THE INT PROCESSES,THE CODE HAS
            72 ;                    TO RESIDE IN MEMORY BANK 0 ONLY.
            73 ;
            74 ;*********************************************************
            75 ;
            76 ;          Z-20      8748-PROM PART# 14504295-004
            77 ;
            78 ;          Z-18      2732-PROM PART #14504296-004
            79 ;
            80 ;*********************************************************
            81 $EJECT
            82 ;
            83 ;          THE FOLLOWING SECTION DEALS WITH A PROCEDURE TO MAKE ANY
            84 ;          CHANGES TO 540 SOURCE CODE, CHECK OUT AFTER ANY LOGIC CHANGES,
            85 ;          MAKING MASTER EPROMS, AND UPDATING THE CONTROL DOCUMENTATION
            86 ;
            87 ;1.TO MAKE CHANGES IN THE SOURCE CODE:
            88 ;          THE FOLLOWING EQUIPMENT IS NEEDED: INTEL'S MDS SYYTEM MODEL 230
            89 ;          OR EUQIVALENT, LATEST 540.SRC DISK, ASM48 SYSTEM DISK
            90 ;          USING THE CREDIT FACILITY OF INTEL, LOAD THE 540.SRC INTO THE MDS,
            91 ;          UPDATE THE REVISION LETTER, DATE CODE AND DESCRIBE THE CHANGE TO BE
            92 ;          MADE AND PROVIDE THE P-CODE WHEREEVER THE CHANGES ARE MADE.
            93 ;          TO ASSEMBLE THE ABOVE CODE USE A SEPARATE DISK TO STORE THE 540.LST.
            94 ;          COPY THE EDITED 540.SRC ONTO THE 540 SYSTEM DISK
            95 ;          START THE ASSEMBLY BY ISSUING THE COMMAND
```

| LOC | OBJ | LINE | SOURCE STATEMENT |
|---|---|---|---|
| | | 96 ; | "ASM48 540.SRC DEBUG XREF PRINT(:F1:540.LST)" |
| | | 97 ; | WHEN THE ASSEMBLY IS COMPLETE THE 540.HEX WOULD END UP ON THE |
| | | 98 ; | SYSTEM DISK AND THE 540.LST ON THE DRIVE 1 DISK |
| | | 99 ; | |
| | | 100 ;2. | CHECK OUT AFTER AN ASSEMBLY |
| | | 101 ; | EFFORT SHOULD BE MADE TO CHECK OUT ALL THE 540 FUNCTIONS |
| | | 102 ; | TO EXERCISE THE ENTIRE CODE. AS A MINIMUM THE FOLLOWING |
| | | 103 ; | FUNCTIONS SHOULD BE CHECKED OUT: |
| | | 104 ; | NEW EPROMS SHOULD BE BURNT. DATA FILE PROGRAMMED TO CONTAIN |
| | | 105 ; | ALL TYPES OF DATA FILES. |
| | | 106 ; | CHECK OUT ALL ANALOG TYPE INPUTS,OUTPUTS,DIGITAL INPUTS |
| | | 107 ; | DIGITAL OUTPUTS, PULSE TYPE INPUTS,THRESHOLD INPUTS ETC. |
| | | 108 ; | CHECK OUT TRANSMISSION TYPES RS-422, RS-232 MODEM AND 600 |
| | | 109 ; | BAUD TONE AND REPEATER INTERFACES. |
| | | 110 ; | |
| | | 111 ;3. | PROCEDURE TO BURN EPROMS. |
| | | 112 ; | WE NEED AN INTEL'S UNIVERSAL PROM PROGRAMMER, BLANK EPROMS-- |
| | | 113 ; | 8748 AND 2732 --,SYSTEM DISK WITH THW LATEST 540.HEX CODE |
| | | 114 ; | LOAD IN THE 540.HEX BY ISSUING THE COMMAND |
| | | 115 ; | "READ HEX FILE 540.HEX INTO 0" |
| | | 116 ; | ENTER THE *TYPE=8748 AND *SOC=1 |
| | | 117 ; | WE ARE NOW READY TO BURN 8748 EPROM.ISSUE THE COMMAND |
| | | 118 ; | AFTER A BLANK EPROM IS PLACED IN THE SOCKET 1 |
| | | 119 ; | "PRO FRO 0 TO 3FFH STA 0" |
| | | 120 ; | MAKE FIVE SUBMASTERS AND TWO MASTER SETS TO RELEASE TO PRODUCTION. |
| | | 121 ; | TO BURN 2732 EPROMS, WE HAVE TO LOAD BLANK CODE INTO THE FIRST |
| | | 122 ; | 1000 LOCATIONS. |
| | | 123 ; | TYPE IN *TYPE=2732 AND *SOC=2 FOR THE 2732 EPROMS. |
| | | 124 ; | PLACE A BLANK 2732 EPROM IN SOCKET 2 AND ISSUE THE COMMAND |
| | | 125 ; | "TRA FRO 0 TO 3F8H" |
| | | 126 ; | THEN ISSUE THE COMMAND "PRO FRO 0 TO OFFFH STA 0". |
| | | 127 ; | MAKE TWO MASTERS AND FIVE SUB-MASTERS. |
| | | 128 ; | LABEL THE EPROMS WITH THE LATEST DASH# AND DATE CODE. |
| | | 129 ; | |
| | | 130 ;4. | UPDATE CONTROL DOCUMENTATION |
| | | 131 ; | UPDATE MASTER CONTROL DOCUMENTATION |
| | | 132 ; | UPDATE THE APPLICABLE ESN IF NECESSARY |
| | | 133 ; | UPDATE THE SOUCE HISTORY DISK |
| | | 134 ; | COPY THE 540.SRC, 540.HEX AND 540.LST FILES |
| | | 135 ; | ONTO A BLANK DISK FOR VAULT |
| | | 136 ; | |
| | | 137 ;************************************************ |
| | | 138 ;################################################ |
| | | 139 ; | |
| | | 140 $EJECT | |
| | | 141 ; TH | 540 DGP |
| | | 142 ; | |
| | | 143 ; | |

```
LOC   OBJ         LINE              SOURCE STATEMENT

144 ;
              145 ;MEMORY MAP (INTERNAL)
              146 ;
              147 ;      MNEUMONIC   BYTE         DEFINITION
              148 ;                               REGISTER BANK 0
              149 ;      R0          0            SCRATCH
              150 ;      R1          1              .
              151 ;      R2          2              .
0003          152 REG3   EQU         3              .
              153 ;      R4          4            TASK REQUEST BUFFER
              154 ;      R5          5            TRANSMISSION MODE
              155 ;      R6          6            WORD COUNT
              156 ;      R7          7
              157 ;      STACK       8-13         6 LEVEL SUBROUTINE STACK
0014          158 ADTMP  EQU         14H          ;ANALOG TEMPORARY STORE
              159 ;
0016          160 ADTMP1 EQU         16H          ;ANALOG TEMPORARY STORE
              161 ;                               REGISTER BANK 1
              162 ;      R0          18           SCRATCH
              163 ;      R1          19
001A          164 REG2   EQU         1AH
              165 ;      R3          1B           MS COUNT FROM TIMER (14 BIT DOWN COUNT)
              166 ;      R4          1C           LS COUNT FROM TIMER (14 BIT DOWN COUNT)
              167 ;      R5          1D           SAVED ACCUMULATOR
              168 ;      R6          1E           SAVED OPEN PORT
              169 ;      R7          1F           INT/ ENTRY PT INTO CONVERSION ROUTINE
              170 ;
              171 ;                               INTERNAL MEMORY
              172 ;
              173 ;
0020          174 ADDRES EQU         20H          ;HARDWARE ADDRESS: BAAAAFTT WHERE A=ADDRESS,
              175 ;                                B=0 IS CLASS-B,AND B=1 CLASS-A
              176 ;                                T=0:  RS422;  1:  RS232
              177 ;                                T=2:  RS422 (A) CLASS-B REPEATER
              178 ;                                T=3:  RS232 (A), RS422 (A) REPEATER
              179 ;                                F=0:  NO FS PANELS;  1:  FS PANELS
              180 ;
              181 ;NOTE* THE REPEATER WILL HAVE THE SAME BAUD RATE AS THE PRIMARY 540
              182 ;     CONNECTED TO THE 560 ,NAMELY 1200 BAUD(MODEMS) OR 600 BAUD TONE.
              183 ;
0021          184 CKSM   EQU         21H          ;CHECKSUM
0022          185 TSMPTR EQU         22H          ;TRANSMISSION BUFFER PTR (CURRENT)
0023          186 TDELAY EQU         23H          ;TRANSMIT DELAY (PER CYCLE WAIT)
0024          187 LINE   EQU         24H          ;LINE SELECT AND PORT SELECT
0025          188 SECOND EQU         25H          ;4 MS CLOCK
0026          189 EIP    EQU         26H          ;EIP STATUS
0027          190 TOTLST EQU         27H          ;TOTALIZER LAST STATUS 1 OR 0
0028          191 TOTINC EQU         28H          ;TOTALIZER INCREMENT FLAG 1=> INCREMENT
```

```
LOC   OBJ       LINE        SOURCE STATEMENT

192 ;
                193 ;##################################################################
                194 ;
0029            195 COSBUF   EQU   29H            ;CHANGE OF STATE FLAG => NONZERO=COS
                196 ;                             ;BIT 7=1=> DIGITAL COS.
                197 ;                             ;BIT 6=1=> ANALOG COS.
                198 ;                             ;BIT 5=1=> FS20 FAILURE, GO OFF LINE. 1/16/81
                199 ;
                200 ;##################################################################
002A            201 RFSH     EQU   2AH            ;ANALOG REFRSH ENTRY
002B            202 WATCHD   EQU   2BH            ;WATCHDOG CLOCK
002C            203 WATCHE   EQU   2CH            ;      "
002D            204 WATCHF   EQU   2DH            ;      "
002E            205 RLYCT    EQU   2EH            ;PULSED RELAY INACTIVE COUNTER
002F            206 TOTTMR   EQU   2FH            ;RUN TIME TIMER
0030            207 ANALOG   EQU   30H            ;ANALOG IN PROCESS DATA FILE
                208 ;                              .
0035            209 SPAN     EQU   35H
                210 ;                              .
0038            211 DIGITL   EQU   38H            ;DIGITAL IN PROCESS DATA FILE
                212 ;                              .
003C            213 MSBIT    EQU   3CH
                214 ;                              .
                215 ;                             3FH
                216 $EJECT
                217 ;MEMORY MAP (EXTERNAL)-----256 BIT MEMORY IN 8155 IC
                218 ;
                219 ;        MNEUMONIC  BYTE      DEFINITION
                220 ;
0000            221 TSMBUF   EQU   0              ;TRANSMISSION BUFFER
0001            222 MSG      EQU   1              ;START OF MESSAGE
0002            223 LENGTH   EQU   2              ;MESSAGE LENGTH
0003            224 EXT      EQU   3              ;CONTROL EXTENSION BYTE
0004            225 INFO     EQU   4              ;INFORMATION BYTE
                226 ;                              .
                227 ;                              .
0048            229 TMPLT    EQU   47H            ;TEMPLATE BYTES
                                  48H            ; 0: ANALOG QTY, 1: DIGITAL QTY
                230 ;
                231 ;##################################################################
                232 ;
004A            233 ANAST    EQU   4AH            ;ANALOG VALUES 1 TO 28 (INCLUDES TOTALIZERS
                234 ;                                          AND RUN TIMES)
                235 ;                              .
                236 ;##################################################################
                237 ;
                238 ;
```

```
LOC    OBJ              LINE           SOURCE STATEMENT
                        239  ;
0082                    240  DIGST    EQU    82H        ;DIGITAL STATUS (0-24--4 PER BYTE) 6BYTES
                        241  ;
                        242  ;
008E                    243  SLFCAL   EQU    8EH        ;SELF CAL STATUS (X1)(8 BITS ONLY)
                        244           EQU    8FH        ;SELF CAL STATUS (X10)
0090                    245  DIGPT    EQU    90H        ;DIGITAL PT DATA FILE
                        246  ;
                        247  ;
00B0                    248  ANAPT    EQU    0B0H       ;ANALOG PT DATA FILE
                        249  ;
                        250  ;
00D0                    251  DIGDLY   EQU    0D0H       ;DIGITAL DELAY STORE (ONLY ON BOARD DRIVERS)
00E0                    252  ANAID    EQU    0E0H       ;ANALOG OUTPUT REFRESH VALUE
                        253  ;
                        254  ;
00F0                    255  ANAIN    EQU    0F0H       ;CURRENT ANALOG INPUT BEING CONVERTED
                        256                             ;  CURRENT ANALOG ENTRY PT
00F2                    257  RLYSCH   EQU    0F2H       ;PULSED RELAY ENTRY PT
00F3                    258  TOTSCH   EQU    0F3H       ;CURRENTLY PROCESSED TOTALIZER INPUT
00F4                    259  TOTASS   EQU    0F4H       ;ASSIGNED TOTALIZERS
00F5                    260  TOTRUN   EQU    0F5H       ;TOTALIZER=0, RUNTIME=1
00F6                    261  TOTACT   EQU    0F6H       ;COUNT ACTIVE=1
00F7                    262  TABLE0   EQU    0F7H       ;INTERPOLATION TABLE PTRS
00F8                    263  TABLE1   EQU    0F8H
00F9                    264  TABLE2   EQU    0F9H
00FA                    265  TABLE3   EQU    0FAH
00FB                    266  DIGMSK   EQU    0FBH       ;DIGITAL INPUT DATA FILE LOCATION
00FC                    267  DUMMY    EQU    0FCH       ;RESULT OF THRESHOLD CONVERSION AND DUMMY LOCATION
                        268           EQU    0FDH       ;SPARE
                        269           EQU    0FEH       ;SPARE
00FF                    270  NRTMR    EQU    0FFH       ;540-REPEATER NO RESPONSE TIMER
                        271  $EJECT
                        272  ;
                        273  ;
                        274  ;HARDWARE PORT ADDRESSES---USED TO OPEN HARDWARE PORT
                        275  ;
0000                    276  XRAM1    EQU    00H        ;RAM OPEN, PROM DISABLED
0080                    277  XRAM     EQU    80H        ;EXTERNAL RAM MEMORY (256 BYTES)
0090                    278  UART     EQU    90H        ;TRANSMISSION INTERFACE PORT
00A0                    279  RLYB1    EQU    0A0H       ;RELAY BANK 1--DIGOUT 8-15
00B0                    280  RLYB0    EQU    0B0H       ;RELAY BANK 0--DIGOUT 0-7
00C0                    281  DIGIN    EQU    0C0H       ;DIGITAL INPUTS 0-5
00D0                    282  DIGIN1   EQU    0D0H       ;DIGITAL INPUTS 6-11
00E0                    283  DIGIN2   EQU    0E0H       ;DIGITAL INPUTS 12-17
00F0                    284  DIGIN3   EQU    0F0H       ;DIGITAL INPUTS 18-23
0088                    285  ANACP    EQU    088H       ;ANALOG CONTROL PORT
0080                    286  DATAIO   EQU    080H       ;PROM INPUT ENABLE
0070                    287  PROG     EQU    070H       ;PROM PROGRAM PULSE ENABLE
```

```
LOC    OBJ            LINE        SOURCE STATEMENT
                      288    ;
                      289    ;
                      290    ;TRANSMISSION DEFINITIONS
                      291    ;            T
                      292    ;            .    T
                      293    ;            C
                      294    ;
                      295    ;
                      296    ;      IOPORT 6--XRAM OPEN
                      297    ;
000A                  298  IN232    EQU   00001010B
0002                  299  OUT232   EQU   00000010B
0000                  300  IN422    EQU   00000000B
0000                  301  OUT422   EQU   00000000B
                      302  ;   UART OPEN
0000                  303  UARTIO   EQU   0            ;UART INPUT/OUTPUT ADDRESS
0001                  304  UARTCS   EQU   1            ;UART CONTROL/STATUS ADDRESS
                      305  ;            COMMAND WORD
0080                  306  EH       EQU   10000000B    ;ENTER HUNT MODE (NOT USED)
0040                  307  IR       EQU   01000000B    ;INTERNAL RESET =>SET TO MODE FORMAT
0020                  308  RTS      EQU   00100000B    ;"1" ENABLES TRANSMIT.
0010                  309  RESET    EQU   00010000B    ;RESET ERROR FLAGS (PE,OE,FE)
0008                  310  SBRK     EQU   00001000B    ;SEND BREAK (FORCES OUTPUT SPACE)
0006                  311  RXE      EQU   00000110B    ;RECEIVE ENABLE (TURNS ON DATA INPUT)
0001                  312  TXEN     EQU   00000001B    ;TRANSMIT ENABLE
                      313  ;            STATUS WORD
0080                  314  DSR      EQU   10000000B    ;DATA SET READY (RR OR CTS)
0038                  315  ERROR    EQU   00111000B    ;FRAMING, OVERRUN, AND PARITY ERRORS
0004                  316  TXE      EQU   00000100B    ;TRANSMITTER EMPTY
0002                  317  RXRDY    EQU   00000010B    ;RECEIVE DATA READY
0001                  318  TXRDY    EQU   00000001B    ;TRANSMIT ENABLE
                      319  ;            MODE INSTRUCTION
0040                  320  ST       EQU   01000000B    ;STOP BIT SELECT => 1 STOP BIT
0000                  321  PARITY   EQU   00000000B    ;ODD PARITY
0010                  322  PEN      EQU   00010000B    ;PARITY ENABLE
000C                  323  CHARL    EQU   00001100B    ;CHARACTER LENGTH => 8 BITS
0002                  324  B9600    EQU   00000010B    ;9600 BAUD SELECT
0003                  325  B1200    EQU   00000011B    ;300, 600, OR 1200 BAUD SELECT
005E                  326  TF96     EQU   ST+PARITY+PEN+CHARL+B9600  ;9600 BAUD TRANSMIT FORMAT
005F                  327  TF12     EQU   ST+PARITY+PEN+CHARL+B1200  ;1200 BAUD TRANSMIT FORMAT
                      328  ;
                      329  ;
                      330  ;
                      331  ;
                      332  ;
                      333  ;
                      334  ;ANALOG I/O DEFINITIONS
                      335  ;     THE 8155 I/O PORT IS ENABLED BY THE ANALOG CONTROL PORT ENABLE
```

```
LOC  OBJ          LINE        SOURCE STATEMENT
                  336   ;
                  337   ;     THIS PORTS INCLUDES 3 I/O PORTS AND A TIMER WITH CONTROL PORT
                  338   ;     PORTA IS USED TO INPUT THE ADDRESS AND TRANSMISSION MODE OF THE
                  339   ;     540 DGP.
                  340   ;
                  341   ;     TIMER IS A DOWN COUNTER (14 BITS) CLOCKED AT 1.997MHZ
                  342   ;     MAXIMUM REP RATE FOR COUNTER IS 2.735 MS
0000              343   ANACS   EQU   0           ;ANALOG CONTROL BYTE PTR
0001              344   PORTA   EQU   1
0002              345   PORTB   EQU   2           ;ANALOG INPUT/OUTPUT SELECT AND ADDRESS
0003              346   PORTC   EQU   3           ;D/A OUTPUT MS NIBBLE
0004              347   TIMERL  EQU   4           ;TIMER REGISTER LS BYTE
0005              348   TIMERH  EQU   5           ;TIMER REGISTER MS 6BITS + CONTROL MODE
                  349   ;                              MMTTTTTT => M=
                  350   ;                                            0:LOW IN SECOND HALF OF COUNT
                  351   ;                                            1:SQUARE WAVE
                  352   ;                                            2:SINGLE PULSE ON TERMINAL CT
                  353   ;                                            3:SINGLE PULSE WITH AUTO RELOAD
                  354   ;                          COMMAND WORD
00CF              355   TODEF   EQU   11001111B
00CF              356   STRTCT  SET   11001111B
004F              357   STOPCT  SET   01001111B
                  358   $EJECT
0000              359   ;
0000   F5         360           ORG   0
0001   8425       361           SEL   MB1         ; GO TO MEM BANK 1
0003              362           JMP   START       ;ENTRY PT FOR HARDWARE RESET
0003   046E       363           ORG   3
0005   FF         364           JMP   INTPR       ;ENTRY PT FOR INT/ INTERRUPT
0006   FF         365           DB    0FFH,0FFH   ;REV:1-26-81
0007   FF
                  366           ORG   7           ;REV: 1-26-81
                  367   ;***********************************************************************
                  368   ;     T1 INTERRUPT PROCESS REV.1-26-81
                  369   ;     AFTER INCREMENTING R7
                  370   ;     IF R7=11H THEN STOP TIOMER
                  371   ;              IF F1 IS SET
                  372   ;                    THEN EXIT WITHOUT READING TIMER VALUES
                  373   ;              ELSE READ TIMER VALUES
                  374   ;                   AND CHECK IF OVERFLOW MISSED
                  375   ;                   IF R3,R4 VALUES+02CF= CARRY SET THEN OVERFLOW IS
                  376   ;                   MISSED.
                  377   ;           ELSE JUMP TO CONVRT ROUTINE
                  378   ;
                  379   ;***********************************************************************
002A              380   ;
0003              381   ;
                  382   LOLMT   EQU   02AH        ;FOR TESTING LIMITS TO DETECT MISSED
                  383   HILMT   EQU   003H        ; OVERFLOW COUNT
```

| LOC | OBJ | LINE | | SOURCE STATEMENT | | |
|---|---|---|---|---|---|---|
| | | 384 | ; | | | |
| 0007 | D5 | 385 | TINTP: | SEL | RB1 | ;SELECT INTERRUPT REGISTER BANK |
| 0008 | AD | 386 | | MOV | R5,A | ;SAVE A-REG |
| 0009 | 0A | 387 | | IN | A,P2 | ;SAVE OPEN PORT |
| 000A | AE | 388 | | MOV | R6,A | |
| 000B | 15 | 389 | | DIS | I | |
| 000C | 1F | 390 | | INC | R7 | ;DIS I, AND INCR R7 |
| 000D | 2388 | 391 | | MOV | A,#ANACP | ;OPEN TIMER PORT |
| 000F | 3A | 392 | | OUTL | P2,A | |
| 0010 | FF | 393 | | MOV | A,R7 | ;IS R7=10H? |
| 0011 | D310 | 394 | | XRL | A,#10H | ;IF SO RELOAD TIMER, JUMP TO DS3 |
| 0013 | C657 | 395 | | JZ | TINT50 | |
| 0015 | FF | 396 | | MOV | A,R7 | ;IS R7=11H |
| 0016 | D311 | 397 | | XRL | A,#11H | |
| 0018 | C61C | 398 | | JZ | TINT10 | ;YES |
| 001A | 241E | 399 | | JMP | CNVRT | ; ON PAGE 1 |
| 001C | 8804 | 400 | TINT10: | MOV | R0,#TIMERL | ;STOP TIMER |
| 001E | B900 | 401 | | MOV | R1,#ANACS | |
| 0020 | 234F | 402 | | MOV | A,#STOPCT | |
| 0022 | 91 | 403 | | MOVX | @R1,A | |
| 0023 | 763F | 404 | | JF1 | TINT20 | ;STOPPED TIMER |
| 0025 | 80 | 405 | TINT30: | MOVX | A,@R0 | ;IS F1 SET? |
| 0026 | AC | 406 | | MOV | R4,A | ;READ TIMER VALUES |
| 0027 | 18 | 407 | | INC | R0 | ;SAVE IN R3,R4 |
| 0028 | 80 | 408 | | MOVX | A,@R0 | |
| 0029 | 43C0 | 409 | | ORL | A,#0C0H | ;SET B7,B6 |
| 002B | AB | 410 | | MOV | R3,A | |
| 002C | 97 | 411 | | CLR | C | |
| 002D | FC | 412 | | MOV | A,R4 | ;CHECK IF R3,R4>FC83? |
| 002E | 132A | 413 | | ADDC | A,#LOLMT | ;COMPL OF LOW LIMIT |
| 0030 | FB | 414 | | MOV | A,R3 | |
| 0031 | 1303 | 415 | | ADDC | A,#HILMT | ; AND HI LIMIT |
| 0033 | E651 | 416 | | JNC | TINTXX | ;OVER FLOW NOT MISSED |
| 0035 | CA | 417 | | DEC | R2 | ;OVERFLOW MISSED |
| 0036 | 97 | 418 | TINTYY: | CLR | C | ;ADD 1C0H IFF OVERFLOW OCCURED |
| 0037 | FC | 419 | | MOV | A,R4 | ; TO R3,R4 VALUES |
| 0038 | 13C0 | 420 | | ADDC | A,#0C0H | |
| 003A | AC | 421 | | MOV | R4,A | |
| 003B | FB | 422 | | MOV | A,R3 | |
| 003C | 1301 | 423 | | ADDC | A,#01H | |
| 003E | AB | 424 | | MOV | R3,A | ;SHOULD HAVE NO OVERFLOW |
| 003F | A5 | 425 | TINT20: | CLR | F1 | ;CLEAR F1 FLAG |
| 0040 | 8805 | 426 | TINT40: | MOV | R0,#TIMERH | ;RELOAD TIMER CONSTANTS |
| 0042 | 237F | 427 | | MOV | A,#TIMEH | |
| 0044 | 90 | 428 | | MOVX | @R0,A | |
| 0045 | 8804 | 429 | | MOV | R0,#TIMERL | |
| 0047 | 23FF | 430 | | MOV | A,#TIMEL | |
| 0049 | 90 | 431 | | MOVX | @R0,A | |

```
LOC   OBJ         LINE        SOURCE STATEMENT
004A  B800        432              MOV    R0,#ANACS
004C  23CF        433              MOV    A,#IODEF
004E  90          434              MOVX   @R0,A
004F  2431        435              JMP    JCNVRT                ;ON P.1
0051  FA          436   TINTXX:   MOV    A,R2                   ;WAS THERE AN OVERFLOW BEFORE?
0052  37          437              CPL    A                     ; IF SO ADD 1C0H O R3,R4
0053  9636        438              JNZ    TINTYY                ; ELSE EXIT
0055  043F        439              JMP    TINT20
              440   ;
              441   ;**********************************************************
              442   $EJECT
              443   ;
007E          444   DTIMEH   EQU   07EH   ;TIMER VALUES LOADED AT THE END
003E          445   DTIMEL   EQU   03EH   ;DS3 PROCESS TO COMPENSATE TO GET 4.096MS.
              446                          AND ENABLE INTERRUPT  REV.1-26-80
              447   ;
              448   ;**********************************************************
              449   ;
0057  B900        450   TINT50:  MOV    R1,#ANACS
0059  234F        451              MOV    A,#STOPCT
005B  91          452              MOVX   @R1,A                 ;STOP TIMER
              453   ;
005C  B805        454   DS3A:    MOV    R0,#TIMERH
005E  237E        455              MOV    A,#DTIMEH             ;RELOAD TIMER TO GIVE 4.096 MS.
0060  90          456              MOVX   @R0,A                 ;AT THE NEXT INT
0061  B804        457              MOV    R0,#TIMERL
0063  233E        458              MOV    A,#DTIMEL
0065  90          459              MOVX   @R0,A
0066  B800        460              MOV    R0,#ANACS
0068  23CF        461              MOV    A,#IODEF
006A  90          462              MOVX   @R0,A                 ;START TIMER
006B  05          463              EN     I                     ;ENABLE INTERRUPT
006C  2486        464              JMP    DS3
              465   ;
              466   $EJECT
              467   ;**********************************************************
              468   ;    INT PROCESS REV.1-26-81
              469   ;    DURING DS3 PHASE OF DUAL SLOPE INTEGRATION
              470   ;    INT IS ENABLED AND OVERFLOWS CONTED UNDER INTERRUPTS
              471   ;    THE TIMER IS LOADED WITH VALUES SUCH THAT 4.096 MS
              472   ;    TIME OUT OCCURS PRECISELY
              473   ;         IF NOT IN DS3 MODE WITH R7 NOT EQUAL TO 10,THEN
              474   ;    PROCESS AS BEFORE
              475   ;         THE VALUES LOADED INTO R3,R4 --WHEN F1 FLAG IS SET--
              476   ;         ARE CALCULATED BY DIVIDING THE TIME WINDOW BETWEEN
              477   ;         THE OCCURENCE OF INT. AND THE RESTARTING THE TIMER TO
              478   ;         THREE EQUAL VALUES , . ./DIVIDING THE "HOLE" OF
              479   ;         OCCURENCE OF TIINT INTO 3 AND MINIMIZING THE ERROR
              480   ;         INTRODUCED BY THIS SOLUTION.
```

```
LOC  OBJ              LINE            SOURCE STATEMENT
                       481    ;
                       482    ;********************************************
                       483    ;
00FF                   484    FTIMEH  EQU    0FFH          ;FIRST SAMPLE TIMER HI VALUE IN R3
00D9                   485    FTIMEL  EQU    0D9H          ;   "      "    "   LO  "    "  IN R4
00FF                   486    STIMEH  EQU    0FFH          ;SECOND SAMPLE TIMER HI VALUE IN R3
001C                   487    STIMEL  EQU    01CH          ;   "      "    "   LO  "    "  INR R4
007E                   488    ITIMEH  EQU    07EH          ;INT TIMER 4.096 MS. CONSTANTS
003E                   489    ITIMEL  EQU    03EH          ;ALLOWING FOR PROCESS TIME
                       490    ;
                       491    ;********************************************
006E  05               492    INTPR:  SEL    RB1
006F  AD               493            MOV    R5,A          ;SAVE A AND OPEN PORT
0070  0A                494            IN     A,P2
0071  AE                495            MOV    R6,A
0072  2388              496            MOV    A,#ANACP      ;OPEN TIMER PORT
0074  3A                497            OUTL   P2,A
0075  FF                498            MOV    A,R7          ;IS R7=10H?
0076  D310              499            XRL    A,#10H
0078  C67C              500            JZ     INT10         ;YES.
007A  241E              501            JMP    CNVRT         ;NO. GO TO PREV. CLOCK ROUTINE
007C  CA                502    INT10:  DEC    R2            ;GET AN OVERFLOW COUNT
007D  8900              503            MOV    R1,#ANACS
007F  234F              504            MOV    A,#STOPCT     ;STOP TIMER
0081  91                505            MOVX   @R1,A
0082  4695              506            JNT1   INT20         ;SAMPLE T1 INPUT
0084  B805              507    INT30:  MOV    R0,#TIMERH
0086  237E              508            MOV    A,#ITIMEH     ;RELOAD TIMER VALUES
0088  90                509            MOVX   @R0,A
0089  A804              510            MOV    R0,#TIMERL
008B  233E              511            MOV    A,#ITIMEL
008D  90                512            MOVX   @R0,A
008E  23CF              513            MOV    A,#IODEF
0090  91                514            MOVX   @R1,A
0091  46AA              515            JNT1   INT40         ; SAMPLE T1 INTERRUPT SECOND TIME
0093  2433              516            JMP    INTE          ;EXIT
                       517    ;
                       518    ;       IF T1 IS HIGH
                       519    ;           CASE OF FIRST SAMPLE: LOAD R3,R4=FD,9AH
                       520    ;           CASE OF SECOND SAMPLE LOAD R3,R4=FD,25H
                       521    ;           AND SET F1
                       522    ;       ELSE EXIT TO INTE AFTER STARTING TIMER
                       523    ;
0095  B5                524    INT20:  CPL    F1            ;SET F1 FLAG
0096  23FF              525            MOV    A,#FTIMEH     ;FIRST SAMP VALUES
0098  AB                526            MOV    R3,A
0099  23D9              527            MOV    A,#FTIMEL
009B  AC                528            MOV    R4,A
```

| LOC | OBJ | LINE | | SOURCE STATEMENT | |
|---|---|---|---|---|---|
| | | 529 | | MOV | R0,#TIMERH ;RESET TIMER TO 3E15H FOR 4 MS |
| 009C | 8805 | 530 | | MOV | A,#07EH |
| 009E | 237E | 531 | | MOVX | @R0,A |
| 00A0 | 90 | 532 | | DEC | R0 |
| 00A1 | C8 | 533 | | MOV | A,#015H |
| 00A2 | 2315 | 534 | | MOVX | @R0,A |
| 00A4 | 90 | 535 | | MOV | A,#IODEF ;RESTART TIMER |
| 00A5 | 23CF | 536 | | MOVX | @R1,A |
| 00A7 | 91 | 537 | | JMP | INTE ;EXIT FROM INT |
| 00A8 | 2433 | 538 | ; | | |
| | | 539 | INT40: | CPL | F1 ;SECOND SAMPLE |
| 00AA | B5 | 540 | | MOV | A,#STIMEH |
| 00AB | 23FF | 541 | | MOV | R3,A |
| 00AD | AB | 542 | | MOV | A,#STIMEL |
| 00AE | 231C | 543 | | MOV | R4,A |
| 00B0 | AC | 544 | | JMP | INTE |
| 00B1 | 2433 | 545 | ;************************************************** | | |
| | | 546 | $EJECT | | |
| | | 547 | ; | REPEATER PATCHES | |
| | | 548 | ; | GROUP ADDRESS MATCH LOGIC | |
| 00B3 | F1 | 549 | ADDXA: | MOV | A,@R1 ;GET SWITCH ADDRESS |
| 00B4 | 5303 | 550 | | ANL | A,#03 ;IS IT RS 232-REPEAT |
| 00B6 | D303 | 551 | | XRL | A,#03 |
| 00B8 | C6C8 | 552 | | JZ | ADDXC ;YES. |
| 00BA | F1 | 553 | | MOV | A,@R1 ;NO. |
| 00BB | 5303 | 554 | | ANL | A,#03 ;IS IT 422-REPEAT? |
| 00BD | D302 | 555 | | XRL | A,#02 |
| 00BF | 96C9 | 556 | | JNZ | ADDXB ;NO. |
| 00C1 | 80 | 557 | | MOVX | A,@R0 ;YES. COMPARE THE GROUP,ADDRESS OF 540 ON RS422 |
| 00C2 | D1 | 558 | | XRL | A,@R1 |
| 00C3 | 5378 | 559 | | ANL | A,#78H ; COMPARE BITS 3THRU 6 ONLY |
| 00C5 | C6C9 | 560 | | JZ | ADDXB ;COMPARED |
| 00C7 | BE00 | 561 | | MOV | R6,#XIDLE AND 0FFH ;NOT COMPARED,INITIALIZE REC. |
| 00C9 | E4D2 | 562 | ADDXB: | JMP | ADDXE ;EXIT |
| 00CB | E4CC | 563 | ADDXC: | JMP | ADDX2 ; GO TO ADDX ROUTINE |
| | | 564 | $EJECT | | |
| | | 565 | ;1. TITLE | | |
| | | 566 | ; | DATA--GET PROM FROM DATA FILE | |
| | | 567 | ;2. | CALL AND RETURN | |
| | | 568 | ; | INPUTS | A=PTR TO THE BYTE, R3=QUADRANT, RAM OPEN |
| | | 569 | ; | | |
| | | 570 | ; | OUTPUTS | R4=DATA BYTE |
| | | 571 | ; | | |
| | | 572 | ; | RETURN | |
| | | 573 | ;3. | CALLED ROUTINES | |
| | | 574 | ;4. | EQUATES | |
| | | 575 | ;************************************************** | | |
| | | 576 | ; | | |

```
LOC   OBJ         LINE            SOURCE STATEMENT

577     ;
00CD  A8          578     DATA:   MOV     R0,A            ;SET BYTE PTR
00CE  FB          579             MOV     A,R3            ;GET QUADRANT PTR
00CF  4380        580             ORL     A,#DATAIO
00D1  3A          581             OUTL    P2,A            ;OPEN QUADRANT
00D2  80          582             MOVX    A,@R0
00D3  AC          583             MOV     R4,A            ;GET BYTE
00D4  2380        584             MOV     A,#XRAM
00D6  3A          585             OUTL    P2,A            ;OPEN RAM
00D7  93          586             RETR
                  587     SEJECT
                  588     SEJECT
                  589     ;1. TITLE
                  590     ;       BURNT--BURN TIMER FOR PROM PROGRAMMING
                  591     ;2. CALL AND RETURN
                  592     ;       INPUTS    A=COUNT
                  593     ;
                  594     ;       OUTPUTS
                  595     ;
                  596     ;       RETURN    DELAY WITH NO OTHER ROUTINES RUN
                  597     ;3. CALLED ROUTINES
                  598     ;4. EQUATES
                  599     ;****************************************************
                  600     ;
00D8  65          602     BURNT:  STOP    TCNT            ;STOP COUNTER
00D9  62          603             MOV     T,A
00DA  55          604             STRT    T
00DB  16E0        605     BURNL:  JTF     BURNE           ;WAIT UNTIL TIME EXPIRED
00DD  00          606             NOP             ; REQUIRED FOR PROPER COUNT REV 10-3-80
00DE  04DB        607             JMP     BURNL
00E0  93          608     BURNE:  RETR
                  609     ;
00E1  F0          610     THR1B:  MOV     A,@R0           ;DELAY OF 18 USEC FOR THGRESHOLD TEST
00E2  91          611             MOVX    @R1,A
00E3  00          612             NOP             ; FOR DELAY
00E4  24F1        613             JMP     THR1C           ;JUMP BACK TO THR1 ROUTINE
                  614     ;****************************************************
                  615     ;       REPEATER PATCHES
                  616     ;       IF RS232.REPEATER.REPAETER STATE
                  617     ;                 THEN DO NOT ENABLE RTS
                  618     ;       ELSE ENABLE RTS AS BEFORE
                  619     ;
                  620     ;       IF RS422.REPEATER DO NOT ENABLE RTS,
                  621     ;                 GO TO SEND MODE
                  622     ;
00E6  B824        623     RPT232: MOV     R0,#LINE
00E8  230F        624             MOV     A,#0FH ; LINE =XXXX0000?
```

```
LOC   OBJ        LINE          SOURCE STATEMENT
00EA  50          625                  ANL   A,@R0
00EB  C6F1        626                  JZ    RPT20         ;YES.
00ED  BE06        627                  MOV   R6,#XCTS AND 0FFH ;NO.
00EF  44E6        628                  JMP   RTSEND
00F1  44E0        629   RPT20:         JMP   RTS422
                  630   ;
00F3  B824        631   IDLE5:         MOV   R0,#LINE
00F5  230F        632                  MOV   A,#0FH        ; IS IT 232-REPEATER STATE?
00F7  50          633                  ANL   A,@R0
00F8  C6FE        634                  JZ    IDLE6         ;YES.
00FA  BE02        635                  MOV   R6,#XREC AND 0FFH ;NO.
00FC  4412        636                  JMP   TXEND         ; GO TO REC MODE
00FE  444A        637   IDLE6:         JMP   IDLE4         ; GO BACK TO IDLE ROUTINE
                  638   ;              FILL-IN CODE.
                  639   ;
00FF  FF          640                  DB    0FFH,0FFH,0FFH,0FFH,0FFH,0FFH,0FFH ; 060H-06FH
0100  FF
0101  FF
0102  FF
0103  FF
0104  FF
0105  FF
0106  FF
0107  FF
                  641   ;
                  642   ;
                  643   $EJECT
                  644   ;
0100              645                  ORG   100H
                  646   ;      NOTE:   IF CONVERSION IS ACTIVE, ONE OF THE CONVERSION ROUTINES
                  647   ;              IS ENTERED. EVENTUALLY THESE ROUTINES WILL RETURN THROUGH
                  648   ;              THE "INTE" EXIT POINT
                  649   ;
                  650   ;              THE AREA SET OFF BY '*' BELOW MUST BE FACTORED INTO THE R/P
                  651   ;              CONVERSION ROUTINE AS AN INITIAL OFFSET.
                  652   ;2.    CALL AND RETURN
                  653   ;      INPUTS
                  654   ;      OUTPUTS       TIMEOUT OF HARDWARE TIMER IN 8155
                  655   ;                    CLOCK INCREMENTED
                  656   ;      RETURN
                  657   ;3.    CALLED ROUTINES
0100              658                  ORG   0100H
0100  38          659   XINTE:         DB    RFRSH AND 0FFH        ;IDLE A/D CONVERT EXIT
0100  38          660   ADCAL:         DB    RFRSH AND 0FFH        ;NOT USED
0101  73          661   XT2:           DB    RP AND 0FFH           ;TYPE 2 ANALOG: R/P
0102  D9          662   XT3:           DB    THR1 AND 0FFH         ;TYPE 3 ANALOG: THRESHOLD
0103  A7          663   XT4:           DB    DS0 AND 0FFH          ;TYPE 4 ANALOG: VOLTAGE
0104  A7          664   XT5:           DB    DS0 AND 0FFH          ;TYPE 5 ANALOG: RTD
0105  A7          665   XT6:           DB    DS0 AND 0FFH          ;TYPE 6 ANALOG:
0106  A7          666   XT7:           DB    DS0 AND 0FFH          ;TYPE 7 ANALOG:
0107  A7
```

```
LOC  OBJ       LINE        SOURCE STATEMENT
0108 98        667  XFAIL1: DB      FAIL AND OFFH          ;FAIL
0109 7F        668  XRP1:   DB      RP1 AND OFFH           ;R/P REENTRY 1
010A 7F        669          DB      RP1 AND OFFH           ;R/P REENTRY 2
010B 85        670  XRP2:   DB      RP2 AND OFFH           ;R/P REENTRY 3
010C E0        671  XTHR2:  DB      THR2 AND OFFH          ;THRESHOLD REENTRY 1
010D AB        672  XDS1:   DB      DS1 AND OFFH           ;D/S REENTRY 1
010E B4        673  XDS2:   DB      DS2 AND OFFH           ;D/S REENTRY 2
010F R4        674          DB      DS2 AND OFFH           ;D/S REENTRY 3
0110 86        675  XDS3:   DB      DS3 AND OFFH           ;D/S REENTRY 4
0111 C4        676  XDS4:   DB      DS4 AND OFFH           ;D/S REENTRY 5
0112 9C        677  XRES:   DB      RESULT AND OFFH        ;RESULT EXIT
0113 98        678  XFAIL:  DB      FAIL AND OFFH          ;FAIL
               679  ;4.     EQUATES
               680  ;*************************************************************
               681  ;
               682  ;
0114 D5        683  CONVRT: SEL     RB1                    ;SELECT INTERRUPT REGISTER BANK
0115 15        684          DIS     I
0116 1F        685          INC     R7
0117 D5        686  CLOCK:  SEL     RB1
0118 AD        687          MOV     R5,A                   ;SAVE OPEN PORT
0119 0A        688          IN      A,P2
011A AE        689          MOV     R6,A
011B 2388      690          MOV     A,#ANACP               ;OPEN PORT
011D 3A        691          OUTL    P2,A                   ;CODE FRO 114H--11AH NOT EXECUTED REV 1-28-81
011E B804      692  CNVRT:  MOV     R0,#TIMERL             ;GET TIMER PTR
0120 B900      693          MOV     R1,#ANACS              ;GET TIMER CONTROL PTR
0122 00        694          NOP
0123 00        695          NOP
               696  ;                                      ;REV.1-26-81
0124 234F      697          CALL    OVRFL                  ;TEST OVERFLOW
0126 91        698          MOV     A,#STOPCT              ;STOP COUNTER
0127 80        699          MOVX    @R1,A                  ;**********************************************
0128 AC        700          MOVX    A,@R0                  ;2
0129 18        701          MOV     R4,A                   ;2          GET COUNT
012A 80        702          INC     R0                     ;1          SAVE COUNT
012B 43C0      703          MOVX    A,@R0                  ;2          GET MS COUNT
012D AB        704          ORL     A,#0C0H                ;2
012E 23CF      705          MOV     R3,A                   ;1
0130 91        706          MOV     A,#STRTCT              ;2          START COUNTER
0131 FF        707  JCNVRT: MOVX    @R1,A                  ;****** 13 CYCLES TOTAL TIME CRITICAL**********
0132 B3        708          MOV     A,R7                   ;GET CONVERSION ENTRY
               709          JMPP    @A
               709  $EJECT
               710  ;1. TITLE
               711  ;       INTE--INTERRUPT EXIT--RESTORE ALL REGISTERS AND ENTRY PTS
               712  ;2.     CALL AND RETURN
               713  ;       INPUTS           R3=PORT, R4=ACC
               714  ;
```

```
LOC   OBJ      LINE           SOURCE STATEMENT
               715    ;
               716    ;        OUTPUTS  REGISTERS RESTORED
               717    ;        RETURN
               718    ;   3.   CALLED ROUTINES
               719    ;   4.   EQUATES
               720    ;*********************************************************
               721    ;
               722    ;
0133 FE        723    INTE:    MOV    A,R6           ;GET PORT
0134 3A        724             OUTL   P2,A
0135 FD        725             MOV    A,R5           ;GET ACC
0136 C5        726             SEL    RB0
0137 93        727             RETR
               728    $EJECT
               729    ;1. TITLE   RFSH--REFRESH ANALOG OUTPUTS
               730    ;
               731    ;2. CALL AND RETURN
               732    ;        INPUTS    ANALOG I/O PORT OPEN
               733    ;
               734    ;        OUTPUTS   ANALOG OUTPUT REFRESHED
               735    ;
               736    ;        RETURN
               737    ;   3.   CALLED ROUTINES
               738    ;   4.   EQUATES
               739    ;*********************************************************
               740    ;
               741    ;
0138 27        742    RFSH:    CLR    A
0139 3D        743             MOVD   P5,A           ;DISABLE REFRESH
013A B82A      744             MOV    R0,#RFSH       ;GET REFRESH PTR
013C F0        745             MOV    A,@R0
013D 1244      746             JB0    OLDVAL         ;IF NEW VALUE (WITH HYSTERIS RESET)
013F 27        747    NEWVAL:  CLR    A              ;  SET 0 VALUE
0140 AA        748             MOV    R2,A
0141 AC        749             MOV    R4,A
0142 244E      750             JMP    RFSH1
0144 F42C      751    OLDVAL:  CALL   PANA           ;ELSE (OLD VALUE OR NEW VALUE WITHOUT RESET)
0146 2380      752             MOV    A,#XRAM        ;  GET VALUE ADDRESS
0148 3A        753             OUTL   P2,A           ;  OPEN RAM
0149 81        754             MOVX   A,@R1
014A AA        755             MOV    R2,A
014B 19        756             INC    R1
014C 81        757             MOVX   A,@R1          ;  GET PORTC VALUE
014D AC        758             MOV    R4,A           ;ENDIF
014E F0        759    RFSH1:   MOV    A,@R0          ;GET PORT ADDRESS
014F 37        760             CPL    A
0150 AB        761             MOV    R3,A
0151 2388      762             MOV    A,#ANACP       ;OPEN I/O
```

```
LOC   OBJ     LINE          SOURCE STATEMENT
                763                 OUTL  P2,A
0153  3A       764                 MOV   RO,#PORTC
0154  B803     765                 MOV   R1,#REG2
0156  B91A     766   RFSHL:  MOV   A,@R1
0158  F1       767                 MOVX  @R0,A
0159  90       768                 INC   R1
015A  19       769                 DJNZ  R0,RFSHL        ;DO WHILE VALUES
015B  E858     770                 MOV   A,#8            ;  GET VALUE
015D  2308     771                 MOVD  R0,RFSH         ;  INCREMENT PTRS
015F  3D       772                 MOV   P5,A            ;ENDWHILE
0160  B82A     773                 MOV   R0,#RO          ;START REFRESH
0162  F0       774                 ADD   A,#8
0163  0308     775                 ORL   A,#0C7H
0165  43C7     776                 MOV   @R0,A           ;SET VALUE
0167  A0       777                 SEL   RB0             ;SCHEDULE A/D ROUTINE
0168  C5       778                 MOV   A,#8
0169  2308     779                 ORL   A,R5
016B  4D       780                 MOV   R5,A
016C  AD       781                 SEL   RB1
016D  D5       782                 MOV   R1,#SECOND
016E  B925     783                 INC   @R1             ;TICK CLOCK
0170  11       784   RFSH3:  JMP   INTE
0171  2433     785         $EJECT
               786         ;1. TITLE
               787         ;         RP--R/P CONVERT ROUTINE
               788         ;2.  CALL AND RETURN
               789         ;         INPUTS    R4=MS COUNT, R3=LS COUNT, I/O PORT OPEN
               790         ;
               791         ;         OUTPUTS   INPUT CONVERTED
               792         ;
               793         ;         RETURN
               794         ;3.  CALLED ROUTINES
               795         ;--RANGE
               796         ;         INPUTS    R3=MS, R4=LS COUNT
               797         ;
               798         ;         OUTPUTS   ANALOG+7=RANGE, R7 SET TO REENTRY PT
               799         ;
               800         ;4.  EQUATES
               801         ;****************************************************
               802         ;
               803         RP:
0173  BF08     804                 MOV   R7,#XFAIL1 AND 0FFH  ;SET DEFAULT ENTRY
0175  2305     805                 MOV   A,#5
0177  3C       806                 MOVD  P4,A                 ;OPEN R/P PORT
0178  23FF     807                 MOV   A,#-1
017A  62       808                 MOV   T,A                  ;SET INTERNAL COUNT
017B  25       809                 EN    TCNTI
017C  45       810                 STRT  CNT                  ;START COUNTER
```

| LOC | OBJ | LINE | | SOURCE STATEMENT | | |
|---|---|---|---|---|---|---|
| 017D | 2433 | | | JMP | INTE | |
| | | 811 | ; | | | |
| | | 812 | ; | | | |
| | | 813 | ; | | | |
| 017F | 42 | 814 | RP1: | MOV | A,T | ;GET TIMER VALUE |
| 0180 | 03FE | 815 | | ADD | A,#-2 | |
| 0182 | 62 | 816 | | MOV | T,A | |
| 0183 | 2433 | 817 | | JMP | INTE | ;SET COUNTER TO 3 |
| | | 818 | ; | | | |
| | | 819 | ; | | | |
| 0185 | 42 | 820 | RP2: | MOV | A,T | ;SET TIMEOUT ACCUMULATOR (20 COUNTS) |
| 0186 | 03EC | 821 | | ADD | A,#-20 | |
| 0188 | 62 | 822 | | MOV | T,A | |
| 0189 | BF11 | 823 | | MOV | R7,#XRES-1 AND 0FFH | ;SET RESULT ENTRY PT |
| 018B | 0312 | 824 | | ADD | A,#18 | ;IF COUNT TOO FAST THEN |
| 018D | F292 | 825 | | JB7 | RP2A | |
| 018F | 1F | 826 | | INC | R7 | ; FAILED RESULT |
| 0190 | 2496 | 827 | | JMP | RPE | ;ELSE (WITHIN RANGE) |
| 0192 | B833 | 828 | RP2A: | MOV | R0,#ANALOG+3 | ; SAVE RANGE MEASURE |
| 0194 | F481 | 829 | | CALL | MOVERI+2 | ;ENDIF |
| 0196 | 2433 | 830 | | JMP | INTE | |
| | | 831 | RPE: SEJECT | | | |
| | | 832 | ;1. TITLE | | | |
| | | 833 | ; CONVERSION EXIT--ENTER AT FAIL OR RESULT | | | |
| | | 834 | ;2. CALL AND RETURN | | | |
| | | 835 | ; INPUTS R3=MS, R4=LS COUNT | | | |
| | | 836 | ; | | | |
| | | 837 | ; OUTPUTS ANALOG+1=MS, ANALOG+2=LS | | | |
| | | 838 | ; | | | |
| | | 839 | ; RETURN | | | |
| | | 840 | ;3. CALLED ROUTINES | | | |
| | | 841 | ;4. EQUATES | | | |
| | | 842 | ;************************************************* | | | |
| | | 843 | ; | | | |
| | | 844 | ; | | | |
| 0198 | BB00 | 845 | FAIL: | MOV | R3,#0 | ;STORE 0 (FAIL) VALUE |
| 019A | BC00 | 846 | | MOV | R4,#0 | |
| 019C | F4AF | 847 | RESULT: | CALL | MOVERI | ;SAVE MS,LS STATUS |
| 019E | 27 | 848 | | CLR | A | ;TURN OFF CONVERSION |
| 019F | 3C | 849 | | MOVD | P4,A | |
| 01A0 | 65 | 850 | | STOP | TCNT | |
| 01A1 | 35 | 851 | | DIS | TCNTI | ;DISABLE TIMER |
| 01A2 | BF00 | 852 | | MOV | R7,#XINTE AND 0FFH | ;SET REENTRY PT |
| 01A4 | 05 | 853 | | EN | I | |
| 01A5 | 2433 | 854 | | JMP | INTE | |
| | | 855 | SEJECT | | | |
| | | 856 | ;1. TITLE | | | |
| | | 857 | ; DS--DUAL SLOPE INTEGRATION | | | |
| | | 858 | ;2. CALL AND RETURN | | | |

```
LOC   OBJ        LINE        SOURCE STATEMENT
                 859    ;    INPUTS       R3=MS COUNT, R4=LS COUNT, I/O PORT OPEN
                 860    ;
                 861    ;    OUTPUTS      INPUT CONVERTED
                 862    ;
                 863    ;    RETURN
                 864    ;3.  CALLED ROUTINES
                 865    ;4.  EQUATES
                 866    ;****************************************************
                 867    ;
                 868    ;
01A7 BF0D        869  DS0:   MOV    R7,#XDS1 AND 0FFH   ;WAIT FOR LINE TO CHARGE
01A9 2433        870         JMP    INTE
                 871    ;
                 872    ;
01AB 1F          873  DS1:   INC    R7                  ;SET REENTRY PT
01AC 2346        874         MOV    A,#70               ;PRESET COUNTER
01AE 62          875         MOV    T,A
01AF 2309        876         MOV    A,#9
01B1 3C          877         MOVD   P4,A                ;START INTEGRATION
01B2 55          878         STRT   T
01B3 25          879         EN     TCNTI               ;START COUNTER
01B4 2433        880         JMP    INTE
                 881    ;
                 882    ;
0186 65          883  DS2:   STOP   TCNT                ;STOP COUNTER
0187 4698        884  DS3:   JNT1   FAIL                ;IF INVALID RESULT THEN
                 885    ;                                  FAILED RESULT
                 886    ;                                  ELSE (VALID RESULT)
01B9 BAFF        887         MOV    R2,#0FFH
01BB A5          888         CLR    F1                  ;  RESET OVERFLOW COUNTER
01BC 23FF        889         MOV    A,#-1               ;  WAIT FOR INTEGRATION COMPLETE
01BE 62          890         MOV    T,A
01BF 45          891         STRT   CNT
01C0 27          892         CLR    A                   ;  STOP INTEGRATION (EXTERNAL)
01C1 3C          893         MOVD   P4,A
01C2 2433        894         JMP    INTE
                 895    ;                               ;ENDIF
                 896    ;
01C4 97          897  DS4:   CLR    C                   ;NORMALIZE R3,R4 COUNT
01C5 B903        898         MOV    R1,#3
01C7 F8          899  DS4LP: MOV    A,R3                ;DO FOR 3 HITS
01C8 67          900         RRC    A                   ;  SHIFT RIGHT
01C9 AB          901         MOV    R3,A
01CA FC          902         MOV    A,R4
01CB 67          903         RRC    A
01CC AC          904         MOV    R4,A
01CD E9C7        905         DJNZ   R1,DS4LP            ;  ENDDO
01CF FA          906         MOV    A,R2                ;GET OVERFLOW COUNT
```

| LOC | OBJ | LINE | | SOURCE STATEMENT | | |
|---|---|---|---|---|---|---|
| 01D0 | 47 | 907 | | SWAP | A | |
| 01D1 | 77 | 908 | | RR | A | |
| 01D2 | 2B | 909 | | XCH | A,R3 | |
| 01D3 | 43FA | 910 | | ORL | A,#0FAH | ;PACK OVERFLOW WITH R3 COUNT |
| 01D5 | 5B | 911 | | ANL | A,R3 | |
| 01D6 | AB | 912 | | MOV | R3,A | |
| 01D7 | 249C | 913 | | JMP | RESULT | |
| | | 914 | $EJECT | | | |
| | | 915 | ;1. TITLE | | | |
| | | 916 | ; | THR1--THRESHOLD INPUT HANDLER | | |
| | | 917 | ;2. | CALL AND RETURN | | |
| | | 918 | ; | INPUTS | | |
| | | 919 | ; | OUTPUTS | | |
| | | 920 | ; | RETURN | | |
| | | 921 | ;3. | CALLED ROUTINES | | |
| | | 922 | ;4. | EQUATES | | |
| 0080 | | 923 | ALARM | EQU | 10000000B | ;ALARM MASK,REV.6-9-80 |
| 0040 | | 924 | TBL | EQU | 01000000B | ;TROUBLE MASK |
| | | 925 | ;*********************************************************** | | | |
| | | 926 | ; | | | |
| | | 927 | ; | | | |
| 01D9 | 2305 | 928 | THR1: | MOV | A,#5 | |
| 01DB | 3C | 929 | | MOVD | P4,A | ;OPEN THRESH PORT |
| 01DC | 8F0C | 930 | | MOV | R7,#XTHR2 AND 0FFH | |
| 01DE | 2433 | 931 | | JMP | INTE | ;SCHEDULE REENTRY |
| | | 932 | ; | | | |
| | | 933 | ; | | | |
| 01E0 | 46E6 | 934 | THR2: | JNT1 | THR1A | ;IF ALARM THEN |
| 01E2 | 2380 | 935 | | MOV | A,#ALARM | ; GET ALARM |
| 01E4 | 24F5 | 936 | | JMP | THR2A | ;ELSE |
| 01E6 | B835 | 937 | THR1A: | MOV | R0,#ANALOG+5 | ; SET TROUBLE LEVEL |
| 01E8 | 8903 | 938 | | MOV | R1,#PORTC | |
| 01EA | F0 | 939 | | MOV | A,@R0 | |
| 01EB | 91 | 940 | | MOVX | @R1,A | |
| 01EC | 18 | 941 | | INC | R0 | |
| 01ED | 8901 | 942 | | MOV | R1,#PORTA | |
| 01EF | 04E1 | 943 | | JMP | THR1B | |
| 01F1 | 56F9 | 944 | THR1C: | JT1 | THR2B | ;IF TROUBLE THEN |
| 01F3 | 2340 | 945 | | MOV | A,#TBL | ; GET TROUBLE |
| 01F5 | B837 | 946 | THR2A: | MOV | R0,#ANALOG+7 | ; SET VALUE |
| 01F7 | 40 | 947 | | ORL | A,@R0 | |
| 01F8 | A0 | 948 | | MOV | @R0,A | |
| 01F9 | 8F00 | 949 | THR2B: | MOV | R7,#XINTE AND 0FFH | ;ENDIF |
| 01FB | 27 | 950 | | CLR | A | ;RESET ENTRY TO IDLE |
| 01FC | 3C | 951 | | MOVD | P4,A | ;TURN OFF INPUT |
| 01FD | 2433 | 952 | | JMP | INTE | |
| 01FF | FF | 953 | | DB | 0FFH | ;FILL IN CODE |
| | | 954 | $EJECT | | | |

```
LOC    OBJ         LINE        SOURCE STATEMENT

955    ;1. TITLE
                    956    ;        TSM--TRANSMISSION ROUTINE
                    957    ;2. CALL AND RETURN
                    958    ;        INPUTS
                    959    ;        OUTPUTS
                    960    ;        RETURN
                    961    ;3. CALLED ROUTINES
0200                962            ORG      0200H
0200   2A           963    XIDLE:  DB       IDLE AND 0FFH        ;IDLE ROUTINE (SET UP RECEIVE)
0201   13           964    XWAIT:  DB       WAIT AND 0FFH        ;WAIT FOR DELAY SYNC FOR TRANSMISSION
0202   52           965    XREC:   DB       REC AND 0FFH         ;RECEIVE ROUTINE
0203   CF           966    XRTS:   DB       SRTS AND 0FFH        ;REQUEST TO SEND (SET UP SEND)
0204   B7           967    XSEND:  DB       SEND AND 0FFH        ;SEND
0205   F7           968    XRRCHK: DB       RRCHK AND 0FFH       ;CARRIER DETECT ROUTINE
0206   EE           969    XCTS:   DB       CTSCHK AND 0FFH      ;CLEAR TO SEND WAIT (RS232 ONLY)
                    970    ;4. EQUATES
                    971    ;***********************************************************
                    972    ;
                    973    ;
                    974    ;
0207   00           975    TSM:    NOP      ; SEL      RB1
0208   00           976            NOP      ;REV: 1-26-81
0209   00           977            NOP
                    978    ;
020A   00           979            CALL     OVRFL                ;TEST OVERFLOW
020B   2390         980            NOP      ;        SEL    RB0
020D   3A           981            MOV      A,#UART              ;OPEN UART PORT
020E   8901         982            OUTL     P2,A
0210   FE           983            MOV      R1,#UARTCS           ;OPEN CONTROL/STATUS PORT
0211   R3           984            MOV      A,R6                 ;GET TRANSMISSION
                    985            JMPP     aA                   ;CASE OF TRANSMIT MODE OF:
                    986    ;                                              IDLE
                    987    ;                                              REC
                    988    ;                                              SRTS
                    989    ;                                              SEND
                    990    ;                                              RRCHK
                    991    ;                                              CTSCHK
0212   93           992    TXEND:  RETR                          ENDCASE
                    993    $EJECT
                    994    ;1. TITLE
                    995    ;        WAIT--WAIT FOR QUIET TIME TO EXPIRE WITHOUT RECEIVING ANY TRANSMISSION
                    996    ;2. CALL AND RETURN
                    997    ;        INPUTS      R1=UART STATUS PTR, UART OPEN
                    998    ;        OUTPUTS     WAIT IMPLEMENTED
                    999    ;
                   1000    ;        RETURN
                   1001    ;
                   1002    ;3. CALLED ROUTINES
```

```
LOC   OBJ      LINE          SOURCE STATEMENT

1003    ;4.   EQUATES
                1004    ;***********************************************************
                1005    ;
                1006    ;
0213  81        1007    WAIT:    MOVX   A,@R1              ;GET STATUS
0214  B923      1008             MOV    R1,#TDELAY         ;GET DELAY PTR
0216  321A      1009             JB1    WAIT1              ;IF UART RECEIVED DATA THEN
0218  4422      1010             JMP    WAIT2
021A  BB00      1011    WAIT1:   MOV    R0,#UARTIO         ; GET UART DATA PTR
021C  80        1012             MOVX   A,@R0              ; READ DATA
021D  237B      1013             MOV    A,#123             ; RESET TIMER
021F  A1        1014             MOV    @R1,A
0220  4428      1015             JMP    WAIT3              ;ELSE
0222  11        1016    WAIT2:   INC    @R1                ; COUNT TIMER
0223  F1        1017             MOV    A,@R1
0224  9628      1018             JNZ    WAIT3              ; TEST DONE
0226  BE00      1019             MOV    R6,#XIDLE AND 0FFH
                1020    ;                                  ENDIF
0228  4412      1021    WAIT3:   JMP    TXEND
                1022    $EJECT
                1023    ;1. TITLE    IDLE
                1024    ;
                1025    ;2. CALL AND RETURN
                1026    ;     INPUTS      R1=UART STATUS PTR, UART OPEN
                1027    ;
                1028    ;     OUTPUTS     RECEIVE ENABLED
                1029    ;
                1030    ;3. CALLED ROUTINES
                1031    ;4. EQUATES
0017            1032    RTSRES   EQU    RXE+TXEN+RESET     ;RTS RESET
                1033    ;***********************************************************
                1034    ;
                1035             REV. DEC.04,80
022A  81        1036    IDLE:    MOVX   A,@R1              ;GET UART STATUS
022B  522F      1037             JB2    IDLE3              ;IF NOT READY THEN
022D  4412      1038    IDLE2:   JMP    TXEND              ; EXIT
                1039    ;                                  ELSE
022F  BF00      1040    IDLE3:   MOV    R7,#0              ; CLEAR WORD COUNT
0231  B821      1041             MOV    R0,#CKSM           ; CLEAR CHECKSUM
0233  27        1042             CLR    A
0234  A0        1043             MOV    @R0,A
0235  18        1044             INC    R0                 ; CLEAR TRANSMISSION BUFFER PTR
0236  A0        1045             MOV    @R0,A
0237  2317      1046             MOV    A,#RTSRES          ; DISABLE OUTPUT DRIVERS
0239  91        1047             MOVX   @R1,A
023A  81        1048             MOVX   A,@R1
023B  B900      1049             MOV    R1,#UARTIO         ; DUMMY READ STATUS
023D  81        1050             MOVX   A,@R1              ; DUMMY READ DATA
```

| LOC | OBJ | LINE | | SOURCE STATEMENT | | |
|---|---|---|---|---|---|---|
| 023E | 23B0 | 1051 | | MOV | A,#XRAM | ; OPEN RAM |
| 0240 | 3A | 1052 | | OUTL | P2,A | |
| 0241 | B824 | 1053 | | MOV | R0,#LINE | ; GET LINE |
| 0243 | F0 | 1054 | | MOV | A,@R0 | |
| 0244 | 3E | 1055 | | MOVD | P6,A | |
| 0245 | B820 | 1056 | | MOV | R0,#ADDRES | ; GET ADDRES |
| 0247 | F0 | 1057 | | MOV | A,@R0 | ;ENDIF |
| 0248 | 124E | 1058 | | JB0 | IDLE1 | ;IF RS422 THEN |
| 024A | 8E02 | 1059 | IDLE4: | MOV | R6,#XREC AND 0FFH | ; ENABLE RECEIVE ROUTINE |
| 024C | 442D | 1060 | | JMP | IDLE2 | ;ELSE (RS232) |
| 024E | 04F3 | 1061 | IDLE1: | JMP | IDLE5 | ; ENABLE CARRIER DETECT CHECK |
| | | 1062 | | SEE REPEATER PATCH | | ENDIF |
| 0250 | A4EA | 1063 | IDLE8: | JMP | IDLE9 | ; SEE DELAY PATCH |
| | | 1064 | $EJECT | | | |
| | | 1065 | ;1. TITLE | | | |
| | | 1066 | ; REC--RECEIVE DATA | | | |
| | | 1067 | ;2. CALL AND RETURN | | | |
| | | 1068 | ; INPUTS | | | |
| | | 1069 | ; OUTPUTS | | | |
| | | 1070 | ; RETURN | | | |
| | | 1071 | ;3. CALLED ROUTINES | | | |
| | | 1072 | ;4. EQUATES | | | |
| 0003 | | 1073 | MSGL | EQU | 3 | ;BASE MESSAGE LENGTH |
| 0001 | | 1074 | REQ1 | EQU | 00000001B | ;REQUEST RECV |
| 00FE | | 1075 | MCASE | EQU | 11111110B | ;CASE 1 MASK |
| 0003 | | 1076 | MTYPE | EQU | 3 | ;MESSAGE TYPE MASK |
| | | 1077 | ;************************************************* | | | |
| | | 1078 | ; | | | |
| | | 1079 | ; | | | |
| | | 1080 | ; | | | |
| 0252 | 81 | 1081 | REC: | MOVX | A,@R1 | ;GET STATUS WORD |
| 0253 | 3257 | 1082 | | JB1 | RDATA | ;IF DATA READY THEN |
| 0255 | A4C8 | 1083 | | JMP | RDATAA | |
| 0257 | 5338 | 1084 | RDATA: | ANL | A,#ERROR | ; SET ERROR FLAG |
| 0259 | 96A1 | 1085 | | JNZ | ERKSET | |
| | | 1086 | | MOV | R1,#EIP | ; CLEAR NO RESPONSE WATCHDOG |
| 0258 | A4B9 | 1087 | | JMP | RDATAH | ; SEE REPEATER PATCH |
| 025D | 23FC | 1088 | RDATAC: | MOV | A,#0FCH | |
| 025F | 51 | 1089 | | ANL | @R1,A | |
| 0260 | A1 | 1090 | | MOV | @R1,A | |
| 0261 | B900 | 1091 | | MOV | R1,#UARTIO | ; OPEN UART IO |
| 0263 | 81 | 1092 | | MOVX | A,@R1 | ; GET DATA |
| 0264 | AC | 1093 | | MOV | R4,A | ; SAVE BYTE |
| 0265 | B821 | 1094 | | MOV | R0,#CKSM | ; GET CHECKSUM PTR |
| 0267 | 60 | 1095 | | ADD | A,@R0 | ; TALLY CHECKSUM |
| | | 1096 | | MOV | @R0,A | |
| | | 1097 | | INC | R7 | ; INCREMENT WORD COUNT |
| 0268 | A0 | 1098 | | MOV | A,#XRAM | ; OPEN RAM |

| LOC | OBJ | LINE | | SOURCE | STATEMENT | | |
|---|---|---|---|---|---|---|---|
| | | 1099 | | | | | |
| 0269 | F5 | 1100 | | SEL | MB1 | ; PATCH IN MB1 | |
| 026A | 848C | 1101 | RDATAH: | JMP | RDATAF | ; SEE PAGE C IN MEM. BANK 1 | |
| 026C | 3A | 1102 | | OUTL | P2,A | | |
| 026D | FF | 1103 | | MOV | A,R7 | ; GET WORD COUNT | |
| 026E | 1274 | 1104 | | JB0 | CASE1 | ; CASE RECEIVE WORD COUNT OF | |
| 0270 | 3289 | 1105 | | JB1 | CASE2 | | |
| 0272 | 4492 | 1106 | | JMP | CASE3 | | |
| 0274 | 53FE | 1107 | CASE1: | ANL | A,#MCASE | ; 1: GET MESSAGE TYPE | |
| 0276 | 9692 | 1108 | | JNZ | CASE3 | | |
| 0278 | FD | 1109 | | MOV | A,R5 | | |
| 0279 | 537F | 1110 | | ANL | A,#7FH | | |
| 027B | AD | 1111 | | MOV | R5,A | | |
| 027C | FC | 1112 | | MOV | A,R4 | | |
| 027D | 3281 | 1113 | | JB1 | TYPE2 | ; IF TYPE2 THEN | |
| 027F | 44A9 | 1114 | | JMP | STORE | | |
| 0281 | 1249 | 1115 | TYPE2: | JB0 | STORE | ; SET LONG FORM FLAG | |
| 0283 | FD | 1116 | | MOV | A,R5 | | |
| 0284 | 4380 | 1117 | | ORL | A,#80H | | |
| 0286 | AD | 1118 | | MOV | R5,A | | |
| 0287 | 44A9 | 1119 | | JMP | STORE | ; ENDIF | |
| 0289 | 53FD | 1119 | CASE2: | ANL | A,#0FDH | | |
| 028B | 9692 | 1120 | | JNZ | CASE3 | | |
| 028D | FD | 1121 | | MOV | A,R5 | | |
| 028E | F2A9 | 1122 | | JB7 | STORE | ; 2: IF NOT LONG-FORM THEN | |
| 0290 | 4499 | 1123 | | JMP | EOM | ; END OF MESSAGE | |
| | | 1124 | | | | ; ELSE | |
| | | 1125 | | | | ; CONTINUE RECEIVE | |
| | | 1126 | ; | | | ; ENDIF | |
| 0292 | 8802 | 1127 | CASE3: | MOV | R0,#LENGTH | ; 3-N: | |
| 0294 | 80 | 1128 | | MOVX | A,@R0 | ; IF WORD COUNT >= LENGTH THEN | |
| 0295 | 37 | 1129 | | CPL | A | | |
| 0296 | 6F | 1130 | | ADD | A,R7 | | |
| 0297 | E6A9 | 1131 | | JNC | STORE | | |
| | | 1132 | | | | ; END OF MESSAGE | |
| | | 1133 | ; | | | ; ENDIF | |
| | | 1134 | ; | | | ; ENDCASE | |
| 0299 | 8821 | 1135 | EOM: | MOV | R0,#CKSM | ; IF EOM | |
| 029B | 10 | 1136 | | INC | @R0 | | |
| 029C | F0 | 1137 | | MOV | A,@R0 | ; GET CHECKSUM | |
| 029D | BE00 | 1138 | | MOV | R6,#XIDLE AND 0FFH | ; INITIALIZE REC. | |
| 029F | C6A5 | 1139 | | JZ | REQ | ; IF CHECKSUM ERROR THEN | |
| | | 1140 | ; | | | ; WAIT FOR QUIET TIME | |
| 02A1 | BE01 | 1141 | ERRSET: | MOV | R6,#XWAIT AND 0FFH | | |
| 02A3 | 44B5 | 1142 | | JMP | RDATAE | | |
| 02A5 | 2301 | 1143 | | MOV | A,#REQ1 | ; ELSE | |
| | | 1144 | REQ: | | | ; SET RECEIVE PROCESS AND DIG IN | |
| 02A7 | 4D | 1144 | | ORL | A,R5 | ; ENDIF | |
| 02A8 | AD | 1145 | | MOV | R5,A | ; ELSE | |
| | | 1146 | ; | | | | |

```
LOC    OBJ            LINE         SOURCE STATEMENT
02A9   B822           1147  STORE: MOV    R0,#TSMPTR           ;  GET TRANSMISSION PTR
02AB   10             1148         INC    @R0                  ;  INCREMENT PTR
02AC   F0             1149         MOV    A,@R0
02AD   53C0           1150         ANL    A,#0C0H
02AF   9645           1151         JNZ    RDATAE
02B1   F0             1152         MOV    A,@R0
02B2   A8             1153         MOV    R0,A
02B3   FC             1154         MOV    A,R4                 ;  GET BYTE
02B4   90             1155         MOVX   @R0,A                ;  QUEUE BYTE
                      1156  ;                                    ENDIF
02B5   4412           1157  RDATAE: JMP   TXEND                ; ENDIF
                      1158  $EJECT
                      1159  ;1. TITLE
                      1160  ;          SEND--TRANSMIT ROUTINE
                      1161  ;    NOTE:  THIS ROUTINE ASSUMES WORD COUNT, TRANSMISSION PTR ,CKSM
                      1162  ;           ARE PRESET.  ONLY WORD COUNT IS SET BY THE TRANSMISSION FORMATER
                      1163  ;2.  CALL AND RETURN
                      1164  ;     INPUTS      UART OPEN, R1=STATUS REGISTER, F1=0 => 2 BYTE MESSAGE
                      1165  ;                 WITH NO "P" BYTE
                      1166  ;
                      1167  ;     OUTPUTS     BYTE SENT WHEN READY
                      1168  ;
                      1169  ;     RETURN
                      1170  ;3.  CALLED ROUTINES
                      1171  ;4.  EQUATES
                      1172  ;***********************************************************************
                      1173  ;
                      1174  ;
02B7   81             1175  SEND:  MOVX   A,@R1                ;GET STATUS BYTE
02B8   37             1176         CPL    A
02B9   12CD           1177         JB0    SNDEND               ;IF UART READY THEN
02BB   B823           1178         MOV    R0,#TDELAY           ;  INCREMENT DELAY TIMER
02BD   10             1179         INC    @R0
02BE   F0             1180         MOV    A,@R0
02BF   96CD           1181         JNZ    SNDEND
02C1   23DF           1182         MOV    A,#0DFH              ;IF TIMER EXPIRED THEN
02C3   A0             1183         MOV    @R0,A                ;  RESET TIMER FOR 4.5 MS. TOTAL
02C4   F496           1184         CALL   GETBYT               ;  GET BYTE
02C6   B900           1185         MOV    R1,#UARTIO           ;  GET DATA PTR
02C8   91             1186         MOVX   @R1,A                ;  SEND DATA
02C9   B821           1187         MOV    R0,#CKSM             ;  GET CHECKSUM PTR
02CB   60             1188         ADD    A,@R0                ;  TALLY CHECKSUM
02CC   A0             1189         MOV    @R0,A                ;  ENDIF
                      1190  ;                                   ENDIF
02CD   4412           1191  SNDEND: JMP   TXEND
                      1192  $EJECT
                      1193  ;1. TITLE
                      1194  ;          SRTS--SET REQUEST TO SEND
```

```
LOC   OBJ           LINE          SOURCE STATEMENT
                    1195  ;2. CALL AND RETURN
                    1196  ;         INPUTS      UART OPEN, R1=STATUS REGISTER
                    1197  ;
                    1198  ;         OUTPUTS     ENABLE OUTPUTS AND SET CTS DELAY IF RS232
                    1199  ;
                    1200  ;3. CALLED ROUTINES
                    1201  ;4. EQUATES
0027                1202  RTSREQ EQU     RTS+RXE+TXEN       ;RTS REQUEST
                    1203  ;*********************************************************
                    1204  ;
                    1205  ;
02CF 2327           1206  SRTS:     MOV     A,#RTSREQ        ;ENABLE RTS
02D1 91             1207            MOVX    @R1,A
02D2 2380           1208            MOV     A,#XRAM          ;OPEN RAM
02D4 3A             1209            OUTL    P2,A
02D5 B824           1210            MOV     R0,#LINE         ;SET LINE
02D7 2307           1211            MOV     A,#7
02D9 50             1212            ANL     A,@R0
02DA 3E             1213            MOVD    P6,A
02DB B820           1214            MOV     R0,#ADDRES       ;GET ADDRESS
02DD F0             1215            MOV     A,@R0
02DE 12E4           1216            JB0     SRS232           ;IF RS422 THEN
02E0 BE04           1217  RTS422:   MOV     R6,#XSEND AND 0FFH ; ENABLE SEND
02E2 44E6           1218            JMP     RTSEND           ;ELSE
02E4 04E6           1219  SRS232:   JMP     RPT232           ; ENABLE CTS WAIT
                    1220  ; SEE REPEATER PATCH
02E6 B821           1221  RTSEND:   MOV     R0,#CKSM         ;ENDIF
02E8 27             1222            CLR     A                ;CLEAR CKSM
02E9 A0             1223            MOV     @R0,A
02EA 18             1224            INC     R0
02EB A0             1225            MOV     @R0,A            ;CLEAR TSM PTR
02EC 4412           1226            JMP     TXEND
                    1227  $EJECT
                    1228  ;1. TITLE  CTSCHK--CHECK CLEAR TO SEND
                    1229  ;
                    1230  ;2. CALL AND RETURN
                    1231  ;         INPUTS      UART OPEN, R1=UARTCS
                    1232  ;
                    1233  ;         OUTPUTS     CTS CHECKED AND SEND ENABLED IF READY
                    1234  ;
                    1235  ;3. CALLED ROUTINES
                    1236  ;4. EQUATES
                    1237  ;*********************************************************
                    1238  ;
                    1239  ;
02EE 81             1240  CTSCHK:   MOVX    A,@R1            ;GET STATUS
02EF F2F3           1241            JB7     CTSCK1           ;IF CTS THEN
02F1 44F5           1242            JMP     CTSEND
```

```
LOC   OBJ        LINE        SOURCE STATEMENT
02F3  BE04       1243  CTSCK1: MOV    R6,#XSEND AND 0FFH      ; ENABLE SEND
02F5  4412       1244  CTSEND: JMP    TXEND                   ;ENDIF
                 1245  $EJECT
                 1246  ;1. TITLE
                 1247  ;        RRCHK--RECEIVER READY CHECK
                 1248  ;2.  CALL AND RETURN
                 1249  ;        INPUTS   UART OPEN, R1=UARTCS
                 1250  ;
                 1251  ;        OUTPUTS
                 1252  ;                 RR CHECKED AND RECEIVE ENABLED IF READY
                 1253  ;3.  CALLED ROUTINES
                 1254  ;4.  EQUATES
                 1255  ;***********************************************************
                 1256  ;
                 1257  ;
02F7  81         1258  RRCHK:  MOVX   A,@R1                   ;GET STATUS
02F8  F2FC       1259          JB7    RRCHK1                  ;IF RR THEN
02FA  44FE       1260          JMP    RREND
02FC  BE02       1261  RRCHK1: MOV    R6,#XREC AND 0FFH       ; ENABLE RECEIVE
02FE  4412       1262  RREND:  JMP    TXEND
                 1263  $EJECT
                 1264  ;
                 1265  ;##########################################################
                 1266  ;
0300             1267          ORG    0300H
                 1268  ;1. TITLE
                 1269  ;        RECV--RECEIVE PROCESS ROUTINE
                 1270  ;        ALL RECEIVED MESSAGES ARE PROCESSED BY THE RECEIVE PROCESS
                 1271  ;        ROUTINE AFTER THE TOTAL MESSAGE IS RECEIVED. MESSAGES COME IN 4
                 1272  ;        TYPES:  0: LINE SWITCH
                 1273  ;                1: POLL
                 1274  ;                2: LONG FORM
                 1275  ;                3: REPEAT
                 1276  ;        MESSAGES 0,1,3 HAVE 2 BYTE FORMATS WITH THE SECOND BYTE BEING THE
                 1277  ;        COMPLEMENT (1'S) OF THE FIRST BYTE
                 1278  ;                TYPE                                        BIT
                 1279  ;                 0       ABXXXX00=> A(B): SWITCH TO A(B), X: UNASSIGNED
                 1280  ;                 1       MMMMML01=> M: MODULE ADDRESS IN BINARY
                 1281  ;                                    L: LINE  0=A, 1=B
                 1282  ;                 3       MMMMML11=> M: MODULE ADDRESS IN BINARY
                 1283  ;        MESSAGE TYPE 2 HAS A VARIABLE LENGTH FORMAT DEFINED ACCORDING TO
                 1284  ;        BYTE                          DEFINITION
                 1285  ;        1.3.........63.             C:CONTROL BYTE  0MMMML10
                 1286  ;        CLE.....MSG......P          L:LENGTH => LENGTH OF MESSAGE-P
                 1287  ;                                    E:CONTROL EXTENSION
                 1288  ;                                             0: COS
                 1289  ;                                             1: DEMAND
                 1290  ;
```

```
LOC  OBJ        LINE        SOURCE STATEMENT

1291  ;                                      2: COMMAND RELAYS
                1292  ;                                      3: NO RESPONSE (INTER PROCESSOR)
                1293  ;                                      4: DOWN LINE LOAD
                1294  ;                                      5: UP LINE LOAD
                1295  ;                                      6: COMMAND ANALOG OUTPUT (CPA)
                1296  ;                                      7: DIAGNOSTIC
                1297  ;                                      8: SELF RESET
                1298  ;2. CALL AND RETURN
                1299  ;       INPUTS    RAM OPEN, MESSAGE IN REC BUFFER
                1300  ;
                1301  ;       OUTPUTS   OUTPUT FORMATTED (AS REQUESTED)
                1302  ;
                1303  ;       RETURN
                1304  ;3. CALLED ROUTINES
0300 71         1305  CE:       DB   REC1 AND 0FFH           ;0: COS--SET RECEIVE MODE
0301 18         1306            DB   XCOSFM AND 0FFH         ;1: DEMAND--SET COS FORMAT
0302 16         1307            DB   XRELAY AND 0FFH         ;2: COMMAND RELAY--SET UP RELAY COMMAND
0303 71         1308            DB   REC1 AND 0FFH           ;3: NO RESPONSE--SET UP RECEIVE MODE
0304 8D         1309            DB   PRGRAM AND 0FFH         ;4: DOWN LINE LOAD--SET PROGRAM
0305 73         1310            DB   UPLINE AND 0FFH         ;5: UPLINE LOAD--UP LINE LOAD
0306 14         1311            DB   XCPA AND 0FFH           ;6: COMMAND CPA--SET CPA VALUE
0307 12         1312            DB   XDIAG AND 0FFH          ;7: DIAGNOSTIC
0308 10         1313            DB   HWRES AND 0FFH          ;8: HARDWARE RESET
0309 71         1314            DB   REC1 AND 0FFH           ;9: COS DIGITAL ONLY--SET RECEIVE MODE
030A 71         1315            DB   REC1 AND 0FFH           ;10:COS ANALOG ONLY--SET RECEIVE MODE
030B 71         1316            DB   REC1 AND 0FFH           ;11: SPARE
030C 71         1317            DB   REC1 AND 0FFH           ;12: SPARE
030D 71         1318            DB   REC1 AND 0FFH           ;13: SPARE
030E 71         1319            DB   REC1 AND 0FFH           ;14: SPARE
030F 71         1320            DB   REC1 AND 0FFH           ;15: SPARE
                1321  ;NOTE: CONTROL EXTENSIONS E0H THRU' FFH ARE RESERVED FOR GERMAN-DDC
                1322  ;        PROJECT
                1323  ;**************************************************************
0310 0400       1324  HWRES:    JMP   0                      ;HARDWARE RESET
0312 6471       1325  XDIAG:    JMP   REC1
0314 C422       1326  XCPA:     JMP   CPA
0316 A402       1327  XRELAY:   JMP   RELAY
0318 643F       1328  XCOSFM:   JMP   COSFMA
                1329  ;4. EQUATES
000F            1330  CENUM     EQU   0FH                    ;NUMBER OF CONTROL EXTENSIONS
                1331  ;**************************************************************
                1332  ;
                1333  ;
031A 8801       1334  RECV:     MOV   R0,#MSG                ;GET MESSAGE START
031C 80         1335            MOVX  A,@R0
031D 1225       1336            JB0   TYP1                   ;CASE OF MESSAGE TYPE OF
031F 3242       1337            JB1   TYP2                   ;       0: SWITCH LINES
0321 F411       1338  TYP0:     CALL  LINESW
```

| LOC | OBJ | LINE | | SOURCE STATEMENT | | |
|---|---|---|---|---|---|---|
| 0323 | 6471 | 1339 | | JMP | REC1 | |
| 0325 | 324E | 1340 | TYP1: | JB1 | TYP3 | ; 1: IF ADDRESS MATCH THEN |
| 0327 | F48E | 1341 | | CALL | ADDX | |
| 0329 | 3265 | 1342 | | JB1 | TYP4 | |
| 032B | 9671 | 1343 | | JNZ | REC1 | |
| 032D | FD | 1344 | | MOV | A,R5 | ;IF R5 BIT 6 SET SEND I'M OK BACK |
| 032E | 5340 | 1345 | | ANL | A,#40H | ;ELSE PROCESS NORMALLY |
| 0330 | 9665 | 1346 | | JNZ | TYP4 | |
| 0332 | F5 | 1347 | | SEL | MB1 | |
| 0333 | D400 | 1348 | | CALL | DIG | ;DI#1 THROUGH #24 |
| 0335 | 7414 | 1349 | | CALL | FSSTAT | ;FOR F&S COS |
| 0337 | E5 | 1350 | | SEL | MB0 | |
| 0338 | B929 | 1351 | | MOV | R1,#COSBUF | |
| 033A | F1 | 1352 | | MOV | A,@R1 | |
| 033B | B271 | 1353 | | JB5 | REC1 | |
| 033D | C665 | 1354 | | JZ | TYP4 | |
| 033F | F5 | 1355 | COSFMA: | SEL | MB1 | ; SELECT MB1 |
| 0340 | C480 | 1356 | | JMP | CUSFM | |
| 0342 | F4AE | 1357 | TYP2: | CALL | ADDX | ; 2: IF ADDRESS MATCH THEN |
| 0344 | 3262 | 1358 | | JB1 | TYP6 | |
| 0346 | 9671 | 1359 | | JNZ | REC1 | |
| 0348 | B803 | 1360 | | MOV | R0,#EXT | ; GET CONTROL EXTENSION |
| 034A | B0 | 1361 | | MOVX | A,@R0 | |
| 034B | 530F | 1362 | | ANL | A,#CENUM | |
| 034D | B3 | 1363 | | JMPP | @A | ; EXECUTE EXTENSION ROUTINE |
| | | 1364 | ; | | | ENDIF |
| 034E | F4BE | 1365 | TYP3: | CALL | ADDX | ; 3: IF ADDRESS MATCH THEN |
| 0350 | 9671 | 1366 | | JNZ | REC1 | |
| 0352 | B800 | 1367 | | MOV | R0,#TSMBUF | |
| 0354 | 80 | 1368 | | MOVX | A,@R0 | |
| 0355 | AA | 1369 | | MOV | R2,A | |
| 0356 | BAFE | 1370 | | MOV | R3,#0FEH | ; GET LAST MESSAGE LENGTH |
| 0358 | EA5C | 1371 | | DJNZ | R2,TYP5 | |
| 035A | BAFD | 1372 | | MOV | R3,#0FDH | ; IF POLL LAST MESSAGE THEN |
| 035C | B801 | 1373 | TYP5: | MOV | R0,#MSG | ; GET ADDRESS BYTE |
| 035E | 80 | 1374 | | MOVX | A,@R0 | |
| 035F | 5B | 1375 | | ANL | A,R3 | |
| 0360 | 90 | 1376 | | MOVX | @R0,A | ; SET POLL FORMAT |
| 0361 | 1A | 1377 | | INC | R2 | |
| 0362 | FA | 1378 | TYP6: | MOV | A,R2 | ; ENDIF |
| 0363 | 6467 | 1379 | | JMP | RECVE | |
| 0365 | 2301 | 1380 | TYP4: | MOV | A,#1 | |
| | | 1381 | ; | | | |
| | | 1382 | ; | | | ENDCASE |
| | | 1383 | ; | | | |
| 0367 | B802 | 1384 | RECVE: | MOV | R0,#LENGTH | ;SET LENGTH |
| 0369 | B900 | 1385 | | MOV | R1,#TSMBUF | ;GET LENGTH RECORD PTR |
| 036B | 91 | 1386 | | MOVX | @R1,A | |

```
LOC    OBJ          LINE   SOURCE STATEMENT
036C   90           1387          MOVX  @R0,A
036D   17           1388          INC   A
036E   AF           1389          MOV   R7,A
036F   BE03         1390          MOV   R6,#XRTS AND 0FFH
0371   840F         1391   REC1:  JMP   EXEC
                    1392   ;###############################################################
                    1393   $EJECT
                    1394   ;1. TITLE
                    1395   ;      UPLINE--UPLINE LOAD OF DATA FILE
                    1396   ;
                    1397   ;2.    CALL AND RETURN
                    1398   ;      INPUTS   RAM OPEN, MESSAGE PER: BYTE0 => QUADRANT
                    1399   ;                                      BYT1 => STARTING BYTE
                    1400   ;      OUTPUTS  DATA FILE TRANSFERED TO MESSAGE
                    1401   ;
                    1402   ;      RETURN
                    1403   ;3.    CALLED ROUTINES
                    1404   ;--DATA
                    1405   ;
                    1406   ;      INPUT    R0=PTR TO BYTE AND QUADRANT
                    1407   ;
                    1408   ;      OUTPUT   A=DATA BYTE
                    1409   ;
                    1410   ;4.    EQUATES
0020                1411   XFERCT EQU   32
0025                1412   LEN    EQU   37
                    1413   ;***************************************************************
                    1414   ;
                    1415   ;
0373   8906         1416   UPLINE: MOV  R1,#INFO+2            ;NUMBER OF BYTES IN MESSAGE
0375   BA20         1417          MOV   R2,#XFERCT            ;LENGTH OF MESSAGE
0377   8804         1418          MOV   R0,#INFO              ;GET PTR TO NEW MSG
0379   80           1419          MOVX  A,@R0                 ;GET TRANSFER COUNT
037A   5307         1420          ANL   A,#7
037C   AB           1421          MOV   R3,A                  ;GET QUADRANT
037D   8805         1422   LOAD:  MOV   R0,#INFO+1
037F   80           1423          MOVX  A,@R0                 ;DO WHILE COUNT
0380   17           1424          INC   A
0381   90           1425          MOVX  @R0,A                 ; GET BYTE PTR
0382   14CD         1426          CALL  DATA
0384   FC           1427          MOV   A,R4                  ; GET BYTE
0385   91           1428          MOVX  @R1,A                 ; STORE BYTE
0386   19           1429          INC   R1                    ; INCREMENT DATA PTR
0387   EA7D         1430          DJNZ  R2,LOAD               ;ENDWHILE
0389   2325         1431          MOV   A,#LEN                ;SET MESSAGE LENGTH
038B   6467         1432          JMP   RECVE                 ;SEND MESSAGE
                    1433   $EJECT
                    1434   ;1. TITLE
```

```
LOC    OBJ              LINE        SOURCE STATEMENT
                        1435   ;                PRGRAM--PROGRAM DATA FILE.  NOTE:  WHEN BURNING DATA FILE ALL
                        1436   ;                OTHER CONTROL OPERATIONS OF THE 540 CEASE.
                        1437   ;                THE PROGRAM MESSAGE HAS THE FOLLOWING FORMAT:
                        1438   ;                        BYTE    FORMAT
                        1439   ;                         0      0000QQQQ        Q:QUADRANT ADDRESS
                        1440   ;                         1      AAAAAAAA        A:ADDRESS TO PROGRAMMED
                        1441   ;                         2      DDDDDDDD        D:DATA TO BE PROGRAMMED
                        1442   ;   2.  CALL AND RETURN
                        1443   ;           INPUTS    RAM OPEN
                        1444   ;
                        1445   ;           OUTPUTS   PROM PROGRAMMED
                        1446   ;
                        1447   ;           RETURN
                        1448   ;   3.  CALLED ROUTINES
                        1449   ;  --DATA
                        1450   ;           INPUTS    R0=PTR TO BYTE, QUADRANT
                        1451   ;
                        1452   ;           OUTPUTS   A=BYTE, R1 RESTORED
                        1453   ;
                        1454   ;   4.  EQUATES
0090                    1455   T50MS    EQU     90H             ;50 MS TIME OUT
0006                    1456   PROGL    EQU     6               ;LENGTH OF PROGRAM MESSAGE
                        1457   ;***********************************************************************
                        1458   ;
                        1459   ;
03AD 15                 1460   PRGRAM:  DIS     I               ;DISABLE INTERRUPTS, REV.6-6-80
03AE 35                 1461            DIS     TCNTI           ; DISABLE TIMER INT.
03AF 2340               1462            MOV     A,#40H          ; SET BIT 6 OF R5,PROM BURN FLAG
03B1 40                 1463            ORL     A,R5            ; REV. 10-3-80
03B2 AD                 1464            MOV     R5,A
03B3 B904               1465            MOV     R1,#INFO
03B5 B1                 1466            MOVX    A,@R1           ;GET INFO PTR
03B6 5307               1467            ANL     A,#7            ;GET BYTE QUADRANT
03B8 AB                 1468            MOV     R3,A
03B9 19                 1469            INC     R1              ;SAVE BYTE QUADRANT
03BA 81                 1470            MOVX    A,@R1           ;GET BYTE PTR
03BB AA                 1471            MOV     R2,A            ;SAVE BYTE PTR
03BC 19                 1472            INC     R1              ;GET BYTE
03BD 81                 1473            MOVX    A,@R1           ;GET BYTE
03BE AC                 1474            MOV     R4,A
03BF 2301               1475            MOV     A,#1
03C1 3F                 1476            MOVD    P7,A
03C2 FA                 1477            MOV     A,R2            ;GET BYTE ADDRESS
03C3 02                 1478            OUTL    BUS,A           ;SET BYTE ADDRESS
03C4 2340               1479            MOV     A,#40H          ;TURN ON 25 V AND DISABLE RAM.
03C6 3A                 1480            OUTL    P2,A
03C7 FC                 1481            MOV     A,R4
03C8 02                 1482            OUTL    BUS,A           ;SET BYTE TO PROGRAM
```

```
LOC   OBJ         LINE    SOURCE STATEMENT
03A9  FB          1483        MOV    A,R3
03AA  4370        1484        ORL    A,#PROG
03AC  3A          1485        OUTL   P2,A                    ;PROGRAM BYTE
03AD  27          1486        CLR    A
03AE  14D8        1487        CALL   BURNT                   ;START 50 MS PROGRAM
03B0  14D8        1488        CALL   BURNT                   ;PROGRAM IT
03B2  14D8        1489        CALL   BURNT
03B4  237F        1490        MOV    A,#7FH                  ;TO GIVE TOTAL 50MS DELAY
03B6  14D8        1491        CALL   BURNT
03B8  2380        1492        MOV    A,#XRAM                 ;OPEN RAM AND STOP PROGRAMMING
03BA  3A          1493        OUTL   P2,A
03BB  2376        1494        MOV    A,#76H
03BD  3F          1495        MOVD   P7,A
                  1496    ;
                                                             ; TURN OFF CR20,CR21 AND 24V.
                                                             ; AND PROGRAM DELAY OF
                                                             ;10MS. POST BURN DELAY
03BE  14D8        1497        CALL   BURNT                   ;POST BURN DELAY
03C0  FA          1498        MOV    A,R2                    ;GET BYTE ADDRESS
03C1  14CD        1499        CALL   DATA                    ;GET BYTE
03C3  FC          1500        MOV    A,R4
03C4  91          1501        MOVX   @R1,A                   ;SEND VERIFY BYTE
03C5  2380        1502        MOV    A,#XRAM                 ;SAVE IT IN XMSN BUFFER
03C7  F40A        1503        CALL   OFF                     ;DISABLE RELAY DRIVERS
03C9  23A0        1504        MOV    A,#RLYB1
03CB  F40A        1505        CALL   OFF                     ;TURN OFF ALL DRIVERS AFTER PROM BURN
03CD  2380        1506        MOV    A,#XRAM
03CF  3A          1507        OUTL   P2,A                    ;OPEN RAM PORT
03D0  2306        1508        MOV    A,#PROGL
03D2  6467        1509        JMP    RECVE                   ;SEND THE MESSAGE
                  1510    ;
                  1511    ;
                  1512    ;
                  1513    ;                                  FILL-IN CODE
                  1514    ;
03D4  FF
03D5  FF
03D6  FF
03D7  FF
03D8  FF
03D9  FF          1515        DB     0FFH,0FFH,0FFH,0FFH,0FFH      ; 3D3H-3DFH
03DA  FF
03DB  FF
03DC  FF
03DD  FF
03DE  FF
03DF  FF
03E0  FF
03E1  FF
03E2  FF          1516        DB     0FFH,0FFH,0FFH,0FFH,0FFH,0FFH,0FFH,0FFH ; 3E0H-3EFH
03E3  FF
03E4  FF
```

```
LOC   OBJ              LINE      SOURCE STATEMENT

03E5  FF
03E6  FF
03E7  FF
03E8  FF
03E9  FF               1517      DB        0FFH,0FFH,0FFH,0FFH,0FFH,0FFH,0FFH
03EA  FF
03EB  FF
03EC  FF
03ED  FF
03EE  FF
03EF  FF
03F0  FF
03F1  FF               1518      DB        0FFH,0FFH,0FFH,0FFH,0FFH,0FFH,0FFH,0FFH,0FFH ; 3F0H-3FAH
03F2  FF
03F3  FF
03F4  FF
03F5  FF
03F6  FF
03F7  FF
03F8  FF
03F9  FF               1519      DB        0FFH,0FFH,0FFH
03FA  FF
03FB  FF

1520      ;
                       1521      $EJECT
03FB                   1522                ORG       3F8H
03FB  FF               1523                DB        0FFH              ;DATA FILE TERMINATOR
03FC  47               1524      REV:      DB        'G'               ;REV. LETTER OF 540 ASSEMBLY
03FD  02               1525      DATE:     DB        02H,04H,81H       ;DATE FEB. 04, 1981
03FE  04
03FF  81

1526      $EJECT
                       1527      ;1. TITLE                                              COMMENT
                       1528      ;         EXEC--REAL TIME EXECUTIVE THAT CONTROLS TASK INITIATION IN THE 540
                       1529      ;         DGP.  THE EXEC SCHEDULES TASKS ON A REQUEST BASIS AND ON A POLLED
                       1530      ;         BASIS.  THE POLLED ROUTINES ARE CRITICAL TO EXECUTE OFTEN (WITHIN
                       1531      ;         1 MS) AND MUST EXECUTE QUICKLY.
                       1532      ;                   POLLED ROUTINE
                       1533      ;                   TSM                 TRANSMISSION HANDLER
                       1534      ;                   WATCH               WATCH DOG TIMER
                       1535      ;         THE REQUEST BASIS IS USED TO SCHEDULE TIME OR EVENT DRIVEN ROUTINES
                       1536      ;         REGISTER 5 IS DESIGNATED THE TASK REQUEST BUFFER. UP TO 5 TASKS
                       1537      ;         CAN BE INITIATED BY REQUEST.  ONE TASK IS EXECUTED PER EXEC LOOP.
                       1538      ;         THESE TASKS ARE PRIORITIZED ON A FIXED BASIS FROM RIGHT TO LEFT IN
                       1539      ;         THE TASK REQUEST BUFFER.  THE TASKS ARE DEFINED AS BELOW:
                       1540      ;                   TASK REQUEST BUFFER => 76543210
                       1541      ;                                          7:   ASSIGNED FOR 'REC' ROUTINE
                       1542      ;                                          6:   ASSIGNED FOR PROM-BURN FLAG
```

| LOC | OBJ | LINE | | SOURCE STATEMENT | |
|---|---|---|---|---|---|
| | | 1543 | ; | | ASSIGNED FOR DDC RE. OCT.3,80 |
| | | 1544 | ; | 5: | EIP=> 2 SECOND EVENT PROGRAM |
| | | 1545 | ; | 4: | A/D CONVERT => SCHEDULED BY INTERRUPT |
| | | 1546 | ; | | DRIVEN CONVERTER ROUTINE |
| | | 1547 | ; | 3: | RELAY ACTIVATE => SCHEDULED BY RELAY |
| | | 1548 | ; | | COMMAND |
| | | 1549 | ; | 2: | TOTALIZER => SCHEDULED BY WATCH DOG |
| | | 1550 | ; | | AND BY ITSELF |
| | | 1551 | ; | 1: | TRANSMISSION PROCESS => SCHED- |
| | | 1552 | ; | | ULED BY RECEIVED TSM. |
| | | 1553 | ; | 0: | AN INTERRUPT DRIVEN CLOCK AND A/D CONVERSION ROUTINE IS USED FOR TIME |
| | | 1554 | ; | | KEEPING, DELAYS, AND CONVERSION. THIS ROUTINE IS USED TO SCHEDULE |
| | | 1555 | ; | | THE CONVERT ROUTINE |
| | | 1556 | ;2. | | CALL AND RETURN |
| | | 1557 | ; | | INPUTS |
| | | 1558 | ; | | OUTPUTS |
| | | 1559 | ; | | RETURN |
| | | 1560 | ;3. | | CALLED ROUTINES |
| 0400 | | 1561 | | ORG | 400H |
| 0400 641A | | 1562 | TASK0: | JMP | RECV ; PROCESS RECEIVE TRANSMISSION |
| 0402 843F | | 1563 | TASK1: | JMP | TOTAL ; TOTALIZER |
| 0404 8471 | | 1564 | TASK2: | JMP | RLY ; RELAY TIMER |
| 0406 C400 | | 1565 | TASK3: | JMP | AD ; A/D CONVERT |
| 0408 C46E | | 1566 | TASK4: | JMP | EIPP ; EIP PROGRAMS |
| | | 1567 | ;4. | EQUATES | |
| 00FF | | 1568 | MASK1 | EQU | 0FFH |
| 040A FE | | 1569 | BITMSK: | DB | 11111110B |
| 040B FD | | 1570 | | DB | 11111101B |
| 040C FB | | 1571 | | DB | 11111011B |
| 040D F7 | | 1572 | | DB | 11110111B |
| 040E EF | | 1573 | | DB | 11101111B |
| | | 1574 | ;************************************************************ |
| | | 1575 | ; |
| | | 1576 | ; |
| 040F 5407 | | 1577 | EXEC: | CALL | TSM |
| 0411 2380 | | 1578 | | MOV | A,#XRAM ;OPEN RAM PORT |
| 0413 3A | | 1579 | | OUTL | P2,A |
| 0414 9449 | | 1580 | | CALL | WATCH |
| 0416 B8FF | | 1581 | TASKRQ: | MOV | R3,#0FFH |
| 0418 FD | | 1582 | | MOV | A,R5 ; IF R5 BIT6 IS SET DISABLE ALL EXEC. |
| 0419 5340 | | 1583 | | ANL | A,#40H ; TASKS, EXCEPT TASK0 |
| 041B C621 | | 1584 | | JZ | NTASK ; ELSE NORMAL FUCTIONS,10-3-80 |
| 041D 23C1 | | 1585 | | MOV | A,#0C1H ;CLEAR BITS 5 THRU 1 |
| 041F 5D | | 1586 | | ANL | A,R5 |
| 0420 AD | | 1587 | | MOV | R5,A |
| 0421 FD | | 1588 | NTASK | MOV | A,R5 ;GET TASK REQUEST |
| 0422 531F | | 1589 | TASK: | ANL | A,#1FH |
| 0424 C60F | | 1590 | | JZ | EXEC ;IF TASK REQUEST THEN |

```
LOC   OBJ       LINE         SOURCE STATEMENT
0426  67        1591              RRC   A                      ; GET TASK
0427  18        1592              INC   R3                     ;
0428  E622      1593              JNC   TASK
042A  FB        1594              MOV   A,R3                   ; GET TASK PTR
042B  030A      1595              ADD   A,#BITMSK AND OFFH     ; GET TASK REQ MASK
042D  A3        1596              MOVP  A,@A
042E  AB        1597              MOV   R3,A                   ; SAVE TASK DESIGNATOR
042F  5D        1598              ANL   A,R5                   ; RESET TASK REQUEST
0430  AD        1599              MOV   R5,A
0431  FB        1600              MOV   A,R3                   ; GET TASK TABLE BAS
0432  37        1601              CPL   A
0433  1200      1602              JB0   TASK0
0435  3202      1603              JB1   TASK1
0435  5204      1604              JB2   TASK2
0437  7206      1605              JB3   TASK3
0439  920A      1606              JB4   TASK4
                1607         ;                                 ENDIF
                1608         $EJECT
                1609         ;1. TITLE
                1610         ;        TOTAL--TOTALIZER
                1611         ;2. CALL AND RETURN
                1612         ;  --INPUT ONE PROCESSING
                1613         ;    INPUTS    TOTSCH--CURRENTLY PROCESSED TOTALIZER INPUT
                1614         ;              TOTASS--ASSIGNED TOTALIZERS
                1615         ;              TOTRUN--TOTALIZER-1, RUN TIME=0
                1616         ;              TOTLST--LAST STATUS OF INPUT (1 => "1" LAST TIME)
                1617         ;              TOTINC--PULSE TRANSITION TO 1 DEBOUNCE
                1618         ;              TOTACT--ACTIVE TOTALIZERS NEEDING COUNT (1=> COUNT)
                1619         ;              TOTTMR--RUN TIME DELAY 2.00 SEC
                1620         ;    OUTPUTS   TOTALIZER INCREMENTED WHEN COUNT
                1621         ;    RETURN
                1622         ;3. CALLED ROUTINES
                1623         ;  --ONE--INPUT ONE PROCESSING
                1624         ;    INPUTS    R0=TOTLST, R1=TOTINC, R2=VALUE, R3=POSITION MASK (TOTALIZER NUM);   OUTPUTS
                1625         ;                                                                                 ;TOTALIZER COS CHECK
                1626         ;              POINT INCREMENTED                                                  ;TOTALIZER INCREMENT ENTRY
                1627         ;**********************************************************************************
                1628         ;4. EQUATES
                1629         XTOT1:   DB    TOTAL1 AND OFFH
                1630         XTOT2:   DB    ONE AND OFFH
                1631         ;**********************************************************************************
                1632         ;
                1633         ;
043F  88F3      1634         TOTAL:  MOV   R0,#TOTSCH           ;GET TOTALIZER SCHEDULE PTR
0441  80        1635                 MOVX  A,@R0
0442  C649      1636                 JZ    TOTALA
0444  B3        1637                 JMPP  @A
                1638         ;
```

```
LOC  OBJ     LINE        SOURCE STATEMENT
0445 2302    1639 TOTALY: MOV   A,#2              ;SCHEDULE REENTR
0447 4D      1640         ORL   A,R5
0448 AD      1641         MOV   R5,A
0449 233E    1642 TOTALA: MOV   A,#XTOT2 AND 0FFH ;SCHEDULE TOTALIZER COS CHECK
044B 89F3    1643 TOTALX: MOV   R1,#TUTSCH        ;GET TOTALIZER SCHEDULE PTR
044D 91      1644         MOVX  @R1,A
044E 840F    1645 TOTALE: JMP   EXEC
             1646 ;
             1647 ;
0450 23C0    1648 TOTAL1: MOV   A,#DIGIN          ;GET DATA
0452 3A      1649         OUTL  P2,A
0453 09      1650         IN    A,P1
0454 37      1651         CPL   A
0455 AA      1652         MOV   R2,A
0456 2384    1653         MOV   A,#XRAM+4
0458 3A      1654         OUTL  P2,A
0459 3F      1655         MOVD  P7,A              ;TURN ON LED
045A 88F4    1656         MOV   R0,#TOTASS        ;GET TOTALIZER ASSIGNMENT PTR
045C H927    1657         MOV   R1,#TOTLST        ;GET LAST VALUE PTR
045E 80      1658         MOVX  A,@R0
045F 5A      1659         ANL   A,R2              ;UPDATE LAST VALUE
0460 21      1660         XCH   A,@R1             ;GET COS
0461 01      1661         XRL   A,@R1             ;GET NEW WAIT INPUT (INPUT * COS)
0462 51      1662         ANL   A,@R1             ;GET WAIT PTR
0463 R828    1663         MOV   R0,#TOTINC        ;UPDATE WAIT
0465 20      1664         XCH   A,@R0
0466 R82F    1665         MOV   R0,#TOTTMR        ;GET RUN TIME TIMER
0468 40      1666         ORL   A,@R0             ;GET WAIT OR RUN
0469 51      1667         ANL   A,@R1             ;GFT (WAIT OR RUN)*INPUT
046A A9F6    1668         MOV   R1,#TOTACT
046C 91      1669         MOVX  @R1,A             ;TOTALIZER PULSE ACTIVE=WAIT*INPUT OR
                                                        RUN*INPUT
046D 27      1671         CLR   A
046E A0      1672         MOV   @R0,A             ;RESET RUN TIME
046F 8445    1673         JMP   TOTALY
             1674 ;
             1675 $EJECT
             1676 ;1. TITLE   RLY--PULSED DRIVER ACTIVATION AND TIMING
             1677 ;    NOTE:  THE RELAY DELAY FILE CAN HOLD 8 CURRENTLY ACTIVE PULSED RELAYS.
             1678 ;           THE FILE IS ARRANGED AS:
             1679 ;                     BYTE            FUNCTION
             1680 ;                     EVEN            TIMER ENTRY1
             1681 ;                     ODD             RELAY ACTIVATION ENTRY FOR 'REGRLY'
             1682 ;2. CALL AND RETURN
             1683 ;   INPUTS   RLYSCH=ENTRY PT, RLYENT=NEXT RELAY TO PROCESS, RLYCT=INACTIVE COUNT
             1684 ;
             1685 ;   OUTPUTS
```

| LOC | OBJ | LINE | SOURCE STATEMENT | | |
|---|---|---|---|---|---|
| | | 1687 | ; | | |
| | | 1688 | ; | RETURN | RELAY PULSED FOR SPECIFIED TIME |
| | | 1689 | ;3. CALLED ROUTINES | | |
| | | 1690 | ;---REGRLY | | |
| | | 1691 | ; INPUTS | | |
| | | 1692 | ; | | A=LH10-ID- WHERE L=LOW DRIVER ACTIVATE, H=HIGH DRIVER ACTIVATE |
| | | 1693 | ; | | ID=DRIVER TO PULSE |
| | | 1694 | ; OUTPUTS | | |
| | | 1695 | ; | | RELAY ID SPECIFIED TURNED OFF |
| | | 1696 | ;4. EQUATES | | |
| | | 1697 | ;************************************************************ | | |
| | | 1698 | ; | | |
| | | 1699 | ; | | |
| 0471 B9F2 | | 1700 RLY: | MOV | R1,#RLYSCH | ;GET CURRENT ENTRY PT |
| 0473 81 | | 1701 | MOVX | A,@R1 | |
| 0474 968B | | 1702 | JNZ | RLY2 | |
| | | 1703 | ; | | |
| | | 1704 | ; | | |
| 0476 B82E | | 1705 RLY1: | MOV | R0,#RLYCT | ;GET COUNT |
| 0478 F0 | | 1706 | MOV | A,@R0 | |
| 0479 C6A7 | | 1707 | JZ | RLYE | ;IF RELAYS IN QUEUE THEN |
| 047B AA | | 1708 | MOV | R2,A | |
| 047C B8D0 | | 1709 | MOV | R0,#DIGDLY | |
| 047E 80 | | 1710 RLY1L: | MOVX | A,@R0 | ; DO WHILE COUNT AND NO EXPIRED TIMERS |
| 047F 07 | | 1711 | DEC | A | ; GET TIMER |
| 0480 90 | | 1712 | MOVX | @R0,A | ; DECREMENT TIMER |
| 0481 18 | | 1713 | INC | R0 | |
| 0482 C6A3 | | 1714 | JZ | RLYE1 | ; TEST EXPIRED |
| 0484 18 | | 1715 | INC | R0 | |
| 0485 EA7E | | 1716 | DJNZ | R2,RLY1L | ; ENDWHILE |
| 0487 8800 | | 1717 | MOV | R0,#0 | |
| 0489 84A3 | | 1718 | JMP | RLYE1 | ;ENDIF |
| | | 1719 | ; | | |
| | | 1720 | ; | | |
| 048B A8 | | 1721 RLY2: | MOV | R0,A | ;GET TIMER VALUE |
| 048C 80 | | 1722 | MOVX | A,@R0 | |
| 048D 846F | | 1723 | CALL | REGRLY | ;DO RELAY ACTION |
| 048F 2380 | | 1724 | MOV | A,#XRAM | ;OPEN RAM |
| 0491 3A | | 1725 | OUTL | P2,A | |
| 0492 B92E | | 1726 | MOV | R1,#RLYCT | |
| 0494 F1 | | 1727 | MOV | A,@R1 | ;GET RELAY COUNT |
| 0495 07 | | 1728 | DEC | A | ;DECREMENT ACTIVE RELAY COUNT |
| 0496 A1 | | 1729 | MOV | @R1,A | |
| 0497 E7 | | 1730 | RL | A | |
| 0498 03D1 | | 1731 | ADD | A,#DIGDLY+1 | |
| 049A A9 | | 1732 | MOV | R1,A | ;EXCHANGE SORT LAST AND CURRENT ENTRY |
| 049B 81 | | 1733 | MOVX | A,@R1 | ;GET LAST ENTRY |
| 049C 90 | | 1734 | MOVX | @R0,A | ;STORE IN CURRENTLY ACTIVATED ENTRY |

| LOC | OBJ | LINE | | SOURCE STATEMENT | | |
|---|---|---|---|---|---|---|
| 049D | C8 | 1735 | | DEC | R0 | |
| 049E | C9 | 1736 | | DEC | R1 | |
| 049F | 81 | 1737 | | MOVX | A,@R1 | |
| 04A0 | 90 | 1738 | | MOVX | @R0,A | |
| 04A1 | B800 | 1739 | | MOV | R0,#0 | |
| 04A3 | B9F2 | 1740 | RLYE1: | MOV | R1,#RLYSCH | |
| 04A5 | F8 | 1741 | | MOV | A,R0 | |
| 04A6 | 91 | 1742 | | MOVX | @R1,A | |
| 04A7 | 840F | 1743 | | JMP | EXEC | ;EXIT RELAY ROUTINE |
| | | 1744 | RLYE: | SEJECT | | |
| | | 1745 | ;1. | TITLE | | |
| | | 1746 | ; | WATCH--WATCHDOG TIMER | | |
| | | 1747 | ;2. | CALL AND RETURN | | |
| | | 1748 | ; | INPUTS | SECOND CLOCK | |
| | | 1749 | ; | | | |
| | | 1750 | ; | OUTPUTS | | |
| | | 1751 | ; | IF SECOND CLOCK STOPPED FOR LONGER THEN 2SEC MINIMUM THEN | | |
| | | 1752 | ; | THE SECOND CLOCK IS TICKED AND INTERRUPTS ENABLED. IF THE | | |
| | | 1753 | ; | 8 MS COUNT EXPIRES, THE TOTALIZER ROUTINE IS SCHEDULED. | | |
| | | 1754 | ; | RETURN | | |
| | | 1755 | ;3. | CALLED ROUTINES | | |
| | | 1756 | ; | EQUATES | | |
| | | 1757 | ;*************************************************************** | | | | |
| | | 1758 | ; | | | |
| | | 1759 | ; | | | |
| 04A9 | B82B | 1760 | WATCH: | MOV | R0,#WATCHD | ;GET WATCHDOG TIMER PTR |
| 04AB | 10 | 1761 | | INC | @R0 | |
| 04AC | F0 | 1762 | | MOV | A,@R0 | ;GET WATCHDOG TIMER |
| 04AD | 96C9 | 1763 | | JNZ | WATCH2 | ;IF EXPIRED THEN |
| 04AF | 23D2 | 1764 | | MOV | A,#-46 | ; TEST CLOCK EXTENSION |
| 04B1 | A0 | 1765 | | MOV | @R0,A | |
| 04B2 | 2306 | 1766 | | MOV | A,#2+4 | ; SCHEDULE TOTALIZER AND RLY |
| 04B4 | 4D | 1767 | | ORL | R5,A | |
| 04B5 | AD | 1768 | | MOV | R5,A | |
| 04B6 | 18 | 1769 | | INC | R0 | ; TEST CLOCK EXTENSION |
| 04B7 | 10 | 1770 | | INC | @R0 | |
| 04B8 | F0 | 1771 | | MOV | A,@R0 | |
| 04B9 | 96C9 | 1772 | | JNZ | WATCH2 | |
| 04BB | B925 | 1773 | | MOV | R1,#SECOND | ; TICK SECOND CLOCK |
| 04BD | 18 | 1774 | | INC | R0 | ; GET LAST SECOND ENTRY |
| 04BE | F0 | 1775 | | MOV | A,@R0 | |
| 04BF | D1 | 1776 | | XRL | A,@R1 | ; TEST SECOND TICK |
| 04C0 | 96C3 | 1777 | | JNZ | WATCH1 | ; IF SECOND CLOCK NOT TICKING THEN |
| 04C2 | 05 | 1778 | | EN | I | ; ENABLE INTERRUPTS (FAILED SENSOR) |
| | | 1779 | WATCH1: | | | ; ENDIF |
| 04C3 | F1 | 1780 | | MOV | A,@R1 | ; UPDATE LAST SECOND ENTRY |
| 04C4 | A0 | 1781 | | MOV | @R0,A | |
| 04C5 | B92F | 1782 | | MOV | R1,#TOTTMR | |
| 04C7 | E4F2 | | | JMP | WATCHX | ;PATCHED ELSE WHERE FOR WANT OF SPACE |

```
LOC   OBJ           LINE           SOURCE STATEMENT
                    1783   ;       MOV    R0,#TOTRUN       ; SCHEDULE RUN TIME INCREMENT
                    1784   ;       MOV    R1,#TOTTMR
                    1785   ;       MOVX   A,@R0
                    1786   ;       MOV    A,#16
                    1787   ;       MOV    A,R5
                    1788   ;       ORL    A,R5
                    1789   ;       MOV    R5,A
04C9  93            1790   WATCH2: RETR
                    1791   ;
                    1792   $EJECT
                    1793   ;
                    1794   ;1. TITLE
                    1795   ;           ONE--ONE INPUT PROCESS
                    1796   ;2. CALL AND RETURN
                    1797   ;       INPUTS
                    1798   ;                 R0=TOTLST, R1=TOTINC, R2=VALUE, R3=POSITION MASK (TOTALIZER NUM
                    1799   ;       OUTPUTS
                    1800   ;                 POINT INCREMENTED
                    1801   ;3. CALLED ROUTINES
                    1802   ;4. EQUATES
                    1803   ;*********************************************************************
                    1804   ;
                    1805   ;
04CA  89F6          1806   ONE:    MOV    R1,#TOTACT       ;GET INPUTS TO COUNT
04CC  81            1807           MOVX   A,@R1
04CD  96D6          1808           JNZ    ONE0
04CF  2306          1809           MOV    A,#6
04D1  3F            1810           MOVD   P7,A             ;TURN OFF LED
04D2  233D          1811           MOV    A,#XTOT1 AND 0FFH
04D4  844B          1812           JMP    TOTALX
04D6  BAFE          1813   ONE0:   MOV    R2,#-2
04D8  BBFE          1814           MOV    R3,#0FEH
04DA  97            1815           CLR    C
04DB  F7            1816   ONE1:   RLC    A                ;DO WHILE PT NOT FOUND
04DC  2B            1817           XCH    A,R3
04DD  77            1818           RR     A                ; TEST POINT
04DE  2B            1819           XCH    A,R3             ; ROTATE MASK
04DF  1A            1820           INC    R2               ; INCREMENT PTR OFFSET
04E0  1A            1821           INC    R2
04E1  E6DB          1822           JNC    ONE1             ;ENDWHILE
04E3  41            1823           MOVX   A,@R1
04E4  5A            1824           ANL    A,R3
04E5  91            1825           MOVX   @R1,A            ;UPDATE INPUTS TO COUNT
04E6  234A          1826   ONE2:   MOV    A,#ANAST         ;GET STATUS PTR
04E8  6A            1827           ADD    A,R2
04E9  17            1828           INC    A
04EA  A8            1829           MOV    R0,A
04EB  80            1830           MOVX   A,@R0            ;INCREMENT STATUS
```

```
LOC   OBJ        LINE           SOURCE STATEMENT
04EC  17         1831                  INC    A
04ED  90         1832                  MOVX   @R0,A
04EE  96FE       1833                  JNZ    ONEE
04F0  C8         1834                  DEC    R0
04F1  80         1835                  MOVX   A,@R0              ;  GET VALUE
04F2  17         1836                  INC    A
04F3  90         1837                  MOVX   @R0,A              ;  INCREMENT STATUS
04F4  53F0       1838                  ANL    A,#0F0H
04F6  C6FE       1839                  JZ     ONEE               ;  IF 12 BIT OVERFLOW THEN
04F8  27         1840                  CLR    A
04F9  90         1841                  MOVX   @R0,A              ;    WRAP COUNTER AROUND
04FA  18         1842                  INC    R0
04FB  235F       1843                  MOV    A,#95              ;    PRESET COUNTER TO 95
04FD  90         1844                  MOVX   @R0,A
                 1845          ;                                    ENDIF
                 1846          ;                                 ENDIF
04FE  F437       1847    ONEE: CALL   ANACOS                     ;SET ANALOG COS
0500  8445       1848          JMP    TOTALY
                 1849          ;
                 1850          $EJECT
                 1851          ;1. TITLE
                 1852          ;      RELAY--RELAY COMMAND EXECUTION IF DATA FILE
                 1853          ;2. CALL AND RETURN
                 1854          ;      INPUTS
                 1855          ;      OUTPUTS     RELAY COMMANDED, R0 RESTORED
                 1856          ;      RETURN
                 1857          ;3. CALLED ROUTINES
                 1858          ;--FILE--GET DATA FILE
                 1859          ;      INPUT
                 1860          ;                  R0=PTR TO POINT NUMBER (MUST BE MASKED)
                 1861          ;                  A=0 => ANALOG, A=NONZERO => DIGITAL
                 1862          ;      OUTPUT      R1=PTR TO FILE(BEGINNING) ,R0=PTR TO POINT NUMBER
                 1863          ;--RLYACT--RELAY ACTIVATION
                 1864          ;      INPUTS      R0=RELAY COMMAND PTR, R1=RELAY FILE,A7=ON=1, OFF=0
                 1865          ;      OUTPUTS     RELAY COMMANDED
                 1866          ;--POINT
                 1867          ;      INPUTS      B7=STATUS, R1=DATA FILE PTR
                 1868          ;      OUTPUTS     POINT UPDATED
                 1869          ;4. EQUATES
0004             1877    SSLEN EQU    4                          ;LENGTH OF START STOP MESSAGE
                 1878    ;***********************************************************************
```

| LOC | OBJ | LINE | | SOURCE STATEMENT | | |
|---|---|---|---|---|---|---|
| | | 1879 | ; | | | |
| | | 1880 | ; | | | |
| 0502 | | 1881 | | ORG | 0502H | |
| 0502 | B804 | 1882 | RELAY: | MOV | R0,#INFO | ;GET PTR TO MSG |
| 0504 | F467 | 1883 | | CALL | FILE | ;GET POINT DATA FILE |
| 0506 | B938 | 1884 | | MOV | R1,#DIGITL | |
| 0508 | F1 | 1885 | | MOV | A,@R1 | |
| 0509 | C612 | 1886 | | JZ | SS | |
| 050B | F440 | 1887 | | CALL | POINT | |
| 050D | B804 | 1888 | | MOV | R0,#INFO | :UPDATE STATUS |
| 050F | 80 | 1889 | | MOVX | A,@R0 | |
| 0510 | B938 | 1890 | | MOV | R1,#DIGITL | ;GET DATA FILE PTR |
| 0512 | B423 | 1891 | SS: | CALL | RLYACT | ;EXECUTE BIT 0 START STOP |
| 0514 | B93C | 1892 | | MOV | R1,#MSBIT | ;GET BIT 1 FILE |
| 0516 | F1 | 1893 | | MOV | A,@R1 | |
| 0517 | C61F | 1894 | | JZ | SSE | ;IF 3 MODE THEN |
| 0519 | B804 | 1895 | | MOV | R0,#INFO | |
| 051B | 80 | 1896 | | MOVX | A,@R0 | |
| 051C | E7 | 1897 | | RL | A | |
| 051D | B423 | 1898 | SS1: | CALL | RLYACT | ; FXECUTE BIT 1 START STOP |
| | | 1899 | ; | | | ENDIF |
| 051F | 2304 | 1900 | SSE: | MOV | A,#SSLEN | ;SFND RESPONSE |
| 0521 | 6467 | 1901 | | JMP | RECVE | |
| | | 1902 | $EJECT | | | |
| | | 1903 | ;1. TITLE | | | |
| | | 1904 | ; RLYACT--RELAY ACTIVATE   THIS ROUTINE ACCEPTS INPUTS ACCORDING TO | | | |
| | | 1905 | ;                          THE FOLLOWING FILE ENTRIES: | | | |
| | | 1906 | ;                          TYPE              ASSIGNMENT | | | |
| | | 1907 | ;                          REGULAR           LH10-ID-        L:LOW DRIVER ACTIVE | | | |
| | | 1908 | ;                                                            H:HIGH DRIVER ACTIVE | | | |
| | | 1909 | ;                                                            ID: 0-15 RELAY ID | | | |
| | | 1910 | ;                          CIM MAGLATCH      0011-ID- | | | |
| | | 1911 | ;                          FS MODULE         000--ID- | | | |
| | | 1912 | ;               NOTE THAT UP TO 32 FS RELAYS MAY BE COMMANDED | | | |
| | | 1913 | ;2. CALL AND RETURN | | | |
| | | 1914 | ;   INPUTS      R0=RELAY COMMAND PTR (INFO), R1=RELAY FILE,A7=ON=1,OFF=0 | | | |
| | | 1915 | ; | | | |
| | | 1916 | ;   OUTPUTS     RELAY COMMANDED | | | |
| | | 1917 | ;   RETURN | | | |
| | | 1918 | ;3. CALLED ROUTINES | | | |
| | | 1919 | ;   --ONBRD--COMMAND ON BOARD DRIVERS (APPLIES TO MAINTAINED RELAY BOARD) | | | |
| | | 1920 | ;   --FSRLY--COMMAND OFF BOARD RELAYS ON FS MODULES | | | |
| | | 1921 | ;   --CIMSS--COMMAND CIM MAGLATCH MODULES | | | |
| | | 1922 | ; | | | |
| | | 1923 | ;   INPUTS      A=COMMAND BYTE | | | |
| | | 1924 | ; | | | |
| | | 1925 | ;   OUTPUTS     DRIVER COMMANDED | | | |
| | | 1926 | ; | | | |

```
LOC  OBJ          LINE           SOURCE STATEMENT
                  1927  ;4.  EQUATES
                  1928  ;************************************************
                  1929  ;
                  1930  ;
0523 A8           1931  RLYACT: MOV   R3,A            ;SAVE COMMAND
0524 F1           1932          MOV   A,@R1           ;GET FILE ENTRY
0525 962A         1933          JNZ   RL1             ;IF NO DATA FILE THEN
0527 80           1934          MOVX  A,@R0           ;  GET COMMAND BYTE
0528 A437         1935          JMP   RL2             ;ELSE IF DATA FILE THEN
052A 19           1936  RL1:    INC   R1              ;  INCREMENT DATA FILE PTR
052B F1           1937          MOV   A,@R1           ;  GET DELAY BYTE
052C C631         1938          JZ    RL3             ;  IF TIMER THEN
052E B452         1939          CALL  PULSE           ;    SET TIMEOUT AND RELAY
0530 C9           1940          DEC   R1              ;  ENDIF
0531 FB           1941  RL3:    MOV   A,R3            ;  GET COMMAND
0532 19           1942          INC   R1
0533 F236         1943          JB7   RL4             ;  IF 0 COMMAND THEN
0535 19           1944          INC   R1              ;    INCREMENT DATA FILE PTR
                  1945  ;                             ;  ELSE 1 COMMAND
0536 F1           1946  RL4:    MOV   A,@R1           ;    GET COMMAND
                  1947  ;                             ;  ENDIF
0537 8244         1948  RL2:    JB5   ONBRD           ;  IF FS MODULE THEN
0539 F23D         1949          JB7   RL5
053B A44E         1950          JMP   RL99
053D A8           1951          MOV   R3,A
053E F5           1952  RL5:    SEL   MB1
053F 7485         1953          CALL  FSRLY           ;    START STOP
0541 E5           1954          SEL   MB0
0542 A44E         1955          JMP   RL99
                  1956  ;                             ;  ELSE IF REGULAR START STOP
0544 924A         1957  ONBRD:  JB4   CIMSS
0546 B46F         1958          CALL  REGRLY          ;    EXECUTE REGULAR START STOP
0548 A44E         1959          JMP   RL99            ;  ELSE IF CIM THEN
054A F5           1960  CIMSS:  SEL   MB1
054B 74E4         1961          CALL  CIM             ;    EXECUTE START STOP
054D E5           1962          SEL   MB0
                  1963  ;                             ;  ENDIF
054E 2380         1964  RL99:   MOV   A,#XRAM         ;OPEN RAM
0550 3A           1965          OUTL  P2,A
0551 93           1966          RETR
                  1967          SEJECT
                  1968  ;1. TITLE                     REV. 5-23-80
                  1969  ;         PULSE
                  1970  ;2. CALL AND RETURN
                  1971  ;         INPUTS    R1=PTR TO DELAY AND ACTION
                  1972  ;
                  1973  ;         OUTPUTS   ACTION AND DELAY SCHEDULED
                  1974  ;
```

```
LOC  OBJ              LINE           SOURCE STATEMENT
                      1975   ;             RETURN
                      1976   ;3.     CALLED ROUTINES
                      1977   ;4.     EQUATES
                      1978   ;************************************************************
                      1979   ;
                      1980   ;
0552 B82E             1981   PULSE:  MOV     R0,#RLYCT       ;       INCREMENT RELAY PULSED COUNT
0554 10               1982           INC     @R0
0555 F0               1983           MOV     A,@R0           ;       GET PTR
0556 E7               1984           RL      A
0557 03CE             1985           ADD     A,#DIGDLY-2
0559 A8               1986           MOV     R0,A
055A F1               1987           MOV     A,@R1           ;       SET DELAY
055B 90               1988           MOVX    @R0,A
055C 18               1989           INC     R0
055D 19               1990           INC     R1              ;       INCREMENT PTRS
055E FB               1991           MOV     A,R3            ;COMMAND IN A
055F F266             1992           JB7     PULSA           ;1 COMMAND,ACT ON BYTE 2 OF D.F.
0561 19               1993           INC     R1              ;0-COMMAND ,ACT ON BYTE 3 OF D.F.
0562 F1               1994           MOV     A,@R1
0563 C9               1995           DEC     R1
0564 A467             1996           JMP     PULSB
0566 F1               1997   PULSA:  MOV     A,@R1
0567 533F             1998   PULSB:  ANL     A,#3FH          ;       SET ACTION
0569 90               1999           MOVX    @R0,A
056A 93               2000           RETR
                      2001   $EJECT
                      2002   ;1. TITLE
                      2003   ;             REGRLY--REGULAR RELAY DRIVER
                      2004   ;2.     CALL AND RETURN
                      2005   ;       INPUTS      A=COMMAND
                      2006   ;
                      2007   ;       OUTPUTS     RELAY COMMANDED
                      2008   ;
                      2009   ;3.     CALLED ROUTINES
                      2010   ;4.     EQUATES
056B 0E               2011   BCOM:   DB      00001110B       ;RELAY POSITION 0 MASK
056C 0D               2012           DB      00001101B       ;RELAY POSITION 1 MASK
056D 0B               2013           DB      00001011B       ;RELAY POSITION 2 MASK
056E 07               2014           DB      00000111B       ;RFLAY POSITION 3 MASK
                      2015   ;************************************************************
                      2016   ;
                      2017   ;
056F AA               2018   REGRLY: MOV     R2,A
0570 7276             2019           JB3     BANK1           ;IF BANK0 THEN
0572 23B0             2020           MOV     A,#RLYR0        ; GET BANK 0
0574 A478             2021           JMP     BANK
                      2022   ;                               ELSE
```

| LOC | OBJ | LINE | | SOURCE | STATEMENT | | |
|---|---|---|---|---|---|---|---|
| 0576 | 23A0 | 2023 | BANK1: | MOV | A,#RLYB1 | ; | GET BANK 1 |
| | | 2024 | ; | | | ; | ENDIF |
| 0578 | 3A | 2025 | BANK: | OUTL | P2,A | ; | OPEN RELAY BANK |
| 0579 | FA | 2026 | | MOV | A,R2 | | |
| 057A | 5303 | 2027 | | ANL | A,#3 | ; | GET ON/OFF MASK |
| 057C | 0368 | 2028 | | ADD | A,#BCOM AND 0FFH | | |
| 057E | A3 | 2029 | | MOVP | A,@A | ; | SAVE MASK PTR |
| 057F | AB | 2030 | | MOV | R3,A | | |
| 0580 | FA | 2031 | | MOV | A,R2 | ; | GET COMMAND |
| 0581 | 97 | 2032 | | CLR | C | | |
| 0582 | 5286 | 2033 | | JB2 | HI1 | ; | IF LOWER 4 OUTPUTS (PORT 4(HI),6(LO)) |
| 0584 | A487 | 2034 | | JMP | HIOUT | ; | ELSE |
| 0586 | A7 | 2035 | HI1: | CPL | C | ; | SET C FLAG |
| | | 2036 | ; | | | ; | RESET C FLAG |
| | | 2037 | ; | | | ; | ENDIF |
| | | 2038 | ; | | | | |
| 0587 | FB | 2039 | HIOUT: | MOV | A,R3 | ; | IF LOWER 4 OUTPUTS (PORTS 4,6) |
| 0588 | F68E | 2040 | | JC | HIOFF | | |
| 058A | 9C | 2041 | | ANLD | P4,A | ; | TURN BOTH OFF |
| 058B | 9E | 2042 | | ANLD | P6,A | ; | ELSE IF HIGHER 4 (PORTS 5,7) THEN |
| 058C | A490 | 2043 | | JMP | LOWCHK | | |
| 058E | 9D | 2044 | HIOFF: | ANLD | P5,A | ; | TURN BOTH OFF |
| 058F | 9F | 2045 | | ANLD | P7,A | | |
| | | 2046 | ; | | | ; | ENDIF |
| 0590 | FA | 2047 | LOWCHK: | MOV | A,R2 | ; | GET COMMAND |
| 0591 | F297 | 2048 | | JB7 | LOW1 | ; | IF NO ON COMMAND THEN |
| 0593 | D2A1 | 2049 | | JB6 | HI | ; | EXIT |
| 0595 | A4A9 | 2050 | | JMP | BANKE | ; | ELSE IF LOW ON COMMAND THEN |
| 0597 | FB | 2051 | LOW1: | MOV | A,R3 | ; | GET MASK PTR |
| 0598 | 37 | 2052 | | CPL | A | | |
| 0599 | F69E | 2053 | | JC | P7LO | ; | IF PORT 6 THEN |
| 059B | 8E | 2054 | | ORLD | P6,A | ; | SET LOW OUTPUT |
| 059C | A4A9 | 2055 | | JMP | BANKE | ; | ELSE PORT 7 |
| 059E | 8F | 2056 | P7LO: | ORLD | P7,A | ; | SET LOW OUTPUT |
| 059F | A4A9 | 2057 | | JMP | BANKE | ; | ENDIF |
| 05A1 | FB | 2058 | HI: | MOV | A,R3 | ; | ELSE IF HI ON COMMAND THEN |
| 05A2 | 37 | 2059 | | CPL | A | | |
| 05A3 | F6A8 | 2060 | | JC | P5HI | ; | IF LOWER OUTPUT (PORT4) THEN |
| 05A5 | 8C | 2061 | | ORLD | P4,A | ; | TURN ON |
| 05A6 | A4A9 | 2062 | | JMP | BANKE | ; | ELSE |
| 05A8 | 8D | 2063 | P5HI: | ORLD | P5,A | ; | TURN ON |
| | | 2064 | ; | | | ; | ENDIF |
| | | 2065 | ; | | | ; | ENDIF |
| 05A9 | 93 | 2066 | BANKE: | RETR | | | |
| | | 2067 | ; | | | | |
| | | 2068 | ; | | | | |
| | | 2069 | ; | | FILL-IN CODE | | |
| 05AA | FF | 2070 | | DB | 0FFH,0FFH,0FFH,0FFH,0FFH,0FFH,0FFH,0FFH | | |

```
LOC   OBJ              LINE            SOURCE STATEMENT

05AB  FF
05AC  FF
05AD  FF
05AE  FF
05AF  FF
05B0  FF
05B1  FF
05B2  FF              2071             DB      0FFH,0FFH,0FFH,0FFH,0FFH,0FFH
05B3  FF
05B4  FF
05B5  FF
05B6  FF
05B7  FF
05B8  FF

2072  ;
                     2073  $EJECT
                     2074  ;***********************************************************
                     2075  ;NR TIMER FOR THE REPEATER
                     2076  ;            IF RS-232 REPEATER 540 DOES NOT GET THE RESPONSE FROM
                     2077  ;            RS-422 REPEATER IT WILL TIME OUT AFTER 50MS AND SWAP
                     2078  ;            LINES TO LISTEN TO 560 POLLS.
                     2079  ;
05B9 2380            2080  RDATAB: MOV     A,#XRAM  ; OPEN THE XRAM PORT
05BB 3A              2081          OUTL    P2,A
05BC 2301            2082          MOV     A,#01H  ; INITIALIZE THE TIMER FOR 50 MS.
05BE B9FF            2083          MOV     R1,#NRTMR
05C0 91              2084          MOVX    @R1,A
05C1 2390            2085          MOV     A,#UART       ; OPEN UART PORT
05C3 3A              2086          OUTL    P2,A
05C4 B926            2087          MOV     R1,#EIP
05C6 4450            2088          JMP     RDATAC        ; GO TO REC ROUTINE
                     2089  ;
                     2090  ;***********************************************************
                     2091  ;540 REPEATER PATCH
                     2092  ;
                     2093  ;            IF RS232.REPEATER.REPEAT STATE .NRTMR EXPIRED
                     2094  ;                  THEN SWAP LINES
                     2095  ;            ELSE EXIT
                     2096  ;
05C8 2380            2097  RDATAA: MOV     A,#XRAM       ;OPEN RAM PORT
05CA 3A              2098          OUTL    P2,A
05CB B9FF            2099          MOV     R1,#NRTMR
05CD 81              2100          MOVX    A,@R1         ;INCR NRTMR AND TEST IF EXPIRED
05CE 17              2101          INC     A
05CF 91              2102          MOVX    @R1,A         ;RESTORE INCR. VALUE
05D0 D3FF            2103          XRL     A,#0FFH       ;TIMER EXPIRED?50 MS. UP?
05D2 96EA            2104          JNZ     RDATAD        ;NO
05D4 B920            2105          MOV     R1,#ADDRES    ;YES. IS IT 232.REPEATER?
```

```
LOC   OBJ        LINE            SOURCE STATEMENT
05D6  F1         2106                    MOV     A,@R1
05D7  5303       2107                    ANL     A,#03
05D8  D303       2108                    XRL     A,#03
05D9  96EA       2109                    JNZ     RDATAD          ;NO,EXIT FROM TSN.
05DB  8924       2110                    MOV     R1,#LINE        ;YES, IN REPEATER STATE?
05DD  F1         2111                    MOV     A,@R1
05DE  530F       2112                    ANL     A,#0FH
05E0  96E8       2113                    JNZ     RDATAD          ;NO,INITALIZE REC.
05E2  F41E       2114                    CALL    LNSWAP          ;YES, SWAP LINES
05E4  8E00       2115    RDATAX: MOV     R6,#XIDLE AND 0FFH
05E6  4412       2116    RDATAD: JMP     TXEND           ;EXIT
                 2117            ;  REV. NOV.21,80
                 2118            ;  DELAY FOR 1.5MS AFTER THE UART EMPTY IS
                 2119            ;  ESTABLISHED BEFORE DISABLING RS422 DRIVERS
                 2120            ;
05EA  B823       2121    IDLE9:  MOV     R0,#TDELAY
05EC  10         2122            INC     @R0
05ED  F0         2123            MOV     A,@R0
05EE  96F5       2124            JNZ     IDLE7           ;DELAY UP?
05F0  23F0       2125            MOV     A,#0F0H         ;NO.
05F2  A0         2126            MOV     @R0,A           ;YES,RESET TDELAY TO 3MS
05F3  442F       2127            JMP     IDLE3           ; DISABLE THE RS-422 DRIVERS
05F5  4420       2128    IDLE7:  JMP     IDLE2           ;EXIT FROM TSN.
                 2129            ;
                 2130            ;           FILL-IN CODE
                 2131            ;
05F7  FF         2132            DB      0FFH                                            ; 5F7H-5FFH
05F8  FF         2133            DB      0FFH,0FFH,0FFH,0FFH,0FFH,0FFH,0FFH,0FFH
05F9  FF
05FA  FF
05FB  FF
05FC  FF
05FD  FF
05FE  FF
05FF  FF

2134    ;
                 2135    ;**********************************************************
                 2136    ;
                 2137            $EJECT
                 2138            ;1.TITLE
                 2139            ;               AD--ANALOG TO DIGITAL CONVERSION ROUTINES
                 2140            ;2.     CALL AND RETURN
                 2141            ;               INPUTS  RAM OPEN
                 2142            ;
                 2143            ;               OUTPUTS CONVERSION SCHEDULED AND ENABLED
                 2144            ;
                 2145            ;               RETURN
                 2146            ;3.     CALLED ROUTINES
```

```
LOC   OBJ         LINE        SOURCE STATEMENT
                  2147   ;--OPNPRT--OPEN ANALOG PORT
                  2148   ;           INPUT    ANALOG DATA FILE PRESENT
                  2149   ;
                  2150   ;           OUTPUT   ANALOG PORT ENABLED
                  2151   ;
                  2152   ;4. EQUATES
000F              2153   XADN    EQU   0FH            ;NUMBER OF AD CONVERSION ROUTINES
0600              2154           ORG   600H
                  2155   ;*********************************************************
                  2156   ;
                  2157   ;
0600 B8F1         2158   AD:     MOV   R0,#ANAIN+1    ;GET ENTRY PT
0602 80           2159           MOVX  A,@R0
0603 530F         2160           ANL   A,#XADN
0605 C60A         2161           JZ    ADIDL
0607 F5           2162           SEL   MB1
0608 4410         2163           JMP   ADMB1
                  2164   ;
                  2165   ;
                  2166   ;                                   ;ENTER ROUTINE
                  2167   ;
060A B8F0         2168   ADIDL:  MOV   R0,#ANAIN      ;GET ANALOG INPUT PTR
060C 80           2169           MOVX  A,@R0          ;GET NEXT PT
060D 17           2170           INC   A
060E 531F         2171           ANL   A,#01FH
0610 90           2172           MOVX  @R0,A
0611 27           2173           CLR   A
0612 F467         2174           CALL  FILE           ;GET PT FILE
0614 B8F1         2175           MOV   R0,#ANAIN+1    ;GET ANALOG INPUT
0616 A932         2176           MOV   R1,#ANALOG+2
0618 F1           2177           MOV   A,@R1
0619 C620         2178           JZ    AD1            ;IF NO DATA FILE OR OUTPUT THEN
061B 7220         2179           JB3   AD1            ;  EXIT
061D 2308         2180           MOV   A,#XOPEN AND 0FFH
                  2181   ;                            ELSE
061F 90           2182           MOVX  @R0,A          ;  SET REENTRY PT
                  2183   ;                            ENDIF
0620 840F         2184   AD1:    JMP   EXEC
                  2185   SEJECT
                  2186   ;1. TITLE
                  2187   ;    CPA--ANALOG SETPOINT ADJUST
                  2188   ;2. CALL AND RETURN
                  2189   ;     INPUTS    RAM OPEN, MESSAGE READY
                  2190   ;
                  2191   ;     OUTPUTS   ANALOG OUTPUT POINT UPDATED, ANALOG ID VALUE CALCULATED
                  2192   ;                          AND STORED
                  2193   ;
                  2194   ;          RETURN
```

```
LOC   OBJ        LINE         SOURCE STATEMENT

2195    ;3.  CALLED ROUTINES
                 2196    ;--FILE
                 2197    ;
                 2198    ;       INPUTS     R0=PTR TO POINT NUMBER (MUST BE MASKED)
                 2199    ;
                 2200    ;       OUTPUTS    R1=PTR TO FILE(BEGINNING), R0=PTR TO POINT NUMBER
                 2201    ;--MULT
                 2202    ;
                 2203    ;       INPUTS     R0=PTR TO MULTIPLIER, R1=PTR TO MULTIPLICAND
                 2204    ;
                 2205    ;       OUTPUTS    R3,R4=RESULT(MS 16 BITS), R0=PTR TO LS BYTE
                 2206    ;--ADD16
                 2207    ;
                 2208    ;       INPUTS     R1=PTR TO ADDEND, R3,R4=AUGEND
                 2209    ;
                 2210    ;       OUTPUTS    R3,R4=RESULT
                 2211    ;--REVRSE
                 2212    ;
                 2213    ;       INPUTS     DIGITL+1 BIT 1=1 => FORWARD ACTING
                 2214    ;                          BIT 1=0 => REVERSE ACTING
                 2215    ;
                 2216    ;       OUPUTS     COMMAND=3FF-COMMAND
                 2217    ;4.  EQUATES
0005             2218    CPAL   EQU    5              ;LENGTH OF CPA MESSAGE
                 2219    ;*********************************************************************
                 2220    ;
0622 B804        2221    CPA:   MOV    R0,#INFO       ;GET PT NUMBER
0624 B93F        2222           MOV    R1,#DIGITL+7
0626 BAB0        2223           MOV    R2,#ANAPT
0628 F473        2224           CALL   FILE2
062A B93A        2225           MOV    R1,#DIGITL+2
062C F1          2226           MOV    A,@R1
062D 7231        2227           JB3    CPA1           ;TEST CPA FILE
062F C46A        2228           JMP    CPA2
0631 80          2229    CPA1:  MOVX   A,@R0
0632 AC          2230           MOV    R4,A
0633 E7          2231           RL     A
0634 E7          2232           RL     A
0635 5303        2233           ANL    A,#3           ;GET MS BITS OF COMMAND
0637 AB          2234           MOV    R3,A
0638 18          2235           INC    R0
0639 80          2236           MOVX   A,@R0
063A BA02        2237           MOV    R2,#2
063C 97          2238    CPALP: CLR    C
063D F7          2239           RLC    A              ;MULTIPLY COMMAND BY 4
063E 28          2240           XCH    A,R3
063F F7          2241           RLC    A
0640 28          2242           XCH    A,R3
```

| LOC | OBJ | LINE | SOURCE STATEMENT | | |
|---|---|---|---|---|---|
| 0641 | EA3C | 2243 | DJNZ | R2,CPALP | |
| 0643 | 2C | 2244 | XCH | A,R4 | |
| 0644 | F434 | 2245 | CALL | PANAST | ;GET LS BITS OF COMMAND |
| 0646 | F426 | 2246 | CALL | MOVER | ;GET PTR TO STATUS LOCATION |
| 0648 | B83E | 2247 | MOV | R0,#DIGITL+6 | ;SET ANALOG STATUS FOR COMMAND |
| 064A | F4B1 | 2248 | CALL | MOVEI | |
| 064C | F403 | 2249 | CALL | REVRSE | ;PROCESS REVERSE/FORWARD ACTING OPTION |
| 064E | F5 | 2250 | SEL | MB1 | ;PRESET RESULT |
| 064F | 27 | 2251 | CLR | A | |
| 0650 | AB | 2252 | MOV | R3,A | |
| 0651 | AC | 2253 | MOV | R4,A | |
| 0652 | B83D | 2254 | MOV | R0,#DIGITL+5 | ;GET MULTPLIER |
| 0654 | B93E | 2255 | MOV | R1,#DIGITL+6 | |
| 0656 | 14AE | 2256 | CALL | MULT | |
| 0658 | B93B | 2257 | MOV | R1,#DIGITL+3 | |
| 065A | 14C4 | 2258 | CALL | ADD16 | |
| 065C | E5 | 2259 | SEL | MB0 | |
| 065D | 8839 | 2260 | MOV | R0,#DIGITL+1 | ;STORE CPA VALUE |
| 065F | F0 | 2261 | MOV | A,@R0 | |
| 0660 | F42C | 2262 | CALL | PANA | ;GET ANALOG PTR |
| 0662 | F426 | 2263 | CALL | MOVER | ;STORE ANALOG VALUES |
| 0664 | B92A | 2264 | MOV | R1,#RFSH | |
| 0666 | F0 | 2265 | MOV | A,@R0 | |
| 0667 | A1 | 2266 | MOV | @R1,A | ;SET NEW VALUE INDICATOR |
| 0668 | F4B7 | 2267 | CALL | ANACOS | |
| 066A | 2305 | 2268 | CPA2: MOV | A,#CPAL | ;SET COS INDICATOR |
| 066C | 6467 | 2269 | JMP | RECVE | |
| | | 2270 | $EJECT | | |
| | | 2271 | ;1. TITLE | | |
| | | 2272 | ; EIP--EVENT INTIATED ACTION ROUTINE | | |
| | | 2273 | ; NOTE: THIS ROUTINE WILL RUN EVERY TWO SECONDS UNDER THE CONTROL OF | | |
| | | 2274 | ; THE 'WATCH' ROUTINE. THIS IS THE LOWEST PRIORITY TASK OF | | |
| | | 2275 | ; THE 540 DGP. | | |
| | | 2276 | ; THE PURPOSE OF THE ROUTINE IS TWO DO ONE OF 3 ACTIONS POSSIBLE | | |
| | | 2277 | ; FOR A GIVE EVENT INITIATION. IF NO EXTERNAL ACTION IS DONE | | |
| | | 2278 | ; TO THE EVENT MASK THEN EACH ACTION WILL BE DONE IN TURN. THE | | |
| | | 2279 | ; ACTIONS ARE SCHEDULED BY THE STATE OF TWO 'ACTION' BITS. | | |
| | | 2280 | ; THREE POSSIBLE SEPARATE EIPS ARE POSSIBLE, BUT ONLY ONE IS | | |
| | | 2281 | ; IMPLEMENTED. THIS ONE IS USED TO MONITOR TRANSMISSION. | | |
| | | 2282 | ; | | |
| | | 2283 | ; | | |
| | | 2284 | ; THE TRANSMISSION MONITOR IS USED TO LOOK FOR NO TRANSMISSION | | |
| | | 2285 | ; RESPONSE. IF NO TRANSMISSION IS RECEIVED FOR MORE THEN 2 SECONS | | |
| | | 2286 | ; THE ROUTINE WILL INITIATE A LINE SWITCH. IF 2 LINE SWITCHES ARE | | |
| | | 2287 | ; NOT SUCCESSFUL IN BRINGING A RECEIVED BYTE, A PROGRAMMABLE RELAY | | |
| | | 2288 | ; DRIVER ACTION WILL BE INITIATED. | | |
| | | 2289 | ; | | |
| | | 2290 | ; | | |

```
LOC   OBJ            LINE           SOURCE STATEMENT
                     2291   ;       THREE POSSIBLE EIPS COULD BE PROGRAMMED USING THE DATA FILE
                     2292   ;       FOR DIGITAL INPUTS.  THE DATA FILE FORMAT FOLLOWS:
                     2293   ;               BYTE    BITS            FUNCTION
                     2294   ;                0      10100001        HEADER BYTE OF DATA FILE
                     2295   ;                1      MMMMMMMM        ID 1-8 NORMALLY OPEN/CLOSED ASSIGNMENT
                     2296   ;                2      MMMMMMMM        ID 9-16 NO/NC ASSIGNMENT
                     2297   ;                3      MMMMMMMM        ID 17-24 NO/NC ASSIGNMENT
                     2298   ;                4      RRRRRRRR        M1 RELAY ACTION
                     2299   ;                                       RELAY ACTION USES THE FORMATS
                     2300   ;                                       USED IN THE DIGITAL OUTPUT 'R'
                     2301   ;                                       ASSIGNMENTS.  THIS INPUT IS
                     2302   ;                                       USED AS AN INPUT TO 'REGRLY'
                     2303   ;                5                      SPARE
                     2304   ;                6                      SPARE
                     2305   ;                7                      SPARE
                     2306   ;2.     CALL AND RETURN
                     2307   ;              INPUTS           EIP WITH STATUS
                     2308   ;
                     2309   ;              OUTPUTS          ACTIVITY EXECUTED OR SCHEDULED
                     2310   ;
                     2311   ;              RETURN
                     2312   ;3.     CALLED ROUTINES
                     2313   ;--FILE3
                     2314   ;              INPUTS           R0=PTR TO PACKED FILE PTR, R1=PTR TO LAST LOCATION OF 8 TO BE LOADED
                     2315   ;
                     2316   ;              OUTPUTS          8 LOCATIONS MOVED TO WORKSPACE
                     2317   ;
                     2318   ;--REGRLY
                     2319   ;              INPUTS           A=COMMAND
                     2320   ;
                     2321   ;              OUTPUTS          RELAY COMMANDED
                     2322   ;
                     2323   ;--LINESW
                     2324   ;              INPUTS           LINE
                     2325   ;
                     2326   ;              OUTPUTS          LINE SWITCHED
                     2327   ;
                     2328   ;4.     EQUATES
0003                 2329          EIPEN    EQU     00000011B       ;MASK TO ENABLE EIPS
                     2330   ;********************************************************************
                     2331   ;
                     2332   ;
066E 8826            2333          EIPP:    MOV     R0,#EIP                 ;GET ASSIGNED EIP VALUE
0670 F0              2334                   MOV     A,@R0
0671 C68A            2335                   JZ      EIP2                    ;CASE OF EIP OF
0673 37              2336                   CPL     A
0674 1286            2337                   JB0     EIP1            ; 0: NO ACTION
0676 3286            2338                   JB1     EIP1
```

| LOC | OBJ | LINE | | SOURCE STATEMENT | |
|---|---|---|---|---|---|
| 0678 | 10 | 2339 | | INC | @R0 | ;GET DIGITAL INPUT FILE |
| 0679 | B8FB | 2340 | | MOV | R0,#DIGMSK | |
| 067B | B93F | 2341 | | MOV | R1,#DIGITL+7 | |
| 067D | F47C | 2342 | | CALL | FILE3 | |
| 067F | B93C | 2343 | | MOV | R1,#DIGITL+4 | |
| 0681 | F1 | 2344 | | MOV | A,@R1 | |
| 0682 | C686 | 2345 | | JZ | EIP1 | |
| 0684 | 846F | 2346 | | CALL | REGRLY | ; 1,2: LINESWITCH |
| 0686 | F411 | 2347 | EIP1: | CALL | LINESW | |
| 0688 | BE00 | 2348 | | MOV | R6,#XIDLE AND 0FFH | ; 3: TURN ON (OFF) ASSIGNED RELAY |
| 068A | 8826 | 2349 | EIP2: | MOV | R0,#EIP | ;ENDCASE |
| 068C | F0 | 2350 | | MOV | A,@R0 | |
| 068D | 17 | 2351 | | INC | A | ;INCREMENT EIP COUNTER |
| 068E | 5303 | 2352 | | ANL | A,#EIPEN | |
| 0690 | A0 | 2353 | | MOV | @R0,A | |
| 0691 | 840F | 2354 | | JMP | EXEC | |
| 0693 | FF | 2355 | | DB | 0FFH,0FFH,0FFH,0FFH,0FFH,0FFH,0FFH,0FFH | |
| 0694 | FF | | | | | |
| 0695 | FF | | | | | |
| 0696 | FF | | | | | |
| 0697 | FF | | | | | |
| 0698 | FF | | | | | |
| 0699 | FF | | | | | |
| 069A | FF | | | | | |
| 069B | FF | 2356 | | DB | 0FFH,0FFH,0FFH,0FFH,0FFH,0FFH,0FFH,0FFH | |
| 069C | FF | | | | | |
| 069D | FF | | | | | |
| 069E | FF | | | | | |
| 069F | FF | | | | | |
| 06A0 | FF | | | | | |
| 06A1 | FF | | | | | |
| 06A2 | FF | | | | | |
| 06A3 | FF | 2357 | | DB | 0FFH,0FFH,0FFH,0FFH,0FFH,0FFH,0FFH,0FFH | |
| 06A4 | FF | | | | | |
| 06A5 | FF | | | | | |
| 06A6 | FF | | | | | |
| 06A7 | FF | | | | | |
| 06A8 | FF | | | | | |
| 06A9 | FF | | | | | |
| 06AA | FF | | | | | |
| 06AB | FF | 2358 | | DB | 0FFH,0FFH,0FFH,0FFH,0FFH,0FFH,0FFH,0FFH | |
| 06AC | FF | | | | | |
| 06AD | FF | | | | | |
| 06AE | FF | | | | | |
| 06AF | FF | | | | | |
| 06B0 | FF | | | | | |
| 06B1 | FF | | | | | |
| 06B2 | FF | | | | | |

| LOC | OBJ | LINE | SOURCE STATEMENT |
|---|---|---|---|
| 06B3 | FF | 2359 | DB  OFFH,OFFH,OFFH,OFFH,OFFH,OFFH,OFFH,OFFH |
| 06B4 | FF | | |
| 06B5 | FF | | |
| 06B6 | FF | | |
| 06B7 | FF | | |
| 06B8 | FF | | |
| 06B9 | FF | | |
| 06BA | FF | | |
| 06BB | FF | 2360 | DB  OFFH,OFFH,OFFH,OFFH,OFFH,OFFH,OFFH,OFFH |
| 06BC | FF | | |
| 06BD | FF | | |
| 06BE | FF | | |
| 06BF | FF | | |
| 06C0 | FF | | |
| 06C1 | FF | | |
| 06C2 | FF | | |
| 06C3 | FF | 2361 | DB  OFFH,OFFH,OFFH,OFFH,OFFH,OFFH,OFFH,OFFH |
| 06C4 | FF | | |
| 06C5 | FF | | |
| 06C6 | FF | | |
| 06C7 | FF | | |
| 06C8 | FF | | |
| 06C9 | FF | | |
| 06CA | FF | | |
| 06CB | FF | 2362 | DB  OFFH,OFFH,OFFH,OFFH,OFFH,OFFH,OFFH,OFFH |
| 06CC | FF | | |
| 06CD | FF | | |
| 06CE | FF | | |
| 06CF | FF | | |
| 06D0 | FF | | |
| 06D1 | FF | | |
| 06D2 | FF | | |
| 06D3 | FF | 2363 | DB  OFFH,OFFH,OFFH,OFFH,OFFH,OFFH,OFFH,OFFH |
| 06D4 | FF | | |
| 06D5 | FF | | |
| 06D6 | FF | | |
| 06D7 | FF | | |
| 06D8 | FF | | |
| 06D9 | FF | | |
| 06DA | FF | | |
| 06DB | FF | 2364 | DB  OFFH,OFFH,OFFH,OFFH,OFFH,OFFH,OFFH,OFFH |
| 06DC | FF | | |
| 06DD | FF | | |
| 06DE | FF | | |
| 06DF | FF | | |
| 06E0 | FF | | |
| 06E1 | FF | | |
| 06E2 | FF | | |

```
LOC   OBJ           LINE        SOURCE STATEMENT
06E3  FF            2365         DB      0FFH,0FFH,0FFH,0FFH,0FFH,0FFH,0FFH,0FFH
06E4  FF
06E5  FF
06E6  FF
06E7  FF
06E8  FF
06E9  FF
06EA  FF
06EB  FF            2366         DB      0FFH,0FFH,0FFH,0FFH
06EC  FF
06ED  FF
06EE  FF

2367  $EJECT
                    2368  ;1. TITLE
                    2369  ;            COS--CHANGE OF STATE
                    2370  ;2. CALL AND RETURN
                    2371  ;       INPUTS     R2=COS MASK, R1=PTR TO CURRENT STATUS
                    2372  ;
                    2373  ;       OUTPUTS    STATUS UPDATED, COS BITS SET IF CHANGE
                    2374  ;
                    2375  ;       RETURN
                    2376  ;3. CALLED ROUTINES
                    2377  ;4. EQUATES
                    2378  ;***********************************************************
                    2379  ;
                    2380  ;
06FD                2381         ORG     6FDH
06FD  A8            2382  COS:   MOV     R0,A
06FE  81            2383         MOVX    A,@R1
06FF  D8            2384         XRL     A,R0
0700  C609          2385         JZ      COSE         ;IF COS THEN
0702  F8            2386         MOV     A,R0
0703  91            2387         MOVX    @R1,A        ; UPDATE STATUS
0704  8829          2388         MOV     R0,#COSBUF
0706  FA            2389         MOV     A,R2
0707  40            2390         ORL     A,@R0        ; SET COS
0708  A0            2391         MOV     @R0,A
0709  93            2392         RETR                 ;ENDIF
                    2393  COSE:
                    2394  $EJECT
                    2395  ;1. TITLE
                    2396  ;            OFF--INITIALIZE OUTPUT DRIVERS TO 0
                    2397  ;2. CALL AND RETURN
                    2398  ;       INPUTS
                    2399  ;       OUTPUTS    ALL OUTPUT DRIVERS DRIVEN LOW
                    2400  ;
                    2401  ;       RETURN
                    2402  ;3. CALLED ROUTINES
                    2403  ;4. EQUATES
```

| LOC | OBJ | LINE | SOURCE STATEMENT | |
|---|---|---|---|---|
| | | | ;************************************************************ | |
| 070A | 3A | 2403 | ; | |
| 070B | 27 | 2404 | ; | |
| 070C | 3C | 2405 | ; | |
| 070C | 3C | 2406 | OFF: | OUTL P2,A |
| 070D | 3D | 2407 | | CLR A ;TURN ON OUTPUTS LOW |
| 070E | 3E | 2408 | | MOVD P4,A |
| 070F | 3F | 2409 | | MOVD P5,A |
| 0710 | 93 | 2410 | | MOVD P6,A |
| | | 2411 | | MOVD P7,A |
| | | 2412 | | RETR |
| | | 2413 | $EJECT | |
| | | 2414 | ;1. TITLE | |
| | | 2415 | ; LINESW--LINE SWITCH | |
| | | 2416 | ;2. CALL AND RETURN | |
| | | 2417 | ; INPUTS RAM OPEN, A=COMMAND | |
| | | 2418 | ; | |
| | | 2419 | ; OUTPUTS LINE SELECTED | |
| | | 2420 | ; | |
| | | 2421 | ; RETURN | |
| | | 2422 | ;3. CALLED ROUTINES | |
| | | 2423 | ;4. EQUATES | |
| 0005 | | 2424 | RLINE EQU 5 ;R LINE MASK | |
| | | 2425 | ;************************************************************ | |
| | | 2426 | ;REV. 8-12-80 | |
| | | 2427 | ; IF CLASS-B SELECTED DO NOT SWITCH LINES | |
| | | 2428 | ; SWITCH BIT 8 IN ADDRESS IS CLASS-B BIT | |
| | | 2429 | ; | |
| | | 2430 | ; | |
| 0711 | B820 | 2431 | LINESW: MOV R0,#ADDRES | |
| 0713 | F0 | 2432 | | MOV A,@R0 |
| 0714 | 5380 | 2433 | | ANL A,#80H ;IS BIT7=0? |
| 0716 | C61D | 2434 | | JZ LSWE ;YES. |
| 0718 | B824 | 2435 | LNSWAP: MOV R0,#LINE ;GET LINE PTR | |
| 071A | F0 | 2436 | | MOV A,@R0 |
| 071B | 47 | 2437 | | SWAP A ;CHANGE LINES |
| 071C | A0 | 2438 | | MOV @R0,A |
| 071D | 93 | 2439 | | RETR |
| | | 2440 | LSWE: $EJECT | |
| 071E | 81 | 2441 | MOVE: MOVX A,@R1 ; GET DATA | |
| 071F | 90 | 2442 | | MOVX @R0,A ; STORE DATA |
| 0720 | 18 | 2443 | | INC R0 |
| 0721 | 19 | 2444 | | INC R1 ; INCREMENT PTRS |
| 0722 | 1B | 2445 | | INC R3 ; INCREMENT LENGTH |
| 0723 | EA1E | 2446 | | DJNZ R2,MOVE ;ENDWHILE |
| 0725 | 93 | 2447 | | RETR |
| | | 2448 | $EJECT | |
| | | 2449 | ;1. TITLE | |
| | | 2450 | ; MOVER--MOVE REGISTER 3,4 TO EXTERNAL MEMORY | |

```
LOC   OBJ              LINE              SOURCE STATEMENT
                       2451    ;2.   CALL AND RETURN
                       2452    ;           INPUTS     VALUE 1,2 IN R3,R4, PTR IN R1
                       2453    ;
                       2454    ;           OUTPUTS    VALUES MOVED TO MEMORY
                       2455    ;
                       2456    ;           RETURN
                       2457    ;3.   CALLED ROUTINES
                       2458    ;4.   EQUATES
                       2459    ;******************************************************
                       2460    ;
                       2461    ;
0726 FB                2462    MOVER:   MOV    A,R3
0727 91                2463             MOVX   @R1,A              ;GET VALUE1
0728 19                2464             INC    R1
0729 FC                2465             MOV    A,R4
072A 91                2466             MOVX   @R1,A              ;GET VALUE2
072B 93                2467             RETR
                       2468    $EJECT
                       2469    ;1.   TITLE     PANA--FIND PTR TO ANALOG OUTPUT STORE
                       2470    ;
                       2471    ;2.   CALL AND RETURN
                       2472    ;           INPUTS     A=PACKED POINT VALUE
                       2473    ;
                       2474    ;           OUTPUTS    R1=PTR TO EXTERNAL MEMORY MOST SIGNIFICANT BYTE
                       2475    ;
                       2476    ;           RETURN
                       2477    ;3.   CALLED ROUTINES
                       2478    ;4.   EQUATES
                       2479    ;******************************************************
                       2480    ;
                       2481    ;
072C 77                2482    PANA:    RR     A
072D 77                2483             RR     A
072E 530E              2484             ANL    A,#0EH
0730 03E0              2485             ADD    A,#ANAID
0732 A9                2486             MOV    R1,A
0733 83                2487             RET
                       2488    $EJECT
                       2489    ;1.   TITLE     PANAST--GET PTR TO ANALOG STATUS LOCATION
                       2490    ;
                       2491    ;2.   CALL AND RETURN
                       2492    ;           INPUTS     A=ID NUMBER
                       2493    ;
                       2494    ;           OUTPUT     R1=PTR TO EXTERNAL MEMORY LOCATION FOR STATUS UPDATE
                       2495    ;
                       2496    ;           RETURN
                       2497    ;3.   CALLED ROUTINES
                       2498    ;4.   EQUATES
```

```
LOC   OBJ         LINE           SOURCE STATEMENT

2499   ;****************************************************************
                  2500   ;
                  2501   ;
0734  07          2502   PANAST: DEC   A                      ;DECREMENT ID
0735  531F        2503           ANL   A,#1FH
0737  E7          2504           RL    A
0738  034A        2505           ADD   A,#ANAST
073A  A9          2506           MOV   R1,A                   ;SET PTR
073B  93          2507           RETR
                  2508   $EJECT
                  2509   ;1. TITLE
                  2510   ;        POINT--UPDATE POINT STATUS
                  2511   ;2. CALL AND RETURN
                  2512   ;        INPUTS
                  2513   ;               R0=PTR TO POINT NUMBER AND STATUS (SSOPPPPP) S=STATUS,
                  2514   ;               P=POINT NUMBER
                  2515   ;        OUTPUTS
                  2516   ;               POINT STATUS UPDATED
                  2517   ;        RETURN
                  2518   ;3. CALLED ROUTINES
                  2519   ;        EQUATES
073C  3F          2520   MPOS:   DB    00111111B              ;0 POINT POSITION MASK
073D  CF          2521           DB    11001111B              ;1 POINT POSITION MASK
073E  F3          2522           DB    11110011B              ;2 POINT POSITION MASK
073F  FC          2523           DB    11111100B              ;3 POINT POSITION MASK
                  2524   ;****************************************************************
                  2525   ;
                  2526   ;
0740  80          2527   POINT:  MOVX  A,@R0                  ;GET PTR TO POINT STATUS BYTE
0741  07          2528           DEC   A
0742  AA          2529           MOV   R2,A
0743  77          2530           RR    A
0744  77          2531           RR    A
0745  5307        2532           ANL   A,#7
0747  0385        2533           ADD   A,#DIGST+3
0749  A9          2534           MOV   R1,A
074A  FA          2535           MOV   A,R2                   ;GET PT POSITION NUMBER
074B  5303        2536           ANL   A,#3
074D  AA          2537           MOV   R2,A
074E  033C        2538           ADD   A,#MPOS AND 0FFH
0750  A3          2539           MOVP  A,@A
0751  AB          2540           MOV   R3,A                   ;GET PT POSITION MASK
0752  1A          2541           INC   R2
0753  80          2542           MOVX  A,@R0
0754  53C0        2543           ANL   A,#0C0H
0756  EA5A        2544   POINTL: DJNZ R2,POINT1               ;DO WHILE COUNT
0758  E45E        2545           JMP   POINT2
075A  77          2546   POINT1: RR   A
```

```
LOC   OBJ         LINE           SOURCE STATEMENT
0758  77          2547                  RR     A                    ; MOVE POSITION 1
075C  E456        2548                  JMP    POINTL               ;ENDWHILE
075E  AA          2549           POINT2: MOV   R2,A
075F  81          2550                  MOVX   A,@R1                ;GET STATUS
0760  58          2551                  ANL    A,R3
0761  4A          2552                  ORL    A,R2
0762  8A80        2553                  MOV    R2,#80H
0764  D4FD        2554                  CALL   COS                  ;UPDATE STATUS
0766  93          2555                  RETR
                  2556           $EJECT
                  2557           ;1. TITLE
                  2558           ;       FILE--FILE RETRIEVER
                  2559           ;       NOTE: TO ENSURE NO ERRONEOUS RESULTS, FILE LOCATION QUAD 0, BYTE 0
                  2560           ;             MUST BE SET TO ALL ZEROS!!!!! THIS CAUSES NON EXISTING DATA
                  2561           ;             FILES TO BE LOADED AS ZERO.
                  2562           ;2. CALL AND RETURN
                  2563           ;       INPUTS        R0=PTR TO POINT NUMBER (MUST BE MASKED)
                  2564           ;                     A=0 => ANALOG, A NOT 0 => DIGITAL
                  2565           ;
                  2566           ;       OUTPUTS       R1=PTR TO FILE, R0=INFO PTR
                  2567           ;
                  2568           ;3. CALLED ROUTINES
                  2569           ;4. EQUATES
                  2570           ;*********************************************************************
                  2571           ;
0767  966F        2572           FILE:   JNZ    FILE1                ;IF ANALOG THEN
0769  8937        2573                   MOV    R1,#ANALOG+7         ;  GET FILE DESTINATION PTR
076B  BA80        2574                   MOV    R2,#ANAPT            ;  GET PT LOCATION
076D  E473        2575                   JMP    FILE2                ;ELSE
076F  B93F        2576           FILE1:  MOV    R1,#DIGITL+7         ;  GET FILE DESTINATION PTR
0771  BA90        2577                   MOV    R2,#DIGPT            ;  GET PT LOCATION
                  2578           ;                                    ENDIF
0773  80          2579           FILE2:  MOVX   A,@R0                ;GET POINT
0774  07          2580                   DEC    A
0775  531F        2581                   ANL    A,#01FH
0777  6A          2582                   ADD    A,R2
0778  A8          2583                   MOV    R0,A
0779  F47C        2584                   CALL   FILE3
077B  93          2585                   RETR                        ;GET FILE
                  2586           $EJECT
                  2587           ;1. TITLE
                  2588           ;       FILE3--GET FILE
                  2589           ;2. CALL AND RETURN
                  2590           ;       INPUTS        R0=PTR TO PACKED FILE PTR
                  2591           ;                     R1=PTR TO LAST LOCATION OF 8 TO BE LOADED INTO
                  2592           ;
                  2593           ;       OUTPUTS
```

```
LOC     OBJ             LINE            SOURCE STATEMENT

2595    ;       ******************************************************
                        2596    ;                       RETURN
                        2597    ;3.     CALLED ROUTINES
                        2598    ;4.     EQUATES
                        2599    ;******************************************************
                        2600    ;
                        2601    ;
077C    80              2602    FILE3:  MOVX    A,@R0              ;GET POINT FILE LOCATION
077D    5307            2603            ANL     A,#07H
077F    AB              2604            MOV     R3,A               ;GET QUADRANT
0780    80              2605            MOVX    A,@R0
0781    4307            2606            ORL     A,#07H             ;GET BYTE ADDRESS
0783    AA              2607            MOV     R2,A
0784    FA              2608    FILELP: MOV     A,R2               ;DOWHILE MORE DATA
0785    14CD            2609            CALL    DATA               ;  GET BYTE
0787    FC              2610            MOV     A,R4
0788    A1              2611            MOV     @R1,A              ;  SAVE BYTE
0789    C9              2612            DEC     R1
078A    CA              2613            DEC     R2                 ;  DECREMENT PTRS
078B    FA              2614            MOV     A,R2               ;  TEST DONE
078C    5307            2615            ANL     A,#7
078E    43F8            2616            ORL     A,#0F8H
0790    37              2617            CPL     A
0791    9684            2618            JNZ     FILELP             ;ENDWHILE
0793    B804            2619    FILEE:  MOV     R0,#INFO           ;GET INFO PTR
0795    93              2620            RETR
                        2621    $EJECT
                        2622    ;1. TITLE        GETBYT
                        2623    ;
                        2624    ;2.     CALL AND RETURN
                        2625    ;               INPUTS     UART OPEN, R1=UARTCS
                        2626    ;
                        2627    ;               OUTPUTS    A=SEND BYTE
                        2628    ;
                        2629    ;               RETURN
                        2630    ;3.     CALLED ROUTINES
                        2631    ;4.     EQUATES
                        2632    ;******************************************************
                        2633    ;
                        2634    ;
0796    EFA0            2635    GETBYT: DJNZ    R7,MORE            ;IF LAST BYTE THEN
0798    BE00            2636            MOV     R6,#XIDLE AND 0FFH ;  SET RECEIVE INITIALIZATION
079A    B821            2637            MOV     R0,#CKSM           ;  GET CHECKSUM
079C    F0              2638            MOV     A,@R0              ;  ENDIF
079D    37              2639            CPL     A
079E    E4AE            2640            JMP     GETEND
07A0    23R0            2641    MORE:   MOV     A,#XRAM            ;ELSE
07A2    3A              2642            OUTL    P2,A               ;  OPEN RAM
```

```
LOC   OBJ        LINE                SOURCE STATEMENT
07A3  8822       2643                MOV    R0,#TSMPTR      ; GET OUTPUT PTR
07A5  10         2644                INC    @R0
07A6  F0         2645                MOV    A,@R0           ; GET PTR
07A7  A8         2646                MOV    R0,A
07A8  80         2647                MOVX   A,@R0           ; GET BYTE
07A9  AC         2648                MOV    R4,A            ; SAVE BYTE
07AA  2390       2649                MOV    A,#UART         ; OPEN UART PORT
07AC  3A         2650                OUTL   P2,A
07AD  FC         2651                MOV    A,R4            ; GET BYTE
                 2652                                       ENDIF
07AE  93         2653      GETEND:   RETR
                 2654      $EJECT
                 2655      ;1. TITLE
                 2656      ;         MOVERI--SAVE REGISTERS INTERNAL
                 2657      ;2. CALL AND RETURN
                 2658      ;         INPUTS     R3, R4 TO BE SAVED
                 2659      ;
                 2660      ;         OUTPUTS    SAVED AT ANALOG+1,2
                 2661      ;
                 2662      ;         RETURN
                 2663      ;3. CALLED ROUTINES
                 2664      ;4. EQUATES
                 2665      ;*************************************************
                 2666      ;
07AF  8831       2667      MOVERI:   MOV    R0,#ANALOG+1    ;MOVE ANALOG VALUES TO TEMP STORE
07B1  FB         2668      MOVEI:    MOV    A,R3
07B2  A0         2669                MOV    @R0,A
07B3  18         2670                INC    R0
07B4  FC         2671                MOV    A,R4
07B5  A0         2672                MOV    @R0,A
07B6  83         2673                RET
                 2674      $EJECT
                 2675      ;1. TITLE
                 2676      ;         ANACOS
                 2677      ;2. CALL AND RETURN
                 2678      ;         INPUTS     NONE
                 2679      ;
                 2680      ;         OUTPUTS    ANALOG COS SET
                 2681      ;
                 2682      ;         RETURN
                 2683      ;3. CALLED ROUTINES
                 2684      ;4. EQUATES
                 2685      ;*************************************************
                 2686      ;
07B7  B929       2687      ANACOS:   MOV    R1,#COSBUF      ;SET ANALOG COS
07B9  2340       2688                MOV    A,#40H
```

```
LOC   OBJ        LINE         SOURCE STATEMENT
07BB  41         2691              ORL    A,@R1
07BC  A1         2692              MOV    @R1,A
07BD  93         2693              RETR
                 2694         $EJECT
                 2695         ;1. TITLE
                 2696         ;              ADDX--ADDRESS MATCH ROUTINE
                 2697         ;2. CALL AND RETURN
                 2698         ;     INPUTS     R0=MESSAGE PTR , A=MESSAGE
                 2699         ;
                 2700         ;     OUTPUTS    A=0 => MATCH BIT1 SET => REPEATER
                 2701         ;
                 2702         ;              RETURN
                 2703         ;3. CALLED ROUTINES
                 2704         ;--LINESW
                 2705         ;     INPUTS     'LINE' WITH CURRENT LINE SET
                 2706         ;
                 2707         ;     OUTPUTS    'LINE' SWAPPED
                 2708         ;
                 2709         ;4. EQUATES
                 2710         ;***********************************************
                 2711         ;
                 2712         ;
07BE  B920       2713         ADDX:   MOV    R1,#ADDRES       ;GET ADDRESS
07C0  D1         2714                 XRL    A,@R1
07C1  5378       2715                 ANL    A,#78H            ;BITS 6 THRU 3 IS 540- GROUP ADDRESS
07C3  C6D2       2716                 JZ     ADDXE             ;IF NO MATCH THEN
07C5  41         2717                 ORL    A,@R1             ; GET REPEATER INFO
07C6  AA         2718                 MOV    R2,A
07C7  37         2719                 CPL    A
07C8  32D1       2720                 JB1    ADDX1             ; IF REPEATER THEN
07CA  0483       2721                 JMP    ADDXA             ;  SEE REPEATER PATCH
07CC  F418       2722         ADDX2:  CALL   LNSWAP            ;   SWITCH LINES UNCONDITIONALLY
07CE  B802       2723                 MOV    R0,#LENGTH        ;   GET MESSAGE LENGTH
07D0  80         2724                 MOVX   A,@R0             ;  ENDIF
07D1  2A         2725         ADDX1:  XCH    A,R2              ; ENDIF
07D2  93         2726         ADDXE:  RETR                     ;GET MATCHED INFO
                 2727         $EJECT
                 2728         ;1. TITLE
                 2729         ;              REVRSE--REVERSE/FORWARD ACTING SWITCH FOR CPA
                 2730         ;2. CALL AND RETURN
                 2731         ;     INPUTS     DIGIT1+6,7=COMMAND*4
                 2732         ;
                 2733         ;     OUTPUTS    DIGIT1+6,7=COMMAND*4 OR FFC-COMMAND*4
                 2734         ;
                 2735         ;3. CALLED ROUTINES
                 2736         ;--SUBT
                 2737         ;     INPUTS     R0=SUBTRAHEND, R1=MINUEND
                 2738         ;
```

```
LOC    OBJ          LINE              SOURCE STATEMENT

2739    ;                 OUTPUTS        R3,R4=RESULT
                    2740    ;
                    2741    ;4.  EQUATES
                    2742    ;************************************************************
                    2743    ;
                    2744    ;
07D3  8839          2745    REVRSE: MOV       R0,#DIGITL+1      ;GET REVERSE/FORWARD ACTING DATA FILE
07D5  F0            2746            MOV       A,@R0
07D6  32E6          2747            JB1       REV1              ;IF REVERSE ACTING THEN
07D8  BB0F          2748            MOV       R3,#0FH           ;   GET 0FFCH
07DA  BCFC          2749            MOV       R4,#0FCH
07DC  B903          2750            MOV       R1,#REG3          ;   GET 0FFCH-COMMAND*4
07DE  B83E          2751            MOV       R0,#DIGITL+6
07E0  F5            2752            SEL       MB1
07E1  149A          2753            CALL      SUBT
07E3  E5            2754            SEL       MB0
07E4  F4B1          2755            CALL      MOVEI             ;ELSE (FORWARD ACTING)
                    2756    ;                                   ;   GET COMMAND*4
                    2757    ;                                   ;ENDIF
07E6  93            2758    REV1:   RETR
                    2759    $EJECT
                    2760    ;1.  TITLE   OVRFL--TIMER OVERFLOW CHECK
                    2761    ;
                    2762    ;2.  CALL AND RETURN
                    2763    ;         INPUTS    REGISTER BANK 1 SELECTED
                    2764    ;
                    2765    ;         OUTPUTS   IF CHANGE IN TIMER OVERFLOW STATUS, THEN R2 INCREMENTED
                    2766    ;
                    2767    ;         RETURN
                    2768    ;3.  CALLED ROUTINES
                    2769    ;4.  EQUATES
                    2770    ;************************************************************
                    2771    ;
07E7  86ED          2773    OVRFL:  JNI       OVRFL2            ;IF NO INTERRUPT THEN
07E9  76EF          2774            JF1       OVRFL3            ;   IF NOT INTERRUPT LAST TIME THEN
07EB  E4F1          2775    OVRFL1: JMP       OVRFL4            ;       EXIT
                    2776    ;                                   ;   ELSE (INTERRUPT LAST TIME)
                    2777    ;                                   ;       INCREMENT COUNTER
                    2778    ;                                   ;   ENDIF
                    2779    ;                                   ;ELSE
07ED  76EB          2780    OVRFL2: JF1       OVRFL1            ;   IF INTERRUPT LAST TIME THEN
                    2781    ;                                   ;       EXIT
                    2782    ;                                   ;   ELSE (NO INTERRUPT LAST TIME)
07EF  B5            2783    OVRFL3: CPL       F1
07F0  CA            2784            DEC       R2                ;       INCREMENT DOWN COUNTER
07F1  83            2785    OVRFL4: RET                         ;ENDIF
                    2786    ;
```

```
LOC    OBJ           LINE           SOURCE STATEMENT
07F2   B8F5          2787   WATCHX: MOV    R0,#TOTRUN           ;SCHEDULE RUN TIME INCREMENT
07F4   80            2788           MOVX   A,@R0
07F5   A1            2789           MOV    @R1,A
07F6   2310          2790           MOV    A,#16
07F8   49            2791           ORL    A,R5                 ;SCHEDULE EIP PROGRAM (2 SECONDS)
07F9   AD            2792           MOV    R5,A
07FA   93            2793           RETR
                     2794           DB     0FFH,0FFH,0FFH,0FFH,0FFH
                     2795   $EJECT
                     2796   ;DATE CODE AND 540 FIRMWARE REV LETTER ARE FOUND AT THE END OF THE DATA FILE
                     2797   ;AREA. THE DATA FILE IS TERMINATED IN A 'FF'.
                     2798   ;DATE CODE.   SEE 3F0H AREA
                     2799   ;
0800                 2800           ORG    800H
                     2801   ;
                     2802   ;DATA FILE TERMINATOR IS AT 3F8H
                     2803   $EJECT
                     2804   ;1. TITLE
                     2805   ;       RANGE--DETERMINE INPUT RANGE OF R/P
                     2806   ;2. CALL AND RETURN
                     2807   ;       INPUTS       R3=MS ,R4=LS COUNT
                     2808   ;
                     2809   ;       OUTPUTS      A=0 => INVALID, ANALOG+6=RANGE
                     2810   ;
                     2811   ;       RETURN
                     2812   ;3. CALLED ROUTINES
                     2813   ;   --ADD16
                     2814   ;       INPUTS       R3,R4=AUGEND, R1=PTR TO ADDEND (INTERNAL)
                     2815   ;
                     2816   ;       OUTPUTS      R3,R4=RESULT
                     2817   ;
                     2818   ;4. EQUATES
0001                 2819   LIMIT1  EQU    (75*2*4-130)/256
0006                 2820   LIMIT2  EQU    (75*2*4-130) MOD 256
0006                 2821   LIMIT3  EQU    6
0040                 2822   LIMIT4  EQU    040H
0800  F20E           2823   RANG1:  DW     -((5870+5*16000) MOD 16384)+95*4     ;75 MICROSECOND OFFSET
0802  F08E           2824           DW     -((5870+4*16000) MOD 16384)+95*4     ;
0804  EF0E           2825           DW     -((5870+3*16000) MOD 16384)+95*4     ;200*2*4=COUNT RANGE OF 4 PULSES
0806  ED8E           2826           DW     -((5870+2*16000) MOD 16384)+95*4     ;
0808  EC0E           2827           DW     -((5870+1*16000) MOD 16384)+95*4     ;
080A  EA8E           2828           DW     -5870+95*4                           ;RANGE 1,1075-1275
080C  017C           2829   RANG7:  DW     95*4                                 ;RANGE 2
080E  3FFC           2830   RANG8:  DW     4095*4                               ;RANGE 3
0810  0000           2831   RANG9:  DW     0                                    ;RANGE 4
                     2832   ;                                                   ;RANGE 5
                     2833   ;                                                   ;RANGE 6,75-275
                     2834   ;                                                   ;RANGE7--RANGE DEFAULT LOW
                                                                                ;RANGE8--RANGE DEFAULT HIGH
```

| LOC | OBJ | LINE | | SOURCE | STATEMENT | |
|---|---|---|---|---|---|---|
| | | 2835 | RANGE: | MOV | R1,#ANALOG+3 | ;GET PTRS |
| 0812 | B933 | 2836 | | MOV | R3,#LIMIT1 | ;GET BASE OFFSET |
| 0814 | BB01 | 2837 | | MOV | R4,#LIMIT2 | ;GET BASE OFFSET (LS) |
| 0816 | BC06 | 2838 | | CALL | ADD16 | ;SUBTRACT OFFSET |
| 0818 | 14C4 | 2839 | | MOV | R0,#RANG9 AND 0FFH | ;GET '0' DEFAULT FOR NO COUNTS |
| 081A | B810 | 2840 | | JB7 | RANGE1 | ;IF WITHIN RANGES THEN |
| 081C | F220 | 2841 | | JMP | RANGE5 | |
| 081E | 0448 | 2842 | RANGE1: | MOV | A,#LIMIT3 | ; GET RANGE LENGTH |
| 0820 | 2306 | 2843 | | MOV | @R1,A | |
| 0822 | A1 | 2844 | | INC | R1 | |
| 0823 | 19 | 2845 | | MOV | A,#LIMIT4 | |
| 0824 | 2340 | 2846 | | MOV | @R1,A | |
| 0826 | A1 | 2847 | | DEC | R1 | |
| 0827 | C9 | 2848 | | MOV | R0,#RANG7 AND 0FFH | ; GET RANGE PTR |
| 0828 | B80C | 2849 | | MOV | R2,#7 | ; GET RANGE COUNT |
| 082A | BA07 | 2850 | RANGE2: | DJNZ | R2,RANGE3 | ; DO WHILE NO RANGE AND COUNT |
| 082C | EA30 | 2851 | | JMP | RANGE4 | |
| 082E | 0446 | 2852 | RANGE3: | CALL | ADD16 | ; SUBTRACT RANGE LENGTH |
| 0830 | 14C4 | 2853 | | DEC | R0 | ; GET NEXT RANGE PTR |
| 0832 | C8 | 2854 | | DEC | R0 | |
| 0833 | C8 | 2855 | | JB7 | RANGE2 | ; ENDWHILE |
| 0834 | F22C | 2856 | | | | ;ENDIF |
| | | 2857 | | MOV | R1,#ANALOG+6 | ;GET PROGRAMMED RANGE |
| 0836 | B936 | 2858 | | MOV | A,@R1 | |
| 083A | F1 | 2859 | | JZ | RANGE6 | ;IF PROGRAMMED RANGE THEN |
| 0839 | C64E | 2860 | | CPL | A | |
| 083B | 37 | 2861 | | INC | A | |
| 083C | 17 | 2862 | | ADD | A,R2 | ; GET MEASURED RANGE - PROGRAMMED RANGE |
| 083D | 6A | 2863 | | JZ | RANGE6 | ; IF NO MATCH THEN |
| 083E | C64E | 2864 | | JB7 | RANGE4 | ; IF LOWER RANGE THEN |
| 0840 | F246 | 2865 | | MOV | R0,#RANG7 AND 0FFH | ; SET '95' RESULT |
| 0842 | B80C | 2866 | | JMP | RANGE5 | ; ELSE (HIGHER RANGE) |
| 0844 | 0448 | 2867 | | MOV | R0,#RANG8 AND 0FFH | ; SET '4095' RESULT |
| 0846 | B80E | 2868 | RANGE4: | MOV | | ;ENDIF |
| | | 2869 | | | | ;ENDIF |
| 0848 | B931 | 2870 | RANGE5: | MOV | R1,#ANALOG+1 | ; GET RESULT PTR |
| 084A | 27 | 2871 | | CLR | A | |
| 084B | A1 | 2872 | | MOV | @R1,A | |
| 084C | 19 | 2873 | | INC | R1 | |
| 084D | A1 | 2874 | | MOV | @R1,A | ; CLEAR RAW VALUE |
| | | 2875 | | ; | | |
| 084E | F8 | 2876 | RANGE6: | MOV | A,R0 | |
| 084F | A3 | 2877 | | MOVP | A,@A | |
| 0850 | AB | 2878 | | MOV | R3,A | ;ENDIF |
| 0851 | 18 | 2879 | | INC | R0 | ;GET OFFSET PTR |
| 0852 | F8 | 2880 | | MOV | A,R0 | |
| 0853 | A3 | 2881 | | MOVP | A,@A | |
| 0854 | AC | 2882 | | MOV | R4,A | |

```
LOC  OBJ         LINE         SOURCE STATEMENT
0855 93          2883         RANGEE: RETR
                 2884         $EJECT
                 2885         ;1. TITLE
                 2886         ;         TABLE--GET TABLE PTR TO ENTRY
                 2887         ;2. CALL AND RETURN
                 2888         ;    INPUTS      A=TABLE NUMBER
                 2889         ;
                 2890         ;    OUTPUTS     TABLE ENTRY PTR , 0=> NO ADDITION DONE
                 2891         ;
                 2892         ;    RETURN
                 2893         ;3. CALLED ROUTINES
                 2894         ;4. EQUATES
                 2895         ;****************************************************
                 2896         ;
                 2897         ;
0856 03F6        2898         TABLE:  ADD     A,#TABLE0-1
0858 A8          2899                 MOV     R0,A
0859 80          2900                 MOVX    A,@R0                  ; GET TABLE DIRECTORY PTR
085A C671        2901                 JZ      TABLEE                 ; GET TABLE PTR
085C 5307        2902                 ANL     A,#7
085E AB          2903                 MOV     R3,A
085F 80          2904                 MOVX    A,@R0
0860 53F8        2905                 ANL     A,#0F8H                ; GET TABLE QUADRANT
0862 03E8        2906                 ADD     A,#-24
0864 AC          2907                 MOV     R4,A                   ; GET TABLE START LOCATION
0865 8932        2908                 MOV     R1,#ANALOG+2
0867 F1          2909                 MOV     A,@R1
0868 F7          2910                 RLC     A                      ; GET MS BIT OF LS BYTE
0869 C9          2911                 DEC     R1
086A F1          2912                 MOV     A,@R1
086B F7          2913                 RLC     A                      ; INCLUDE BIT IN MS BYTE
086C 531F        2914                 ANL     A,#1FH
086E C671        2915                 JZ      TABLEE
0870 6C          2916                 ADD     A,R4                   ; GET TABLE ADDRESS (1 OF 31)
0871 93          2917         TABLEE: RETR
                 2918         $EJECT
                 2919         ;1. TITLE
                 2920         ;         DIVD--15 BIT DIVIDE
                 2921         ;   NOTE: THE DIVIDEND AND DIVISOR MUST HAVE BIT 15 SET TO 0 TO WORK
                 2922         ;         IN ALL CASES.
                 2923         ;2. CALL AND RETURN
                 2924         ;    INPUTS      R1=PTR TO DIVIDEND, R0=PTR TO DIVISOR (BOTH INTERNAL)
                 2925         ;                DIVIDEND=32 BITS AS:     (R1)=MOST SIGNIFICANT
                 2926         ;                                         (R1+1)=NEXT    "
                 2927         ;                                         (R1+2)=NEXT    "
                 2928         ;                                         (R1+3)=LEAST SIGNIFICANT
                 2929         ;
                 2930         ;                DIVISOR=16 BITS AS:      (R0)=MOST SIGNIFICANT
```

| LOC  | OBJ  | LINE | SOURCE STATEMENT | | |
|------|------|------|------|------|------|
|      |      | 2931 | ; | | |
|      |      | 2932 | ; | OUTPUTS | R1+2=PTR TO QUOTIENT   (R0+1)=LEAST SIGNIFICANT |
|      |      | 2933 | ; | | R3,R4=REMAINDER |
|      |      | 2934 | ; | | |
|      |      | 2935 | ; | RETURN | |
|      |      | 2936 | ;3. | CALLED ROUTINES | |
|      |      | 2937 | ;4. | EQUATES | |
|      |      | 2938 | ;************************************************ | | |
|      |      | 2939 | ; | | |
|      |      | 2940 | ; | | |
| 0872 | BA10 | 2941 | DIVD:  | MOV | R2,#16 |
| 0874 | 1498 | 2942 | DIVDL: | CALL | SUBT       ;DO WHILE COUNT |
| 0876 | E67E | 2943 |        | JNC  | DIVD1      ;  GET DIVISOR-HIGH ORDER |
| 0878 | F8   | 2944 |        | MOV  | A,R3       ;  IF NEGATIVE (BORROW) THEN |
| 0879 | A1   | 2945 |        | MOV  | @R1,A      ;    GET REMAINDER |
| 087A | 19   | 2946 |        | INC  | R1 |
| 087B | FC   | 2947 |        | MOV  | A,R4 |
| 087C | A1   | 2948 |        | MOV  | @R1,A |
| 087D | C9   | 2949 |        | DEC  | R1 |
| 087E | 1483 | 2950 | DIVD1: | CALL | LINK       ; GET LOW ORDER INTO HIGH ORDER |
| 0880 | EA74 | 2951 |        | DJNZ | R2,DIVDL   ;ENDWHILE |
| 0882 | 93   | 2952 |        | RETR | |
|      |      | 2953 | ; | | |
|      |      | 2954 | ; | | |
|      |      | 2955 | ; | | |
| 0883 | BB04 | 2956 | LINK:  | MOV  | R3,#4      ;DO WHILE BYTES |
| 0885 | 19   | 2957 |        | INC  | R1 |
| 0886 | 19   | 2958 |        | INC  | R1 |
| 0887 | 19   | 2959 |        | INC  | R1 |
| 0888 | 19   | 2960 |        | INC  | R1 |
| 0889 | C9   | 2961 | LINKLP:| DEC  | R1 |
| 088A | 21   | 2962 |        | XCH  | A,@R1      ;  GET BYTE |
| 088B | F7   | 2963 |        | RLC  | A          ;  MOVE MS BIT INTO LINK |
| 088C | 21   | 2964 |        | XCH  | A,@R1      ;  SAVE NEW VALUE |
| 088D | EB89 | 2965 |        | DJNZ | R3,LINKLP  ;ENDWHILE |
| 088F | 83   | 2966 |        | RET  | |
|      |      | 2967 | $EJECT | | |
|      |      | 2968 | ;1. TITLE | | |
|      |      | 2969 | ;       SUBT--SUBTRACT TWO 16 BIT NUMBERS | | |
|      |      | 2970 | ;2. CALL AND RETURN | | |
|      |      | 2971 | ;   INPUTS   R1=PTR TO MINUEND, R0=PTR TO SUBTRAHEND | | |
|      |      | 2972 | ; | | |
|      |      | 2973 | ;   OUTPUTS | | |
|      |      | 2974 | ;            R3,R4=RESULT, IF NEGATIVE RESULT, BORROW IS MARKED BY FLAG |
|      |      | 2975 | ;            0 AND NO CARRY | | |
|      |      | 2976 | ;   RETURN | | |
|      |      | 2977 | ;3. CALLED ROUTINES | | |
|      |      | 2978 | ;4. EQUATES | | |

```
LOC   OBJ         LINE        SOURCE STATEMENT
                  2979   ;************************************************************
                  2980   ;
                  2981   ;
0890  1498        2982   SUBTV:  CALL   SUBT                    ;SUBTRACT
0892  F697        2983           JC     SUBTV1                  ;IF OVERFLOW THEN
0894  27          2984           CLR    A                       ;  SET RESULT=0
0895  AB          2985           MOV    R3,A
0896  AC          2986           MOV    R4,A
0897  83          2987   SUBTV1: RET                            ;ENDIF
                  2988   ;
                  2989   ;
                  2990   ;
0898  18          2991   SUBT:   INC    R0                      ;GET LS PTR
0899  19          2992           INC    R1
089A  85          2993           CLR    F0                      ;INITIALIZE BORROW
089B  F0          2994           MOV    A,@R0                   ;GET LS SUBTRAHEND
089C  37          2995           CPL    A
089D  0301        2996           ADD    A,#1
089F  F6A2        2997           JC     SUBT1
08A1  95          2998           CPL    F0                      ;IF BORROW THEN
08A2  61          2999   SUBT1:  ADD    A,@R1                   ;  SET FLAG 0
08A3  AC          3000           MOV    R4,A                    ;ENDIF
08A4  C8          3001           DEC    R0                      ;SAVE MINUEND-SUBTRAHEND
08A5  C9          3002           DEC    R1                      ;GET MS PTRS
08A6  F0          3003           MOV    A,@R0                   ;GET MS SUBTRAHEND
08A7  37          3004           CPL    A
08A8  B6AB        3005           JF0    SUBT2
08AA  17          3006           INC    A                       ;IF BORROW THEN
08AB  71          3007   SUBT2:  ADDC   A,@R1                   ;  SUBTRACT 1
08AC  AB          3008           MOV    R3,A                    ;ENDIF
08AD  83          3009           RET                            ;SAVE MINUEND -SUBTRAHEND
                  3010   $EJECT
                  3011   ;1. TITLE   MULT--8 X 16 BIT MULTIPLY ROUTINE
                  3012   ;
                  3013   ;2. CALL AND RETURN
                  3014   ;      INPUTS    R0=PTR TO MULTIPLIER, R1=PTR TO MULTIPLICAND
                  3015   ;                R1, R1+1=PTR TO MULTIPLIER
                  3016   ;
                  3017   ;      OUTPUTS   R3,R4=MS RESULT, R0=PTR TO LS BYTE OF RESULT
                  3018   ;
                  3019   ;      RETURN
                  3020   ;3. CALLED ROUTINES
                  3021   ;4. EQUATES
                  3022   ;************************************************************
                  3023   ;
                  3024   ;
08AE  BA09        3025   MULT:   MOV    R2,#9                   ;SET COUNTER
08B0  97          3026           CLR    C
```

| LOC | OBJ | LINE | | SOURCE STATEMENT | | |
|---|---|---|---|---|---|---|
| 0881 | 20 | 3027 | MULTLP: | XCH | A,@R0 | ;DO WHILE COUNT |
| 0882 | 67 | 3028 | | RRC | A | ; GET MULTIPLIER BIT |
| 0883 | 20 | 3029 | | XCH | A,@R0 | |
| 0884 | EAB7 | 3030 | | DJNZ | R2,MULT1 | ; TEST COUNT |
| 0886 | 93 | 3031 | | RETR | | |
| 0887 | E6BB | 3032 | MULT1: | JNC | MULT2 | ; IF BIT SET THEN |
| 0889 | 14C4 | 3033 | | CALL | ADD16 | ; ADD MULTIPLICAND |
| 088B | 97 | 3034 | MULT2: | CLR | C | ; ENDIF |
| 088C | FB | 3035 | | MOV | A,R3 | ; SHIFT OUT LEAST SIGNIFICANT BIT |
| 088D | 67 | 3036 | | RRC | A | |
| 088E | AB | 3037 | | MOV | R3,A | |
| 088F | FC | 3038 | | MOV | A,R4 | |
| 08C0 | 67 | 3039 | | RRC | A | |
| 08C1 | AC | 3040 | | MOV | R4,A | |
| 08C2 | 04B1 | 3041 | | JMP | MULTLP | ;ENDWHILE |
| | | 3042 | $EJECT | | | |
| | | 3043 | ;1. TITLE | | | |
| | | 3044 | ; ADD16--ADD TWO 16 BIT VALUES, GET 16 BIT RESULT (OVERFLOW IN CARRY) |
| | | 3045 | ;2. CALL AND RETURN | | | |
| | | 3046 | ; INPUTS R3=MS, R4=LS, R1=PTR TO ADDEND (INTERNAL) |
| | | 3047 | ; | | | |
| | | 3048 | ; OUTPUTS R3,R4=RESULT | | | |
| | | 3049 | ; | | | |
| | | 3050 | ; RETURN | | | |
| | | 3051 | ;3. CALLED ROUTINES | | | |
| | | 3052 | ;4. EQUATES | | | |
| | | 3053 | ;*********************************************************************** |
| | | 3054 | ; | | | |
| | | 3055 | ; | | | |
| 08C4 | 97 | 3056 | ADD16: | CLR | C | ;CLEAR CARRY |
| 08C5 | 19 | 3057 | | INC | R1 | |
| 08C6 | F1 | 3058 | | MOV | A,@R1 | |
| 08C7 | 6C | 3059 | | ADD | A,R4 | ;ADD LEAST SIGN. ADDEND |
| 08C8 | AC | 3060 | | MOV | R4,A | ;SAVE LS ENTRY |
| 08C9 | C9 | 3061 | | DEC | R1 | |
| 08CA | F1 | 3062 | | MOV | A,@R1 | ;GET MS ADDEND |
| 08CB | 78 | 3063 | | ADDC | A,R3 | ;ADD MUST SIGN. ADDEND |
| 08CC | AB | 3064 | | MOV | R3,A | ;SAVE MS ENTRY |
| 08CD | 83 | 3065 | | RET | | |
| | | 3066 | $EJECT | | | |
| | | 3067 | ;1. TITLE | | | |
| | | 3068 | ; DIVIDE BY 2 (RIGHT SHIFT MULTIPLE) |
| | | 3069 | ;2. CALL AND RETURN | | | |
| | | 3070 | ; INPUTS R2=DIVISOR/2, R3=MS, R4=LS |
| | | 3071 | ; | | | |
| | | 3072 | ; OUTPUTS R3=MS, R4=LS |
| | | 3073 | ; | | | |
| | | 3074 | ; RETURN | | | |

```
LOC    OBJ           LINE          SOURCE STATEMENT

3075    ;3.   CALLED ROUTINES
                     3076    ;4.   EQUATES
                     3077    ;***********************************************************
                     3078    ;
                     3079    ;
08CE   97            3080    NORMAL: CLR   C                      ;DO WHILE DIVISOR
08CF   FB            3081            MOV   A,R3
08D0   67            3082            RRC   A
08D1   AB            3083            MOV   R3,A
08D2   FC            3084            MOV   A,R4
08D3   67            3085            RRC   A                      ;  SHIFT DOUBLE REGISTER
08D4   AC            3086            MOV   R4,A
08D5   EACE          3087            DJNZ  R2,NORMAL              ;ENDWHILE
08D7   93            3088            RETR
                     3089    ;
                     3090    ;       SET UP GAIN BIT OUTPUT,ADDED 6-6-80
                     3091    ;       LOOK AT GAIN BIT IN THE DATAFILE
                     3092    ;       IF G=0, OUTPUT X10 GAIN
                     3093    ;       IF G=1, OUTPUT X1 GAIN
08D8   R833          3094    BASEEA: MOV   R0,#ANALOG+3           ;D.F. BYTE 3
08DA   F0            3095            MOV   A,@R0
08DB   F2E5          3096            JB7   BASEEH                 ;EXIT IF NOT VOLTAGE TYPE
08DD   8418          3097            JMP   BASEED         ; PATCHED 6-19-80
08DF   92E6          3098    BASEEF: JB4   BASEEC                 ;GAIN BIT SET?
08E1   81            3099            MOVX  A,@R1                  ;NO. SET X10 GAIN
08E2   04F3          3100            JMP   BASEEZ                 ;RESET BIT4,PATCHED 6-12-80
08E4   91            3101    BASEEY: MOVX  @R1,A                  ;OUTPUT TO PORT C
08E5   93            3102    BASEEB: RETR                         ;EXIT
08E6   81            3103    BASEEC: MOVX  A,@R1                  ;OUTPUT X1 GAIN
08E7   4310          3104            ORL   A,#10H                 ;SET R4
08E9   91            3105            MOVX  @R1,A                  ;OUTPUT TO PORT C
08EA   93            3106            RETR
                     3107    ;
08EB   F0            3108    NUM:    MOV   A,@R0                  ;GET MASKED VALUE
08EC   530F          3109            ANL   A,#0FH
08EE   AB            3110            MOV   R3,A
08EF   18            3111            INC   R0
08F0   F0            3112            MOV   A,@R0
08F1   AC            3113            MOV   R4,A
08F2   93            3114            RETR
                     3115    ;
08F3   530F          3116    BASEEZ: ANL   A,#0FH   ;PATCHED 6-12-80
08F5   17            3117            INC   A       ;INCREASE D/A OUTPUT BY 200H
08F6   17            3118            INC   A
08F7   04E4          3119            JMP   BASEEY   ;FOR X10 GAIN INPUTS
08F9   FF            3120            DB    0FFH,0FFH,0FFH,0FFH,0FFH,0FFH,0FFH
08FA   FF
08FB   FF
```

```
LOC   OBJ              LINE         SOURCE STATEMENT
08FC  FF
08FD  FF
08FE  FF
08FF  FF
0900  FF
                       3121   $EJECT
                       3122   ;1. TITLE      ,REV.6-6-80
                       3123   ;        BASE--CALULATE BASE FROM 'RRR' ENTRY IN DATA FILE
                       3124   ;2. CALL AND RETURN
                       3125   ;        INPUTS
                       3126   ;        OUTPUTS
                       3127   ;        RETURN
                       3128   ;3. CALLED ROUTINES
0900                   3129            ORG     0900H
                       3130   ;
0900  73               3131   RANGES:  DB      BASE0 AND 0FFH          CASE OF 'RRR' OF
0901  12               3132            DB      BASE1 AND 0FFH          ;0:  R/P,THRESHOLD=>NO PROCESSING
0902  1C               3133            DB      BASE2 AND 0FFH          ;1:  FULL RANGE>5V
0903  28               3134            DB      BASE3 AND 0FFH          ;2:  0-5V VOLTAGE/CURRENT
0904  30               3135            DB      BASE4 AND 0FFH          ;3:  5-10V VOLTAGE/CURRENT
0905  43               3136            DB      BASE5 AND 0FFH          ;4:  3.7MA, 10X RTD
0906  49               3137            DB      BASE6 AND 0FFH          ;5:  3.7MA, 1X RTD
0907  4F               3138            DB      BASE7 AND 0FFH          ;6:  1.2MA, 10X RTD
                       3139   ;                                        ;7:  1.2MA,1X RTD
                       3140   ;4. EQUATES                              ENDCASE
                       3141   ;***********************************************
                       3142   ;
                       3143   ;
0908  B932             3144   BASE:    MOV     R1,#ANALOG+2            ;GET ENTRY POINTER
090A  B873             3145            MOV     R0,#ANALOG+3            ;GET RANGE VALUE
090C  F0               3146            MOV     A,@R0
090D  47               3147            SWAP    A
090E  77               3148            RR      A
090F  5307             3149            ANL     A,#7
0911  B3               3150            JMPP    @A
                       3151   ;
                       3152   ;                                        ;CASE RANGE OF
0912  B835             3153   BASE1:   MOV     R0,#ANALOG+5            ;   0:  USE BASE DATA FILE ENTRY
0914  14EB             3154            CALL    NUM
0916  BA01             3155            MOV     R2,#1                   ;   1:  GET RANGE
0918  14CE             3156            CALL    NORMAL
091A  2455             3157            JMP     BASEP
                       3158   ;                                        ;       GET RANGE/2
                       3159   ;                                        ;       CASE OF ENTRY OF:
                       3160   ;                                        ;           1:  A/D=800H-RANGE/2
                       3161   ;                                        ;           2:  A/D=800H+RANGE/2
                       3162   ;                                        ;           3:  A/D=800H
                       3163   ;                                        ;       ENDCASE
091C  F1               3163   BASE2:   MOV     A,@R1                   ;   2:  CASE ENTRY OF:
```

| LOC | OBJ | LINE | | SOURCE STATEMENT | | |
|---|---|---|---|---|---|---|
| 091D | F223 | 3164 | | JB7 | BASE2A | ;    1:    A/D=800H-BASE |
| 091F | 14EB | 3165 | | CALL | NUM | |
| 0921 | 2455 | 3166 | | JMP | BASEP | |
| 0923 | 9255 | 3167 | BASE2A: | JB4 | BASEP | ;    2:    A/D=800H+RANGE-BASE |
| 0925 | B833 | 3168 | | MOV | R0,#ANALOG+3 | |
| 0927 | 14EB | 3169 | | CALL | NUM | ;    3:    A/D=800H |
| 0929 | 6400 | 3170 | | JMP | BASE2H | ;ENDCASE |
| | | 3171 | ; | | | |
| | | 3172 | ; | | | ;CASE ENTRY OF: |
| 092B | F1 | 3173 | BASE3: | MOV | A,@R1 | ;    1:    A/D=0 |
| 092C | F233 | 3174 | | JB7 | BASE3A | |
| 092E | 27 | 3175 | | CLR | A | |
| 092F | A3 | 3176 | | MOV | R3,A | |
| 0930 | AC | 3177 | | MOV | R4,A | |
| 0931 | 2471 | 3178 | | JMP | BASEEX | ;    2:    A/D=RANGE |
| 0933 | 9239 | 3179 | BASE3A: | JB4 | BASE3B | |
| 0935 | B835 | 3180 | | MOV | R0,#ANALOG+5 | ;    3:    A/D=BASE |
| 0937 | 2473 | 3181 | | JMP | BASEE | |
| 0939 | B833 | 3182 | BASE3B: | MOV | R0,#ANALOG+3 | |
| 093B | 2473 | 3183 | | JMP | BASEE | |
| | | 3184 | ; | | | ;ENDCASE |
| | | 3185 | ; | | | |
| 093D | BB04 | 3186 | BASE4: | MOV | R3,#(1024/256) | ;    4:    A/D=2.5V |
| 093F | BC00 | 3187 | | MOV | R4,#(1024) MOD 256 | ;** REV 1/16/81 ** |
| 0941 | 2471 | 3188 | | JMP | BASEEX | |
| | | 3189 | ; | | | |
| 0943 | BB17 | 3190 | BASE5: | MOV | R3,#((4095/2)/256)+10H | ;    5:    A/D=5V + 1X INPUT |
| 0945 | BCFF | 3191 | | MOV | R4,#(4095/2) MOD 256 | |
| 0947 | 2471 | 3192 | | JMP | BASEEX | |
| | | 3193 | ; | | | |
| 0949 | BB01 | 3194 | BASE6: | MOV | R3,#(4095/10)/256 | ;    6:    A/D=1.0V,REV.6-6-80 |
| 094B | BC99 | 3195 | | MOV | R4,#(4095/10) MOD 256 | ;LOAD 01,99 IN R3,R4 RESPLY. |
| 094D | 2471 | 3196 | | JMP | BASEEX | |
| | | 3197 | ; | | | |
| 094F | BB17 | 3198 | BASE7: | MOV | R3,#(1924/256)+10H | ;    7:    A/D=4.7V + 1X INPUT |
| 0951 | BC84 | 3199 | | MOV | R4,#(1924)MOD 256 | ;LOAD 17,34 IN R3,R4 RESPLY. |
| 0953 | 2471 | 3200 | | JMP | BASEEX | |
| | | 3201 | ; | | | ;END CASE |
| 0955 | B839 | 3202 | BASEP: | MOV | R0,#DIGITL+1 | ;RESET LOC.38,39 TO 07FFH |
| 0957 | 23FF | 3203 | | MOV | A,#0FFH | |
| 0959 | A0 | 3204 | | MOV | @R0,A | |
| 095A | C8 | 3205 | | DEC | R0 | |
| 095B | 2307 | 3206 | | MOV | A,#07H | |
| 095D | A0 | 3207 | | MOV | @R0,A | |
| 095E | F1 | 3208 | | MOV | A,@R1 | |
| 095F | B903 | 3209 | | MOV | R1,#REG3 | |
| 0961 | F26H | 3210 | | JB7 | BASEP1 | |
| 0963 | B803 | 3211 | | MOV | R0,#REG3 | ;POINTER FOR SUBTRAHEND |

```
LOC  OBJ      LINE          SOURCE STATEMENT
                3212            MOV    R1,#DIGITL     ;POINTER FOR MINUEND
0965 8938       3213            CALL   SUBT
0967 1498       3214            JMP    BASEEX
0969 2471       3215  BASEP1:  JB4    BASEE          ;GET 800-X
096B 9273       3216            MOV    R1,#DIGITL     ;GET 800+X
096D 8938       3217            CALL   ADD16          ;POINT R1 AT DRYT 38H
096F 14C4       3218   ;
0971 A803       3219  BASEEX:  MOV    R0,#REG3       ;GET PTR TO SOURCE
0973 A903       3220  BASEE:   MOV    R1,#PORTC      ;GET D/A PTR
0975 F0         3221            MOV    A,@R0
0976 91         3222            MOVX   @R1,A          ;OUTPUT D/A VALUE
0977 1A         3223            INC    R0
0978 F0         3224            MOV    A,@R0
097A F0         3225            MOV    R1,#PORTA
097A 91         3226            MOVX   @R1,A
097C 0408       3227            JMP    BASEEA
                3228   ;
                3229   ;
                3230  $EJECT
                3231  ;1. TITLE
                3232  ;        OFFSET--OFFSET RESULT
                3233  ;2. CALL AND RETURN
                3234  ;   INPUTS      R4=OFFSET (VVVVVVVS) WHERE V=VALUE, S=SIGN
                3235  ;                       OFFSET RANGES FROM 0 TO 254 IN INCREMENTS OF 2
                3236  ;                       OFFSET RANGES NEGATIVE FROM -1 TO -255 IN INCREMENTS OF 2
                3237  ;   OUTPUTS     OFFSET ADDED (SUBTRACTED) FROM VALUE AT ANALOG+1
                3238  ;
                3239  ;   RETURN
                3240  ;3. CALLED ROUTINES
                3241  ;--SUBT
                3242  ;   INPUTS      R0=MINUEND, R1=SUBTRAHEND PTR
                3243  ;
                3244  ;   OUTPUTS     R3,R4=RESULT
                3245  ;
                3246  ;--ADD16
                3247  ;   INPUTS      R1=PTR TO ADDEND, R3,R4=AUGEND
                3248  ;
                3249  ;   OUTPUTS     R3,R4=RESULT
                3250  ;
                3251  ;--MOVERI
                3252  ;   INPUTS      R3,R4=DATA, ANALOG+1,2=DESTINATION
                3253  ;
                3254  ;   OUTPUTS     VALUES MOVED
                3255  ;
                3256  ;4. EQUATES
                3257  ;********************************************************
                3258  ;
```

| LOC | OBJ | LINE | | SOURCE STATEMENT | | |
|---|---|---|---|---|---|---|
| | | 3260 | ; | | | |
| 097E | B803 | 3261 | OFFSET: | MOV | R0,#REG3 | ;GET SUBTRAHEND(AUGEND) PTR |
| 0980 | B931 | 3262 | | MOV | R1,#ANALOG+1 | |
| 0982 | 27 | 3263 | | CLR | A | |
| 0983 | AB | 3264 | | MOV | R3,A | |
| 0984 | FC | 3265 | | MOV | A,R4 | |
| 0985 | 1288 | 3266 | | JB0 | OFF1 | ;IF POSITIVE OFFSET THEN |
| 0987 | 14C4 | 3267 | | CALL | ADD16 | ;  ADD RESULT |
| 0989 | 248D | 3268 | | JMP | OFF2 | ;ELSE (NEGATIVE OFFSET) |
| 098B | 1490 | 3269 | OFF1: | CALL | SUBTV | ;  SUBTRACT RESULT |
| 098D | E5 | 3270 | | SEL | MB0 | ;ENDIF |
| 098E | F4AF | 3271 | OFF2: | CALL | MOVERI | ;SAVE RESULT |
| 0990 | F5 | 3272 | | SEL | MR1 | |
| 0991 | 93 | 3273 | | RETR | | |
| | | 3274 | $EJECT | | | |
| | | 3275 | ;1. TITLE | | | |
| | | 3276 | ; FINAL--ADDING OFFSET TO R3,R4 AND CHECKING FOR 4095 OVERFLOW | | | |
| | | 3277 | ;           IF OVERFLOW, THEN FORCE TO 4095 | | | |
| | | 3278 | ;2.  CALL AND RETURN | | | |
| | | 3279 | ;    INPUTS    R4=OFFSET, ANALOG+1,2=VALUE TO BE OFFSET | | | |
| | | 3280 | ; | | | |
| | | 3281 | ;    OUTPUTS   ANALOG+1,2 UPDATED WITH NEW VALUE | | | |
| | | 3282 | ; | | | |
| | | 3283 | ;    RETURN | | | |
| | | 3284 | ;3.  CALLED ROUTINES | | | |
| | | 3285 | ;--ADD16 | | | |
| | | 3286 | ;    INPUTS    R1=PTR TO ADDEND, R3,R4=AUGEND | | | |
| | | 3287 | ; | | | |
| | | 3288 | ;    OUTPUTS   R3,R4=RESULT | | | |
| | | 3289 | ; | | | |
| | | 3290 | ;4.  EQUATES | | | |
| | | 3291 | ;************************************************************ | | | |
| | | 3292 | ; | | | |
| | | 3293 | ; | | | |
| 0992 | B803 | 3294 | FINAL: | MOV | R0,#REG3 | ;GET ADD PTRS |
| 0994 | B931 | 3295 | | MOV | R1,#ANALOG+1 | |
| 0996 | 27 | 3296 | | CLR | A | ;PRESET MSB |
| 0997 | AB | 3297 | | MOV | R3,A | |
| 0998 | 14C4 | 3298 | | CALL | ADD16 | |
| 099A | FB | 3299 | | MOV | A,R3 | |
| 099B | 53F0 | 3300 | | ANL | A,#0F0H | ;OFFSET |
| 099D | C6A3 | 3301 | | JZ | FINAL3 | ;IF OVERFLOW THEN |
| 099F | B90F | 3302 | | MOV | R3,#0FH | |
| 09A1 | BCFF | 3303 | | MOV | R4,#0FFH | ;   VALUE= 0FFFH (MAX VALUE POSSIBLE) |
| 09A3 | 348D | 3304 | FINAL3: | CALL | OFF2 | ;ENDIF |
| 09A5 | 4445 | 3305 | | JMP | ADRP3 | ;STORE RESULT |
| | | 3306 | $EJECT | | | |
| | | 3307 | ;1. TITLE | | | |

| LOC | OBJ | LINE | | SOURCE STATEMENT | | |
|---|---|---|---|---|---|---|
| | | 3308 | ;2. | CALL AND RETURN | | |
| | | 3309 | ; | INPUTS | | |
| | | 3310 | ; | OUTPUTS | | |
| | | 3311 | ; | RETURN | | |
| | | 3312 | ;3. | CALLED ROUTINES | | |
| | | 3313 | ;4. | EQUATES | | |
| | | 3314 | ;*********************************************** | | | |
| | | 3315 | ; | | | |
| | | 3316 | ; | | | |
| 09A7 | B931 | 3317 | PV: | MOV | R1,#ANALOG+1 | ;GET BASE VALUE PTR |
| 09A9 | B814 | 3318 | | MOV | R0,#ADTMP | ;GET MEASURED VALUE PTR |
| 09AB | 1490 | 3319 | | CALL | SUBTV | ;GET MEASURE-BASE |
| 09AD | B803 | 3320 | | MOV | R0,#REG3 | ;SAVE RESULT |
| 09AF | 34B9 | 3321 | | CALL | DIVDEN | ;GET DIVIDEND |
| 09B1 | B931 | 3322 | | MOV | R1,#ANALOG+1 | ;GET BASE VALUE PTR |
| 09B3 | B816 | 3323 | | MOV | R0,#ADTMP1 | ;GET RANGE VALUE PTR |
| 09B5 | 1498 | 3324 | | CALL | SUBT | ;GET RANGE-BASE |
| 09B7 | 24C3 | 3325 | | JMP | DIVIDE | ;DIVIDE |
| | | 3326 | $EJECT | | | |
| | | 3327 | ;1. TITLE | | | |
| | | 3328 | ; | DIVDEN--SET UP 32 BIT DIVIDEND TO DIVIDE | | |
| | | 3329 | ;2. | CALL AND RETURN | | |
| | | 3330 | ; | INPUTS | R0=PTR TO DIVIDEND (16 BITS) | |
| | | 3331 | ; | | | |
| | | 3332 | ; | OUTPUTS | DIVIDEND MOVED AND EXTENDED BY 16 BITS OF 0 | |
| | | 3333 | ; | | | |
| | | 3334 | ; | RETURN | | |
| | | 3335 | ;3. | CALLED ROUTINES | | |
| | | 3336 | ;4. | EQUATES | | |
| | | 3337 | ;*********************************************** | | | |
| | | 3338 | ; | | | |
| | | 3339 | ; | | | |
| 09B9 | B93A | 3340 | DIVDEN: | MOV | R1,#DIGITL | |
| 09BB | 34F7 | 3341 | | CALL | MOVEMM | |
| 09BD | 27 | 3342 | | CLR | A | |
| 09BE | 19 | 3343 | | INC | R1 | |
| 09BF | A1 | 3344 | | MOV | @R1,A | |
| 09C0 | 19 | 3345 | | INC | R1 | |
| 09C1 | A1 | 3346 | | MOV | @R1,A | ;CLEAR LS BITS FOR DIVIDE |
| 09C2 | 93 | 3347 | | RETR | | |
| | | 3348 | $EJECT | | | |
| | | 3349 | ;1. TITLE | | | |
| | | 3350 | ; | DIVIDE--MOVE DIVISOR AND DIVIDE AND OFFSET RESULT | | |
| | | 3351 | ;2. | CALL AND RETURN | | |
| | | 3352 | ; | INPUTS | R3,R4=DIVISOR, DIGITL+0-4=DIVIDEND | |
| | | 3353 | ; | | | |
| | | 3354 | ; | OUTPUTS | QUOTIENT (12 BITS) IN ANALOG+1,2 | |
| | | 3355 | ; | | | |

```
LOC   OBJ              LINE           SOURCE STATEMENT
                       3356    ;                                        ************************************************
                       3357    ;3.   CALLED ROUTINES
                       3358    ;4.   EQUATES
                       3359    ;************************************************
                       3360    ;
                       3361    ;
09C3 8803              3362    DIVIDE: MOV    R0,#REG3              ;SAVE RESULT
09C5 B93C              3363            MOV    R1,#DIGITL+4
09C7 34F7              3364            CALL   MOVEMM
09C9 B938              3365            MOV    R1,#DIGITL            ;GET (MEASURE-BASE)/(RANGE-BASE)
09CB B83C              3366            MOV    R0,#DIGITL+4
09CD 1472              3367            CALL   DIVD
09CF B83A              3368            MOV    R0,#DIGITL+2          ;GET RESULT PTR
09D1 B903              3369            MOV    R1,#REG3              ;GET SAVE PTR
09D3 34F7              3370            CALL   MOVEMM                ;SAVE RESULT
09D5 BA03              3371            MOV    R2,#3                 ;NORMALIZE RESULT
09D7 14CE              3372            CALL   NORMAL
09D9 3480              3373            CALL   OFF2                  ;SAVE RESULT
09DB 93                3374            RETR
                       3375    $EJECT
                       3376    ;1. TITLE
                       3377    ;             SAVE--SAVE RESULT
                       3378    ;2.   CALL AND RETURN
                       3379    ;             INPUTS    R1=PTR TO DESTINATION
                       3380    ;                       R2=REENTRY PTR
                       3381    ;                       A=PORT ASSIGNMENT
                       3382    ;
                       3383    ;             OUTPUTS   VALUES STORED IN DATA FILE WORKSPACE
                       3384    ;             RETURN
                       3385    ;3.   CALLED ROUTINES
                       3386    ;     --MOVEMM
                       3387    ;
                       3388    ;             INPUTS    R0=SOURCE PTR1, R1=SOURCE PTR 2
                       3389    ;
                       3390    ;             OUTPUTS   MEMORY VALUES EXCHANGED
                       3391    ;
                       3392    ;4.   EQUATES
                       3393    ;************************************************
                       3394    ;
09DC 8833              3395    SAVE:  MOV    R0,#ANALOG+3            ;GET ENTRY TYPE
09DE F0                3396           MOV    A,@R0
09DF F2E5              3397           JB7    SAVE1                   ;IF VOLTAGE TYPE THEN
09E1 23D8              3398           MOV    A,#11011000B            ; ENABLE SELF CAL GROUND
09E3 24ED              3399           JMP    SAVE4                   ;ELSE IF RTD 10X THEN
09E5 B2EA              3400           JB5    SAVE2                   ;
09E7 27                3401    SAVE1: CLR    A                       ; SET SELF CAL PORT INPUT
09E8 24EC              3402           JMP    SAVE3                   ;ELSE IF RTD 1X THEN
                       3403
```

```
LOC  OBJ        LINE            SOURCE STATEMENT

09EA 230H       3404  SAVE2:    MOV    A,#8              ; SET SELF CAL ENTRY
09EC 6B         3405  SAVE3:    ADD    A,R3              ;ENDIF
09ED A1         3406  SAVE4:    MOV    @R1,A
09EE 19         3407            INC    R1
09EF FA         3408            MOV    A,R2
09F0 A1         3409            MOV    @R1,A             ;ENABLE RETURN
09F1 C9         3410            DEC    R1
09F2 B831       3411            MOV    R0,#ANALOG+1      ;SAVE MS BYTE OF COUNT
09F4 34F7       3412            CALL   MOVEMM
09F6 93         3413            RETR
                3414  $EJECT
                3415  ;1. TITLE
                3416  ;          MOVEMM--MOVE MEMORY TO MEMORY (INTERNAL)
                3417  ;2. CALL AND RETURN
                3418  ;     INPUTS    R0=SOURCE PTR, R1=DESTINATION PTR
                3419  ;
                3420  ;     OUTPUTS   2 BYTES MOVED, PTRS= LAST MOVED BYTE
                3421  ;
                3422  ;     RETURN
                3423  ;3. CALLED ROUTINES
                3424  ;4. EQUATES
                3425  ;****************************************************
                3426  ;
                3427  ;
09F7 F0         3428  MOVEMM:   MOV    A,@R0
09F8 21         3429            XCH    A,@R1
09F9 20         3430            XCH    A,@R0
09FA 18         3431            INC    R0
09FB 19         3432            INC    R1
09FC F0         3433            MOV    A,@R0
09FD 21         3434            XCH    A,@R1
09FE 20         3435            XCH    A,@R0
09FF 93         3436            RETR
                3437  $EJECT
                3438  ;1. TITLE
                3439  ;          ADMB--ANALOG CONVERSION DISTRIBUTION
                3440  ;2. CALL AND RETURN
                3441  ;     INPUTS    A=VALUE OF LOCATION TO JUMP TO
                3442  ;
                3443  ;     OUTPUTS   PER ROUTINE ENTERED
                3444  ;
                3445  ;     RETURN
                3446  ;3. CALLED ROUTINES
0A00            3447            ORG    0A00H
0A00 1B         3448  XADIDL:   DB     ADE AND 0FFH      ;IMPOSSIBLE ENTRY
0A01 1H         3449  XADE:     DB     ADE AND 0FFH      ;CLEAN UP AND STORE ENTRY
0A02 2E         3450  XADT2:    DB     ADRP AND 0FFH     ;TYPE 2 ANALOG: R/P
0A03 4A         3451  XADT3:    DB     ADTHR AND 0FFH    ;TYPE 3 ANALOG: THRESHOLD
```

```
LOC   OBJ           LINE            SOURCE STATEMENT
                    3452   XADT4:   DB       ADV AND OFFH         ;TYPE 4 ANALOG: VOLTAGE
0A04  7E            3453   XADT5:   DB       ADRTD AND OFFH       ;TYPE 5 ANALOG: RTD
0A05  AA            3454   XADT6:   DB       ADV AND OFFH         ;TYPE 6 ANALOG: CURRENT
0A06  7E            3455   XADT7:   DB       ADV AND OFFH         ;TYPE 7 ANALOG: SPARE VOLTAGE TYPE
0A07  7E            3456   XOPEN:   DB       OPNPRT AND OFFH      ;OPEN I/O PORT
0A08  57            3457   XINTP:   DB       INTP AND OFFH        ;INTERPOLATION AND OFFSET ENTRY
0A09  E4            3458   XFNL:    DB       ADFNL AND OFFH       ;FINAL VALUE CALULATION
0A0A  D6            3459   XADR3:   DB       ADRTD3 AND OFFH      ;RTD REENTRY 3
0A0B  C0            3460   XADR2:   DB       ADRTD2 AND OFFH      ;RTD REENTRY 2
0A0C  8A            3461   XADR1:   DB       ADRTD1 AND OFFH      ;RTD REENTRY 1
0A0D  82            3462   XADVR1:  DB       ADV1 AND OFFH        ;VOLTAGE REENTRY 1
0A0E  9E            3463   XADVR2:  DB       ADV2 AND OFFH        ;VOLTAGE REENTRY 2
0A0F  A4            3464   ;4.  EQUATES
                    3465   ;*************************************************************
                    3466   ;
                    3467   ;
0A10  B3            3468   ADMH1:   JMPP     @A
                    3469   ;
                    3470   ;
0A11  34DC          3471   ADVEX:   CALL     SAVE
0A13  2308          3472            MOV      A,#XOPEN AND OFFH
0A15  B8F1          3473            MOV      R0,#ANAIN+1          ;SET NEW INTEGRATION ENTRY
0A17  90            3474            MOVX     @R0,A
0A18  F5            3475   ADVE1:   SEL      MB0
0A19  B40F          3476            JMP      EXEC
                    3477   $EJECT
                    3478   ;1. TITLE   ADE--A/D CONVERSION END
                    3479   ;
                    3480   ;2.  CALL AND RETURN
                    3481   ;       INPUTS
                    3482   ;               ANAL16+1,2=FINAL CONVERTER VALUE
                    3483   ;       OUTPUTS      VALUE STORED IN POINT STATUS FILE, COS DETECTED AND STORED
                    3484   ;       RETURN
                    3485   ;
                    3486   ;3.  CALLED ROUTINES
                    3487   ;4.  EQUATES
                    3488   ;*************************************************************
                    3489   ;
                    3490   ;
0A1B  E5            3491   ADE:     SEL      MB0
0A1C  B830          3492            MOV      R0,#ANALOG           ;STORE VALUES
0A1E  F0            3493            MOV      A,@R0
0A1F  F434          3494            CALL     PANAST
0A21  B832          3495            MOV      R0,#ANALOG+2
0A23  F0            3496            MOV      A,@R0                ;GET VALUES
0A24  AC            3497            MOV      R4,A
0A25  C8            3498            DEC      R0
0A26  F0            3499            MOV      A,@R0
```

| LOC | OBJ | LINE | SOURCE STATEMENT | |
|---|---|---|---|---|
| 0A27 | AB | 3500 | MOV | R3,A ;STORE STATUS |
| 0A28 | F426 | 3501 | CALL | MOVER |
| 0A2A | F5 | 3502 | SEL | MB1 |
| 0A2B | 27 | 3503 | CLR | A |
| 0A2C | 4415 | 3504 | JMP | ADVE ;ENABLE REENTRY AT IDLE |

```
3505        $EJECT
3506   ;1. TITLE
3507   ;     ADRP--RP CONVERTER PROCESSING RAW COUNT
3508   ;     NOTES: THE RP CONVERTER IS DERIVED FROM A FREE RUNNING COUNTER IN THE
3509   ;     8155 AND A PARALLEL PULSE COUNTER IN THE 8049 PROCESSOR. THE FREE
3510   ;     RUNNING COUNTER COUNTS THE TIME BETWEEN 20 PULSES TO ACCUMULATE AN
3511   ;     R/P COUNT.
3512   ;
3513   ;     THE COUNTER RUNS AT 6.0000 MHZ/3 OR 0.50000 MICROSECONDS PER COUNT.
3514   ;
3515   ;     THE R/P ROUTINE HAS SIX RANGES OF CALIBRATION THAT ARE DIGITIZED.  THE
3516   ;     RANGES EACH RESULT IN A VALUE OF 4000 STATES FROM 95 TO 4095 TO MAKE
3517   ;     A 12 BIT VALUE (ALMOST).  THE ACTUAL INPUT RANGE IS DIGITIZED TO 16000
3518   ;     SIGNIFICANT STATES THEN DIVIDED BY 4 TO GET THE RESULTANT 4000 STATES.
3519   ;     FOR EXAMPLE, THE CALIBRATION RANGE OF 75-275 MICROSECONDS HAS A
3520   ;     DIGITIZED VALUE OF:
3521   ;           DIGITIZED VALUE(LOW)=75*4*20=6000 COUNTS
3522   ;           DIGITIZED VALUE(HIGH)=275*4*20=22000 COUNTS
3523   ;
3524   ;           DIGITIZED VALUE (HIGH-LOW)=22000-6000=16000 COUNTS POSSIBLE
3525   ;           FINAL VALUE= DIGITIZED VALUE (HIGH-LOW)/4=4000 COUNTS POSSIBLE
3526   ;
3527   ;     DIGITIZED VALUES ARE ACCUMULATED BY THE 14 BIT COUNTER IN THE 8155.
3528   ;     ACTUAL VALUES FOR THE RANGES MAY EXCEED SOME MULTIPLE OF THE 16384 STATES
3529   ;     POSSIBLE IN THE COUNTER. IF THE COUNTER OVERFLOWS IN THE RANGE, A
3530   ;     OVERFLOW COMPENSATION MUST BE USED.
3531   ;
3532   ;     EACH COUNTER RANGE HAS AN OFFSET THAT IS ADDED IN TO THE COUNT'S ACTUAL
3533   ;     VALUE.
3534   ;
3535   ;     THE FOLLOWING EQUATIONS ARE USED FOR DETERMINING THE ACTUAL R/P VALUE:
3536   ;           VALUE1=(NORMALIZED COUNT-(DIGITIZED VALUE(LOW))MOD 2**14)/4)+95
3537   ;     IF OVERFLOW THEN
3538   ;           VALUE=VALUE1+2**14
3539   ;
3540   ;
3541   ;     THE FOLLOWING TABLE GIVES THE RANGES POSSIBLE:
3542   ;           WHERE COUNT= DIGITIZED VALUE(LOW) MOD 2**14
3543   ;                 OVERFLOW= 2**14
3544   ;     THE ACTUAL VALUES ARE OFFSET BY 130 COUNTS (32.5 MICROSECONDS)
3545   ;     BECAUSE OF THE DIFFERENTIAL TIME BETWEEN STOPPING THE COUNTER
3546   ;     TO READ THE VALUE AND RESTARTING THE COUNTER IS 32.5 MICROSECONDS
3547   ;
```

```
LOC  OBJ    LINE         SOURCE STATEMENT
            3548 ;
            3549 ;        RANGE    CALIBRATION      DIGITIZED        COUNT    COUNTS
            3550 ;                 (MICROSECONDS)   (COUNTS)         (IDEAL)  (ACTUAL)
            3551 ;          6        75-275          6000-22000       6000    6000-130=5870
            3552 ;          5       275-475         22000-38000       5616    (5870+1*16000)MOD 2**14
            3553 ;          4       475-675         38000-54000       5232    (5870+2*16000)MOD 2**14
            3554 ;          3       675-875         54000-70000       4848    (5870+3*16000)MOD 2**14
            3555 ;          2       875-1075        70000-86000       4464    (5870+4*16000)MOD 2**14
            3556 ;          1      1075-1275        86000-102000      4080    (5870+5*16000)MOD 2**14
            3557 ;
            3558 ;        THE CONVERSION PROCESS HAS SEVERAL POSSIBLE ERRORS THAT HAVE A
            3559 ;        MAXIMUM BIAS THAT IS NOT ACCUMULATIVE. THESE ERRORS ARE TABULATED
            3560 ;        BELOW:
            3561 ;        POSSIBLE ERRORS                           MAX ERROR         MAX ERROR
            3562 ;                                                  (MICROSECONDS)    (COUNTS)
            3563 ;
            3564 ;        START INTERRRUPT                              2                 2
            3565 ;        STOP INTERRUPT                                2                 2
            3566 ;        R/P JITTER                                    1                 1
            3567 ;                                                  ----------        ----------
            3568 ;        TOTAL                                         5                 5
            3569 ;
            3570 ;        TOTAL ERROR OUT OF ONE CONVERSION IS 10/8000 COUNTS OR 0.125%.
            3571 ;        THIS RESULTS IS A MAXIMUM ERROR OF 0.125 DEGREE ERROR OUT OF
            3572 ;        A 100 DEGREE RANGE SENSOR DUE TO THE POWER AND CONVERSION PROCESS.
            3573 ;
            3574 ;
            3575 ;2.      CALL AND RETURN
            3576 ;        INPUTS    ANALOG+1=MS, ANALOG+2=LS COUNT
            3577 ;
            3578 ;        OUTPUTS
            3579 ;        RETURN
            3580 ;3.      CALLED ROUTINES
            3581 ;--RANGE
            3582 ;        INPUTS    ANALOG+3,4=RANGE MEASURE, ANALOG+6=PROGRAMMED RANGE
            3583 ;
            3584 ;        OUTPUTS   ANALOG+3,4=OFFSET TO SUBTRACT FROM MEASURE
            3585 ;                  ANALOG+1,2=0 IF OUT OF RANGE CONDITION.
            3586 ;--SUBT
            3587 ;        INPUTS    R1=PTR TO MINUEND, R0=PTR TO SUBTRAHEND
            3588 ;
            3589 ;        OUTPUTS   R3,4=RESULT, IF MESSAGE RESULTS, BORROW IS MARKED BY NO CARRY
            3590 ;
            3591 ;--MOVERI
            3592 ;        INPUTS
```

```
LOC  OBJ        LINE          SOURCE STATEMENT

3595    ;                   R0=PTR TO DESTINATION, R3,R4=DATA TO BE MOVED
                3596    ;
                3597    ;          OUTPUTS  R3,R4 MOVED
                3598    ;4.  EQUATES
                3599    ;********************************************************************
                3600    ;
                3601    ;
0A2E 1412       3602    ADRP:   CALL    RANGE           ;GET RANGE OF INPUT
0A30 B831       3603            MOV     R0,#ANALOG+1    ;GET SUBTRAHEND PTR
0A32 B903       3604            MOV     R1,#REG3        ;GET MINUEND PTR
0A34 1498       3605            CALL    SUBT
0A36 F23A       3606            JB7     ADRP1           ;GET FINAL VALUE
0A38 443E       3607            JMP     ADRP2           ;IF NEGATIVE THEN
0A3A 2340       3608    ADRP1:  MOV     A,#40H          ;  ADD 2**16
0A3C 6B         3609            ADD     A,R3
0A3D AB         3610            MOV     R3,A
0A3E 14CE       3611    ADRP2:  MOV     R2,#2           ;ENDIF
0A40 14CE       3612            CALL    NORMAL          ;NORMALIZE RESULT
0A42 E5         3613    ADRP4:  SEL     MB0
0A43 F4AF       3614            CALL    MOVERI          ;MOVE RESULT TO INTERNAL STORE
0A45 2301       3615    ADRP3:  MOV     A,#ADJE AND 0FFH ;SET REENTRY TO AD END
0A47 F5         3616            SEL     MB1
0A48 4415       3617            JMP     ADVE

3618    $EJECT
                3619    ;1. TITLE
                3620    ;         ADTHR--CONVERT SUPERVISED LOOP (ANALOG INPUT ACTING AS A DIGITAL INPUT)
                3621    ;2.  CALL AND RETURN
                3622    ;          INPUTS   ANALOG=CCOOPPPP WHERE CC=STATUS, P=POINT NUMBER
                3623    ;
                3624    ;          OUTPUTS  POINT NUMBER CALLED OUT IS UPDATED
                3625    ;
                3626    ;          RETURN
                3627    ;3.  CALLED ROUTINES
                3628    ;--POINT
                3629    ;          INPUT    R1=PTR TO POINT NUMBER AND STATUS
                3630    ;
                3631    ;          OUTPUT   POINT STATUS AND COS UPDATED
                3632    ;
                3633    ;4.  EQUATES
                3634    ;********************************************************************
                3635    ;
                3636    ;
0A4A E5         3637    ADTHR:  SEL     MB0
0A4B B937       3638            MOV     R1,#ANALOG+7    ;GET POINT VALUE
0A4D B8FC       3639            MOV     R0,#DUMMY       ;GET THRESHOLD RESULT PTR
0A4F F1         3640            MOV     A,@R1
0A50 90         3641            MOVX    @R0,A           ;SET POINT VALUE
0A51 F440       3642            CALL    POINT           ;UPDATE POINT
```

```
LOC   OBJ         LINE    SOURCE STATEMENT

0A53  F5          3643            SEL     MB1
0A54  27          3644            CLR     A
0A55  4415        3645            JMP     ADVE            ;SET REENTRY TO IDLE
                  3646    $EJECT
                  3647    ;1. TITLE
                  3648    ;       OPEN PORT--OPEN ANALOG PORT
                  3649    ;2. CALL AND RETURN
                  3650    ;       INPUTS
                  3651    ;               ANALOG FILE LOADED
                  3652    ;       OUTPUTS
                  3653    ;               ANALOG PORT OPEN
                  3654    ;       RETURN
                  3655    ;3. CALLED ROUTINES
                  3656    ;--BASE
                  3657    ;       INPUTS
                  3658    ;               ANALOG+3=RRRGVVVV WHERE RRR IS USED TO DETERMINE
                  3659    ;               WHAT IS DONE WITH THE BASE AND RANGE VALUES ON THE ENTRIES
                  3660    ;               INTO A CONVERSION ROUTINE.  ANALOG+2'S IIII HAS BITS TELLING
                  3661    ;               THE ENTRY NUMBER.
                  3662    ;       OUTPUTS
                  3663    ;               D/A OUTPUT SET
                  3664    ;4. EQUATES
                  3665    ;***********************************************************************
                  3666    ;
                  3667    ;
0A57  B8F1        3668    OPNPRT: MOV     R0,#ANAIN+1
0A59  B932        3669            MOV     R1,#ANALOG+2
0A5B  F1          3670            MOV     A,@R1
0A5C  47          3671            SWAP    A
0A5D  530F        3672            ANL     A,#0FH
0A5F  90          3673            MOVX    @R0,A
0A60  5307        3674            ANL     A,#7
0A62  15          3675            DIS     I
0A63  D5          3676            SEL     RB1
0A64  AF          3677            MOV     R7,A
0A65  C5          3678            SEL     RB0
0A66  27          3679            CLR     A
0A67  3D          3680            MOVD    P5,A            ;DISABLE REFRESH
0A68  23A8        3681            MOV     A,#ANACP        ;OPEN ANALOG PORT
0A6A  3A          3682            OUTL    P2,A
0A6B  B802        3683            MOV     R0,#PORTB       ;GET PORT B PTR
0A6D  B931        3684            MOV     R1,#ANALOG+1    ;GET PORT PTR
0A6F  F1          3685            MOV     A,@R1           ;TRANSFER DATA
0A70  37          3686            CPL     A
0A71  90          3687            MOVX    @R0,A
0A72  3408        3688            CALL    BASE            ;SET D/A OUTPUT
0A74  23A0        3689            MOV     A,#XRAM         ;OPEN RAM PORT
0A76  3A          3690            OUTL    P2,A
```

```
LOC   OBJ       LINE           SOURCE STATEMENT
0A77  8932      3691              MOV    R1,#ANALOG+2       ;GET ANALOG SOURCE DATA
0A79  F1        3692              MOV    A,@R1
0A7A  3D        3693              MOVD   P5,A
0A7B  05        3694              EN     I
0A7C  4418      3695              JMP    ADVE1
                3696   $EJECT
                3697   ;1. TITLE
                3698   ;         ADV--INPUT VOLTAGE A/D CONVERSION
                3699   ;         NOTES:    THE VOLTAGE A/D CONVERSION REQUIRES 5 ENTRIES TO THIS
                3700   ;                   ROUTINE TO DO A CONVERSION AND A ENTRY TO THE 'ADE' ROUTINE.
                3701   ;                   INPUTS COME IN TWO CATEGORIES
                3702   ;                         1:  MAXIMUM SPAN IS LESS THEN 5V
                3703   ;                         2:  MAXIMUM SPAN IS MORE THEN 5V
                3704   ;
                3705   ;                   CATEGORY 2 INPUTS ARE DENOTED 'FULL RANGE' TYPES.
                3706   ;                   THE 6 ENTRIES DO THIS:
                3707   ;                         ENTRY        PURPOSE
                3708   ;                           1          GET INPUT RAW VALUE
                3709   ;                           2          GET RANGE RAW VALUE
                3710   ;                           3          GET OFFSET (5.5V) RAW VALUE
                3711   ;                           4          CALCULATE FINAL RESULT
                3712   ;                           5          ADD INTERPOLATE RESULT TO FINAL
                3713   ;                           6          STORE FINAL RESULT
                3714   ;2.  CALL AND RETURN
                3715   ;         INPUTS
                3716   ;         OUTPUTS
                3717   ;         RETURN
                3718   ;3.  CALLED ROUTINES
                3719   ;    --SAVE
                3720   ;         INPUTS    R1=DESTINATION PTR (BOTH INTERNAL)
                3721   ;                   R2=REENTRY PTR, A=PORT ASSIGNMENT
                3722   ;         OUTPUTS   2 BYTES OF DATA MOVED FROM ANALOG+1 AND BASE AND RANGE EXCHANGED
                3723   ;
                3724   ;    --NORMAL
                3725   ;         INPUTS    R3=MS, R4=LS, R2=RIGHT SHIFT COUNT
                3726   ;         OUTPUTS   R3,R4=RESULT
                3727   ;
                3728   ;    --DATA
                3729   ;         INPUTS    A=ADDRESS, R3=QUADRANT
                3730   ;         OUTPUTS   R4=DATA
                3731   ;
                3732   ;    --SUBT
                3733   ;         INPUTS    R0=PTR TO SUBTRAHEND, R1=PTR TO MINUEND
                3734   ;         OUTPUTS   R3, R4=RESULT
```

```
LOC   OBJ       LINE          SOURCE STATEMENT

3739  ;--DIVD
                3740  ;             INPUTS
                3741  ;                    R1=PTR TO DIVIDEND, R0=PTR TO DIVISOR (BOTH INTERNAL)
                3742  ;             OUTPUTS
                3743  ;                    R0+2=PTR TO QUOTIENT
                3744  ;4.   EQUATES
0044            3745  XADV   EQU   (XADT4 AND 0FH)*16+04H          ;REENTRY FOR FULL RANGE READING
00E4            3746  XADV1  EQU   (XADVR1 AND 0FH)*16+04H         ;REENTRY 2+OPEN SELF CAL INPUT
00F4            3747  XADV2  EQU   (XADVR2 AND 0FH)*16+04H         ;REENTRY 3+OPEN SELF CAL INPUT
                3748  ;****************************************************************
                3749  ;
                3750  ;
0A7E B914       3751  ADV:   MOV   R1,#ADTMP                       ;SAVE RESULT
0A80 8831       3752         MOV   R0,#ANALOG+1                    ;GET RESULT
0A82 F0         3753         MOV   A,@R0
0A83 C689       3754         JZ    ADV10                           ;IF NONZERO RESULT THEN
0A85 BAE4       3755  ADV0:  MOV   R2,#XADV1
0A87 4411       3756         JMP   ADVEX                           ;  GET REENTRY
                3757  ;
                3758  ;
0A89 B833       3759  ADV10: MOV   R0,#ANALOG+3                    ;ELSE IF NOT FULL RANGE THEN
0A8B F0         3760         MOV   A,@R0
0A8C B292       3761         JB5   ADV11
0A8E 2301       3762  ADV10A:MOV   A,#XADE AND 0FFH                ;  SCHEDULE RESULT STOR
0A90 4415       3763         JMP   ADVE
0A92 D28E       3764  ADV11: JB6   ADV10A                          ;TEST IF RRR TYPE 1,REV.6-6-80
0A94 2508       3765         MOV   A,#0R                           ;ELSE (FULL RANGE)
0A96 A0         3766         MOV   @R0,A                           ;  FORCE RRR TYPE TO 0
0A97 18         3767         INC   R0                              ;  SET UP 0800H TO D/A OUTPUT FOR BASE
0A98 27         3768         CLR   A
0A99 A0         3769         MOV   @R0,A
0A9A BA44       3770         MOV   R2,#XADV                        ;  GET REENTRY
0A9C 4411       3771         JMP   ADVEX                           ;  SCHEDULE RETRY
                3772  ;                                                ENDIF
                3773  ;
                3774  ;
0A9E B916       3775  ADV1:  MOV   R1,#ADTMP1                      ;SAVE RESULT
0AA0 BAF4       3776         MOV   R2,#XADV2                       ;SCHEDULE REENTRYR
0AA2 4411       3777         JMP   ADVEX
                3778  ;
                3779  ;
0AA4 34A7       3780  ADV2:  CALL  PV                              ;CALCULATE PROPORTIONAL VALUE
0AA6 2309       3781         MOV   A,#XINTP AND 0FFH               ;GET REENTRY
0AA8 4415       3782         JMP   ADVE
                3783  $EJECT
                3784  ;1. TITLE
                3785  ;       ADR--A/D CONVERT RESISTANCE INPUT
                3786  ;       NOTE: THE RESISTANCE INPUT MEASURE USES A HEX SLOPE CONVERSION THAT
```

| LOC | OBJ | LINE | SOURCE STATEMENT |
|---|---|---|---|
| | | 3787 | ; ENABLES THE MEASURED VALUE, THEN THE HIGH END SELF CAL RESISTOR, |
| | | 3788 | ; AND FINALLY THE LOW END SELF CAL RESISTOR. |
| | | 3789 | ; |
| | | 3790 | ; AFTER THESE THREE MEASUREMENTS, THE RAW VALUE, RV, IS CALCULATED |
| | | 3791 | ; USING THE 'PV' SUBROUTINE. THEN ON THE NEXT ENTRY, THE |
| | | 3792 | ; PROPORTIONAL VALUE, PV, IS CALCULATED IN 'ADRTD3'. FOLLOWING |
| | | 3793 | ; THIS, THE FINAL PROPORTIONAL VALUE, FPV, IS CALCULATED BY |
| | | 3794 | ; ADDING THE 'OFFSET' AND 'INTERPOLATION TABLE' ENTRY IN 'INTP'. |
| | | 3795 | ; |
| | | 3796 | ; ON THE NEXT ENTRY, THE FINAL VALUE, FV, IS CALCULATED TO |
| | | 3797 | ; SCALE 'FPV' TO A 95 TO 4095 (4000 COUNT) RESULT IN THE 'ADFNL' |
| | | 3798 | ; ROUTINE. |
| | | 3799 | ; |
| | | 3800 | ; THE EQUATIONS FOR EACH OF THESE STEPS ARE: |
| | | 3801 | ; |
| | | 3802 | ; RV=4095* (MV-MB)/(MR-MB) = RAW VALUE |
| | | 3803 | ; PV=4095* (RV-BV)/R = PROPROTIONAL VALUE |
| | | 3804 | ; FPV=4095*(PV+OFFSET+INTERPOLATION ENTRY) |
| | | 3805 | ; FV= ((4095*FPV)/(4095/4000))+95 |
| | | 3806 | ; |
| | | 3807 | ; WHERE RV=RAW VALUE, MV=MEASURE VARIABLE (RESISTOR BEING MEASURED) |
| | | 3808 | ; MB=MEASURED BASE SELF CAL RESISTOR (365 OHMS (10X) OR 732 OHMS(1X) |
| | | 3809 | ; MR=MEASURE RANGE SELF CAL RESISTOR (732 OHMS(10X) OR 4530 OHMS (1X) |
| | | 3810 | ; BV=BASE VALUE OF RANGE OF INTEREST |
| | | 3811 | ; R=RANGE VALUE OF RANGE OF INTEREST |
| | | 3812 | ; |
| | | 3813 | ; THE RANGE AND BASE VALUES OF INTEREST ARE FOUND IN THE DATA |
| | | 3814 | ; FILE FOR A PARTICULAR INPUT. THESE ARE CALCULATED USING THE |
| | | 3815 | ; FOLLOWING FORMULAS: |
| | | 3816 | ; |
| | | 3817 | ; BV=4095* (SM-MB)/(MR-MB) |
| | | 3818 | ; R= 4095* (SR-S )/(MR-MB) |
| | | 3819 | ; |
| | | 3820 | ; WHERE SM=SENSOR MINIMUM RESISTANCE |
| | | 3821 | ; SR=SENSOR MAXIMUM RESISTANCE |
| | | 3822 | ;2. CALL AND RETURN |
| | | 3823 | ; INPUTS |
| | | 3824 | ; OUTPUTS |
| | | 3825 | ; RETURN |
| | | 3826 | ;3. CALLED ROUTINES |
| | | 3827 | ;4. EQUATES |
| 00D4 | | 3828 | XADRR1 EQU (XADR1 AND 0FH)*16+04H ;REENTRY 2+ OPEN SELF CAL |
| 00C4 | | 3829 | XADRR2 EQU (XADR2 AND 0FH)*16+04H ;REENTRY 3+ OPEN SELF CAL |
| | | 3830 | ;************************************************************ |
| | | 3831 | ; |
| | | 3832 | ; |
| 0AAA | B914 | 3833 | ADRTD: MOV R1,#ADTMP ;SAVE RESULT |
| 0AAC | BAD4 | 3834 | MOV R2,#XADRR1 ;GET REENTRY |

```
LOC   OBJ      LINE            SOURCE STATEMENT
0AAE  88C4     3435            MOV    R3,#11001000B      ;GET SELF CAL RANGE VALUE
0AB0  4411     3436            JMP    ADVEX
                3437     ;
                3438     ;
0AB2  8916     3439   ADRTD1:  MOV    R1,#ADTMP1         ;SAVE RESULT
0AB4  8AC4     3440            MOV    R2,#XADRR2         ;GET REENTRY
0AB6  88C0     3441            MOV    R3,#11000000B      ;GET SELF CAL RANGE VALUE
0AB8  4411     3442            JMP    ADVEX
                3443     ;
                3444     ;
0ABA  34A7     3445   ADRTD2:  CALL   PV                 ;GET PROPORTIONAL RAW VALUE (RV)
0ABC  2308     3446            MOV    A,#XADR3 AND 0FFH  ;GET REENTRY
0ABE  4415     3447            JMP    ADVE
                3448     ;
                3449     ;
0AC0  8833     3450   ADRTD3:  MOV    R0,#ANALOG+3       ;GET BASE
0AC2  14E8     3451            CALL   NUM                ;GET RV
0AC4  8803     3452            MOV    R0,#REG3           ;GET (RV-BASE)
0AC6  8931     3453            MOV    R1,#ANALOG+1
0AC8  1490     3454            CALL   SUBTV
0ACA  3489     3455            CALL   DIVDEN             ;SET DIVIDEND
0ACC  8835     3456            MOV    R0,#ANALOG+5       ;GET RANGE
0ACE  14E8     3457            CALL   NUM
0AD0  34C3     3458            CALL   DIVIDE             ;GET (RV-BASE)/RANGE
0AD2  2309     3459            MOV    A,#XINTP AND 0FFH  ;ENTER INTERPOLATION REENTRY
0AD4  4415     3460            JMP    ADVE
                3461     $EJECT
                3462     ;1. TITLE    ADFNL--A/D FINAL VALUE CALCULATION
                3463     ;
                3464     ;2. CALL AND RETURN
                3465     ;       INPUTS    PROPORTIONAL 12 BIT VALUE IN ANALOG+1,2
                3466     ;
                3467     ;       OUTPUTS   PROPORTIONAL 4000 COUNT VALUE OFFSET BY 95 (95-4095)
                3468     ;
                3469     ;       RETURN
                3470     ;3. CALLED ROUTINES
                3471     ;--DIVDEN--GET DIVIDEND
                3472     ;       INPUTS    R0=PTR TO SUBTRAHEND, MINUEND IN ANALOG+1,2
                3473     ;
                3474     ;       OUTPUTS   DIVIDEND CALCULATED AND STORED
                3475     ;
                3476     ;--DIVIDE
                3477     ;       INPUTS    R3,R4=DIVISOR, DIGITL+0,1,2,3=DIVIDEND
                3478     ;
                3479     ;       OUTPUTS   QUOTIENT NORMALIZED TO 12 BITS AND SAVED IN ANALOG+1,2
                3480     ;
                3881     ;--ADD16
                3882     ;       INPUTS
```

```
LOC  OBJ         LINE    SOURCE STATEMENT

3883    ;                  R1=ADDEND, R3,R4=AUGEND
                 3884    ;
                 3885    ;         OUTPUTS  R3,R4=RESULT
                 3886    ;4.  EQUATES
                 3887    ;************************************************************
                 3888    ;
0AD6 8831        3889    ADFNL:  MOV   R0,#ANALOG+1
0AD8 3489        3890            CALL  DIVDEN                  ;SET DIVIDEND
0ADA 8810        3891            MOV   R3,#(4192)/256          ;GET DIVISOR=4095/4000 (IN 12 BIT FORMAT)
0ADC BC60        3892            MOV   R4,#(4192) MOD 256
0ADE 34C3        3893            CALL  DIVIDE                  ;NORMALIZE TO 4000 CTS
0AE0 BC5F        3894            MOV   R4,#95                  ;GET '95' OFFSET
0AE2 2492        3895            JMP   FINAL
                 3896    $EJECT
                 3897    ;1. TITLE
                 3898    ;         INTP--INTERPOLATION TABLE AND OFFSET PROCESS
                 3899    ;2. CALL AND RETURN
                 3900    ;         INPUTS   FINAL VALUE IN ANALOG+1,2; TABLE ASSIGNMENT, OFFSET ASSIGNMENT
                 3901    ;                  IN ANALOG+5,7 RESPECTIVELY
                 3902    ;
                 3903    ;         OUTPUTS  OUTPUT WITH OFFSET AND INTERPOLATION VALUE ADDED AND NORMALIZED
                 3904    ;                  TO FINAL VALUE.
                 3905    ;         RETURN
                 3906    ;3. CALLED ROUTINES
                 3907    ;--DATA
                 3908    ;         INPUTS   A=ADDRESS, R3=QUADRANT
                 3909    ;
                 3910    ;         OUTPUTS  R4=DATA
                 3911    ;--OFFSET
                 3912    ;         INPUTS   R0=PTR TO OFFSET, ANALOG+1=VALUE TO BE OFFSET
                 3913    ;
                 3914    ;         OUTPUTS  ANALOG+1,2 OFFSET AND UPDATED
                 3915    ;
                 3916    ;4.  EQUATES
                 3917    ;************************************************************
                 3918    ;
                 3919    
                 3920    
                 3921    
0AE4 8835        3922    INTP:   MOV   R0,#ANALOG+5
0AE6 F0          3923            MOV   A,@R0
0AE7 47          3924            SWAP  A
0AE8 5307        3925            ANL   A,#07H
0AEA C6F6        3926            JZ    INTPE                   ;IF TABLE ASSIGNED THEN
0AEC 1456        3927            CALL  TABLE                   ;  GET TABLE ENTRY PTR
0AEE C6F6        3928            JZ    INTPE                   ;  IF NONZERO VALUE THEN
0AF0 E5          3929            SEL   MB0
0AF1 14CD        3930            CALL  DATA                    ;    GET TABLE ENTRY
```

```
LOC   OBJ        LINE   SOURCE STATEMENT

0AF3  F5         3931            SEL     MB1
0AF4  347E       3932            CALL    OFFSET              ;   OFFSET RESULT
                 3933    ;                                       ENDIF
0AF6  8837       3934   INTPE:   MOV     R0,#ANALOG+7        ;   ADD OFFSET
0AF8  F0         3935            MOV     A,@R0
0AF9  AC         3936            MOV     R4,A
0AFA  347E       3937            CALL    OFFSET
0AFC  530A       3938            MOV     A,#XFNL AND 0FFH
0AFE  4415       3939            JMP     ADVE                ;ENDIF
                 3940   $EJECT                               ;SET REENTRY
0B00             3941            ORG     0B00H
                 3942   ; BASE ROUTINE LOGIC FOR RRR TYPE 2 CONTINUED REV.6-9-80
                 3943   ;
0B00  8836       3944   BASE2B:  MOV     R0,#ANALOG+6        ; A/D=7FFH+RANGE-BASE IN D.F.
0B02  B939       3945            MOV     R1,#DIGITL+1        ;HAVE RANGE IN R3,R4
0B04  F0         3946            MOV     A,@R0               ; RANGE-BASE CALCULATION
0B05  A1         3947            MOV     @R1,A               ;MS BYTE OF BASE
0B06  C8         3948            DEC     R0
0B07  C9         3949            DEC     R1
0B08  F0         3950            MOV     A,@R0               ;MS BYTE OF BASE IN D.F.
0B09  530F       3951            ANL     A,#0FH
0B0B  A1         3952            MOV     @R1,A
0B0C  B803       3953            MOV     R0,#REG3            ;POINTER FOR MINUEND
0B0E  1498       3954            CALL    SUBT                ;RANGE-BASE IN R3,R4
0B10  B932       3955            MOV     R1,#ANALOG+2
0B12  2455       3956            JMP     BASEP
                 3957   ;                                    WANT RANGE IN DBYT 38,39H MINUEND
                 3958   ;                                    WANT BASE IN R3,R4 SUBTRAHEND
                 3959   ;                                    WANT RESULT IN R3,R4
                 3960   ;
                 3961   $EJECT
                 3962   ;
                 3963   ;1.  TITLE
                 3964   ;        FSSTATUS--REPORT STATUS OF FS MODULE INPUTS
                 3965   ;        NOTES: THE FS INTERFACE PROVIDES AN OFF BOARD CONNECTION TO FS
                 3966   ;               MODULES OF THE FS20 TYPE.  INTERFACE IS PROVIDED BY REDEFINITION
                 3967   ;               OF DIGITAL INPUTS 1-12 AND DIGITAL OUTPUTS 1-12 TO PROVIDE THE
                 3968   ;               INTERFACE.  THESE INPUTS AND OUTPUTS ARE DEDICATED TO THIS TASK
                 3969   ;               WHEN USED AS AN FS INTERFACE.
                 3970   ;
                 3971   ;        A CROSS REFERENCE OF THE 540 DGP TO FS20 SIGNALS FOLLOWS:
                 3972   ;        540 DEFINITION           FS20 DEFINITION         J6 PIN
                 3973   ;        DIGIN1                   ALA-1                   19
                 3974   ;        DIGIN2                   TBLA-1                  24
                 3975   ;        DIGIN3                   ALB-1                   23
                 3976   ;        DIGIN4                   TBLB-1                  20
                 3977   ;        DIGIN5                   ALC-1                   17
                 3978   ;
```

| LOC | OBJ | LINE | | SOURCE STATEMENT | | |
|---|---|---|---|---|---|---|
| | | 3979 | ; | | DIGIN6 | TRLC-1           1A |
| | | 3980 | ; | | DIGIN7 | ALD-1            22 |
| | | 3981 | ; | | DIGIN8 | TBLD-1           21 |
| | | 3982 | ; | | DIGIN9 | VALID GROUP-0    34 |
| | | 3983 | ; | | DIGIN10 | COS-0            33 |
| | | 3984 | ; | | DIGIN11 | COMMON ALARM-0   14 |
| | | 3985 | ; | | DIGIN12 | COMMON TROUBLE-0 12 |
| | | 3986 | ; | | DIGOUT1 | POINT SELECT A-1  4 |
| | | 3987 | ; | | DIGOUT2 | POINT SELECT B-1 13 |
| | | 3988 | ; | | DIGOUT3 | GROUP SELECT A-1  3 |
| | | 3989 | ; | | DIGOUT4 | GROUP SELECT B-1  5 |
| | | 3990 | ; | | DIGOUT5 | GROUP SELECT C-1  7 |
| | | 3991 | ; | | DIGOUT6 | GROUP SELECT D-1  9 |
| | | 3992 | ; | | DIGOUT7 | START STOP 1/0-1 11 |
| | | 3993 | ; | | DIGOUT8 | COMMAND STROBE-1  2 |
| | | 3994 | ; | | DIGOUT9 | COS SET-1         6 |
| | | 3995 | ; | | DIGOUT10 | COS RESET-1      8 |
| | | 3996 | ; | | DIGOUT11 | STOP SCAN-1      15 |
| | | 3997 | ; | | DIGOUT12 | RESET FOLDBACK-0 10 |
| | | 3998 | ;2. | CALL AND RETURN | | |
| | | 3999 | ; | INPUTS | R0=PTR TO DATA STORE, R3=WORD COUNTER | |
| | | 4000 | ; | | | |
| | | 4001 | ; | OUTPUTS | COS SET, DATA TRANSFERED. | |
| | | 4002 | ; | | | |
| | | 4003 | ; | RETURN | | |
| | | 4004 | ;3. | CALLED ROUTINES | | |
| | | 4005 | ;--FSCTL--FS CONTROL | | | |
| | | 4006 | ; | INPUTS | R2=COMMAND | |
| | | 4007 | ; | | | |
| | | 4008 | ; | OUTPUTS | COMMAND OUTPUT ON DIGITAL OUTPUT LINES | |
| | | 4009 | ; | | | |
| | | 4010 | ;4. | EQUATES | | |
| 0007 | | 4011 | DISSCN | EQU | 00000111B | ;DISABLE SCAN |
| 0006 | | 4012 | COSSET | EQU | 00000110B | ;CHANGE OF STATE SET |
| 0005 | | 4013 | COSRES | EQU | 00000101B | ;CHANGE OF STATE RESET |
| 0003 | | 4014 | STOPSC | EQU | 00000011B | ;STOP SCAN |
| 000F | | 4015 | RFLDBK | EQU | 00001111B | ;RESET FOLDBACK |
| | | 4016 | ;4. | EQUATES | | |
| | | 4017 | ;**************************************************************** | | | |
| | | 4018 | ; | | | |
| | | 4019 | ; | | | |
| 0B14 | 8920 | 4020 | FSSTAT: | MOV | R1,#ADDRES | |
| 0B16 | F1 | 4021 | | MOV | A,@R1 | |
| 0B17 | 5218 | 4022 | | JB2 | FS0 | |
| 0B19 | 6484 | 4023 | | JMP | FS3 | |
| 0B1B | 89FB | 4024 | FS0: | MOV | R1,#DIGMSK | ;GET FS20 ID AND # OF MODULES |
| 0B1D | 81 | 4025 | | MOVX | A,@R1 | |
| 0B1E | AA | 4026 | | MOV | R2,A | |

```
LOC   OBJ      LINE           SOURCE STATEMENT
081F  5307     4027           ANL    A,#07H          ;ISOLATE QUADRANT
0821  AB       4028           MOV    R3,A
0822  FA       4029           MOV    A,R2
0823  53FB     4030           ANL    A,#0FBH         ;ISOLATE ADDRESS OF FILE BEGINNING
0825  0305     4031           ADD    A,#05H          ;SELECT FS20 INFO BYTE
0827  AA       4032           MOV    R2,A
0828  E5       4033           SEL    MB0
0829  14CD     4034           CALL   DATA
082B  F5       4035           SEL    MB1
082C  FC       4036           MOV    A,R4
               4037    ;
               4038    ;              ;R4=NNNDDDDD
               4039    ;              ;NNN=NUMBER OF MODULES-1
               4040    ;              ;DDDDD=DIGITAL ID OF FIRST FS20 POINT
               4041    ;              ;   =(ID-1)/4. ID IS SELECTED
               4042    ;              ;   SUCH THAT THE FS20 DATA BEGINS IN A
               4043    ;              ;   NEW BYTE IN THE DATA STREAM.
               4044    ;              ;EX: NNN=011 MEANS 4 FS20 PANELS.
               4045    ;              ;    DDDDD=01100 MEANS THE FIRST FS20
               4046    ;              ;    POINT WILL HAVE ID 49 (DECIMAL)
               4047    ;
082D  531F     4045           ANL    A,#01FH
082F  77       4046           RR     A
0830  0382     4047           ADD    A,#DIGST
0832  AB       4048           MOV    R0,A
0833  FC       4049           MOV    A,R4
0834  53E0     4050           ANL    A,#0E0H
0836  E7       4051           RL     A
0837  E7       4052           RL     A
0838  E7       4053           RL     A
0839  0301     4054           ADD    A,#01H
083B  E7       4055           RL     A
083C  E7       4056           RL     A
083D  AB       4057           MOV    R3,A
               4058    ;
               4059    ;      BEFORE SCANNING FS20 MODULES, BE SURE ALL DEFINED MODULES
               4060    ;      ARE ACTIVE. IF ANY MODULE FAILES THIS "QUICKY" SCAN, DO NOT
               4061    ;      DO THE REAL SCAN. THIS WILL PREVENT CLEARING OF ANY COS IN
               4062    ;      A GOOD MODULE WITHOUT FIRST REPORTING IT TO THE CENTRAL.
               4063    ;
083E  BA07     4064  FSOK:    MOV    R2,#DISSCN
0840  9436     4065           CALL   FSCTL           ;ENSURE CONTROL LINES ARE LOW
               4066    ;
0842  BC00     4067           MOV    R4,#000H
0844  B929     4068           MOV    R1,#COSBUF
0846  940F     4069  FSOKLP:  CALL   COMAND          ;OUTPUT GROUP ADDRESS BUT NOT
0848  2300     4070           MOV    A,#DIGIN1       ;"STOP SCAN-1". UNIT WILL ANSWER
084A  3A       4071           OUTL   P2,A            ;WITH "VALID GROUP" IF IT IS THERE.
084B  09       4072           IN     A,P1
084C  525F     4073           JB2    FSDEAD          ;BIT2=VALID-GROUP-0
084E  2304     4074           MOV    A,#04H          ;THIS GROUP OK, INCREMENT GROUP NUMBER
```

| LOC | OBJ | LINE | | SOURCE STATEMENT | | |
|---|---|---|---|---|---|---|
| 0850 | 6C | 4075 | | ADD | A,R4 | |
| 0851 | AC | 4076 | | MOV | R4,A | |
| 0852 | DB | 4077 | | XRL | A,R3 | |
| 0853 | 9646 | 4078 | | JNZ | FSOKLP | ;LAST GROUP? |
| 0855 | 23DF | 4079 | | MOV | A,#0DFH | ;NO, CONTINUE. |
| 0857 | 51 | 4080 | | ANL | A,@R1 | ;YES, SUCCESSFUL SCAN. CLEAR |
| 0858 | A1 | 4081 | | MOV | @R1,A | ;COSBUF BITS, |
| 0859 | 940F | 4082 | | CALL | COMAND | |
| | | 4083 | ; | | | |
| 085B | BC00 | 4084 | | MOV | R4,#00H | ;DESELECT ALL GROUPS, PREPARE FOR |
| 085D | 6469 | 4085 | | JMP | FSLP | ;"REAL SCAN" |
| 085F | 2320 | 4086 | FSDEAD: | MOV | A,#020H | ;INITIALIZE GROUP ADDRESS COUNTER, |
| 0861 | 41 | 4087 | | ORL | A,@R1 | ;DO "REAL" FS20 SCAN |
| 0862 | A1 | 4088 | | MOV | @R1,A | ;GROUP DID NOT RESPOND, ABORT FS20 |
| 0863 | BC20 | 4089 | | MOV | R4,#020H | ;PROCESS, SET COSBUF BIT5=1 AND RETURN. |
| 0865 | 940F | 4090 | | CALL | COMAND | |
| 0867 | 6484 | 4091 | | JMP | FS3 | ;DESELECT ALL GROUPS |
| | | 4092 | ; | | | |
| 0869 | B900 | 4093 | FSLP: | MOV | R1,#0 | ;DO FROM GROUPS 0 TO 7 |
| 086B | 940F | 4094 | | CALL | COMAND | |
| 086D | BA02 | 4095 | | MOV | R2,#COSSET | AND STOPSC |
| 086F | 9486 | 4096 | | CALL | FSCTL | ; ISSUE COMMAND AND ADDRESS |
| 0871 | 23C0 | 4097 | | MOV | A,#DIGIN | ; READ INPUTS |
| 0873 | 3A | 4098 | | OUTL | P2,A | |
| 0874 | 09 | 4099 | | IN | A,P1 | |
| 0875 | 533F | 4100 | | ANL | A,#3FH | |
| 0877 | A9 | 4101 | | MOV | R1,A | |
| 0878 | 23D0 | 4102 | | MOV | A,#DIGIN1 | |
| 087A | 3A | 4103 | | OUTL | P2,A | |
| 087B | 09 | 4104 | | IN | A,P1 | |
| 087C | AA | 4105 | | MOV | R2,A | |
| 087D | 77 | 4106 | | RR | A | |
| 087E | 77 | 4107 | | RR | A | ; PACK INPUTS |
| 087F | 53C0 | 4108 | | ANL | A,#0C0H | |
| 0881 | 49 | 4109 | | ORL | A,R1 | |
| 0882 | A9 | 4110 | | MOV | R1,A | |
| 0883 | 2380 | 4111 | | MOV | A,#XRAM | |
| 0885 | 3A | 4112 | | OUTL | P2,A | |
| 0886 | 6491 | 4113 | | JMP | FS1 | |
| 0888 | B929 | 4114 | FSCOS: | MOV | R1,#COSBUF | ; OPEN RAM |
| 088A | 2380 | 4115 | | MOV | A,#80H | |
| 088C | 41 | 4116 | | ORL | A,@R1 | ; SET COS |
| 088D | A1 | 4117 | | MOV | @R1,A | |
| 088E | FA | 4118 | | MOV | A,R2 | |
| 088F | 649A | 4119 | | JMP | FS1A | ; ENDIF |
| 0891 | 943F | 4120 | FS1: | CALL | FSREAD | ;PUT FS DATA INTO ASCENDING ORDER |
| 0893 | 80 | 4121 | | MOVX | A,@R1 | ;READ OLD DATA |
| 0894 | A9 | 4122 | | MOV | R1,A | |

| LOC | OBJ | LINE | | SOURCE STATEMENT | |
|---|---|---|---|---|---|
| 0A95 | FA | 4123 | | MOV | A,R2 | ;DIFFERENCE BETWEEN OLD AND NEW INFO?
| 0A96 | D9 | 4124 | | XRL | A,R1 | ;YES, FLAG DIGITAL COS
| 0A97 | 96A8 | 4125 | | JNZ | FSCOS | ;NO, STORE DATA
| 0A99 | FA | 4126 | | MOV | A,R2 |
| 0A9A | 90 | 4127 | FS1A: | MOVX | @R0,A |
| 0A9B | BA01 | 4128 | | MOV | R2,#COSRES AND STOPSC |
| 0A9D | 9486 | 4129 | | CALL | FSCTL | ; RESET COS
| 0A9F | BA07 | 4130 | | MOV | R2,#DISSCN |
| 0AA1 | 9486 | 4131 | | CALL | FSCTL | ; DISABLE SCAN
| 0AA3 | 18 | 4132 | | INC | R0 |
| 0AA4 | 2304 | 4133 | | MOV | A,#4 | ; ENDIF
| 0AA6 | 6C | 4134 | | ADD | A,R4 | ; INCREMENT GROUP
| 0AA7 | AC | 4135 | | MOV | R4,A | ;
| 0AA8 | DB | 4136 | | XRL | A,R3 |
| 0AA9 | 9669 | 4137 | | JNZ | FSLP | ;ENDDO
| 0AAB | 940F | 4138 | | CALL | COMAND | ;SELECT NON-EXISTANT GROUP
| 0AAD | BA07 | 4139 | | MOV | R2,#DISSCN |
| 0AAF | 9486 | 4140 | | CALL | FSCTL | ;DISABLE SCAN, PRIME FS20 FOR COS.
| 0AB1 | 2380 | 4141 | | MOV | A,#XRAM |
| 0AB3 | 3A | 4142 | | OUTL | P2,A |
| 0AB4 | 93 | 4143 | | RETR | |
| | | 4144 | FS3: | | |
| | | 4145 | $EJECT | | |
| | | 4146 | ;1. TITLE | FSRLY--FS RELAY | |
| | | 4147 | ; | | |
| | | 4148 | ;2. CALL AND RETURN | | |
| | | 4149 | ; INPUTS | BIT 7 OF R3=COMMAND, A=ACTION MASK (000PPPPP) P=ADDRESS |
| | | 4150 | ; | | |
| | | 4151 | ; OUTPUTS | COMMAND INITIATED | |
| | | 4152 | ; | | |
| | | 4153 | ; RETURN | | |
| | | 4154 | ;3. CALLED ROUTINES | | |
| | | 4155 | ;--COMAND | | |
| | | 4156 | ; INPUTS | R4=COMMAND ADDRESS | |
| | | 4157 | ; | | |
| | | 4158 | ; OUTPUTS | COMMAND ISSUED, R1=DIGIN 1-8, R2=DIGIN 7-12 |
| | | 4159 | ; | | |
| | | 4160 | ;4. EQUATES | | |
| | | 4161 | ;*********************************************************** |
| | | 4162 | ; | | |
| | | 4163 | | | | |
| 0AB5 | B920 | 4164 | FSRLY: | MOV | R1,#ADDRES |
| 0AB7 | F1 | 4165 | | MOV | A,@R1 | ;TEST FS MODULES PRESENT
| 0AB8 | 528C | 4166 | | JB2 | FSR1 |
| 0ABA | 64E3 | 4167 | | JMP | FSR2 |
| 0ABC | FB | 4168 | FSR1: | MOV | A,R3 |
| 0ABD | 537F | 4169 | | ANL | A,#07FH | ;GET COMMAND (R3)
| 0ABF | AC | 4170 | | MOV | R4,A |

| LOC | OBJ | LINE | SOURCE STATEMENT | | |
|---|---|---|---|---|---|
| 0BC0 | 940F | 4171 | CALL | COMAND | ;GROUP, POINT, AND COMMAND BIT SET-UP |
| 0BC2 | BA03 | 4172 | MOV | R2,#STOPSC | ; |
| 0BC4 | 9486 | 4173 | CALL | FSCTL | ;SET STOP SCAN =1 |
| 0BC6 | 2380 | 4174 | MOV | A,#RLYR0 | |
| 0BC8 | 3A | 4175 | OUTL | P2,A | |
| 0BC9 | FC | 4176 | MOV | A,R4 | |
| 0BCA | 4380 | 4177 | ORL | A,#080H | |
| 0BCC | AC | 4178 | MOV | R4,A | |
| 0BCD | 9415 | 4179 | CALL | COMAN1 | ;SET COMMAND STROBE=1 |
| 0BCF | 47 | 4180 | SWAP | A | |
| 0BD0 | 537F | 4181 | ANL | A,#07FH | |
| 0BD2 | 9415 | 4182 | CALL | COMAN1 | ;REMOVE COMMAND STROBE |
| 0BD4 | BA07 | 4183 | MOV | R2,#DISSCN | |
| 0BD6 | 9486 | 4184 | CALL | FSCTL | ;REMOVE STOP-SCAN |
| 0BD8 | 2380 | 4185 | MOV | A,#RLYR0 | |
| 0BDA | 3A | 4186 | OUTL | P2,A | |
| 0BDB | BC20 | 4187 | MOV | R4,#020H | ;SELECT DUMMY GROUP TO PRIME OTHER |
| 0BDD | 940F | 4188 | CALL | COMAND | ;PANELS FOR COS |
| 0BDF | BA07 | 4189 | MOV | R2,#DISSCN | |
| 0BE1 | 9486 | 4190 | CALL | FSCTL | |
| 0BE3 | 93 | 4191 | FSR2: RETR | | |
| | | 4192 | $EJECT | | |
| | | 4193 | ;1. TITLE  CIM--CIM MODULE INTERFACE | | |
| | | 4194 | ; | | |
| | | 4195 | ;  NOTES: THE CIM MODULE INTERFACE RELIES ON THE REDEFINITION OF OUTPUT | | |
| | | 4196 | ;          DRIVERS INTO TWO 2 X 8 MATRICES. DIGOUT TERMINALS 1 TO 8 ARE | | |
| | | 4197 | ;          USED AS THE 8Y 8 PORTION, AND DIGOUT 14 (0) AND 15(1) ARE USED | | |
| | | 4198 | ;          AS THE 'OFF' AND 'ON' PULSES FOR THE FIRST 8 RELAYS. DIGOUT | | |
| | | 4199 | ;          12 (0) AND 13 (1) ARE USED LIKEWISE FOR THE SECOND 8 RELAYS. | | |
| | | 4200 | ; | | |
| | | 4201 | ; | | |
| | | 4202 | ;          THE CIM MODULE CONNECTS TO THE 540 THROUGH RELAY INTERFACE 1 | | |
| | | 4203 | ;          VIA RIBBON CABLE. THE SIGNAL DEFINITION AT THAT INTERFACE FOLLOW: | | |
| | | 4204 | ;          540 DEF.            START STOP 1          START STOP 2 | | |
| | | 4205 | ;          DIGOUT1             U1 | | |
| | | 4206 | ;          DIGOUT2             U2 | | |
| | | 4207 | ;          DIGOUT3             U3 | | |
| | | 4208 | ;          DIGOUT4             U4 | | |
| | | 4209 | ;          DIGOUT5             U5 | | |
| | | 4210 | ;          DIGOUT6             U6 | | |
| | | 4211 | ;          DIGOUT7             U7 | | |
| | | 4212 | ;          DIGOUT8             U8 | | |
| | | 4213 | ;          DIGOUT9                                   U1 | | |
| | | 4214 | ;          DIGOUT10                                  U2 | | |
| | | 4215 | ;          DIGOUT11                                  U3 | | |
| | | 4216 | ;          DIGOUT12                                  U4 | | |
| | | 4217 | ;          DIGOUT13     RELAY 9-16 TUR              U5 | | |

```
LOC   OBJ        LINE              SOURCE STATEMENT

4218  ;                     DIGOUT14            RELAY 9-16 TLR    U6
                 4219  ;                     DIGOUT15            RELAY 1-8 TUR     U7
                 4220  ;                     DIGOUT16            RELAY 1-8 TLR     U8
                 4221  ;
                 4222  ;
                 4223  ;      THE RELAYS ARE PULSED ONE AT A TIME BY TURNING ON THE 'U' DRIVER
                 4224  ;      HIGH AND TURNING ON THE APPROPRIATE LATCH 'TLR' OR UNLATCH 'TUR'
                 4225  ;      DRIVER LOW.  NOTE THAT NO MORE THAN 2 RELAYS MAY BE PULSED AT THE
                 4226  ;      SAME TIME.  THE PULSE PERIOD TO TURN ON (OFF) THE RELAYS IS 150 MS.
                 4227  ;
                 4228  ;2.   CALL AND RETURN
                 4229  ;         INPUTS       BIT 7 OF R3=COMMAND, A=ACTION MASK (0011-ID-)
                 4230  ;
                 4231  ;         OUTPUTS      COMMAND INITIATED
                 4232  ;
                 4233  ;         RETURN
                 4234  ;3.   CALLED ROUTINES
                 4235  ;--REGRLY
                 4236  ;         INPUTS       A=ACTION MASK (0101OID-)
                 4237  ;
                 4238  ;         OUTPUTS      OUTPUT TURNED ON(OFF)
                 4239  ;
                 4240  ;--PULSE
                 4241  ;         INPUTS       R1=PTR TO DELAY AND ACTION
                 4242  ;
                 4243  ;         OUTPUTS      ACTION AND DELAY SCHEDULED
                 4244  ;
                 4245  ;--CIMSS
                 4246  ;         INPUTS       R2=COMMAND
                 4247  ;
                 4248  ;         OUTPUTS      DRIVER TURNED ON, DELAY SET FOR PULSE
                 4249  ;***********************************************************************
                 4250  ;4.   EQUATES
00AF             4251  COM18   EQU    10101111B         ;DRIVER 15 LOW (ON FOR RELAYS 1-8)
00AD             4252  COM916  EQU    10101101B         ;DRIVER 13 LOW (ON FOR RELAYS 9-16)
000F             4253  COMTIM  EQU    0FH               ;TIMER FOR PULSED LINES
                 4254  ;***********************************************************************
                 4255  ;
                 4256  ;
0BE4 AC          4257  CIM:    MOV    R4,A              ;SAVE COMMAND
0BE5 72EB        4258          JB3    CIM1              ;IF 1-8 THEN
0BE7 BAAF        4259          MOV    R2,#COM18         ;  GET 1-8 COMMAND
0BE9 64ED        4260          JMP    CIM2              ;ELSE
0BEB BAAD        4261  CIM1:   MOV    R2,#COM916        ;  GET 9-16 COMMAND
0BED F8          4262  CIM2:   MOV    A,R3              ;ENDIF
0BEE F2F1        4263          JB7    CIM3              ;IF '0' COMMAND THEN
0BF0 CA          4264          DEC    R2                ;  DECREMENT 'COM'
                 4265  ;                                ; ENDIF
```

```
LOC   OBJ        LINE         SOURCE STATEMENT
0BF1  74FC       4266  CIM3:  CALL   CIMR                  ;TURN ON COMMAND DRIVER
0BF3  FC         4267         MOV    A,R4
0BF4  4340       4268         ORL    A,#01000000B          ;GET RELAY NUMBER
0BF6  5367       4269         ANL    A,#01100111B
0BF8  AA         4270         MOV    R2,A
0BF9  74FC       4271         CALL   CIMR                  ;TURN ON RELAY DRIVER
0BFB  93         4272         RETR
                 4273  $EJECT
                 4274  ;1. TITLE
                 4275  ;         CIMR
                 4276  ;2. CALL AND RETURN
                 4277  ;      INPUTS    R2=COMMAND
                 4278  ;
                 4279  ;      OUTPUTS   DRIVER TURNED ON, DELAY SET FOR PULSE
                 4280  ;                DRIVER TURNED ON, DELAY SET FOR PULSE
                 4281  ;      RETURN
                 4282  ;3. CALLED ROUTINES
                 4283  ;4. EQUATES
                 4284  ;***********************************************************
                 4285  ;
                 4286  ;
0BFC  E5         4287  CIMR:  SEL    MB0
0BFD  B93A       4288         MOV    R1,#DIGITL+2
0BFF  FA         4289         MOV    A,R2
0C00  A1         4290         MOV    @R1,A
0C01  C9         4291         DEC    R1
0C02  230F       4292         MOV    A,#COMTIM
0C04  A1         4293         MOV    @R1,A
0C05  8452       4294         CALL   PULSE                 ;GET COMMAND SET
0C07  FA         4295         MOV    A,R2
0C08  R46F       4296         CALL   REGRLY                ;GET TIMEOUT SET
0C0A  2380       4297         MOV    A,#XRAM
0C0C  3A         4298         OUTL   P2,A                  ;SET TIMEOUT
0C0D  F5         4299         SEL    MB1                   ;TURN ON OUTPUT
0C0E  93         4300         RETR                         ;GET RAM PORT OPEN
                 4301  $EJECT
                 4302  ;1. TITLE
                 4303  ;         COMMAND--COMMAND AND CONTROL OF FS MODULES.
                 4304  ;2. CALL AND RETURN
                 4305  ;      INPUTS    R4=COMMAND AND ADDRESS
                 4306  ;
                 4307  ;      OUTPUTS   COMMAND ISSUED
                 4308  ;
                 4309  ;      RETURN
                 4310  ;3. CALLED ROUTINES
                 4311  ;--OFF
                 4312  ;      INPUTS    A=RELAY BANK
                 4313  ;
```

```
LOC   OBJ           LINE        SOURCE STATEMENT
                    4314    ;                   OUTPUTS         ALL DRIVERS OFF
                    4315    ;
                    4316    ;
                    4317    ;4.     EQUATES.
                    4318    ;****************************************************************
                    4319    ;
                    4320    ;
0C0F 2380           4321    COMAND: MOV         A,#RLYB0        ; TURN DRIVERS OFF
0C11 E5             4322            SEL         MB0
0C12 F40A           4323            CALL        OFF
0C14 F5             4324            SEL         MB1
0C15 FC             4325    COMAN1: MOV         A,R4            ; SET COMMAND AND ADDRESS
0C16 37             4326            CPL         A
0C17 3E             4327            MOVD        P6,A
0C18 47             4328            SWAP        A
0C19 3F             4329            MOVD        P7,A
0C1A 93             4330            RETR
                    4331    $EJECT
0C1B 53E0           4332    BASEED: ANL         A,#0E0H         ;IS RKR TYPE=0?
0C1D C624           4333            JZ          BASEEE
0C1F B903           4334            MOV         R1,#PORTC
0C21 F0             4335            MOV         A,@R0
0C22 04DF           4336            JMP         BASEEF          ;PATCHED 6-19-80
0C24 93             4337    BASEEE: RETR
                    4338    ;1. TITLE           START--INITIALIZE AFTER HARDWARE RESET
                    4339    ;
                    4340    ;2.     CALL AND RETURN
                    4341    ;               INPUTS
                    4342    ;               OUTPUTS         RAM CLEARED, DIRECTORIES SET UP, AND I/O SET UP, CLOCKS
                    4343    ;                               RUNNING AND INTERRUPTS ENABLED
                    4344    ;               RETURN
                    4345    ;3.     CALLED ROUTINES
                    4346    ;4.     EQUATES
003F                4347    MEMLEN  EQU         03FH            ;LENGTH OF MEMORY (INTERNAL)
00FF                4348    TIMEL   EQU         0FFH            ;LOW BYTE OF TIME SET
007F                4349    TIMEH   EQU         07FH            ;HIGH BYTE OF TIME SET
0008                4350    ADEN    EQU         00010008        ;ENABLE A/D ROUTINE
                    4351    ;****************************************************************
                    4352    ;
                    4353    ;
0C25 75             4354    START:  ENT0        CLK             ;START CLOCK
0C26 2380           4355            MOV         A,#XRAM         ;OPEN RAM PORT
0C28 3A             4356            OUTL        P2,A
0C29 B800           4357            MOV         R0,#0
0C2B 27             4358            CLR         A
0C2C D7             4359            MOV         PSW,A           ;CLEAR STATUS AND STACK
0C2D 90             4360    MEMCLR: MOVX        @R0,A           ;CLEAR EXTERNAL MEMORY
```

```
LOC   OBJ         LINE            SOURCE STATEMENT

0C2E  E82D        4362            DJNZ    R0,MEMCLR          ;CLEAR INTERNAL MEMORY
0C30  C5          4363            SEL     RB0                ;
0C31  883E        4364            MOV     R0,#MEMLEN-1
0C33  B901        4365            MOV     R1,#1
0C35  19          4366  INTCLR:   INC     R1
0C36  A1          4367            MOV     @R1,A
0C37  E835        4368            DJNZ    R0,INTCLR
0C39  2388        4369            MOV     A,#ANACP           ;OPEN ANALOG CONTROL PORT
0C3B  3A          4370            OUTL    P2,A
0C3C  B800        4371            MOV     R0,#ANACS
0C3E  27          4372            CLR     A
0C3F  90          4373            MOVX    @R0,A              ;PRESET I/O TO INPUTS
0C40  B920        4374            MOV     R1,#ADDRES         ;GET ADDRESS PTR
0C42  B802        4375            MOV     R0,#PORTB          ;GET ADDRESS HARDWARE INPUT
0C44  80          4376            MOVX    A,@R0
0C45  A1          4377            MOV     @R1,A              ;GET ADDRESS
0C46  B805        4378            MOV     R0,#TIMERH
0C48  237F        4379            MOV     A,#TIMEH
0C4A  90          4380            MOVX    @R0,A              ;SET UP 60 HZ TIMER
0C4B  B804        4381            MOV     R0,#TIMERL
0C4D  23FF        4382            MOV     A,#TIMEL
0C4F  90          4383            MOVX    @R0,A
0C50  B800        4384            MOV     R0,#ANACS
0C52  23CF        4385            MOV     A,#IODEF
0C54  90          4386            MOVX    @R0,A              ;SET UP ANALOG CONTROL PORT
0C55  9469        4387            CALL    UARTST             ; SET UP USART.
0C57  B408        4388            CALL    DIR                ;SET UP DIRECTORIES
0C59  E5          4389            SEL     MB0
0C5A  23B0        4390            MOV     A,#RLYB0
0C5C  F40A        4391            CALL    OFF                ;OPEN RELAY BANK 0
0C5E  23A0        4392            MOV     A,#RLYB1           ;TURN ON OUTPUTS LOW
0C60  F40A        4393            CALL    OFF                ;OPEN RELAY BANK 1
0C62  05          4394            EN      I                  ;TURN ON OUTPUTS LOW
0C63  840F        4395            JMP     EXEC               ;ENABLE INTERRUPTS
                  4396  $EJECT
                  4397  ;1. TITLE
                  4398  ;         UARTST--START UART AND SET UP FOR OPERATION
                  4399  ;         CALL AND RETURN
                  4400  ;2.       INPUTS
                  4401  ;         OUTPUTS   UART RESET, BIT RATE SET
                  4402  ;         RETURN
                  4403  ;3. CALLED ROUTINES
                  4404  ;4. EQUATES
0C65  50          4405  LINET:    DB      01010000B          ;RS422 (A) , RS422 (B)
0C66  FA          4406            DB      11111010B          ;RS232 (A) , RS232 SEC (B)
0C67  00          4407            DB      00000000B          ;RS422 (A) ON SECONDARY REPEAT ONLY
```

```
LOC   OBJ       LINE            SOURCE STATEMENT

0C68  0A        4410            DB      00001010B               ;RS232 (A) , RS422 (B)--REPEATER
                4411            ;****************************************************************
                4412            ;
                4413            ;
0C69  2390      4414    UARTST: MOV     A,#UART                 ;OPEN UART PORT
0C6B  3A        4415            OUTL    P2,A
0C6C  B901      4416            MOV     R1,#UARTCS              ;OPEN UART CONTROL/STATUS REG
0C6E  27        4417            CLR     A                       ;CLEAR RESET CONDITION
0C6F  91        4418            MOVX    @R1,A
0C70  91        4419            MOVX    @R1,A
0C71  91        4420            MOVX    @R1,A
0C72  2340      4421            MOV     A,#IR                   ;RESET UART
0C74  91        4422            MOVX    @R1,A
0C75  B820      4423            MOV     R0,#ADDRES              ;GET ADDRES PTR
0C77  F0        4424            MOV     A,@R0
0C78  B824      4425            MOV     R0,#LINE                ;GET LINE PTR
0C7A  5303      4426            ANL     A,#3
0C7C  AA        4427            MOV     R2,A
0C7D  0365      4428            ADD     A,#(LINET MOD 256)
0C7F  A3        4429            MOVP    A,@A
0C80  A0        4430            MOV     @R0,A
0C81  FA        4431            MOV     A,R2
0C82  968A      4432            JNZ     LOWSP                   ;IF RS422 ONLY THEN
0C84  235F      4433            MOV     A,#TF96                 ; FORMAT UART (9600 BPS)
0C86  91        4434            MOVX    @R1,A
0C87  93        4435            RETR
0C88  235F      4436    LOWSP:  MOV     A,#TF12                 ; 422 LINE PRESET TO A (EQUALS 0)
                4437            ;                               ;ELSE
                                                                ; FORMAT UART (1200 BPS)
0CBA  91        4438            MOVX    @R1,A
0CBB  93        4439            RETR                            ENDIF
                4440            ;
                4441            $EJECT
                4442            ;*****************************************************************
                4443            ;       REV. OCT.12,80,REC LOGIC PATCH
                4444            ;*****************************************************************
                4445            ;       CHECK FOR VALID GROUP ADDRESS AND VALID LENGTH IN THE
                4446            ;       MESSAGE RECIVED BY THE 540. IF ADDRESS IS OUT OF RANGE,
                4447            ;       GREATER THAN 8 , OR LENGTH GREATER THAN 70 GO TO ERRSET
                4448            ;       LOGIC.
0C8C  1F        4449    RDATAF: INC     R7                      ; INCR WORD COUNT OT RCTR
0C8D  FF        4450            MOV     A,R7                    ;IS RCTR=1?
0C8E  D301      4451            XRL     A,#1
0C90  C69C      4452            JZ      RCT1                    ;YES
0C92  FF        4453            MOV     A,R7                    ;IS RCTR=2?
0C93  D302      4454            XRL     A,#2
0C95  C6AA      4455            JZ      RCT2                    ;YES.
0C97  2380      4456    RDATAG: MOV     A,#XRAM                 ;NO. GO TO NORMAL REC. PROCESS
0C99  E5        4457            SEL     MB0                     ; SELECT MB0
```

```
LOC   OBJ         LINE          SOURCE STATEMENT
0C9A  446C        4458 RCT1:    JMP   RDATAH
0C9C  FC          4459          MOV   A,R4          ;BYTE RECD IN R4.CHECK GROUP ADDR.
0C9D  77          4460          RR    A
0C9E  77          4461          RR    A             ;TO LINE UP GROUP ADDR. TO B0
0C9F  77          4462          RR    A
0CA0  531F        4463          ANL   A,#1FH        ;EXAM. LOWER 5 BITS ONLY
0CA2  00          4464          NOP
0CA3  03F6        4465          ADD   A,#0F6H       ;GROUP ADDR >8?
0CA5  E697        4466          JNC   RDATAG        ;NO.
0CA7  E5          4467          SEL   MB0           ;YES. SET ERROR LOGIC
0CA8  44A1        4468          JMP   ERRSET
                  4469 ;
0CAA  FD          4470 RCT2:    MOV   A,R5
0CAB  37          4471          CPL   A
0CAC  F297        4472          JB7   RDATAG        ;IS LONG MSG BEING RECD?
0CAE  23A9        4473          MOV   A,#0B9H       ;LONG MSG FLAG SET?
0CB0  6C          4474          ADD   A,R4          ;NO.SHORT MSG . EXIT
0CB1  E697        4475          JNC   RDATAG        ; LENGTH >7O?
0CB3  E5          4476          SEL   MB0           ;R4 HAS THE BYTE RECD. LAST
0CB4  44A1        4477          JMP   ERRSET        ;VALID LENGTH.PROCESS NORMALLY
                  4478 $EJECT
                  4479 ;
                  4480 ;1. TITLE    FSCTL--CONTROL FS MODULE INTERFACE
                  4481 ;2. CALL AND RETURN
                  4482 ;      INPUTS       R2=COMMAND
                  4483 ;
                  4484 ;      OUTPUTS      COMMAND ISSUED ON DIGITAL OUTPUTS
                  4485 ;
                  4486 ;      RETURN
                  4487 ;3. CALLED ROUTINES
                  4488 ;4. EQUATES
                  4489 ;******************************************************
                  4490 ;
0CB6  23A0        4491 FSCTL:   MOV   A,#RLYR1      ;OPEN CONTROL DRIVER BANK
0CB8  3A          4492          OUTL  P2,A
0CB9  27          4493          CLR   A
0CBA  3C          4494          MOVD  P4,A
0CBB  3E          4495          MOVD  P6,A          ;BE SURE HIGH DRIVERS ARE OFF AND
                  4496                              ;PROVIDE TIMING DELAYS.
0CBC  FA          4497          MOV   A,R2
0CBD  3E          4498          MOVD  P6,A          ;ISSUE COMMAND
0CBE  93          4499          RFTR
                  4500 $EJECT
                  4501 ;
                  4502 ;1. TITLE:
```

```
LOC   OBJ          LINE            SOURCE STATEMENT

4506    ;
                   4507    ;       FSROTD--ROTATE FS20 DATA INTO ASCENDING ORDER
                   4508    ;       ***** ROUTINE ADDED TO 1/6/81 ASSEMBLY *****
                   4509    ;2.     CALL AND RETURN:
                   4510    ;               INPUT:  R1= T/A 4, T/A 3, T/A 2, T/A 1
                   4511    ;               OUTPUT: R2= T/A 1, T/A 2, T/A 3, T/A 4
                   4512    ;
                   4513    ;3.     RETURN
                   4514    ;       CALLED ROUTINES:
                   4515    ;               NONE
                   4516    ;4.     EQUATES:
                   4517    ;***********************************************************;
                   4518    ;
OCBF F9            4519    FSROTD: MOV     A,R1                    ;R1= 4-3-2-1
OCC0 53C0          4520            ANL     A,#0C0H
OCC2 E7            4521            RL      A
OCC3 E7            4522            RL      A
OCC4 AA            4523            MOV     R2,A
OCC5 F9            4524            MOV     A,R1
OCC6 5330          4525            ANL     A,#030H
OCC8 77            4526            RR      A
OCC9 77            4527            RR      A
OCCA 4A            4528            ORL     A,R2
OCCB AA            4529            MOV     R2,A                    ;R2= 0-0-0-4
OCCC F9            4530            MOV     A,R1
OCCD 530C          4531            ANL     A,#0CH
OCCF E7            4532            RL      A
OCD0 E7            4533            RL      A
OCD1 4A            4534            ORL     A,R2
OCD2 AA            4535            MOV     R2,A                    ;R2= 0-0-3-4
OCD3 F9            4536            MOV     A,R1
OCD4 5303          4537            ANL     A,#03H
OCD6 77            4538            RR      A
OCD7 77            4539            RR      A
OCD8 4A            4540            ORL     A,R2
OCD9 AA            4541            MOV     R2,A                    ;R2= 0-2-3-4
OCDA 93            4542            RETR                            ;R2= 1-2-3-4
                   4543    $EJECT
                   4544    ;
                   4545    ;       FILL-IN CODE
                   4546    ;
OCDB FF            4547            DB      0FFH,0FFH,0FFH,0FFH,0FFH,0FFH,0FFH ; CFOH-CFFH
OCDC FF
OCDD FF
OCDE FF
OCDF FF
OCE0 FF
OCE1 FF
```

| LOC | OBJ | LINE | SOURCE STATEMENT |
|---|---|---|---|
| 0CE2 | FF | | |
| 0CE3 | FF | | |
| 0CE4 | FF | | |
| 0CE5 | FF | | |
| 0CE6 | FF | | |
| 0CE7 | FF | | |
| 0CE8 | FF | | |
| 0CE9 | FF | | |
| 0CEA | FF | | |
| 0CEB | FF | 4548 | DB    0FFH,0FFH,0FFH,0FFH,0FFH,0FFH,0FFH,0FFH,0FFH |
| 0CEC | FF | | |
| 0CED | FF | | |
| 0CEE | FF | | |
| 0CEF | FF | | |
| 0CF0 | FF | | |
| 0CF1 | FF | | |
| 0CF2 | FF | | |
| 0CF3 | FF | 4549 | DB    0FFH,0FFH,0FFH,0FFH,0FFH,0FFH,0FFH,0FFH,0FFH |
| 0CF4 | FF | | |
| 0CF5 | FF | | |
| 0CF6 | FF | | |
| 0CF7 | FF | | |
| 0CF8 | FF | | |
| 0CF9 | FF | | |
| 0CFA | FF | | |
| 0CFB | FF | 4550 | DH    0FFH,0FFH,0FFH,0FFH,0FFH,0FFH,0FFH,0FFH,0FFH |
| 0CFC | FF | | |
| 0CFD | FF | | |
| 0CFE | FF | | |
| 0CFF | FF | | |
| 0D00 | FF | | |
| 0D01 | FF | | |
| 0D02 | FF | 4551 | DH    0FFH,0FFH,0FFH,0FFH,0FFH,0FFH,0FFH,0FFH,0FFH |

```
                        4552 ;
                        4553 $EJECT
                        4554 ;
0D00                    4555        ORG    0D00H
                        4556 ;
                        4557 ;1. TITLE
                        4558 ;         DIR--SET FILE DIRECTORIES
                        4559 ;2. CALL AND RETURN
                        4560 ;    INPUTS
                        4561 ;    OUTPUTS   FILE DIRECTORIES SET UP INCLUDING ANAPT, DIGPT
                        4562 ;    RETURN
                        4563 ;3. CALLED ROUTINES
                        4564 ;--DATA
                        4565 ;
                        4566 ;    INPUT
```

```
LOC   OBJ        LINE         SOURCE STATEMENT
                 4567  ;                  A=PTR TO BYTE, R3=QUADRANT, RAM OPEN, USES R0
                 4568  ;
                 4569  ;                  OUTPUT            R4=DATA BYTE
                 4570  ;4.  EQUATES
0003             4571  MQUAD   EQU   3                        ;MAXIMUM NUMBER OF QUADRANTS
0000             4572  QUADST  EQU   0                        ;BEGINING ADDRESS OF DATA FILES
0D00  24         4573  XDIR:   DB    DIR0-0D00H               ;ANALOG
0D01  28         4574          DB    DIR1-0D00H               ;THRESHOLD
0D02  2E         4575          DB    DIR2-0D00H               ;ANALOG TABLE
0D03  70         4576          DB    DIR3-0D00H               ;SPARE
0D04  38         4577          DB    DIR4-0D00H               ;DIGITAL OUTPUT
0D05  3E         4578          DB    DIR5-0D00H               ;DIGITAL INPUT
0D06  44         4579          DB    DIR6-0D00H               ;TOTALIZER
0D07  62         4580          DB    DIR7-0D00H               ;RUN TIME
                 4581  ;***********************************************************
                 4582  ;
0D08  BA08       4583  DIR:    MOV   R2,#8                    ;GET BYTE STARTING ADDRESS
0D0A  BB00       4584          MOV   R3,#QUADST               ;GET STARTING QUADRANT
0D0C  FA         4585  DIRLP:  MOV   A,R2                     ;DOWHILE MEMORY AREA
0D0D  E5         4586          SEL   MB0
0D0E  14CD       4587          CALL  DATA                     ; GET DATA
0D10  F5         4588          SEL   MB1
0D11  FC         4589          MOV   A,R4
0D12  C670       4590          JZ    DIR8                     ; GET BYTE
0D14  37         4591          CPL   A                        ; CASE BYTE OF
0D15  C67E       4592          JZ    DIRE                     ;   0:
0D17  37         4593          CPL   A                        ;   FF:    END OF DATA FILE
0D18  07         4594          DEC   A                        ;   OTHER:
0D19  531F       4595          ANL   A,#01FH
0D1B  A9         4596          MOV   R1,A
0D1C  FC         4597          MOV   A,R4
0D1D  47         4598          SWAP  A
0D1E  77         4599          RR    A
0D1F  5307       4600          ANL   A,#7
0D21  0300       4601          ADD   A,#XDIR AND 0FFH
0D23  B3         4602          JMPP  @A
                 4603  ;
0D24  B848       4604  DIR0:   MOV   R0,#TMPLT                ;       XXX=0:  ANALOG
0D26  A42A       4605          JMP   DIR1A
0D28  B849       4606  DIR1:   MOV   R0,#TMPLT+1              ;       XXX=1:  THRESHOLD
0D2A  2380       4607  DIR1A:  MOV   A,#ANAPT
0D2C  A466       4608          JMP   DIRL
0D2E  B8FC       4609  DIR2:   MOV   R0,#DUMMY                ;       XXX=2:  ANALOG TABLE
0D30  2318       4610          MOV   A,#24                    ;               ALLOW 32 LOCATIONS
0D32  6A         4611          ADD   A,R2
0D33  AA         4612          MOV   R2,A
0D34  23F7       4613          MOV   A,#TABLE0
0D36  A466       4614          JMP   DIRL
```

| LOC | OBJ | LINE | | SOURCE STATEMENT | | | |
|---|---|---|---|---|---|---|---|
| 0D38 | B849 | 4615 | DIR4: | MOV | R0,#TMPLT+1 | ; | XXX=4: DIGITAL |
| 0D3A | 2390 | 4616 | | MOV | A,#DIGPT | | |
| 0D3C | A466 | 4617 | | JMP | DIRL | | |
| 0D3E | B8FC | 4618 | DIR5: | MOV | R0,#DUMMY | ; | XXX=5: DIGITAL INPUT |
| 0D40 | 23F8 | 4619 | | MOV | A,#DIGMSK | | |
| 0D42 | A466 | 4620 | | JMP | DIRL | | |
| 0D44 | B8FC | 4621 | DIR6: | MOV | R0,#DUMMY | ; | XXX=6: TOTALIZER |
| 0D46 | F9 | 4622 | DIR6A: | MOV | A,R1 | ; | GET TOTALIZER ID |
| 0D47 | AC | 4623 | | MOV | R4,A | | |
| 0D48 | E7 | 4624 | | RL | A | | |
| 0D49 | 034B | 4625 | | ADD | A,#ANAST+1 | | |
| 0D4B | A9 | 4626 | | MOV | R1,A | | |
| 0D4C | 235F | 4627 | | MOV | A,#95 | ; | INITIALIZE VALUE TO 95 |
| 0D4E | 91 | 4628 | | MOVX | @R1,A | | |
| 0D4F | 1C | 4629 | | INC | R4 | | |
| 0D50 | 2301 | 4630 | | MOV | A,#1 | | |
| 0D52 | 77 | 4631 | DIR6B: | RR | A | | |
| 0D53 | EC52 | 4632 | | DJNZ | R4,DIR6B | | |
| 0D55 | 89F4 | 4633 | | MOV | R1,#TOTASS | ; | UPDATE ASSIGNMENT |
| 0D57 | AC | 4634 | | MOV | R4,A | | |
| 0D58 | 81 | 4635 | | MOVX | A,@R1 | | |
| 0D59 | 4C | 4636 | | ORL | A,R4 | | |
| 0D5A | 91 | 4637 | | MOVX | @R1,A | | |
| 0D5B | 80 | 4638 | | MOVX | A,@R0 | | |
| 0D5C | 4C | 4639 | | ORL | A,R4 | | |
| 0D5D | 90 | 4640 | | MOVX | @R0,A | | |
| 0D5E | B848 | 4641 | | MOV | R0,#TMPLT | | |
| 0D60 | A460 | 4642 | | JMP | DIRLA | | |
| 0D62 | B8F5 | 4643 | DIR7: | MOV | R0,#TOTRUN | ; | XXX=7 RUN TIME |
| 0D64 | A446 | 4644 | | JMP | DIR6A | | |
| 0D66 | 69 | 4645 | DIRL: | ADD | A,R1 | | |
| 0D67 | A9 | 4646 | | MOV | R1,A | ; | GET PTR |
| 0D68 | FA | 4647 | | MOV | A,R2 | | |
| 0D69 | 53F8 | 4648 | | ANL | A,#0FAH | | |
| 0D6B | 4B | 4649 | | ORL | A,R3 | | |
| 0D6C | 91 | 4650 | | MOVX | @R1,A | ; | STORE LOCATION |
| 0D6D | 80 | 4651 | DIRLA: | MOVX | A,@R0 | | |
| 0D6E | 17 | 4652 | | INC | A | | |
| 0D6F | 90 | 4653 | | MOVX | @R0,A | ; | INCREMENT TEMPLATE |
| | | 4654 | ; | | | | ENDCASE |
| 0D70 | 2308 | 4655 | DIR8: | MOV | A,#8 | ; | GET NEXT LOCATION |
| 0D72 | 6A | 4656 | | ADD | A,R2 | | |
| 0D73 | AA | 4657 | | MOV | R2,A | | |
| 0D74 | 967C | 4658 | | JNZ | DIR3 | ; | IF PAGE COMPLETE THEN |
| 0D76 | 1B | 4659 | | INC | R3 | | |
| 0D77 | 2303 | 4660 | | MOV | A,#MQUAD | | |
| 0D79 | 5B | 4661 | | ANL | A,R3 | ; | TEST DONE |
| 0D7A | C67E | 4662 | | JZ | DIRE | ; | ENDIF |

```
LOC   OBJ        LINE            SOURCE STATEMENT
0D7C  A40C       4663 DIR3:      JMP    DIRLP                   ;ENDWHILE
0D7E  B849       4664 DIRE:      MOV    R0,#TMPLT+1             ;GET DIGITAL TEMPLATE
0D80  60         4665            MOVX   A,@R0                   ;ADD DIGITAL INPUTS
0D81  0360       4666            ADD    A,#12
0D83  90         4667            MOVX   @R0,A
                 4668 ;
                 4669 ;                                          ;NOW CHECK FOR FS20 IDS.
0D84  B920       4670            MOV    R1,#ADDRES
0D86  F1         4671            MOV    A,@R1
0D87  528B       4672            JB2    DIRFS                   ;FS20 ENABLED? YES, ADD IDS
0D89  A4AC       4673            JMP    DIRQ                    ;NO, EXIT NORMALLY.
0D8B  B9FB       4674 DIRFS:     MOV    R1,#DIGMSK              ;GET POINTER TO DIGITAL INPUT FILE.
0D8D  81         4675            MOVX   A,@R1                   ;A = AAAAQQQQ
0D8E  AA         4676            MOV    R2,A
0D8F  5307       4677            ANL    A,#07H
0D91  AB         4678            MOV    R3,A                    ;R3= 0000QQQQ = QUADRANT
0D92  FA         4679            MOV    A,R2
0D93  53F8       4680            ANL    A,#0F8H
0D95  0305       4681            ADD    A,#05H
0D97  AA         4682            MOV    R2,A                    ;R2= ADDRESS OF FS20 MASK
0D98  E5         4683            SEL    MB0
0D99  14CD       4684            CALL   DATA
0D9B  F5         4685            SEL    MB1
0D9C  FC         4686            MOV    A,R4                    ;R4= NNNDDDDD
0D9D  53E0       4687            ANL    A,#0E0H
0D9F  E7         4688            RL     A
0DA0  E7         4689            RL     A
0DA1  E7         4690            RL     A
0DA2  0301       4691            ADD    A,#01H                  ;A = ACTUAL NUMBER OF FS MODULES (1-8)
0DA4  E7         4692            RL     A
0DA5  E7         4693            RL     A                       ;MULTIPLY #PANELS BY 4 IDS PER PANEL
0DA6  AA         4694            MOV    R2,A
0DA7  B849       4695            MOV    R0,#TMPLT+1
0DA9  F0         4696            MOV    A,@R0
0DAA  6A         4697            ADD    A,R2                    ;ADD FS20 IDS TO OTHER IDS
0DAB  90         4698            MOVX   @R0,A
0DAC  93         4699            RETR
                 4700 DIRQ:
                 4701 $EJECT
                 4702 ;
                 4703 ;              FILL-IN CODE
                 4704 ;
0DAD  FF         4705            DB     0FFH,0FFH,0FFH
0DAE  FF
0DAF  FF
0DB0  FF
0DB1  FF
0DB2  FF         4706            DB     0FFH,0FFH,0FFH,0FFH,0FFH,0FFH,0FFH,0FFH,0FFH ; D80H-DBFH ; DADH-DAFH
```

| LOC | OBJ | LINE | SOURCE STATEMENT |
|---|---|---|---|
| 0DB3 | FF | | |
| 0DB4 | FF | | |
| 0DB5 | FF | | |
| 0DB6 | FF | | |
| 0DB7 | FF | | |
| 0DB8 | FF | 4707 | DB  0FFH,0FFH,0FFH,0FFH,0FFH,0FFH,0FFH,0FFH |
| 0DB9 | FF | | |
| 0DBA | FF | | |
| 0DBB | FF | | |
| 0DBC | FF | | |
| 0DBD | FF | | |
| 0DBE | FF | | |
| 0DBF | FF | | |
| 0DC0 | FF | 4708 | DB  0FFH,0FFH,0FFH,0FFH,0FFH,0FFH,0FFH,0FFH ; DC0H-DCFH |
| 0DC1 | FF | | |
| 0DC2 | FF | | |
| 0DC3 | FF | | |
| 0DC4 | FF | | |
| 0DC5 | FF | | |
| 0DC6 | FF | | |
| 0DC7 | FF | | |
| 0DC8 | FF | 4709 | DB  0FFH,0FFH,0FFH,0FFH,0FFH,0FFH,0FFH,0FFH |
| 0DC9 | FF | | |
| 0DCA | FF | | |
| 0DCB | FF | | |
| 0DCC | FF | | |
| 0DCD | FF | | |
| 0DCE | FF | | |
| 0DCF | FF | | |
| 0DD0 | FF | 4710 | DB  0FFH,0FFH,0FFH,0FFH,0FFH,0FFH,0FFH,0FFH ; DD0H-DDFH |
| 0DD1 | FF | | |
| 0DD2 | FF | | |
| 0DD3 | FF | | |
| 0DD4 | FF | | |
| 0DD5 | FF | | |
| 0DD6 | FF | | |
| 0DD7 | FF | | |
| 0DD8 | FF | 4711 | DB  0FFH,0FFH,0FFH,0FFH,0FFH,0FFH,0FFH,0FFH |
| 0DD9 | FF | | |
| 0DDA | FF | | |
| 0DDB | FF | | |
| 0DDC | FF | | |
| 0DDD | FF | | |
| 0DDE | FF | | |
| 0DDF | FF | | |
| 0DE0 | FF | 4712 | DB  0FFH,0FFH,0FFH,0FFH,0FFH,0FFH,0FFH,0FFH ; DE0H-DEFH |
| 0DE1 | FF | | |
| 0DE2 | FF | | |

| LOC | OBJ | LINE | SOURCE STATEMENT |
|---|---|---|---|
| 0DE3 | FF | | |
| 0DE4 | FF | | |
| 0DE5 | FF | | |
| 0DE6 | FF | | |
| 0DE7 | FF | | |
| 0DE8 | FF | 4713 | DB  0FFH,0FFH,0FFH,0FFH,0FFH,0FFH |
| 0DE9 | FF | | |
| 0DEA | FF | | |
| 0DEB | FF | | |
| 0DEC | FF | | |
| 0DED | FF | | |
| 0DEE | FF | | |
| 0DEF | FF | | |
| 0DF0 | FF | 4714 | DB  0FFH,0FFH,0FFH,0FFH,0FFH,0FFH,0FFH,0FFH ; 0F0H-0FFH |
| 0DF1 | FF | | |
| 0DF2 | FF | | |
| 0DF3 | FF | | |
| 0DF4 | FF | | |
| 0DF5 | FF | | |
| 0DF6 | FF | | |
| 0DF7 | FF | | |
| 0DF8 | FF | 4715 | DB  0FFH,0FFH,0FFH,0FFH,0FFH,0FFH,0FFH,0FFH |
| 0DF9 | FF | | |
| 0DFA | FF | | |
| 0DFB | FF | | |
| 0DFC | FF | | |
| 0DFD | FF | | |
| 0DFE | FF | | |
| 0DFF | FF | | |
| | | 4716 | $EJECT |
| | | 4717 | ; |
| 0E00 | | 4718 | ORG  0E00H |
| | | 4719 | ; |
| | | 4720 | ;1. TITLE    DIG--DIGITAL INPUT HANDLER |
| | | 4721 | ; |
| | | 4722 | ;2. CALL AND RETURN |
| | | 4723 | ;   INPUTS    DIGITAL I/O PORTS |
| | | 4724 | ; |
| | | 4725 | ;   OUTPUTS   DIGITAL VALUES IN 'DIGST' UPDATED |
| | | 4726 | ; |
| | | 4727 | ;   RETURN |
| | | 4728 | ;3. CALLED ROUTINES |
| | | 4729 | ;--FILE3 |
| | | 4730 | ;   INPUT    R0=PTR TO DATA FILE(PACKED), R1=DESTINATION PTR OF DATA FILE |
| | | 4731 | ; |
| | | 4732 | ;   OUTPUT   8 BYTES LOADED |
| | | 4733 | ; |
| | | 4734 | ;--UPDATE |

```
LOC  OBJ            LINE         SOURCE STATEMENT

4735   ;
                    4736   ;       INPUT    A=INPUT PORT, R0=PTR TO BUFFER LOCATION
                    4737   ;
                    4738   ;       OUTPUT   DATA READ, SAVED, R0 INCREMENTED
                    4739   ;--PACK
                    4740   ;       INPUT    4 SIX BIT INPUTS BUFFERED AT DIGITL+4 TO DIGITL+7
                    4741   ;
                    4742   ;       OUTPUT   3 EIGHT BIT BUFFERED WITH IDS ORDERED 1-24
                    4743   ;
                    4744   ;--INVERT
                    4745   ;       INPUTS   3 EIGHT BIT INPUTS AT DIGITL+4, 3 EIGHT BIT NO/NC PROGRAM LINES
                    4746   ;                AT DIGITL+1
                    4747   ;
                    4748   ;       OUTPUTS  NO/NC INVERSION DONE ON PER BIT BASIS
                    4749   ;
                    4750   ;--COS
                    4751   ;       INPUTS   R2=COS MASK, R1=PTR TO CURRENT STATUS, A=NEW STATUS
                    4752   ;
                    4753   ;       OUTPUTS  STATUS UPDATED, COS BITS SET IF CHANGE
                    4754   ;
                    4755   ;4.     EQUATES
                    4756   ;*********************************************************************
                    4757   ;
                    4758   ;
0E00 B8FB           4759   DIG:    MOV    R0,#DIGMSK            ;GET DIGITAL INPUT FILE
0E02 B93F           4760           MOV    R1,#DIGITL+7
0E04 E5             4761           SEL    MR0
0E05 F47C           4762           CALL   FILE3                 ;MOVE FILE INTO TEMP STORAGE
0E07 F5             4763           SEL    MB1
0E08 B83C           4764           MOV    R0,#DIGITL+4
0E0A B920           4765           MOV    R1,#ADDRES
0E0C F1             4766           MOV    A,@R1
0E0D 5211           4767           JB2    DIGFS
0E0F C419           4768           JMP    DIGNFS
0E11 B000           4769   DIGFS:  MOV    @R0,#000H             ;GET CURRENT STATUS
0E13 18             4770           INC    R0                    ;IF FS20 OPERATION IS ENABLED,
0E14 B000           4771           MOV    @R0,#000H             ;FORCE DI#1 TO DI#12 TO 0
0E16 18             4772           INC    R0
0E17 C421           4773           JMP    DIGA                  ;NO FS20, SCAN DI#1 - 24 AS NORMAL
0E19 23C0           4774   DIGNFS: MOV    A,#DIGIN
0E1B D444           4775           CALL   UPDATE                ;GET DIGIN STATUS
0E1D 23D0           4776           MOV    A,#DIGIN1
0E1F D444           4777           CALL   UPDATE                ;GET DIGIN 1 STATUS.
0E21 23E0           4778   DIGA:   MOV    A,#DIGIN2
0E23 D444           4779           CALL   UPDATE                ;GET DIGIN 2 STATUS
0E25 23F0           4780           MOV    A,#DIGIN3
0E27 D444           4781           CALL   UPDATE                ;GET DIGIN 3 STATUS
0E29 2380           4782           MOV    A,#XRAM               ;OPEN RAM PORT
```

| LOC | OBJ | LINE | | SOURCE STATEMENT | | |
|---|---|---|---|---|---|---|
| 0E2B | 3A | 4783 | | OUTL | P2,A | |
| 0E2C | D44A | 4784 | | CALL | PACK | ;PACK INPUTS AS IDS 1-24 |
| 0E2E | D469 | 4785 | | CALL | INVERT | ;SET NO/NC STATUS |
| 0E30 | B982 | 4786 | | MOV | R1,#DIGST | ;GET DIGITAL STATUS PTR |
| 0E32 | BA80 | 4787 | | MOV | R2,#80H | ;GET DIGITAL COS MARKER |
| 0E34 | BB03 | 4788 | | MOV | R3,#3 | |
| 0E36 | BC3C | 4789 | | MOV | R4,#DIGITL+4 | ;GET SOURCE PTR |
| 0E38 | FC | 4790 | DIGLP: | MOV | A,R4 | ;DO WHILE MORE DIGITAL BYTES |
| 0E39 | A8 | 4791 | | MOV | R0,A | ; GET PTR |
| 0E3A | F0 | 4792 | | MOV | A,@R0 | ; GET DATA |
| 0E3B | E5 | 4793 | | SEL | MB0 | |
| 0E3C | D4FD | 4794 | | CALL | COS | ; CHECK COS AND UPDATE |
| 0E3E | F5 | 4795 | | SEL | MB1 | |
| 0E3F | 19 | 4796 | | INC | R1 | |
| 0E40 | 1C | 4797 | | INC | R4 | ; INCREMENT PTR |
| 0E41 | EB38 | 4798 | | DJNZ | R3,DIGLP | |
| 0E43 | 93 | 4799 | | RETR | | ;ENDWHILE |
| | | 4800 | $EJECT | | | |
| | | 4801 | ;1. TITLE | | | |
| | | 4802 | ; | UPDATE | | |
| | | 4803 | ;2. CALL AND RETURN | | | |
| | | 4804 | ; | INPUTS | A=PORT NUM., R0=DESTINATION PTR | |
| | | 4805 | ; | | | |
| | | 4806 | ; | OUTPUTS | PORT READ AND DESTINATION UPDATED | |
| | | 4807 | ; | | | |
| | | 4808 | ; | RETURN | | |
| | | 4809 | ;3. CALLED ROUTINES | | | |
| | | 4810 | ;4. EQUATES | | | |
| | | 4811 | ;*********************************************** | | | |
| | | 4812 | ; | | | |
| | | 4813 | ; | | | |
| 0E44 | 3A | 4814 | UPDATE: | OUTL | P2,A | ;OPEN PORT |
| 0E45 | 09 | 4815 | | IN | A,P1 | ;GET DATA |
| 0E46 | 37 | 4816 | | CPL | A | |
| 0E47 | A0 | 4817 | | MOV | @R0,A | ;STORE DATA |
| 0E48 | 18 | 4818 | | INC | R0 | |
| 0E49 | 93 | 4819 | | RETR | | |
| | | 4820 | $EJECT | | | |
| | | 4821 | ;1. TITLE | | | |
| | | 4822 | ; | PACK | | |
| | | 4823 | ;2. CALL AND RETURN | | | |
| | | 4824 | ; | INPUTS | 4 SIX BIT INPUTS BUFFERED AT DIGITL+4 TO DIGITL+7 | |
| | | 4825 | ; | | | |
| | | 4826 | ; | OUTPUTS | 3 EIGHT BIT OUTPUTS BUFFERED AT DIGITL+4 WITH IDS ORDERED AND | |
| | | 4827 | ; | | INVERTED | |
| | | 4828 | ; | | | |
| | | 4829 | ;3. CALLED ROUTINES | | | |
| | | 4830 | ;4. EQUATES | | | |

```
LOC    OBJ          LINE         SOURCE STATEMENT

4831  ;*********************************************************************
                    4832  ;
                    4833  ;
0E4A  B83C          4834  PACK:    MOV     R0,#DIGITL+4        ;GET INPUT PTR
0E4C  B93C          4835           MOV     R1,#DIGITL+4        ;GET DESTINATION PTR
0E4E  BA18          4836           MOV     R2,#24              ;GET ID COUNTER
0E50  BB06          4837           MOV     R3,#6               ;GET BIT COUNTER FOR INPUT
0E52  BC08          4838           MOV     R4,#8               ;GET BIT COUNTER FOR OUTPUT
0E54  27            4839           CLR     A
0E55  20            4840  PACKLP:  XCH     A,@R0               ;DO FROM 1 TO 24
0E56  97            4841           CLR     C
0E57  67            4842           RRC     A                   ; GET BITY
0E58  20            4843           XCH     A,@R0               ; SAVE BIT
0E59  F7            4844           RLC     A
0E5A  E85F          4845           DJNZ    R3,PACK1            ; DECREMENT INPUT COUNTER
0E5C  BB06          4846           MOV     R3,#6               ; RESET INPUT COUNTER
0E5E  18            4847           INC     R0                  ; INCREMENT INPUT PTR
0E5F  EC66          4848  PACK1:   DJNZ    R4,PACK2            ; DECREMENT OUTPUT COUNTER
0E61  BC08          4849           MOV     R4,#8               ; RESET OUTPUT COUNTER
0E63  A1            4850           MOV     @R1,A               ; SAVE PACKED RESULT
0E64  19            4851           INC     R1                  ; INCREMENT OUTPUT PTR
0E65  27            4852           CLR     A
0E66  EA55          4853  PACK2:   DJNZ    R2,PACKLP           ;ENDDO
0E68  93            4854           RETR
                    4855  $EJECT
                    4856  ;1. TITLE
                    4857  ;         INVERT
                    4858  ;    NOTES:  IN THE DIGITAL INPUT DATA FILE, BYTES 1 TO 3 HAVE THE NORMALLY
                    4859  ;    OPEN/ NORMALLY CLOSED STATUS PROGRAMED. AN ENTRY OF '1' IMPLIES
                    4860  ;          THE INPUT IS NORMALLY OPEN, AND TO GET THE ABNORMAL '1' STATE THE
                    4861  ;          INPUT MUST BE INVERTED. AN ENTRY OF '0' IMPLIES THAT THE INPUT
                    4862  ;          IS NORMALLY CLOSED (0) AND THE INPUT IS NOT INVERTED.
                    4863  ;
                    4864  ;
                    4865  ;          THE BOOLEAN EQUATION HAS TWO INPUTS VARIABLES (INPUT) AND
                    4866  ;          (INVERT) WHERE 'INVERT' IS THE PROGRAMMED INVERSION. THE
                    4867  ;          EQUATION IS:
                    4868  ;                  RESULT=(NOT INVERT AND INPUT) OR (NOT INPUT AND INVERT)
                    4869  ;
                    4870  ;
                    4871  ;          THE ABOVE EQUATION WILL PROCESS 8 DIGITAL INPUTS IN PARALLEL.
                    4872  ;2. CALL AND RETURN
                    4873  ;         INPUTS     3 EIGHT BIT INPUTS AT DIGITL+4, 3 EIGHT BIT NO/NC PROGRAM LINES
                    4874  ;                    AT DIGITL+1
                    4875  ;
                    4876  ;         OUTPUTS    NO/NC INVERSIONS DONE ON PER BIT BASIS
                    4877  ;
                    4878  ;         RETURN
```

```
LOC   OBJ           LINE          SOURCE STATEMENT

4879    ;3.   CALLED ROUTINES
                    4880    ;4.   EQUATES
                    4881    ;***********************************************************
                    4882    ;
                    4883    ;
0E69 BB03           4884    INVERT: MOV   R3,#3              ;GET 'INVERT' PTR
0E6B B839           4885            MOV   R0,#DIGITL+1       ;GET 'INPUT' PTR
0E6D B93C           4886            MOV   R1,#DIGITL+4       ;DO WHILE INPUTS
0E6F F1             4887    INVLP:  MOV   A,@R1              ;   GET INPUT
0E70 37             4888            CPL   A                  ;   CALCULATE OUTPUT
0E71 50             4889            ANL   A,@R0
0E72 AA             4890            MOV   R2,A
0E73 F0             4891            MOV   A,@R0
0E74 37             4892            CPL   A
0E75 51             4893            ANL   A,@R1
0E76 4A             4894            ORL   A,R2
0E77 A1             4895            MOV   @R1,A
0E78 18             4896            INC   R0
0E79 19             4897            INC   R1                 ; INCREMENT PTRS
0E7A E86F           4898            DJNZ  R3,INVLP           ;ENDWHILE
0E7C 93             4899            RETR
                    4900    $EJECT
0E7D FF             4901            DB    0FFH,0FFH,0FFH
0E7E FF
0E7F FF
                    4902    ;1.  TITLE
                    4903    ;        COSFM--FORMAT CHANGE OF STATE
                    4904    ;2.  CALL AND RETURN
                    4905    ;        INPUTS    RAM OPEN
                    4906    ;
                    4907    ;        OUTPUTS   COS FORMATED INTO TRANSMISSION BUFFER
                    4908    ;
                    4909    ;        RETURN
                    4910    ;3.  CALLED ROUTINES
                    4911    ;4.  EQUATES
                    4912    ;***********************************************************
                    4913    ;
0E80 B801           4914    COSFM:  MOV   R0,#MSG            ;GET CONTROL BYTE PTR
0E82 80             4915            MOVX  A,@R0
0E83 1287           4916            JB0   COSFM0             ;IF DEMAND THEN
0E85 C4A3           4917            JMP   COSFM3             ;  CE=UNCHANGED
                    4918    ;                                ENDIF
0E87 53FC           4919    COSFM0: ANL   A,#0FCH            ;SET TYPE2 MESSAGE
0E89 4302           4920            ORL   A,#2
0E8B 90             4921            MOVX  @R0,A
0E8C B803           4922            MOV   R0,#EXT            ;GET EXTENSION PTR
0E8E B929           4923            MOV   R1,#COSBUF         ;GET COS BUFFER PTR
0E90 F1             4924            MOV   A,@R1              ;GET COS TYPE
```

```
LOC  OBJ        LINE   SOURCE STATEMENT

0E91 97         4925          CLR   C
0E92 F7         4926          RLC   A
0E93 E698       4927          JNC   COSFM1               ;IF DIGITAL ONLY COS THEN
0E95 96A2       4928          JNZ   COSFM2
0E97 2309       4929          MOV   A,#9
0E99 C4A3       4930          JMP   COSFM3
0E9B F7         4931 COSFM1:  RLC   A
0E9C E6A2       4932          JNC   COSFM2               ; CE=9
0E9E 230A       4933          MOV   A,#10                ;ELSE IF ANALOG ONLY COS THEN
0EA0 C4A3       4934          JMP   COSFM3
0EA2 27         4935 COSFM2:  CLR   A                    ;ELSE
0EA3 90         4936 COSFM3:  MOVX  @R0,A                ; CE=10
0EA4 27         4937          CLR   A                    ; CE=0
0EA5 B929       4938          MOV   R1,#COSBUF           ;ENDIF
0EA7 A1         4939          MOV   @R1,A                ;GET COS BUFFER PTR
0EA8 BB03       4940          MOV   R3,#3                ;CLEAR COS BUFFER
0EAA B804       4941          MOV   R0,#INFO             ;PRESET LENGTH COUNT
0EAC B948       4942          MOV   R1,#TMPLT            ;GET INFO PTR
0EAE 81         4943          MOVX  A,@R1                ;GET TEMPLATE PTR
0EAF 17         4944          INC   A                    ;GET COUNT OF ANALOG BYTES
0EB0 E7         4945          RL    A
0EB1 AA         4946          MOV   R2,A
0EB2 E5         4947          SEL   MB0
0EB3 F41E       4948          CALL  MOVE                 ;MOVE BYTES INTO BUFFER
0EB5 F5         4949          SEL   MB1
                4950 ;###########################################################
                4951 ;    THIS ROUTINE MODIFIED 1/16/81. PREVENT EXTRA BYTE AFTER LAST DIGITAL
                4952 ;    IN DATA STREAM TO 560
                4953 ;
0EB6 B949       4954          MOV   R1,#TMPLT+1          ;GET DIGITAL TEMPLATE (# DIGITALS)
0EB8 81         4955          MOVX  A,@R1
0EB9 12BF       4956          JB0   CINCR                ;IF BITS 0 OR 1 SET, NEED EXTRA BYTE
0EBB 32BF       4957          JB1   CINCR                ;FOR TRANSMISSION.
0EBD C4C1       4958          JMP   CNOINC               ;IF MULTIPLE OF 4, DON'T NEED IT.
0EBF 0304       4959 CINCR:   ADD   A,#04H
0EC1 77         4960 CNOINC:  RR    A
0EC2 77         4961          RR    A
0EC3 530F       4962          ANL   A,#0FH
0EC5 AA         4963          MOV   R2,A                 ;R2= # OF BITS REQUIRED FOR DIGITALS
0EC6 B982       4964          MOV   R1,#DIGST            ;GET DIGITAL BYTES
0EC8 E5         4965          SEL   MB0
0EC9 F41E       4966          CALL  MOVE
0ECB F8         4967          MOV   A,R3
0ECC 6467       4968          JMP   RECVE
                4969 ;
                4970 ;###########################################################  ; ECFH-EFFH
0ECE FF         4971          DB    0FFH
0ECF FF         4972          DB    0FFH,0FFH,0FFH,0FFH,0FFH,0FFH,0FFH      ; ECFH-EFFH
```

| LOC | OBJ | LINE | SOURCE STATEMENT | |
|---|---|---|---|---|
| 0ED0 | FF | | | |
| 0ED1 | FF | | | |
| 0ED2 | FF | | | |
| 0ED3 | FF | | | |
| 0ED4 | FF | | | |
| 0ED5 | FF | | | |
| 0ED6 | FF | 4973 | DB | 0FFH,0FFH,0FFH,0FFH,0FFH,0FFH,0FFH |
| 0ED7 | FF | | | |
| 0ED8 | FF | | | |
| 0ED9 | FF | | | |
| 0EDA | FF | | | |
| 0EDB | FF | | | |
| 0EDC | FF | | | |
| 0EDD | FF | | | |
| 0EDE | FF | 4974 | DB | 0FFH,0FFH,0FFH,0FFH,0FFH,0FFH,0FFH,0FFH |
| 0EDF | FF | | | |
| 0EE0 | FF | | | |
| 0EE1 | FF | | | |
| 0EE2 | FF | | | |
| 0EE3 | FF | | | |
| 0EE4 | FF | | | |
| 0EE5 | FF | | | |
| 0EE6 | FF | 4975 | DB | 0FFH,0FFH,0FFH,0FFH,0FFH,0FFH,0FFH,0FFH |
| 0EE7 | FF | | | |
| 0EE8 | FF | | | |
| 0EE9 | FF | | | |
| 0EEA | FF | | | |
| 0EEB | FF | | | |
| 0EEC | FF | | | |
| 0EED | FF | | | |
| 0EEE | FF | 4976 | DB | 0FFH,0FFH,0FFH,0FFH,0FFH,0FFH,0FFH,0FFH |
| 0EEF | FF | | | |
| 0EF0 | FF | | | |
| 0EF1 | FF | | | |
| 0EF2 | FF | | | |
| 0EF3 | FF | | | |
| 0EF4 | FF | | | |
| 0EF5 | FF | | | |
| 0EF6 | FF | 4977 | DB | 0FFH,0FFH,0FFH,0FFH,0FFH,0FFH,0FFH,0FFH |
| 0EF7 | FF | | | |
| 0EF8 | FF | | | |
| 0EF9 | FF | | | |
| 0EFA | FF | | | |
| 0EFB | FF | | | |
| 0EFC | FF | | | |
| 0EFD | FF | | | |
| 0EFE | FF | 4978 | DB | 0FFH,0FFH,0FFH,0FFH,0FFH,0FFH,0FFH,0FFH ; F00H-F7FH |
| 0EFF | FF | | | |

| LOC | OBJ | LINE | SOURCE STATEMENT |
|---|---|---|---|
| 0F00 | FF | | |
| 0F01 | FF | | |
| 0F02 | FF | | |
| 0F03 | FF | | |
| 0F04 | FF | | |
| 0F05 | FF | | |
| 0F06 | FF | | |
| 0F07 | FF | 4979 | DB  0FFH,0FFH,0FFH,0FFH,0FFH,0FFH,0FFH,0FFH |
| 0F08 | FF | | |
| 0F09 | FF | | |
| 0F0A | FF | | |
| 0F0B | FF | | |
| 0F0C | FF | | |
| 0F0D | FF | | |
| 0F0E | FF | | |
| 0F0F | FF | 4980 | DB  0FFH,0FFH,0FFH,0FFH,0FFH,0FFH,0FFH,0FFH |
| 0F10 | FF | | |
| 0F11 | FF | | |
| 0F12 | FF | | |
| 0F13 | FF | | |
| 0F14 | FF | | |
| 0F15 | FF | | |
| 0F16 | FF | | |
| 0F17 | FF | 4981 | DB  0FFH,0FFH,0FFH,0FFH,0FFH,0FFH,0FFH,0FFH |
| 0F18 | FF | | |
| 0F19 | FF | | |
| 0F1A | FF | | |
| 0F1B | FF | | |
| 0F1C | FF | | |
| 0F1D | FF | | |
| 0F1E | FF | | |
| 0F1F | FF | 4982 | DB  0FFH,0FFH,0FFH,0FFH,0FFH,0FFH,0FFH,0FFH |
| 0F20 | FF | | |
| 0F21 | FF | | |
| 0F22 | FF | | |
| 0F23 | FF | | |
| 0F24 | FF | | |
| 0F25 | FF | | |
| 0F26 | FF | | |
| 0F27 | FF | 4983 | DB  0FFH,0FFH,0FFH,0FFH,0FFH,0FFH,0FFH,0FFH |
| 0F28 | FF | | |
| 0F29 | FF | | |
| 0F2A | FF | | |
| 0F2B | FF | | |
| 0F2C | FF | | |
| 0F2D | FF | | |
| 0F2E | FF | | |
| 0F2F | FF | 4984 | DB  0FFH,0FFH,0FFH,0FFH,0FFH,0FFH,0FFH,0FFH |

```
LOC  OBJ   LINE   SOURCE STATEMENT

0F30 FF
0F31 FF
0F32 FF
0F33 FF
0F34 FF
0F35 FF
0F36 FF
0F37 FF   4985    DB    0FFH,0FFH,0FFH,0FFH,0FFH,0FFH,0FFH,0FFH
0F38 FF
0F39 FF
0F3A FF
0F3B FF
0F3C FF
0F3D FF
0F3E FF
0F3F FF   4986    DB    0FFH,0FFH,0FFH,0FFH,0FFH,0FFH,0FFH,0FFH
0F40 FF
0F41 FF
0F42 FF
0F43 FF
0F44 FF
0F45 FF
0F46 FF
0F47 FF   4987    DB    0FFH,0FFH,0FFH,0FFH,0FFH,0FFH,0FFH,0FFH
0F48 FF
0F49 FF
0F4A FF
0F4B FF
0F4C FF
0F4D FF
0F4E FF
0F4F FF   4988    DB    0FFH,0FFH,0FFH,0FFH,0FFH,0FFH,0FFH,0FFH
0F50 FF
0F51 FF
0F52 FF
0F53 FF
0F54 FF
0F55 FF
0F56 FF
0F57 FF   4989    DB    0FFH,0FFH,0FFH,0FFH,0FFH,0FFH,0FFH,0FFH
0F58 FF
0F59 FF
0F5A FF
0F5B FF
0F5C FF
0F5D FF
0F5E FF
0F5F FF   4990    DB    0FFH,0FFH,0FFH,0FFH,0FFH,0FFH,0FFH,0FFH
```

| LOC | OBJ | LINE | SOURCE STATEMENT | | |
|---|---|---|---|---|---|
| 0F60 | FF | | | | |
| 0F61 | FF | | | | |
| 0F62 | FF | | | | |
| 0F63 | FF | | | | |
| 0F64 | FF | | | | |
| 0F65 | FF | | | | |
| 0F66 | FF | | | | |
| 0F67 | FF | 4991 | DB | 0FFH,0FFH,0FFH,0FFH,0FFH,0FFH,0FFH,0FFH | |
| 0F68 | FF | | | | |
| 0F69 | FF | | | | |
| 0F6A | FF | | | | |
| 0F6B | FF | | | | |
| 0F6C | FF | | | | |
| 0F6D | FF | | | | |
| 0F6E | FF | | | | |
| 0F6F | FF | 4992 | DB | 0FFH,0FFH,0FFH,0FFH,0FFH,0FFH,0FFH,0FFH | |
| 0F70 | FF | | | | |
| 0F71 | FF | | | | |
| 0F72 | FF | | | | |
| 0F73 | FF | | | | |
| 0F74 | FF | | | | |
| 0F75 | FF | | | | |
| 0F76 | FF | | | | |
| 0F77 | FF | 4993 | DB | 0FFH,0FFH,0FFH,0FFH,0FFH,0FFH,0FFH,0FFH | |
| 0F78 | FF | | | | |
| 0F79 | FF | | | | |
| 0F7A | FF | | | | |
| 0F7B | FF | | | | |
| 0F7C | FF | | | | |
| 0F7D | FF | | | | |
| 0F7E | FF | | | | |
| 0F7F | FF | 4994 | DB | 0FFH,0FFH,0FFH,0FFH,0FFH,0FFH,0FFH,0FFH | ; F80H-FFFH |
| 0F80 | FF | | | | |
| 0F81 | FF | | | | |
| 0F82 | FF | | | | |
| 0F83 | FF | | | | |
| 0F84 | FF | | | | |
| 0F85 | FF | | | | |
| 0F86 | FF | | | | |
| 0F87 | FF | 4995 | DB | 0FFH,0FFH,0FFH,0FFH,0FFH,0FFH,0FFH,0FFH | |
| 0F88 | FF | | | | |
| 0F89 | FF | | | | |
| 0F8A | FF | | | | |
| 0F8B | FF | | | | |
| 0F8C | FF | | | | |
| 0F8D | FF | | | | |
| 0F8E | FF | | | | |
| 0F8F | FF | 4996 | DB | 0FFH,0FFH,0FFH,0FFH,0FFH,0FFH,0FFH,0FFH | |

| LOC | OBJ | LINE | SOURCE STATEMENT |
|---|---|---|---|
| 0F90 | FF | | |
| 0F91 | FF | | |
| 0F92 | FF | | |
| 0F93 | FF | | |
| 0F94 | FF | | |
| 0F95 | FF | | |
| 0F96 | FF | | |
| 0F97 | FF | 4997 | DB  0FFH,0FFH,0FFH,0FFH,0FFH,0FFH,0FFH,0FFH |
| 0F98 | FF | | |
| 0F99 | FF | | |
| 0F9A | FF | | |
| 0F9B | FF | | |
| 0F9C | FF | | |
| 0F9D | FF | | |
| 0F9E | FF | | |
| 0F9F | FF | 4998 | DB  0FFH,0FFH,0FFH,0FFH,0FFH,0FFH,0FFH,0FFH |
| 0FA0 | FF | | |
| 0FA1 | FF | | |
| 0FA2 | FF | | |
| 0FA3 | FF | | |
| 0FA4 | FF | | |
| 0FA5 | FF | | |
| 0FA6 | FF | | |
| 0FA7 | FF | 4999 | DB  0FFH,0FFH,0FFH,0FFH,0FFH,0FFH,0FFH,0FFH |
| 0FA8 | FF | | |
| 0FA9 | FF | | |
| 0FAA | FF | | |
| 0FAB | FF | | |
| 0FAC | FF | | |
| 0FAD | FF | | |
| 0FAE | FF | | |
| 0FAF | FF | 5000 | DB  0FFH,0FFH,0FFH,0FFH,0FFH,0FFH,0FFH,0FFH |
| 0FB0 | FF | | |
| 0FB1 | FF | | |
| 0FB2 | FF | | |
| 0FB3 | FF | | |
| 0FB4 | FF | | |
| 0FB5 | FF | | |
| 0FB6 | FF | | |
| 0FB7 | FF | 5001 | DB  0FFH,0FFH,0FFH,0FFH,0FFH,0FFH,0FFH,0FFH |
| 0FB8 | FF | | |
| 0FB9 | FF | | |
| 0FBA | FF | | |
| 0FBB | FF | | |
| 0FBC | FF | | |
| 0FBD | FF | | |
| 0FBE | FF | | |

| LOC | OBJ | LINE | SOURCE STATEMENT | |
|---|---|---|---|---|
| 0FBF | FF | 5002 | DB | 0FFH,0FFH,0FFH,0FFH,0FFH,0FFH,0FFH |
| 0FC0 | FF | | | |
| 0FC1 | FF | | | |
| 0FC2 | FF | | | |
| 0FC3 | FF | | | |
| 0FC4 | FF | | | |
| 0FC5 | FF | | | |
| 0FC6 | FF | | | |
| 0FC7 | FF | 5003 | DB | 0FFH,0FFH,0FFH,0FFH,0FFH,0FFH,0FFH,0FFH |
| 0FC8 | FF | | | |
| 0FC9 | FF | | | |
| 0FCA | FF | | | |
| 0FCB | FF | | | |
| 0FCC | FF | | | |
| 0FCD | FF | | | |
| 0FCE | FF | | | |
| 0FCF | FF | 5004 | DB | 0FFH,0FFH,0FFH,0FFH,0FFH,0FFH,0FFH,0FFH |
| 0FD0 | FF | | | |
| 0FD1 | FF | | | |
| 0FD2 | FF | | | |
| 0FD3 | FF | | | |
| 0FD4 | FF | | | |
| 0FD5 | FF | | | |
| 0FD6 | FF | | | |
| 0FD7 | FF | 5005 | DB | 0FFH,0FFH,0FFH,0FFH,0FFH,0FFH,0FFH,0FFH |
| 0FD8 | FF | | | |
| 0FD9 | FF | | | |
| 0FDA | FF | | | |
| 0FDB | FF | | | |
| 0FDC | FF | | | |
| 0FDD | FF | | | |
| 0FDE | FF | | | |
| 0FDF | FF | 5006 | DB | 0FFH,0FFH,0FFH,0FFH,0FFH,0FFH,0FFH,0FFH |
| 0FE0 | FF | | | |
| 0FE1 | FF | | | |
| 0FE2 | FF | | | |
| 0FE3 | FF | | | |
| 0FE4 | FF | | | |
| 0FE5 | FF | | | |
| 0FE6 | FF | | | |
| 0FE7 | FF | 5007 | DB | 0FFH,0FFH,0FFH,0FFH,0FFH,0FFH,0FFH,0FFH |
| 0FE8 | FF | | | |
| 0FE9 | FF | | | |
| 0FEA | FF | | | |
| 0FEB | FF | | | |
| 0FEC | FF | | | |
| 0FED | FF | | | |

```
LOC    OBJ              LINE         SOURCE STATEMENT
0FEE   FF
0FEF   FF
0FF0   FF
0FF1   FF
0FF2   FF
0FF3   FF
0FF4   FF
0FF5   FF
0FF6   FF
0FF7   FF               5008         DB      0FFH,0FFH,0FFH,0FFH,0FFH,0FFH,0FFH,0FFH
0FF8   FF
0FF9   FF
0FFA   FF
0FFB   FF
0FFC   FF
0FFD   FF
0FFE   FF
0FFF   FF               5009         DB      0FFH,0FFH,0FFH,0FFH,0FFH,0FFH,0FFH,0FFH ; LAST OF FILL-IN CODE

5010         ORG     0FF0H   ; SO THAT CODE DOES NOT WRAP AROUND
                        5011    ;
0FF0   FF                5012         DB      0FFH,0FFH,0FFH,0FFH,0FFH,0FFH,0FFH,0FFH
0FF1   FF
0FF2   FF
0FF3   FF
0FF4   FF
0FF5   FF
0FF6   FF
0FF7   FF
0FF8   FF                5013         DB      0FFH,0FFH,0FFH,0FFH,0FFH,0FFH,0FFH,0FFH
0FF9   FF
0FFA   FF
0FFB   FF
0FFC   FF
0FFD   FF
0FFE   FF
0FFF   FF
                        5014 $EJECT
                        5015         END

USER SYMBOLS
AD     0600    AD1      0620    ADCAL  0101    ADD16  08C4    ADDRES 0020    ADDX   07BE    ADDX1  07D1    ADDX2  07CC
ADDXA  00B3   ADDXB     00C9    ADDXC  00CB    ADDXE  07D2    ADE    0A1B    ADEN   0008    ADFNL  0AD6    ADIDL  060A
ADMB1  0A10   ADRP      0A2E    ADRP1  0A3A    ADRP2  0A3E    ADRP3  0A45    ADRP4  0A42    ADRTD  0AAA    ADRTD1 0AB2
ADRTD2 0ABA   ADRTD3    0AC0    ADTHR  0A4A    ADTMP  0014    ADTMP1 0016    ADV    0A7E    ADV0   0AB5    ADV1   0A9E
ADV10  0A89   ADV10A    0ABE    ADV11  0A92    ADV2   0AA4    ADVE   0A15    ADVE1  0A18    ADVEX  0A11    ALARM  0080
ANACP  07B7   ANACP     0088    ANACS  0000    ANAID  00E0    ANAIN  00F0    ANALOG 0030    ANAPT  00B0    ANAST  004A
B1200  0003   B9600     0002    BANK   0578    BANK1  0576    BANKE  05A9    BASE   0908    BASE1  0912    BASE2  091C
BASE2A 0923   BASE2B    0800    BASE3  092B    BASE3A 0933    BASE3B 0939    BASE4  093D    BASE5  0943    BASE6  0949
```

| LOC | OBJ | LINE | | SOURCE STATEMENT | | | | | | |
|---|---|---|---|---|---|---|---|---|---|---|
| BASEE7 | 094F | BASEEE | 0973 | BASEEA | 08D8 | BASEEB | 08E5 | BASEEC | 08E6 | BASEED | 0C1B | BASEEE | 0C24 | BASEEF | 08DF |
| BASEEX | 0971 | BASEEY | 08E4 | BASEEZ | 08F3 | BASEP | 0955 | BASEP1 | 096B | BCOM | 056A | BITMSK | 040A | BLINE | 0005 |
| BURNE | 00E0 | BURNL | 00DB | BURNT | 00D8 | CASE1 | 0274 | CASE2 | 0289 | CASE3 | 0292 | CE | 0300 | CENUM | 000F |
| CHARL | 000C | CIM | 0BE4 | CIM1 | 0BEB | CIM2 | 0BED | CIM3 | 0BF1 | CIMR | 0BFC | CIMSS | 054A | CINCR | 0EBF |
| CKSM | 0021 | CLOCK | 0117 | CNOINC | 0EC1 | CNVRT | 0114 | CNVRT1 | 011E | COM18 | 00AD | COMAN1 | 0C15 | COMAND | 0C0F |
| COMTIM | 000F | CONVRT | 0114 | COS | 06FD | COSBUF | 0709 | COSE | 00AF | COSFM | 0E80 | COSFM0 | 0E87 | COSFM1 | 0E9B |
| COSFM2 | 0EA2 | COSFM3 | 0EA3 | COSFMA | 033F | COSFM3 | 02EE | COSRES | 0005 | COSSET | 0006 | CPA | 0622 | CPA1 | 0631 | CPA2 | 066A |
| CPAL | 0005 | CPALP | 063C | CTSCHK | 02EE | CTSCK1 | 02F3 | CTSEND | 02F5 | CPA | 0622 | CPA1 | 0631 | DATE | 03FD |
| DIG | 0E00 | DIGA | 0E21 | DIGDLY | 00D0 | DIGFS | 0E11 | DIGIN | 00C0 | DATA | 00CD | DATAID | 0080 | DIGIN3 | 00F0 |
| DIGITL | 0038 | DIGLP | 0E38 | DIGMSK | 00FB | DIGNFS | 0E19 | DIGPT | 0090 | DIGIN1 | 00D0 | DIGIN2 | 00E0 | DIR0 | 0D24 |
| DIR1 | 0028 | DIR1A | 002A | DIR2 | 002E | DIR3 | 00D7C | DIR4 | 0D38 | DIGST | 0082 | DIR | 0D08 | DIR6A | 0D46 |
| DIR6B | 0D52 | DIR7 | 0D62 | DIR8 | 0D70 | DIRE | 0D2E | DIRFS | 0D7E | DIR5 | 0D3E | DIR6 | 0D44 | DIRLP | 0D0C |
| DIRQ | 0DAC | DISSCN | 0007 | DIVD | 0872 | DIVD1 | 087E | DIVDEN | 0989 | DIRL | 0D66 | DIRLA | 0D6D | DSO | 01A7 |
| DS1 | 01AB | DS2 | 0184 | DS3 | 01B6 | DS3A | 005C | DS4 | 01C4 | DIVDL | 0874 | DIVIDE | 09C3 | DTIMEH | 007E |
| DTIMEL | 003E | DUMMY | 00FC | EH | 0080 | EIP | 0026 | EIP1 | 0686 | DS4LP | 01C7 | DSR | 0080 | EIPP | 066E |
| EOM | 0299 | ERROR | 0038 | ERRSET | 02A1 | EXEC | 040F | EXT | 0003 | EIP2 | 068A | EIPEN | 0003 | FILE1 | 076F |
| FILE2 | 0773 | FILE3 | 077C | FILEE | 0793 | FILELP | 0784 | FAIL | 0198 | FILE | 0198 | FS1 | 0891 |
| FS1A | 089A | FS3 | 08B4 | FSCOS | 0888 | FSCTL | 0CB6 | FSDEAD | 085F | FINAL | 0992 | FINAL3 | 09A3 | FSOKLP | 0B46 |
| FSR1 | 0BBC | FSR2 | 0BE3 | FSRLY | 0BB5 | FSROTD | 0CBF | FSSTAT | 0814 | FSLP | 0869 | FSO | 0BE3E | GETBYT | 0796 |
| GETEND | 07AE | HI | 05A1 | HI1 | 0586 | HILMT | 0003 | HIOFF | 058E | FTIMEH | 00FF | FTIMEL | 00D9 | IDLE | 022A |
| IDLE1 | 024E | IDLE2 | 022D | IDLE3 | 022F | IDLE4 | 024A | IDLE5 | 00F3 | HIOUT | 0587 | HWRES | 0310 | IDLE8 | 0250 |
| IDLE9 | 05EA | IN232 | 000A | IN422 | 0000 | INFO | 0004 | INT10 | 007C | IDLE6 | 00FE | IDLE7 | 05F5 | INT40 | 00AA |
| INTCLR | 0C35 | INTE | 0133 | INTP | 0AE4 | INTPE | 0AF6 | INTPR | 006E | INT20 | 0095 | INT30 | 0084 | IODEF | 00CF |
| IR | 0040 | ITIMEH | 007E | ITIMEL | 003E | JCNVRT | 0131 | LEN | 0025 | INVERT | 0E69 | INVLP | 0E6F | LIMIT2 | 00D6 |
| LIMIT3 | 0006 | LIMIT4 | 0040 | LINE | 0024 | LINESW | 0711 | LINET | 0C65 | LENGTH | 0002 | LIMIT1 | 0001 | LNSWAP | 0718 |
| LOAD | 037D | LOLMT | 002A | LOW1 | 0597 | LOWCHK | 0590 | LOWSP | 0C88 | LINK | 0883 | LINKLP | 0889 | MCASE | 00FE |
| MEMCLR | 0C2D | MEMLEN | 003F | MORE | 07A0 | MOVE | 071E | MOVEI | 0781 | LSWE | 071D | MASK1 | 00FF | MOVERI | 07AF |
| MPOS | 073C | MGUAD | 0003 | MSBIT | 003C | MSG | 0001 | MSGL | 0003 | MOVEMM | 09F7 | MOVER | 0726 | MULT1 | 0887 |
| MULT2 | 08BB | MULTLP | 08B1 | NABLE3 | 00FA | NEWVAL | 013F | NORMAL | 0BCE | MTYPE | 0003 | NTASK | 0BAE | NUM | 08EB |
| OFF | 070A | OFF1 | 098B | OFF2 | 0003 | OFFSET | 097E | OLDVAL | 0144 | NRTMR | 00FF | NTASK | 0421 | ONEO | 04D6 |
| ONE1 | 04DB | ONE2 | 04E6 | ONEE | 04FE | ONPRT | 0A57 | OUT232 | 0002 | ONBRD | 04CA | ONE | 04CA | OVRFL1 | 07EB |
| OVRFL2 | 07ED | OVRFL3 | 07EF | OVRFL4 | 07F1 | OVRFL2 | 07EF | OUT422 | 059E | OUT422 | 0E4A | OVRFL | 07E7 | PACK2 | 0E66 |
| PACKLP | 0E55 | PANA | 072C | PANAST | 0734 | P7LO | 05A8 | PACK | 0000 | OVRFL | 07E7 | PACK1 | 0E5F | POINT2 | 075E |
| POINTL | 0756 | PORTA | 0001 | PORTB | 0002 | PARITY | 0000 | PEN | 0010 | POINT | 0740 | POINT1 | 075A | PULSA | 0566 |
| PULSB | 0567 | PULSE | 0552 | PV | 09A7 | PORTC | 0003 | PRGRAM | 038D | PROG | 0070 | PROGL | 0006 | PULSA | 0566 |
| RANGE | 0812 | RANGE1 | 0820 | RANGE2 | 082C | QUADST | 0000 | RANG1 | 0800 | RANG7 | 080C | RANG8 | 080E | RANGE9 | 0810 |
| RANGES | 0900 | RCT1 | 0C9C | RCT2 | 0CAA | RANGE3 | 0830 | RANGE4 | 0846 | RANG6 | 0848 | RANG8 | 080E | RANGEE | 0855 |
| RDATAD | 05E8 | RDATAE | 02B5 | RDATAF | 0CB8 | RCTEX | 0CA7 | RDATA | 0257 | RANGE5 | 0846 | RDATAA | 05CA | RDATAC | 025D |
| RECV | 031A | RECVE | 0367 | REG2 | 001A | REG3 | 0C97 | RDATAH | 026C | RDATAB | 0589 | RDATAX | 05E6 | REC1 | 0371 |
| RESET | 0010 | RESULT | 019C | REV | 03FC | REV1 | 052A | REGRLY | 056F | REC | 0252 | REG | 02A5 | REQ1 | 0001 |
| RFSH1 | 014E | RFSH3 | 0171 | RFSHL | 0158 | RL1 | 0476 | RL2 | 07E6 | RELAY | 0502 | RFLDBK | 000F | RFSH | 002A |
| RL99 | 054E | RLY | 0471 | RLY1 | 0476 | RLY1L | 047E | RLYSCH | 00F2 | RL3 | 0531 | RL4 | 0536 | RL5 | 053D |
| RLYCT | 002E | RLYE | 04A7 | RLYE1 | 04A3 | RP | 0173 | RP1 | 017F | RLYACT | 0523 | RLYB0 | 0080 | RLYR1 | 00A0 |
| RPE | 0196 | RPT120 | 00F1 | RPT232 | 00E6 | RRCHK | 00E6 | RRCHK1 | 02FC | RP2 | 0185 | RTS | 0020 | RTS422 | 02E0 |

| LOC | OBJ | LINE | SOURCE STATEMENT | | | | | | | | |
|---|---|---|---|---|---|---|---|---|---|---|---|
| RTSEND | 02E6 | RTSREQ | 0027 | RTSRES | 0017 | RXE | 0006 | RXRDY | 0002 | SAVE | 09DC | SAVE1 | 09E5 | SAVE2 | 09EA |
| SAVE3 | 09EC | SAVE4 | 09ED | SBRK | 000A | SECOND | 0025 | SEND | 0287 | SLFCAL | 008E | SNDEND | 02CD | SPAN | 0035 |
| SRS232 | 02E4 | SRTS | 02CF | SS | 0512 | SS1 | 051D | SSE | 051F | SSLEN | 0004 | ST | 0040 | START | 0C25 |
| STIMEH | 00FF | STIMEL | 001C | STOPCT | 004F | STOPSC | 0003 | STORE | 02A9 | STRTCT | 00CF | SUBT | 0898 | SUBT1 | 0BA2 |
| SUBT2 | 0BAB | SUBTV | 0890 | SUBTV1 | 0897 | T50MS | 0090 | TABLE | 0856 | TABLE0 | 00F7 | TABLE1 | 00FB | TABLE2 | 00F9 |
| TABLEE | 0871 | TASK | 0422 | TASK0 | 0400 | TASK1 | 0402 | TASK2 | 0404 | TASK3 | 0406 | TASK4 | 0408 | TASKRQ | 0416 |
| TBL | 0040 | TDELAY | 0023 | TF12 | 005F | TF96 | 005E | THR1 | 01D9 | THR1A | 01E6 | THR1B | 00E1 | THR1C | 001C |
| THR2 | 01E0 | THR2A | 01F5 | THR2B | 01F9 | TIMEH | 007F | TIMEL | 00FF | TIMERH | 0005 | TIMERL | 0004 | TINT10 | 001C |
| TINT20 | 003F | TINT30 | 0025 | TINT40 | 0040 | TINTP | 00FF | TINTXX | 0051 | TINTYY | 0036 | TMPLT | 0004 |
| TOTACT | 00F6 | TOTAL | 043F | TOTAL1 | 0450 | TOTALA | 0449 | TOTALE | 044E | TOTALX | 044B | TOTALY | 0445 | TOTASS | 00F4 |
| TOTINC | 0028 | TOTLST | 0027 | TOTRUN | 00F5 | TOTSCH | 00F3 | TOTTMR | 002F | TSM | 0207 | TSMBUF | 0000 | TSMPTR | 0022 |
| TXE | 0004 | TXEN | 0001 | TXEND | 0212 | TXRDY | 0001 | TYP0 | 0321 | TYP1 | 0325 | TYP2 | 0342 | TYP3 | 034E |
| TYP4 | 0365 | TYP5 | 035C | TYP6 | 0362 | TYPE2 | 0213 | UART | 0281 | UARTCS | 0090 | UARTID | 0000 | UARTST | 0C69 |
| UPDATE | 0E44 | UPLINE | 0373 | WAIT | 0213 | WAIT1 | 021A | WAIT2 | 0222 | WAIT3 | 0401 | WATCH | 0449 | WATCH1 | 04C3 |
| WATCH2 | 04C9 | WATCHD | 002B | WATCHE | 002C | WATCHF | 002D | WATCHX | 07F2 | XADE | 0A01 | XADIDL | 0A0A | XADN | 000F |
| XADR1 | 0A00 | XADR2 | 0A0C | XADR3 | 0A0B | XADRR1 | 00DA | XADRR2 | 00C4 | XADT2 | 0A02 | XADT3 | 0A03 | XADT4 | 0A04 |
| XADT5 | 0A05 | XADT6 | 0A06 | XADT7 | 0A07 | XADV | 0044 | XADV1 | 00E4 | XADV2 | 00F4 | XADVR1 | 0A0E | XADVR2 | 0A0F |
| XCOSFM | 0318 | XCPA | 0314 | XCTS | 0206 | XDIAG | 0312 | XDIR | 0000 | XDS1 | 010D | XDS2 | 010E | XDS3 | 0110 |
| XDS4 | 0111 | XFAIL | 0113 | XFAIL1 | 0108 | XFERCT | 0020 | XFNL | 000A | XIDLE | 0200 | XINTF | 0100 | XINTP | 0A09 |
| XOPEN | 0A08 | XRAM | 0080 | XRAM1 | 0000 | XREC | 0202 | XRELAY | 0316 | XRES | 0112 | XRP1 | 0109 | XRP2 | 010B |
| XRRCHK | 0205 | XRTS | 0203 | XSEND | 0204 | XT2 | 0102 | XT3 | 0103 | XT4 | 0104 | XT5 | 0105 | XT6 | 0106 |
| XT7 | 0107 | XTHR2 | 010C | XTOT1 | 043D | XTOT2 | 043E | XWAIT | 0201 | | | | | | |
| AD | 1565 | 2158# | | | | | | | | | |
| AD1 | 2178 | 2179 | 2184# | | | | | | | | |
| ADCAL | 660# | 2852 | 3033 | 3056# | 3217 | 3267 | 3298 | 4164 | 4374 | 4423 | 4670 | 4765 |
| ADD16 | 2258 | 1056 | 1214 | 2105 | 2431 | 2713 | 4020 | | | | |
| ADDRES | 176# | 1357 | 1365 | 2713# | | | | | | | |
| ADDX | 1341 | 2720 | 2725# | | | | | | | | |
| ADDX1 | 2720 | 563 | 2722# | | | | | | | | |
| ADDX2 | 563 | 549# | 2721 | | | | | | | | |
| ADDXA | 549# | 556 | 560 | 562# | | | | | | | |
| ADDXB | 556 | 552 | 563# | | | | | | | | |
| ADDXC | 552 | 562 | 2716 | 2726# | | | | | | | |
| ADDXE | 562 | 3448 | 3449 | 3491# | | | | | | | |
| ADE | 3448 | 4351# | | | | | | | | | |
| ADEN | 4351# | | | | | | | | | | |
| ADFNL | 3458 | 3889# | | | | | | | | | |
| ADIDL | 2161 | 2168# | | | | | | | | | |
| ADMB1 | 2163 | 3468# | | | | | | | | | |
| ADRP | 3450 | 3602# | | | | | | | | | |
| ADRP1 | 3606 | 3608# | | | | | | | | | |
| ADRP2 | 3607 | 3611# | | | | | | | | | |
| ADRP3 | 3305 | 3615# | | | | | | | | | |
| ADRP4 | 3613# | | | | | | | | | | |
| ADRTD | 3453 | 3833# | | | | | | | | | |
| ADRTD1 | 3461 | 3839# | | | | | | | | | |
| ADRTD2 | 3460 | 3845# | | | | | | | | | |

| LOC | OBJ | LINE | | | SOURCE STATEMENT | | | | | | | | |
|---|---|---|---|---|---|---|---|---|---|---|---|---|---|
| ADRTD3 | 3459 | 3850# | | | | | | | | | | | |
| ADTHR | 3451 | 3637# | | | | | | | | | | | |
| ADTMP | 159# | 3318 | 3751 | 3833 | | | | | | | | | |
| ADTMP1 | 161# | 3323 | 3775 | 3839 | | | | | | | | | |
| ADV | 3452 | 3454 | 3455 | 3751# | | | | | | | | | |
| ADV0 | 3755# | | | | | | | | | | | | |
| ADV1 | 3462 | 3775# | | | | | | | | | | | |
| ADV10 | 3754 | 3759# | | | | | | | | | | | |
| ADV10A | 3762# | | | | | | | | | | | | |
| ADV11 | 3761 | 3764# | | | | | | | | | | | |
| ADV2 | 3463 | 3780# | | | | | | | | | | | |
| ADVE | 3473# | 3504 | 3617 | 3645 | 3763 | 3782 | 3847 | 3860 | 3939 | | | | |
| ADVE1 | 3475# | 3695 | | | | | | | | | | | |
| ADVEX | 3471# | 3756 | 3771 | 3777 | 3836 | 3842 | | | | | | | |
| ALARM | 923# | 935 | | | | | | | | | | | |
| ANACOS | 1847 | 2267 | 2689# | | | | | | | | | | |
| ANACP | 285# | 391 | 496 | 690 | 762 | 3681 | 4369 | | | | | | |
| ANACS | 343# | 401 | 432 | 450 | 460 | 503 | 693 | | | | | | |
| ANAID | 252# | 2485 | | | | | | | | | | | |
| ANAIN | 255# | 2158 | 2168 | 2175 | 3473 | 3668 | 2668 | 2835 | 2857 | 2870 | 2908 | 3094 | 3144 | 3145 | 3153 | 3168 |
| ANALOG | 207# | 828 | 937 | 946 | 2176 | 2574 | 3396 | 3411 | 3492 | 3495 | 3603 | 3638 | 3669 | 3684 | 3691 | 3752 |
| | 3180 | 3182 | 3262 | 3295 | 3317 | 3322 | 3934 | 3944 | 3955 | | | | | | | |
| | 3759 | 3850 | 3853 | 3856 | 3889 | 3922 | | | | | | | | | | |
| ANAPT | 248# | 2223 | 2575 | 4607 | | | | | | | | | | | | |
| ANAST | 233# | 1826 | 2505 | 4625 | | | | | | | | | | | | |
| B1200 | 325# | 327 | | | | | | | | | | | | | | |
| B9600 | 324# | 326 | | | | | | | | | | | | | | |
| BANK | 2021 | 2025# | | | | | | | | | | | | | | |
| BANK1 | 2019 | 2023# | | | | | | | | | | | | | | |
| BANKE | 2050 | 2055 | 2057 | 2062 | 2066# | | | | | | | | | | | |
| BASE. | 3144# | 3688 | | | | | | | | | | | | | | |
| BASE1 | 3132 | 3153# | | | | | | | | | | | | | | |
| BASE2 | 3133 | 3163# | | | | | | | | | | | | | | |
| BASE2A | 3164 | 3167# | | | | | | | | | | | | | | |
| BASE2B | 3170 | 3944# | | | | | | | | | | | | | | |
| BASE3 | 3134 | 3173# | | | | | | | | | | | | | | |
| BASE3A | 3174 | 3179# | | | | | | | | | | | | | | |
| BASE3B | 3179 | 3182# | | | | | | | | | | | | | | |
| BASE4 | 3135 | 3186# | | | | | | | | | | | | | | |
| BASE5 | 3136 | 3190# | | | | | | | | | | | | | | |
| BASE6 | 3137 | 3194# | | | | | | | | | | | | | | |
| BASE7 | 3138 | 3198# | | | | | | | | | | | | | | |
| BASEE | 3131 | 3181 | 3183 | 3215 | 3220# | | | | | | | | | | | |
| BASEEA | 3094# | 3227 | | | | | | | | | | | | | | |
| BASEEB | 3096 | 3102# | | | | | | | | | | | | | | |
| BASEEC | 3098 | 3103# | | | | | | | | | | | | | | |
| BASEED | 3097 | 3103# | | | | | | | | | | | | | | |
| BASEEE | 3097 | 4332# | | | | | | | | | | | | | | |
| BASEEE | 4333 | 4337# | | | | | | | | | | | | | | |

| LOC OBJ | | LINE | | SOURCE STATEMENT | | | |
|---|---|---|---|---|---|---|---|
| BASEEF | 3098# | 4336 | | | | | |
| BASEEX | 3178 | 3188 | 3192 | 3196 | 3200 | 3214 | 3219# |
| BASEEY | 3101# | 3119 | | | | | |
| BASEEZ | 3100 | 3116# | | | | | |
| BASEP | 3157 | 3166 | 3167 | 3202# | 3956 | | |
| BASEP1 | 3210 | 3215# | | | | | |
| BCOM | 2011# | 2028 | | | | | |
| BITMSK | 1569# | 1595 | | | | | |
| BLINE | 2424# | | | | | | |
| BURNE | 605 | 608# | | | | | |
| BURNL | 605# | 607 | | | | | |
| BURNT | 602# | 1487 | 1488 | 1489 | 1491 | 1497 | |
| CASE1 | 1103 | 1106# | | | | | |
| CASE2 | 1104 | 1119# | | | | | |
| CASE3 | 1105 | 1107 | 1120 | 1127# | | | |
| CE | 1305# | | | | | | |
| CENUM | 1330# | 1362 | | | | | |
| CHARL | 323# | 326 | 327 | | | | |
| CIM | 1961 | 4257# | | | | | |
| CIM1 | 4258 | 4261# | | | | | |
| CIM2 | 4260 | 4262# | | | | | |
| CIM3 | 4263 | 4266# | | | | | |
| CIMR | 4266 | 4271 | 4287# | | | | |
| CIMSS | 1957 | 1960# | | | | | |
| CINCR | 4956 | 4957 | 4959# | | | | |
| CKSM | 184# | 1041 | 1094 | 1135 | 1187 | 1221 | 2637 |
| CLOCK | 686# | | | | | | |
| CNOINC | 4958 | 4960# | | | | | |
| CNVRT | 399 | 501 | 692# | | | | |
| COM18 | 4251# | 4259 | | | | | |
| COM916 | 4252# | 4261 | | | | | |
| COMAN1 | 4179 | 4182 | 4325# | | | | |
| COMAND | 4069 | 4082 | 4090 | 4094 | 4138 | 4171 | 4188 | 4321# |
| COMTIM | 4253# | 4292 | | | | | |
| CONVRT | 683# | | | | | | |
| COS | 2382# | 2554 | | | | | |
| COSBUF | 195# | 1351 | 2388 | 2689 | 4068 | 4114 | 4923 | 4938 |
| COSE | 2385 | 2392# | | | | | |
| COSFM | 1356 | 4914# | | | | | |
| COSFM0 | 4916 | 4919# | | | | | |
| COSFM1 | 4927 | 4931# | | | | | |
| COSFM2 | 4928 | 4932 | 4935# | | | | |
| COSFM3 | 4917 | 4930 | 4934 | 4936# | | | |
| COSFMA | 1328 | 1355# | | | | | |
| COSRES | 4013# | 4128 | | | | | |
| COSSET | 4012# | 4095 | | | | | |
| CPA | 1326 | 2221# | | | | | |
| CPA1 | 2227 | 2229# | | | | | |

| LOC | OBJ | LINE | | | SOURCE STATEMENT | | | | | | | | |
|---|---|---|---|---|---|---|---|---|---|---|---|---|---|
| CPA2 | 2228 | 2268# | | | | | | | | | | | |
| CPAL | 2218# | 2268 | | | | | | | | | | | |
| CPALP | 2238# | 2243 | | | | | | | | | | | |
| CTSCHK | 969 | 1240# | | | | | | | | | | | |
| CTSCK1 | 1241 | 1243# | | | | | | | | | | | |
| CTSEND | 1242 | 1244# | | | | | | | | | | | |
| DATA | 578# | 1426 | 1499 | 2609 | 3930 | 4034 | 4587 | 4684 | | | | | |
| DATAIO | 286# | 580 | | | | | | | | | | | |
| DATE | 1525# | | | | | | | | | | | | |
| DIG | 1348 | | | | | | | | | | | | |
| DIGA | 4773 | 4759# | | | | | | | | | | | |
| | | 4778# | | | | | | | | | | | |
| DIGDLY | 251# | 1709 | 1731 | | | | | | | | | | |
| DIGFS | 4767 | 4769# | 1985 | | | | | | | | | | |
| DIGIN | 281# | 1648 | 4774 | | | | | | | | | | |
| DIGIN1 | 282# | 4070 | 4776 | | | | | | | | | | |
| DIGIN2 | 283# | 4778 | | | | | | | | | | | |
| DIGIN3 | 284# | 4780 | | | | | | | | | | | |
| DIGITL | 211# | 1884 | 1890 | 2222 | 2225 | 2247 | 2254 | 2255 | 2257 | 2260 | 2341 | 2343 | 2577 | 2745 | 2751 | 3202 |
| | 3212 | 3216 | 3340 | 3363 | 3365 | 3366 | 3368 | 3945 | 4288 | 4760 | 4764 | 4789 | 4834 | 4835 | 4885 | 4886 |
| DIGLP | 4790# | 4798 | | | | | | | | | | | |
| DIGMSK | 266# | 2340 | 4024 | 4619 | 4674 | 4759 | | | | | | | |
| DIGNFS | 4768 | 4774# | | | | | | | | | | | |
| DIGPT | 245# | 2578 | 4616 | | | | | | | | | | |
| DIGST | 240# | 2533 | 4047 | 4786 | 4964 | | | | | | | | |
| DIR | 438# | 4583# | | | | | | | | | | | |
| DIR0 | 4573 | 4604# | | | | | | | | | | | |
| DIR1 | 4574 | 4606# | | | | | | | | | | | |
| DIR1A | 4605 | 4607# | | | | | | | | | | | |
| DIR2 | 4575 | 4609# | | | | | | | | | | | |
| DIR3 | 4658 | 4663# | | | | | | | | | | | |
| DIR4 | 4577 | 4615# | | | | | | | | | | | |
| DIR5 | 4578 | 4618# | | | | | | | | | | | |
| DIR6 | 4579 | 4621# | | | | | | | | | | | |
| DIR6A | 4622# | 4644 | | | | | | | | | | | |
| DIR6B | 4631# | 4632 | | | | | | | | | | | |
| DIR7 | 4580 | 4643# | | | | | | | | | | | |
| DIR8 | 4576 | 4590 | 4655# | | | | | | | | | | |
| DIRE | 4592 | 4662 | 4664# | | | | | | | | | | |
| DIRFS | 4672 | 4674# | | | | | | | | | | | |
| DIRL | 4608 | 4614 | 4617 | 4620 | 4645# | | | | | | | | |
| DIRLA | 4642 | 4651# | | | | | | | | | | | |
| DIRLP | 4585# | 4663 | | | | | | | | | | | |
| DIRQ | 4673 | 4699# | | | | | | | | | | | |
| DISSCN | 4011# | 4064 | 4130 | 4139 | 4183 | 4189 | | | | | | | |
| DIVD | 2941# | 3367 | | | | | | | | | | | |
| DIVD1 | 2943 | 2950# | | | | | | | | | | | |
| DIVDEN | 3321 | 3340# | 3855 | 3890 | | | | | | | | | |
| DIVDL | 2942# | 2951 | | | | | | | | | | | |

| LOC | OBJ | LINE | | SOURCE STATEMENT | | | | | |
|---|---|---|---|---|---|---|---|---|---|
| DIVIDE | 3325 | 3362# | 3858 | 3893 | | | | | |
| DS0 | 663 | 664 | 665 | 666 | 869# | | | | |
| DS1 | 672 | 873# | | | | | | | |
| DS2 | 673 | 674 | 880# | | | | | | |
| DS3 | 464 | 675 | 883# | | | | | | |
| DS3A | 454# | | | | | | | | |
| DS4 | 676 | 897# | | | | | | | |
| DS4LP | 899# | 905 | | | | | | | |
| DSR | 314# | | | | | | | | |
| DTIMEH | 444# | 455 | | | | | | | |
| DTIMEL | 445# | 458 | | | | | | | |
| DUMMY | 267# | 3639 | 4609 | 4618 | 4621 | | | | |
| EH | 306# | | | | | | | | |
| EIP | 189# | 2087 | 2333 | 2349 | | | | | |
| EIP1 | 2337 | 2338 | 2345 | 2347# | | | | | |
| EIP2 | 2335 | 2349# | | | | | | | |
| EIPEN | 2329# | 2352 | | | | | | | |
| EIPP | 1566 | 2333# | | | | | | | |
| EOM | 1123 | 1135# | | | | | | | |
| ERROR | 315# | 1084 | | | | | | | |
| ERRSET | 1085 | 1141# | 4468 | 4477 | | | | | |
| EXEC | 1391 | 1577# | 1590 | 1645 | 1743 | 2184 | 2354 | 3476 | 4395 |
| EXT | 224# | 1360 | 4922 | | | | | | |
| FAIL | 667 | 678 | 845# | 884 | | | | | |
| FILE | 1883 | 2174 | 2573# | | | | | | |
| FILE1 | 2573 | 2577# | | | | | | | |
| FILE2 | 2224 | 2576 | 2580# | | | | | | |
| FILE3 | 2342 | 2585 | 2602# | 4762 | | | | | |
| FILEE | 2619# | | | | | | | | |
| FILELP | 2608# | 2618 | | | | | | | |
| FINAL | 3294# | 3895 | | | | | | | |
| FINAL3 | 3301 | 3304# | | | | | | | |
| FS0 | 4022 | 4024# | | | | | | | |
| FS1 | 4113 | 4120# | | | | | | | |
| FS1A | 4119 | 4127# | | | | | | | |
| FS3 | 4023 | 4091 | 4143# | | | | | | |
| FSCOS | 4114# | 4125 | | | | | | | |
| FSCTL | 4065 | 4096 | 4129 | 4131 | 4140 | 4173 | 4184 | 4190 | 4494# |
| FSDEAD | 4073 | 4086# | | | | | | | |
| FSLP | 4085 | 4093# | 4137 | | | | | | |
| FSOK | 4064# | | | | | | | | |
| FSOKLP | 4069# | 4078 | | | | | | | |
| FSR1 | 4166 | 4168# | | | | | | | |
| FSR2 | 4167 | 4191# | | | | | | | |
| FSRLY | 1953 | 4164# | | | | | | | |
| FSROTD | 4120 | 4519# | | | | | | | |
| FSSTAT | 1349 | 4020# | | | | | | | |
| FTIMEH | 484# | 525 | | | | | | | |

| LOC | OBJ | LINE | SOURCE STATEMENT | | | | | | | | | |
|---|---|---|---|---|---|---|---|---|---|---|---|---|
| FTIMEL | 485# | 527 | | | | | | | | | | |
| GETBYT | 1184 | 2635# | | | | | | | | | | |
| GETEND | 2640 | 2653# | | | | | | | | | | |
| HI | 2049 | 2058# | | | | | | | | | | |
| HI1 | 2033 | 2035# | | | | | | | | | | |
| HILMT | 383# | 415 | | | | | | | | | | |
| HIOFF | 2040 | 2044# | | | | | | | | | | |
| HIOUT | 2034 | 2039# | | | | | | | | | | |
| HWRES | 1313 | 1324# | | | | | | | | | | |
| IDLE | 963 | 1036# | | | | | | | | | | |
| IDLE1 | 1058 | 1061# | | | | | | | | | | |
| IDLE2 | 1038# | 1060 | 2128 | | | | | | | | | |
| IDLE3 | 1037 | 1040# | 2127 | | | | | | | | | |
| IDLE4 | 637 | 1059# | | | | | | | | | | |
| IDLE5 | 631# | 1061 | | | | | | | | | | |
| IDLE6 | 634 | 637# | | | | | | | | | | |
| IDLE7 | 2124 | 2128# | | | | | | | | | | |
| IDLE8 | 1063# | | | | | | | | | | |
| IDLE9 | 1063 | 2121# | | | | | | | | | | |
| IN232 | 298# | | | | | | | | | | | |
| IN422 | 300# | | | | | | | | | | | |
| INFO | 225# | 1416 | 1418 | 1422 | 1465 | 1882 | 1888 | 1895 | 2221 | 2619 | 4941 | |
| INT10 | 500 | 502# | | | | | | | | | | |
| INT20 | 506 | 524# | | | | | | | | | | |
| INT30 | 507# | | | | | | | | | | | |
| INT40 | 515 | 539# | | | | | | | | | | |
| INTCLR | 4366# | 4368 | | | | | | | | | | |
| INTE | 516 | 537 | 544 | 723# | 784 | 811 | 817 | 830 | 854 | 870 | 880 | 894 | 931 | 952 |
| INTP | 3457 | 3922# | 3934# | | | | | | | | | |
| INTPE | 3926 | 3928 | | | | | | | | | | |
| INTPR | 364 | 492# | | | | | | | | | | |
| INVERT | 4785 | 4884# | | | | | | | | | | |
| INVLP | 4887# | 4898 | | | | | | | | | | |
| IODEF | 355# | 433 | 461 | 513 | 535 | 4385 | | | | | | |
| IR | 307# | 4421 | | | | | | | | | | |
| ITIMEH | 488# | 508 | | | | | | | | | | |
| ITIMEL | 489# | 511 | | | | | | | | | | |
| JCNVRT | 435 | 707# | | | | | | | | | | |
| LEN | 1412# | 1431 | | | | | | | | | | |
| LENGTH | 223# | 1127 | 1384 | 2723 | | | | | | | | |
| LIMIT1 | 2819# | 2836 | | | | | | | | | | |
| LIMIT2 | 2820# | 2837 | | | | | | | | | | |
| LIMIT3 | 2821# | 2842 | | | | | | | | | | |
| LIMIT4 | 2822# | 2845 | | | | | | | | | | |
| LINE | 187# | 623 | 631 | 1053 | 1210 | 2110 | 2435 | 4425 | | | | |
| LINESW | 1338 | 2347 | 2431# | | | | | | | | | |
| LINET | 4407# | 4428 | | | | | | | | | | |

| | LOC OBJ | LINE | SOURCE STATEMENT | | |
|---|---|---|---|---|---|
| LINK | 2950 | 2956# | | | |
| LINKLP | 2961# | 2965 | | | |
| LNSWAP | 2114 | 2435# | 2722 | | |
| LOAD | 1422# | 1430 | | | |
| LOLMT | 382# | 413 | | | |
| LOW1 | 2048 | 2051# | | | |
| LOWCHK | 2043 | 2047# | | | |
| LOWSP | 4432 | 4436# | | | |
| LSWE | 2434 | 2439# | | | |
| MASK1 | 1568# | | | | |
| MCASE | 1075# | 1106 | | | |
| MEMCLR | 4361# | 4362 | | | |
| MEMLEN | 4348# | 4364 | | | |
| MORE | 2635 | 2641# | | | |
| MOVE | 2441# | 2446 | 4948 | 4966 | |
| MOVEI | 2248 | 2669# | 2755 | | |
| MOVEMM | 3341 | 3364 | 3370 | 3412 | 3428# |
| MOVER | 2246 | 2263 | 2462# | 3501 | |
| MOVERI | 829 | 847 | 2668# | 3271 | 3614 |
| MPOS | 2520# | 2538 | | | |
| MQUAD | 4571# | 4660 | | | |
| MSBIT | 213# | 1892 | | | |
| MSG | 222# | 1334 | 1373 | 4914 | |
| MSGL | 1073# | | | | |
| MTYPE | 1076# | | | | |
| MULT | 2256 | 3025# | | | |
| MULT1 | 3030 | 3032# | | | |
| MULT2 | 3032 | 3034# | | | |
| MULTLP | 3027# | 3041 | | | |
| NABLE3 | 265# | | | | |
| NEWVAL | 747# | | | | |
| NORMAL | 3080# | 3087 | 3156 | 3372 | 3612 |
| NRTMR | 270# | 2083 | 2099 | | |
| NTASK | 1584 | 1588# | | | |
| NUM | 3108# | 3154 | 3165 | 3169 | 3851 | 3857 |
| OFF | 1503 | 1505 | 2406# | 4323 | 4391 | 4393 |
| OFF1 | 3266 | 3269# | | | |
| OFF2 | 3268 | 3270# | 3304 | | |
| OFFSET | 3261# | 3932 | 3937 | 3373 | |
| OLDVAL | 746 | 751# | | | |
| ONBRD | 1948 | 1957# | | | |
| ONE | 1630 | 1806# | | | |
| ONE0 | 1808 | 1813# | | | |
| ONE1 | 1816# | 1822 | | | |
| ONE2 | 1826# | | | | |
| ONEE | 1833 | 1839 | 1847# | | |
| OPNPRT | 3456 | 3668# | | | |

| LOC OBJ | LINE | SOURCE STATEMENT |
|---|---|---|
| OUT232 | 299# | |
| OUT422 | 301# | |
| OVRFL | 2773# | |
| OVRFL1 | 2775# 2780 | |
| OVRFL2 | 2773 2780# | |
| OVRFL3 | 2774 2783# | |
| OVRFL4 | 2775 2785# | |
| P5HI | 2060 2063# | |
| P7LO | 2053 2056# | |
| PACK | 4784 4834# | |
| PACK1 | 4845 4848# | |
| PACK2 | 4848 4853# | |
| PACKLP | 4840# 4853 | |
| PANA | 751 2262 2482# | |
| PANAST | 2245 2502# 3494 | |
| PARITY | 321# 326 327 | |
| PEN | 322# 326 327 | |
| POINT | 1887 2527# 3642 | |
| POINT1 | 2544 2546# | |
| POINT2 | 2545 2549# | |
| POINTL | 2544# 2548 | |
| PORTA | 344# 942 3224 | |
| PORTB | 345# 3683 4375 | |
| PORTC | 346# 764 938 | |
| PRGRAM | 1309 1460# | |
| PROG | 287# 1484 | |
| PROGL | 1456# 1508 | |
| PULSA | 1992 1997# | |
| PULSB | 1996 1998# | |
| PULSE | 1939 1981# 4294 | |
| PV | 3317# 3780 3845 | |
| QUADST | 4572# 4584 | |
| RANG1 | 2823# | |
| RANG7 | 2829# 2848 2865 | |
| RANG8 | 2830# 2867 | |
| RANG9 | 2831# 2839 | |
| RANGE | 2835# 3602 | |
| RANGE1 | 2840 2842# | |
| RANGE2 | 2850# 2855 | |
| RANGE3 | 2850 2852# | |
| RANGE4 | 2851 2864 2867# | |
| RANGE5 | 2841 2866 2870# | |
| RANGE6 | 2859 2863 2876# | |
| RANGEE | 2883# | |
| RANGES | 3131# | |
| RCT1 | 4452 4459# | |
| RCT2 | 4455 4470# | |
| RCTEX | 4467# | |

| LOC | OBJ | LINE | | | SOURCE STATEMENT | | | | | | |
|---|---|---|---|---|---|---|---|---|---|---|---|
| RDATA | 1082 | 1084# | | | | | | | | | |
| RDATAA | 1083 | 2097# | | | | | | | | | |
| RDATAB | 1087 | 2080# | | | | | | | | | |
| RDATAC | 1088# | 2088 | | | | | | | | | |
| RDATAD | 2104 | 2109 | 2113 | 2116# | | | | | | | |
| RDATAE | 1142 | 1151 | 1157# | | | | | | | | |
| RDATAF | 1100 | 4449# | | | | | | | | | |
| RDATAG | 4456# | 4466 | 4472 | 4475 | | | | | | | |
| RDATAH | 1101# | 4458 | | | | | | | | | |
| RDATAX | 2115# | | | | | | | | | | |
| REC | 965 | 1081# | | | | | | | | | |
| REC1 | 1305 | 1308 | 1314 | 1315 | 1316 | 1317 | 1318 | 1319 | 1320 | 1325 | 1339 | 1343 | 1353 | 1359 | 1366 | 1391# |
| RECV | 1334# | 1562 | | | | | | | | | |
| RECVE | 1379 | 1384# | 1432 | 1509 | 1901 | 2269 | 496A | | | | |
| REG2 | 166# | 765 | | | | | | | | | |
| REG3 | 153# | 2750 | 3209 | 3211 | 3219 | 3261 | 3294 | 3320 | 3362 | 3369 | 3604 | 3852 | 3953 | | | |
| REGRLY | 1723 | 1958 | 2018# | 2346 | 4296 | | | | | | |
| RELAY | 1327 | 1882# | | | | | | | | | |
| REQ | 1139 | 1143# | | | | | | | | | |
| REQ1 | 1074# | 1143 | | | | | | | | | |
| RESET | 309# | 1032 | | | | | | | | | |
| RESULT | 677 | 847# | 913 | | | | | | | | |
| REV | 1524# | | | | | | | | | | |
| REV1 | 2747 | 2758# | | | | | | | | | |
| REVRSE | 2249 | 2745# | | | | | | | | | |
| RFLDBK | 4015# | | | | | | | | | | |
| RFRSH | 659 | 660 | 742# | | | | | | | | |
| RFSH | 201# | 744 | 772 | 2264 | | | | | | | |
| RFSH1 | 750 | 759# | | | | | | | | | |
| RFSH3 | 784# | | | | | | | | | | |
| RFSHL | 766# | 769 | | | | | | | | | |
| RL1 | 1933 | 1936# | | | | | | | | | |
| RL2 | 1935 | 1948# | | | | | | | | | |
| RL3 | 1938 | 1941# | | | | | | | | | |
| RL4 | 1943 | 1946# | | | | | | | | | |
| RL5 | 1949 | 1951# | | | | | | | | | |
| RL99 | 1950 | 1955 | | | | | | | | | |
| RLY | 1564 | 1700# | | | | | | | | | |
| RLY1 | 1705# | | | | | | | | | | |
| RLY1L | 1710# | 1716 | | | | | | | | | |
| RLY2 | 1702 | 1721# | | | | | | | | | |
| RLYACT | 1891 | 1898 | 1931# | | | | | | | | |
| RLYB0 | 280# | 1502 | 2020 | 4174 | 4185 | 4321 | 4390 | | | | |
| RLYB1 | 279# | 1504 | 2023 | 4392 | 4494 | | | | | | |
| RLYCT | 205# | 1705 | 1726 | 1981 | | | | | | | |
| RLYE | 1707 | 1743# | | | | | | | | | |
| RLYE1 | 1714 | 1718 | 1740# | | | | | | | | |
| RLYSCH | 257# | 1700 | 1740 | | | | | | | | |

| LOC | OBJ | LINE | SOURCE STATEMENT | | | | |
|---|---|---|---|---|---|---|---|
| RP | 661 | 804# | | | | | |
| RP1 | 668 | 669 | 814# | | | | |
| RP2 | 670 | 820# | | | | | |
| RP2A | 825 | 828# | | | | | |
| RPE | 827 | 830# | | | | | |
| RPT20 | 626 | 629# | | | | | |
| RPT232 | 623# | 1219 | | | | | |
| RRCHK | 968 | 1258# | | | | | |
| RRCHK1 | 1259 | 1261# | | | | | |
| RREND | 1260 | 1262# | | | | | |
| RTS | 308# | 1202 | | | | | |
| RTS422 | 629 | 1217# | | | | | |
| RTSEND | 628 | 1218 | 1221# | | | | |
| RTSREQ | 1202# | 1206 | | | | | |
| RTSRES | 1032# | 1046 | | | | | |
| RXE | 311# | 1032 | 1202 | | | | |
| RXRDY | 317# | | | | | | |
| SAVE | 3396# | 3471 | | | | | |
| SAVE1 | 3398 | 3401# | | | | | |
| SAVE2 | 3401 | 3404# | | | | | |
| SAVE3 | 3403 | 3405# | | | | | |
| SAVE4 | 3400 | 3406# | | | | | |
| SBRK | 310# | | | | | | |
| SECOND | 188# | 782 | 1773 | | | | |
| SEND | 967 | 1175# | | | | | |
| SLFCAL | 243# | | | | | | |
| SNDEND | 1177 | 1181 | 1191# | | | | |
| SPAN | 209# | | | | | | |
| SRS232 | 1216 | 1219# | | | | | |
| SRTS | 966 | 1206# | | | | | |
| SS | 1886 | 1891# | | | | | |
| SS1 | 1898# | | | | | | |
| SSE | 1894 | 1900# | | | | | |
| SSLEN | 1877# | 1900 | | | | | |
| ST | 320# | 326 | 327 | | | | |
| START | 362 | 4355# | | | | | |
| STIMEH | 486# | 540 | | | | | |
| STIMEL | 487# | 542 | | | | | |
| STOPCT | 357# | 402 | 451 | 504 | 697 | | |
| STOPSC | 4014# | 4095 | 4128 | 4172 | | | |
| STORE | 1113 | 1114 | 1118 | 1122 | 1131 | 1147# | |
| STRTCT | 356# | 705 | | | | | |
| SUBT | 2753 | 2942 | 2982 | 2991# | 3213 | 3324 | 3605 | 3954 |
| SUBT1 | 2997 | 2999# | | | | | |
| SUBT2 | 3005 | 3007# | | | | | |
| SUBTV | 2982# | 3269 | 3319 | 3854 | | | |
| SUBTV1 | 2983 | 2987# | | | | | |
| T50MS | 1455# | | | | | | |
| TABLE | 2898# | 3927 | | | | | |

| LOC OBJ | | LINE | | SOURCE STATEMENT | | | | |
|---|---|---|---|---|---|---|---|---|
| TABLE0 | 262# | 2898 | 4613 | | | | | |
| TABLE1 | 263# | | | | | | | |
| TABLE2 | 264# | | | | | | | |
| TABLEE | 2901 | 2915 | 2917# | | | | | |
| TASK | 1589# | 1593 | | | | | | |
| TASK0 | 1562# | 1602 | | | | | | |
| TASK1 | 1563# | 1603 | | | | | | |
| TASK2 | 1564# | 1604 | | | | | | |
| TASK3 | 1565# | 1605 | | | | | | |
| TASK4 | 1566# | 1606 | | | | | | |
| TASKRQ | 1581# | | | | | | | |
| TBL | 924# | 945 | | | | | | |
| TDELAY | 186# | 1008 | 1178 | 2121 | | | | |
| TF12 | 327# | 4436 | | | | | | |
| TF96 | 326# | 4433 | | | | | | |
| THR1 | 662 | 928# | | | | | | |
| THR1A | 934 | 937# | | | | | | |
| THR1B | 610# | 943 | | | | | | |
| THR1C | 613 | 944# | | | | | | |
| THR2 | 671 | 934# | | | | | | |
| THR2A | 936 | 946# | | | | | | |
| THR2B | 944 | 949# | | | | | | |
| TIMEH | 427 | 4350# | 4379 | | | | | |
| TIMEL | 430 | 4349# | 4382 | | | | | |
| TIMERH | 348# | 426 | 454 | 507 | 529 | 4378 | 4381 | |
| TIMERL | 347# | 400 | 429 | 457 | 510 | 692 | | |
| TINT10 | 398 | 400# | | | | | | |
| TINT20 | 404 | 425# | 439 | | | | | |
| TINT30 | 405# | | | | | | | |
| TINT40 | 426# | | | | | | | |
| TINT50 | 395 | 450# | | | | | | |
| TINTP | 385# | | | | | | | |
| TINTXX | 416 | 436# | | | | | | |
| TINTYY | 418# | 438 | | | | | | |
| TMPLT | 229# | 4604 | 4606 | 4615 | 4641 | 4664 | 4695 | 4942 | 4954 |
| TOTACT | 261# | 1668 | 1806 | | | | | |
| TOTAL | 1563 | 1634# | | | | | | |
| TOTAL1 | 1629 | 1648# | | | | | | |
| TOTALA | 1636 | 1642# | | | | | | |
| TOTALE | 1645# | | | | | | | |
| TOTALX | 1643# | 1812 | | | | | | |
| TOTALY | 1639# | 1673 | | | | | | |
| TOTASS | 259# | 1656 | 4633 | | | | | |
| TOTINC | 191# | 1663 | | | | | | |
| TOTLST | 190# | 1657 | | | | | | |
| TOTRUN | 260# | 2787 | 4643 | | | | | |
| TOTSCH | 258# | 1634 | 1643 | | | | | |
| TOTTMR | 206# | 1665 | 1781 | | | | | |

| LOC | OBJ | LINE | | SOURCE STATEMENT | | | | | | |
|---|---|---|---|---|---|---|---|---|---|---|
| TSM | 975# | 1577 | | | | | | | | |
| TSMBUF | 221# | 1367 | 1385 | | | | | | | |
| TSMPTR | 185# | 1147 | 2643 | | | | | | | |
| TXE | 316# | | | | | | | | | |
| TXEN | 312# | 1032 | 1202 | 1038 | 1157 | 1191 | 1226 | 1244 | 1262 | 2116 |
| TXEND | 636 | 992# | 1021 | | | | | | | |
| TXRDY | 318# | | | | | | | | | |
| TYP0 | 1338# | | | | | | | | | |
| TYP1 | 1336 | 1340# | | | | | | | | |
| TYP2 | 1337 | 1357# | | | | | | | | |
| TYP3 | 1340 | 1365# | | | | | | | | |
| TYP4 | 1342 | 1346 | 1354 | 1380# | | | | | | |
| TYP5 | 1371 | 1373# | | | | | | | | |
| TYP6 | 1358 | 1378# | | | | | | | | |
| TYPE2 | 1112 | 1114# | | | | | | | | |
| UART | 278# | 980 | 2085 | 2649 | 4414 | | | | | |
| UARTCS | 304# | 982 | 4416 | | | | | | | |
| UARTIO | 303# | 1011 | 1049 | 1091 | 1185 | | | | | |
| UARTST | 4387 | 4414# | | | | | | | | |
| UPDATE | 4775 | 4777 | 4779 | 4781 | 4814# | | | | | |
| UPLINE | 1310 | 1416# | | | | | | | | |
| WAIT | 964 | 1007# | | | | | | | | |
| WAIT1 | 1009 | 1011# | | | | | | | | |
| WAIT2 | 1010 | 1016# | | | | | | | | |
| WAIT3 | 1015 | 1018 | 1021# | | | | | | | |
| WATCH | 1580 | 1760# | | | | | | | | |
| WATCH1 | 1777 | 1779# | | | | | | | | |
| WATCH2 | 1763 | 1772 | 1790# | | | | | | | |
| WATCHD | 202# | 1760 | | | | | | | | |
| WATCHE | 203# | | | | | | | | | |
| WATCHF | 204# | | | | | | | | | |
| WATCHX | 1782 | 2787# | | | | | | | | |
| XADE | 3449# | 3615 | 3762 | | | | | | | |
| XADIDL | 3448# | | | | | | | | | |
| XADN | 2153# | 2160 | | | | | | | | |
| XADR1 | 3461# | 3828 | | | | | | | | |
| XADR2 | 3460# | 3829 | | | | | | | | |
| XADR3 | 3459# | 3846 | | | | | | | | |
| XADRR1 | 3828# | 3834 | | | | | | | | |
| XADRR2 | 3829# | 3840 | | | | | | | | |
| XADT2 | 3450# | | | | | | | | | |
| XADT3 | 3451# | | | | | | | | | |
| XADT4 | 3452# | 3745 | | | | | | | | |
| XADT5 | 3453# | | | | | | | | | |
| XADT6 | 3454# | | | | | | | | | |
| XADT7 | 3455# | | | | | | | | | |
| XADV | 3745# | 3770 | | | | | | | | |
| XADV1 | 3746# | 3755 | | | | | | | | |

| LOC | OBJ | LINE | SOURCE STATEMENT | | | | | | | | | |
|---|---|---|---|---|---|---|---|---|---|---|---|---|
| XADV2 | 3747# | 3776 | | | | | | | | | | |
| XADVR1 | 3462# | 3746 | | | | | | | | | | |
| XADVR2 | 3463# | 3747 | | | | | | | | | | |
| XCOSFM | 1306 | 1328# | | | | | | | | | | |
| XCPA | 1311 | 1326# | | | | | | | | | | |
| XCTS | 627 | 969# | | | | | | | | | | |
| XDIAG | 1312 | 1325# | | | | | | | | | | |
| XDIR | 4573# | 4601 | | | | | | | | | | |
| XDS1 | 672# | 869 | | | | | | | | | | |
| XDS2 | 673# | | | | | | | | | | | |
| XDS3 | 675# | | | | | | | | | | | |
| XDS4 | 676# | | | | | | | | | | | |
| XFAIL | 678# | | | | | | | | | | | |
| XFAIL1 | 667# | 804 | | | | | | | | | | |
| XFERCT | 1411# | 1417 | | | | | | | | | | |
| XFNL | 3458# | 3938 | | | | | | | | | | |
| XIDLE | 561 | 963# | 1019 | 1138 | | | | | | | | |
| XINTE | 659# | 852 | 949 | | | | | | | | | |
| XINTP | 3457# | 3781 | 3859 | | | | | | | | | |
| XOPEN | 2180 | 3456# | 3472 | | | | | | | | | |
| XRAM | 277# | 584 | 752 | 1051 | 1208 | 1492 | 1506 | 1578 | 1653 | 1724 | 1964 | 2080 | 2097 | 2641 | 3689 | 4111 |
| | 4141 | 4297 | 4356 | 4456 | 4782 | | | | | | | | |
| XRAM1 | 276# | | | | | | | | | | | |
| XREC | 635 | 965# | 1059 | 1261 | | | | | | | | |
| XRELAY | 1307 | 1327# | | | | | | | | | | |
| XRES | 677# | 823 | | | | | | | | | | |
| XRP1 | 668# | | | | | | | | | | | |
| XRP2 | 670# | | | | | | | | | | | |
| XRRCHK | 968# | | | | | | | | | | | |
| XRTS | 966# | 1390 | | | | | | | | | | |
| XSEND | 967# | 1217 | 1243 | | | | | | | | | |
| XT2 | 661# | | | | | | | | | | | |
| XT3 | 662# | | | | | | | | | | | |
| XT4 | 663# | | | | | | | | | | | |
| XT5 | 664# | | | | | | | | | | | |
| XT6 | 665# | | | | | | | | | | | |
| XT7 | 666# | | | | | | | | | | | |
| XTHR2 | 671# | 930 | | | | | | | | | | |
| XTOT1 | 1629# | 1811 | | | | | | | | | | |
| XTOT2 | 1630# | 1642 | | | | | | | | | | |
| XWAIT | 964# | 1141 | | | | | | | | | | |

CROSS REFERENCE COMPLETE

The embodiments of the invention in which an exclusive property or right is claimed are defined as follows:

1. A data gathering panel for conversion of analog values into digital values comprising:
   input terminal means adapted to be connected to at least one analog sensor for receiving an analog value;
   memory means for storing a base value and a range value for said at least one analog sensor;
   base means connected to said memory means for applying said base value to said analog value; and,
   analog-to-digital conversion means connected to said analog input terminal means, to said base means and to said memory means for converting said analog value into a digital value, said conversion means determining said digital value by utilizing said analog value, said base value and said range value, said analog-to-digial conversion means comprising a hex slope analog-to-digital converter and an integrator, said integrator being charged from a reference level to a level determined by said analog value and then discharged to said reference level, said integrator being charged to a level determined by said base value and being discharged to said reference level, and said integrator being charged to a level determined by said range value and being discharged to said reference level.

2. The data gathering panel of claim 1 wherein said analog-to-digital conversion means further comprises timer means for digitally timing the times required for discharging said integrator to said reference level from said level determined by said analog value, said level determined by said base value and said level determined by said range value.

3. The data gathering panel of claim 2 wherein said base means comprises digital-to-analog circuit means for converting a digital input into said base value, said digital-to-analog converter also converting a digital input into a range value.

4. The data gathering panel of claim 3 wherein said base means further comprises a resistance multiplexer having a plurality of resistors connected as inputs thereto and an output for supplying range and base values when said analog sensor is a resistance type sensor.

5. The data gathering panel of claim 4 wherein said input terminal means comprises an output multiplexer having a plurality of inputs each of which may be connected to a corresponding one of a plurality of analog sensors and having an output means to be connected to said analog-to-digital conversion means.

6. The data gathering panel of claim 5 wherein said input terminal means comprises input multiplexer means having a plurality of outputs connected of said plurality of inputs of said output multiplexer and having an input connected to a constant current source for supplying current to passive type analog sensors.

7. The data gathering panel of claim 6 wherein said conversion means comprises a microcomputer for controlling said integrator, said timer, said digital-to-analog converter, said output and input multiplexers, and said resistance multiplexer for connecting said plurality of resistors to said integrator for supplying said range and base values when said analog sensor is a resistance type sensor.

8. The data gathering panel of claim 1 wherein said base means comprises digital-to-analog circuit means for converting a digital input into said base value, said digital-to-analog converter also converting a digital input into a range value.

9. The data gathering panel of claim 8 wherein said base means further comprises a resistance multiplexer having a plurality of resistors connected as inputs thereto and an output for supplying range and base values when said analog sensor is a resistance type sensor.

10. The data gathering panel of claim 9 wherein said input terminal means comprises an output multiplexer having a plurality of inputs each of which may be connected to a corresponding one of a plurality of analog sensors and having an output means to be connected to said analog-to-digital conversion means.

11. The data gathering panel of claim 10 wherein said input terminal means comprises input multiplexer means having a plurality of outputs connected to said plurality of inputs of said output multiplexer and having an input connected to a constant current source for supplying current to passive type analog sensors.

12. The data gathering panel of claim 11 wherein said conversion means comprises a microcomputer for controlling said integrator, said timer, said digital-to-analog converter, said output and input multiplexers, and said resistance multiplexer for connecting said plurality of resistors to said integrator for supplying said range and base values when said analog sensor is a resistance type sensor.

13. The data gathering panel of claim 1 wherein said input terminal means comprises an output multiplexer having a plurality of inputs each of which may be connected to a corresponding one of a plurality of analog sensors and having an output means to be connected to said analog-to-digital conversion means.

14. The data gather panel of claim 13 wherein said input terminal means comprises input multiplexer means having a plurality of outputs connected to said plurality of inputs of said output multiplexer and having an input connected to a constant current source for supplying current to passive type analog sensors.

15. A data gathering panel for permitting connection to a plurality of input sensors having different characteristics, said input sensors including at least resistance sensors, voltage sensors and current sensors, said data gathering panel comprising:
   a plurality of input terminals for connection to a plurality of input sensors, said input terminals connected as inputs to multiplexer means, said multiplexer means being connected to said processing means, said input terminals comprising a plurality of analog input terminals adapted to be connected to a plurality of analog sensors having different characteristics and a plurality of digital input terminals adapted to be connected to a plurality of digital input sensors, said multiplexer means comprising an analog multiplexer connected to said plurality of analog input terminal means and a plurality of buffers each capable of being enabled for connecting groups of said plurality of digital input terminals to said processing means, said multiplexer means having an output;
   memory means for storing characteristics of said input sensors so that said data gathering panel can be connected to input sensors having different characteristics; and,
   processing means including conversion means connected to an output of said analog multiplexer for converting analog values received from said plurality of analog sensors into corresponding digital values, said processing means including digital-to-analog converter means connected to said output of said analog multiplexer for applying to said analog values corresponding base values when said analog values are below a predetermined level, said base values being dependent upon said characteristics stored in said memory means, said conversion means comprising a hex slope converter having an integrator, said processing means applying said analog values to said integrator for charging said integrator from a reference level to levels representing said analog values and then discharging said integrator to said reference level, for charging said integrator from said reference level to levels representing said base values and then discharging said integrator back to said reference level, and for charging said integrator from said reference level to levels dependent upon range values which are stored in said memory means and which are dependent upon the particular analog sensors, and for discharging said integrator back to said reference level, said hex slope converter utilizing said analog values, said base values and said range values in terms of said discharge times for determining corresponding digital values for said analog values.

16. The data gathering panel of claim 15 wherein said processing means comprises a plurality of precision resistors connected to the input of a precision resistor multiplexer which has an output connected to the output of said analog multiplexer for supplying base and range values to said analog values as determined by said characteristics stored in said memory means.

17. A data gathering panel for permitting connection to a plurality of input sensors having different characteristics, said input sensors including at least resistance sensors, voltage sensors and current sensors, said data gathering panel comprising:
input terminal means for connection to a plurality of input sensors;
memory means for storing characteristics of said input sensors so that said data gathering panel can be connected to input sensors having different characteristics; and,
processing means including conversion means connected to an output of said analog multiplexer for converting analog values received from said plurality of analog sensors into corresponding digital values, said processing means including digital-to-analog converter means connected to said output of said analog multiplexer for applying to said analog values corresponding base values when said analog values are below a predetermined level, said base values being dependent upon said characteristics stored in said memory means, said conversion means comprising a hex slope converter having an integrator, said processing means applying said analog values to said integrator for charging said integrator from a reference level to levels representing said analog values and then discharging said integrator to said reference level, for charging said integrator from said reference level to levels representing said base values and then discharging said integrator back to said reference level, and for charging said integrator from said reference level to levels dependent upon range values which are stored in said memory means and which are dependent upon the particular analog sensors, and for discharging said integrator back to said reference level, said hex slope converter utilizing said analog values, said base values and said range values in terms of said discharge times for determining corresponding digital values for said analog values.

18. The data gathering panel of claim 17 wherein said processing means comprises a plurality of precision resistors connected to the input of a precision resistor multiplexer which has an output connected to the output of said analog multiplexer for supplying base and range values to said analog values as determined by said characteristics stored in said memory means.

19. A data gathering panel for permitting connection to a plurality of input sensors having different characteristics, said input sensors including at least resistance sensors, voltage sensors and current sensors, said data gathering panel comprising:
a plurality of input terminals for connection to a plurality of input sensors, said input terminals connected as inputs to multiplexer means, said multiplexer means being connected to said processing means, said input terminals comprising a plurality of analog input terminals adapted to be connected to a plurality of analog sensors having different characteristics and said multiplexer means comprising an analog multiplexer connected to said plurality of analog input terminals and having an output;
memory means for storing characteristics of said input sensors so that said data gathering panel can be connected to input sensors having different characteristics; and,
processing means including conversion means connected to an output of said analog multiplexer for converting analog values received from said plurality of analog sensors into corresponding digital values, said processing means including digital-to-analog converter means connected to said output of said analog multiplexer for applying to said analog values corresponding base values when said analog values are below a predetermined level, said base values being dependent upon said characteristics stored in said memory means, said conversion means comprising a hex slope converter having an integrator, said processing means applying said analog values to said integrator for charging said integrator from a reference level to levels representing said analog values and then discharging said integrator to said reference level, for charging said integrator from said reference level to levels representing said base values and then discharging said integrator back to said reference level, and for charging said integrator from said reference level to levels dependent upon range values which are stored in said memory means and which are dependent upon the particular analog sensors, and for discharging said integrator back to said reference level, said hex slope converter utilizing said analog values, said base values and said range values in terms of said discharge times for determining corresponding digital values for said analog values.

20. The data gathering panel of claim 19 wherein said processing means comprises a plurality of precision resistors connected to the input of a precision resistor multiplexer which has an output connected to the output of said analog multiplexer for supplying base and range values to said analog values as determined by said characteristics stored in said memory means.

* * * * *